(12) United States Patent
Miyamoto et al.

(10) Patent No.: US 11,616,031 B2
(45) Date of Patent: Mar. 28, 2023

(54) SEMICONDUCTOR DEVICE AND ELECTRONIC APPARATUS

(71) Applicant: Sony Semiconductor Solutions Corporation, Kanagawa (JP)

(72) Inventors: Takashi Miyamoto, Kanagawa (JP); Yoshiyuki Akiyama, Kanagawa (JP); Junichi Tsunoda, Kanagawa (JP); Shuuichi Kojima, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 595 days.

(21) Appl. No.: 16/632,665

(22) PCT Filed: Jul. 13, 2018

(86) PCT No.: PCT/JP2018/026427
§ 371 (c)(1),
(2) Date: Jan. 21, 2020

(87) PCT Pub. No.: WO2019/021852
PCT Pub. Date: Jan. 31, 2019

(65) Prior Publication Data
US 2021/0167026 A1    Jun. 3, 2021

(30) Foreign Application Priority Data

Jul. 27, 2017 (JP) .............. JP2017-145364

(51) Int. Cl.
*H01L 27/00* (2006.01)
*H01L 23/64* (2006.01)
(Continued)

(52) U.S. Cl.
CPC .......... *H01L 23/645* (2013.01); *H01L 23/585* (2013.01); *H01L 27/1463* (2013.01); *H01L 27/14623* (2013.01)

(58) Field of Classification Search
CPC .......... H01L 27/14623; H01L 27/1463; H01L 27/1464; H01L 27/14601; H04N 5/369
See application file for complete search history.

(56) References Cited

U.S. PATENT DOCUMENTS

2005/0237275 A1    10/2005    Inoue et al.
2009/0004764 A1    1/2009    Ohnuma et al.
(Continued)

FOREIGN PATENT DOCUMENTS

JP    2014-057426 A    3/2014
TW    201601302 A    1/2016
(Continued)

OTHER PUBLICATIONS

Jin Xiangliang et al. "Principle and analysis of novel gate-induced noise in pixel mosfet of emos imagers", Journal of Semiconductors vol. 24, No. 9, Sep. 30, 2003.

(Continued)

*Primary Examiner* — Reema Patel
(74) *Attorney, Agent, or Firm* — Michael Best & Friedrich LLP

(57) ABSTRACT

The present technology relates to a semiconductor device and an electronic apparatus that make it possible to suppress the generation of noise in signals. A semiconductor device includes: a first semiconductor substrate on which at least a portion of a first conductor loop is formed; and a second semiconductor substrate on which a second conductor loop is formed. The second semiconductor substrate includes a first conductor layer and a second conductor layer. The first conductor layer and the second conductor layer each include a conductor. The first conductor layer and the second conductor layer are configured to cause a direction of a loop surface in which a magnetic flux is generated from the second conductor loop to be different from a direction of a loop surface in which an induced electromotive force is (Continued)

generated in the first conductor loop. The present technology is applicable, for example, to a CMOS image sensor.

22 Claims, 69 Drawing Sheets

(51) Int. Cl.
  *H01L 23/58* (2006.01)
  *H01L 27/146* (2006.01)

(56) References Cited

U.S. PATENT DOCUMENTS

| | | |
|---|---|---|
| 2014/0131585 A1 | 5/2014 | Ishioka |
| 2016/0093570 A1 | 3/2016 | Watanabe et al. |
| 2017/0078603 A1 | 3/2017 | Yamasaki et al. |
| 2017/0133425 A1* | 5/2017 | Shigenami ........ H01L 27/14636 |

FOREIGN PATENT DOCUMENTS

| | | |
|---|---|---|
| WO | 2010109744 A1 | 9/2010 |
| WO | 2011086612 A1 | 7/2011 |
| WO | 2013/115075 A1 | 8/2013 |
| WO | 2014097425 A1 | 6/2014 |
| WO | 2015/198913 A1 | 12/2015 |
| WO | 2016/152577 A1 | 9/2016 |
| WO | 2016/181874 A1 | 11/2016 |
| WO | 2017119177 A1 | 7/2017 |
| WO | 2017/149845 A1 | 9/2017 |

OTHER PUBLICATIONS

Wang Jun et al. "Frequency and bias dependent modeling of induced gate noise and cross-correlation noise in 40 nm metal-oxide-semiconductor field-effect transistors", Acta Physica Sinica, vol. 65, No. 25, Dec. 20, 2016.

Chinese Office Action dated Nov. 15, 2021 for corresponding Chinese Application No. 2018800470198.

* cited by examiner

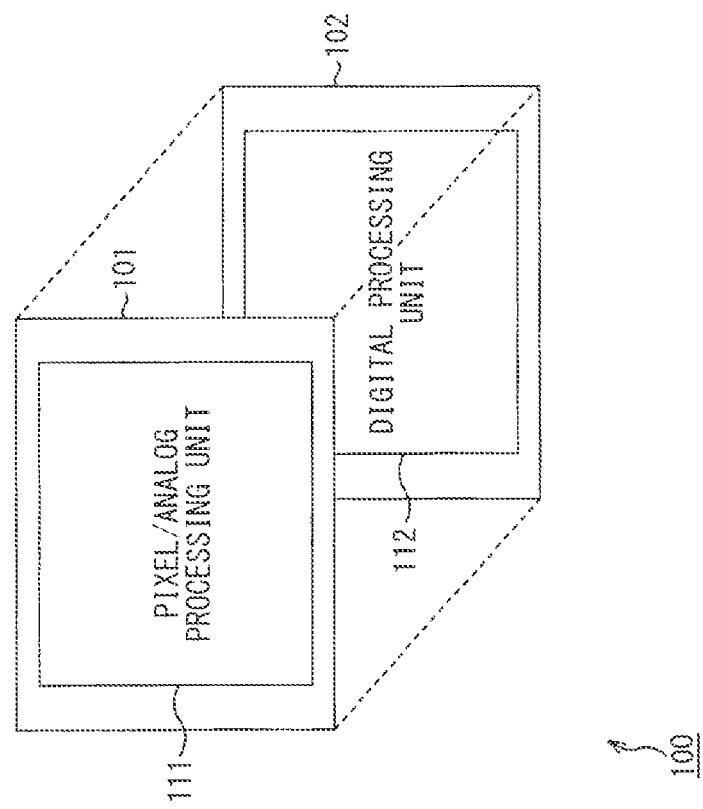

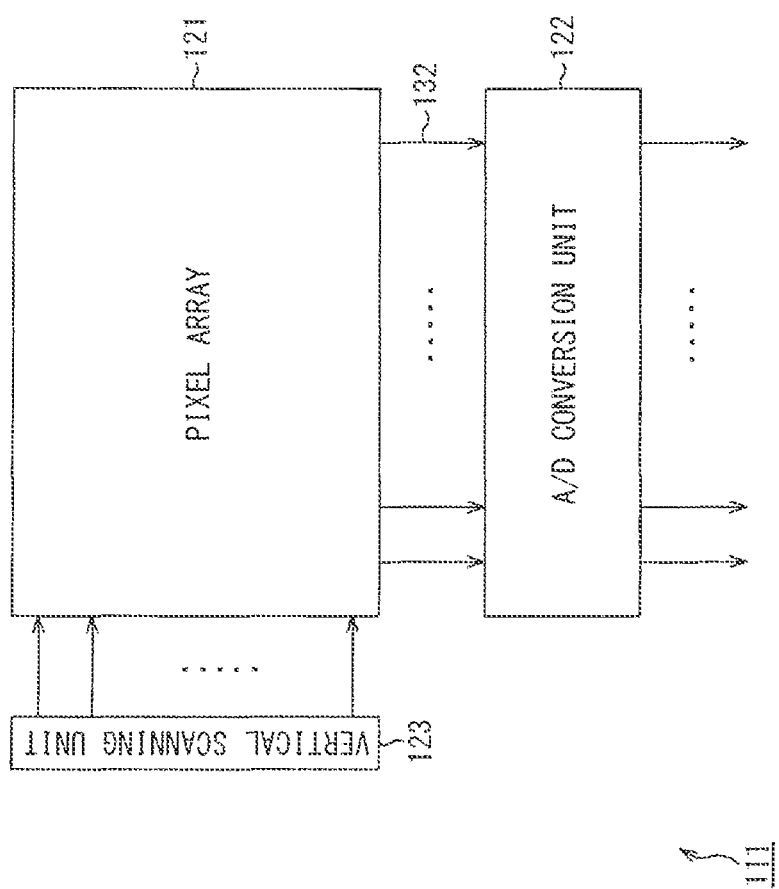

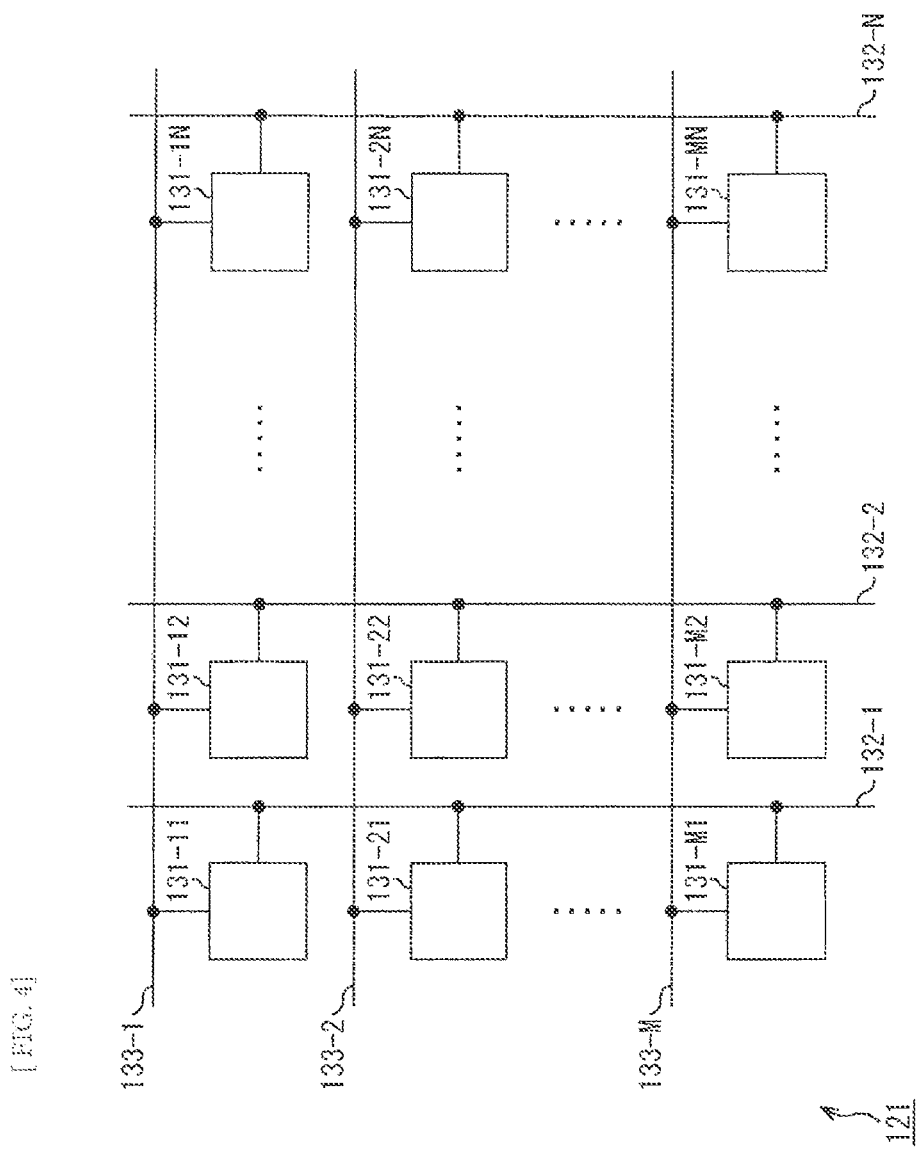
[FIG. 4]

[FIG. 5]
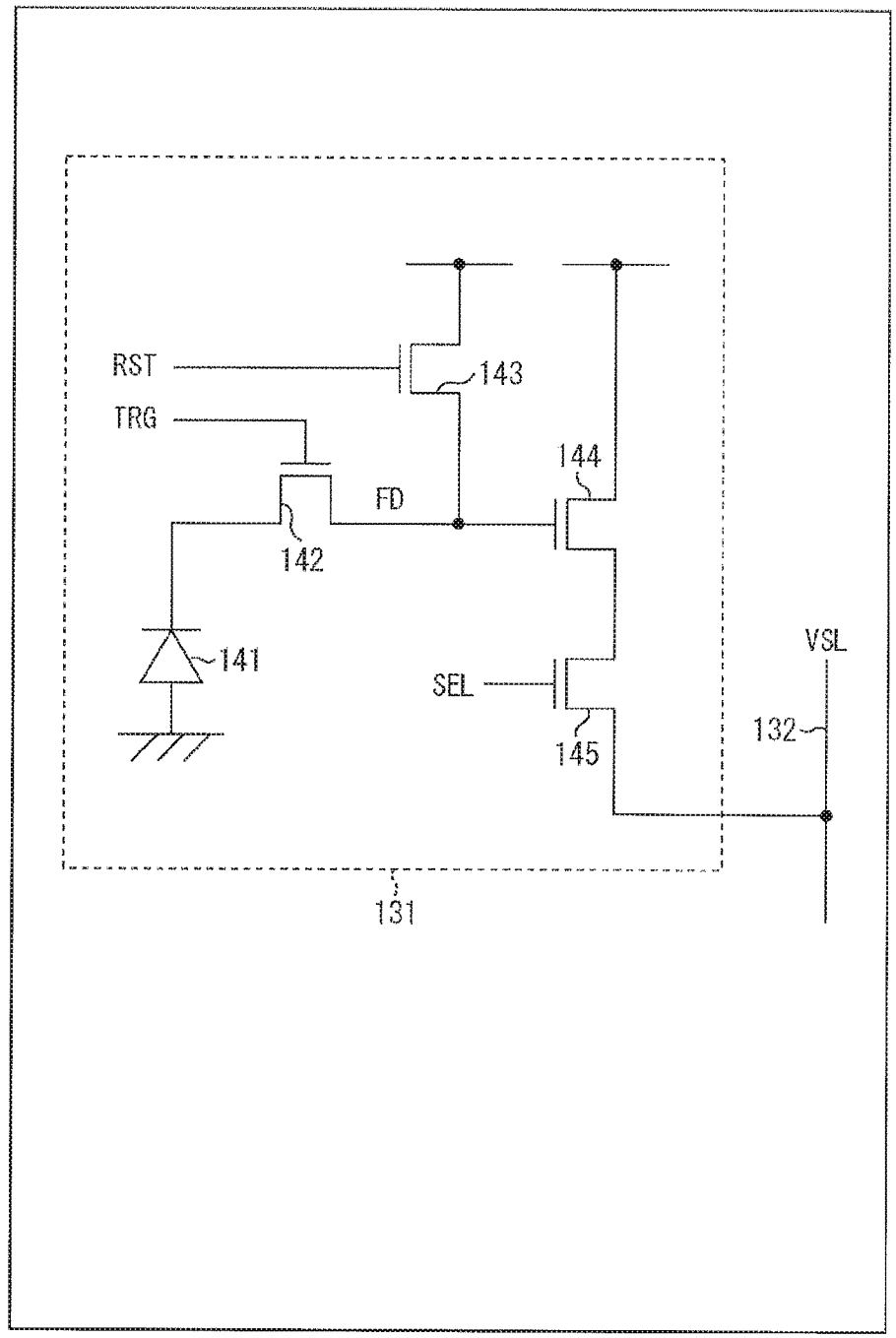

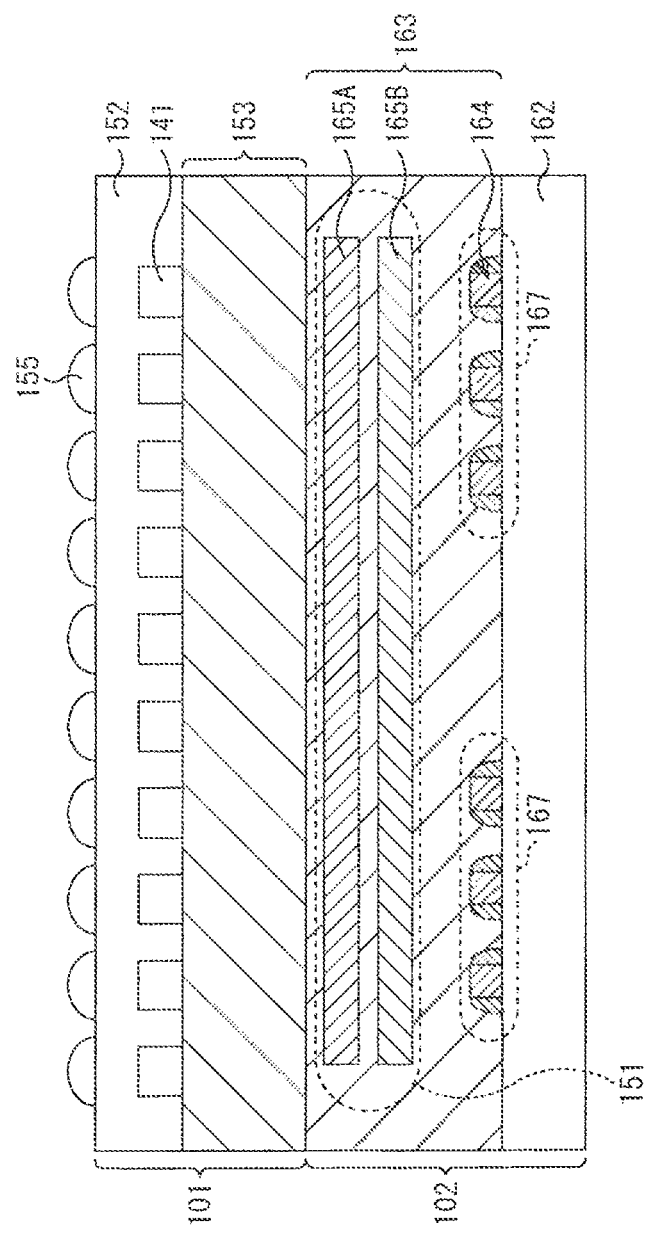

[ FIG. 7 ]
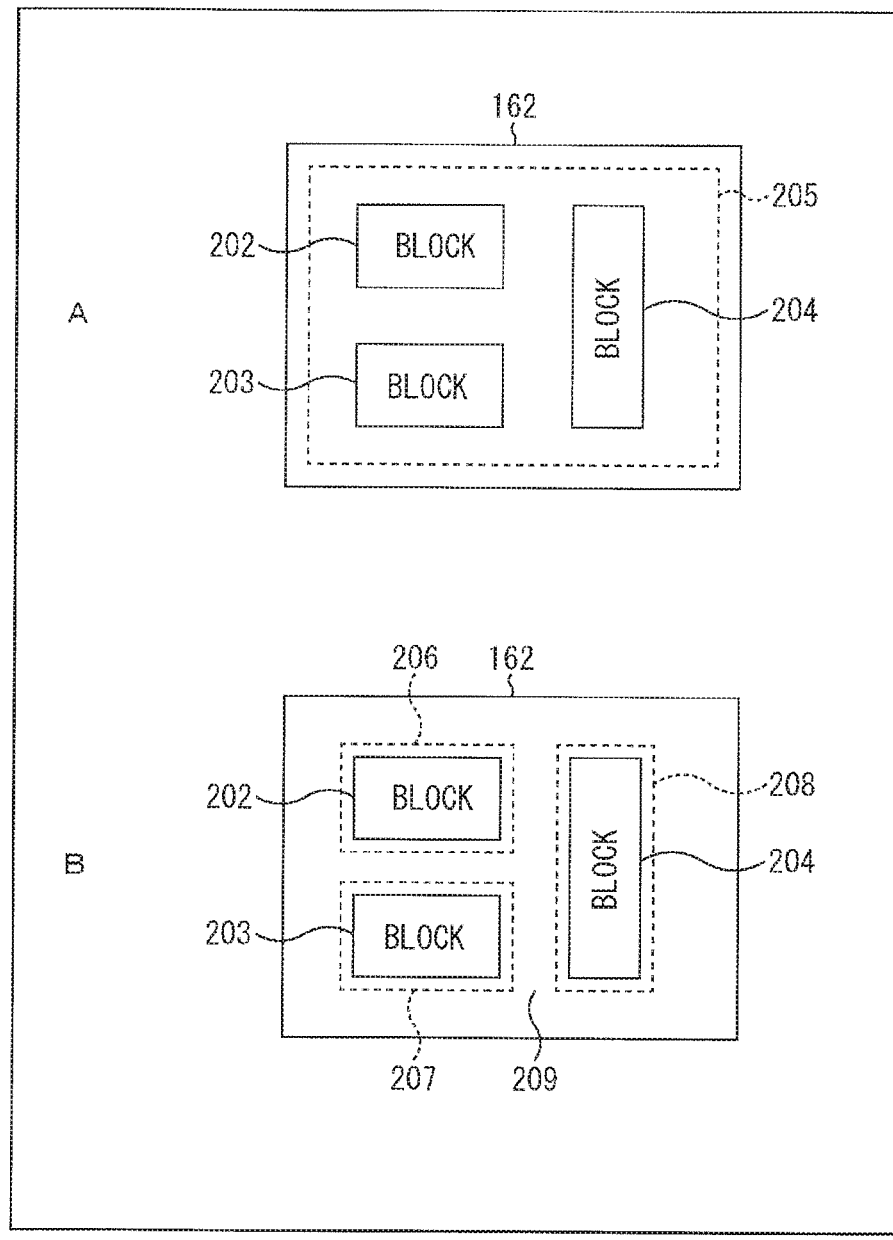

[ FIG. 8 ]
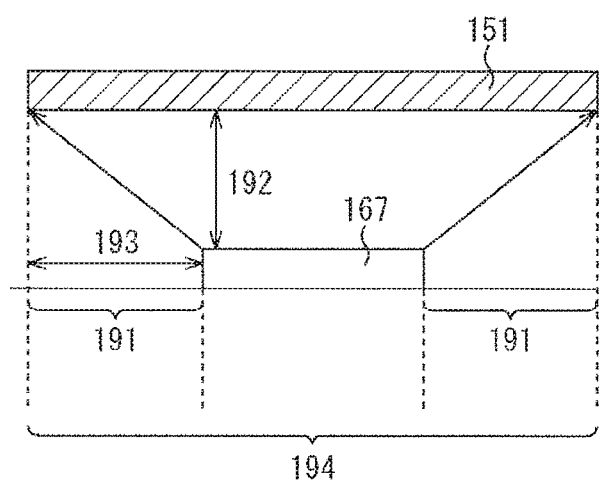

[FIG. 9]
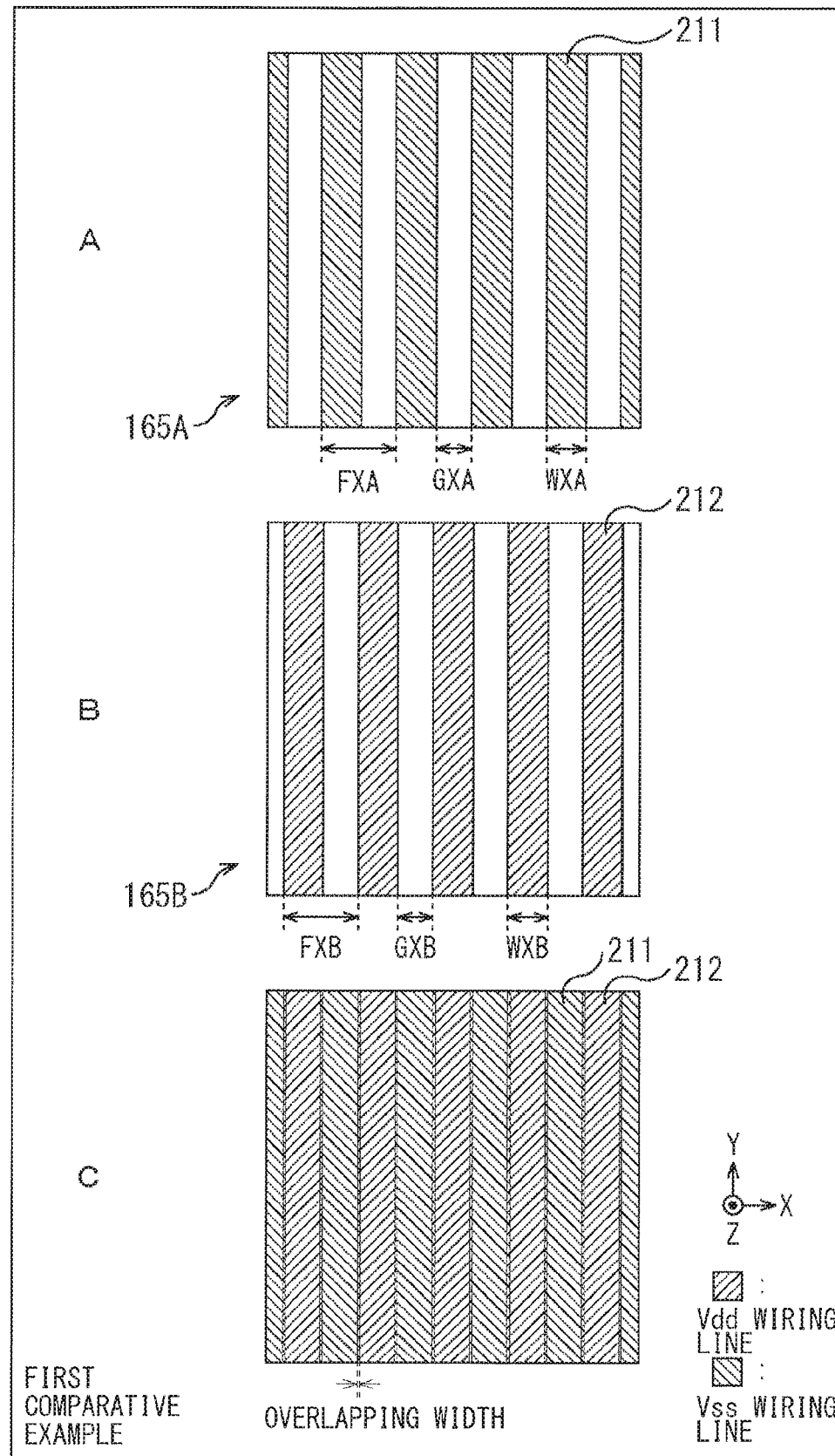

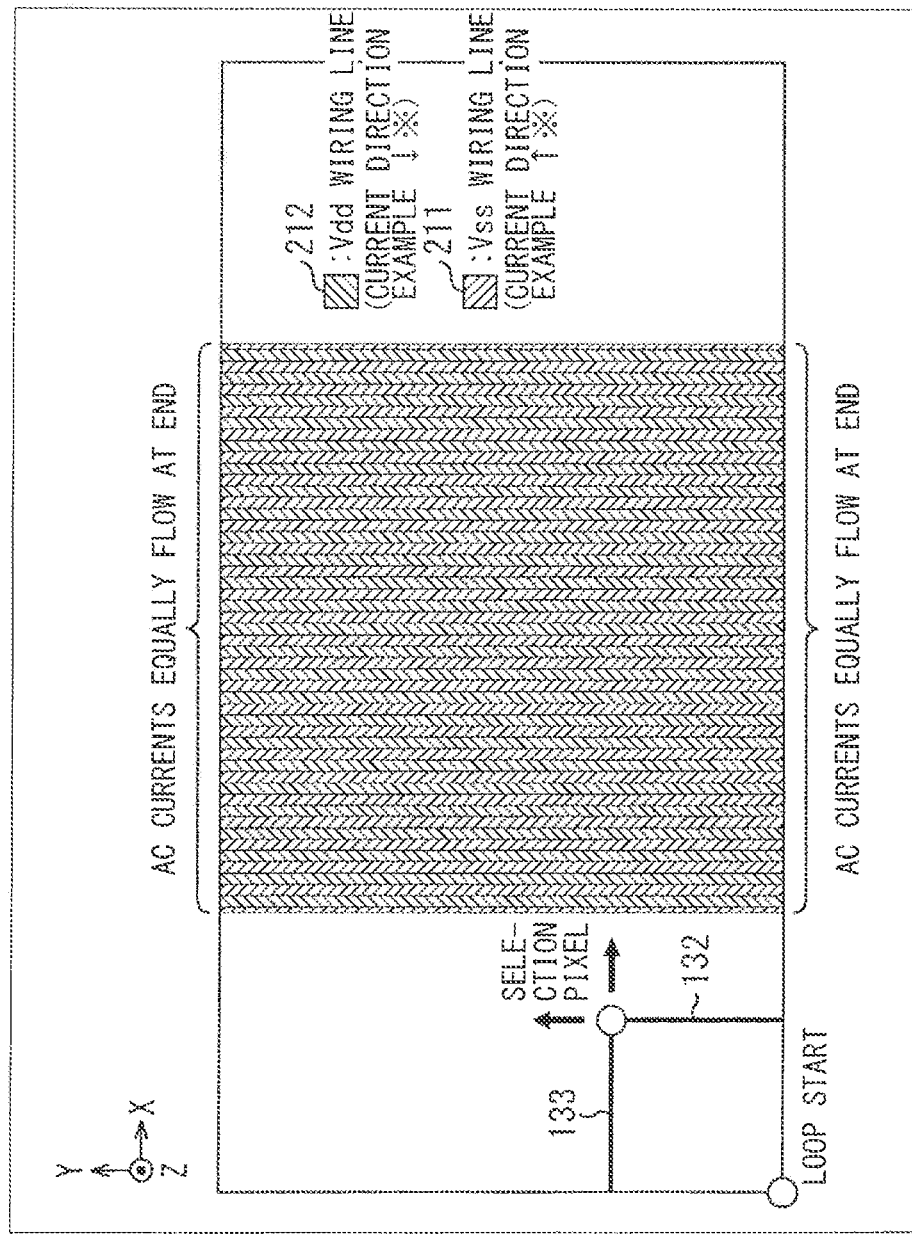

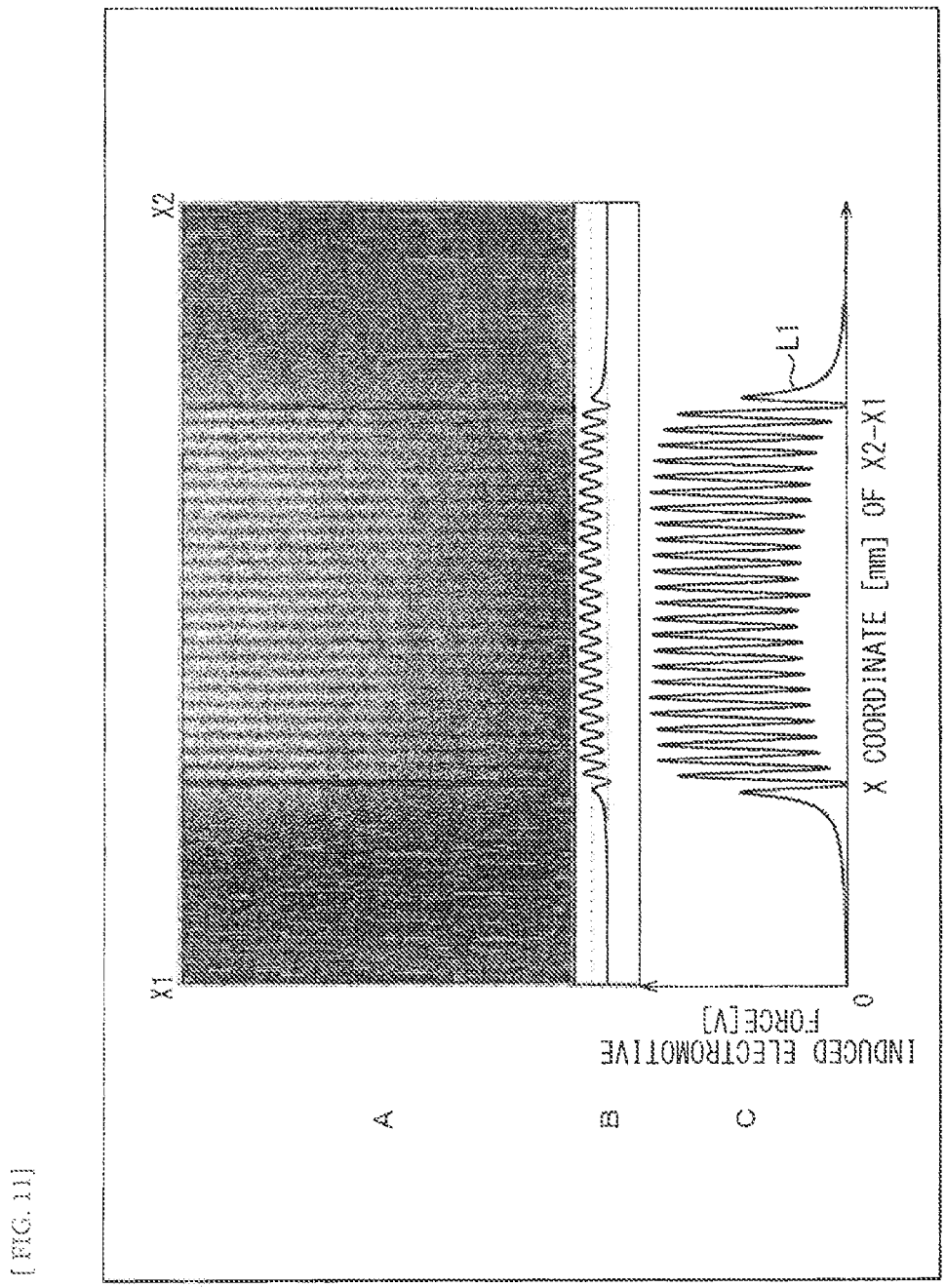
[FIG. 11]

[ FIG. 12 ]
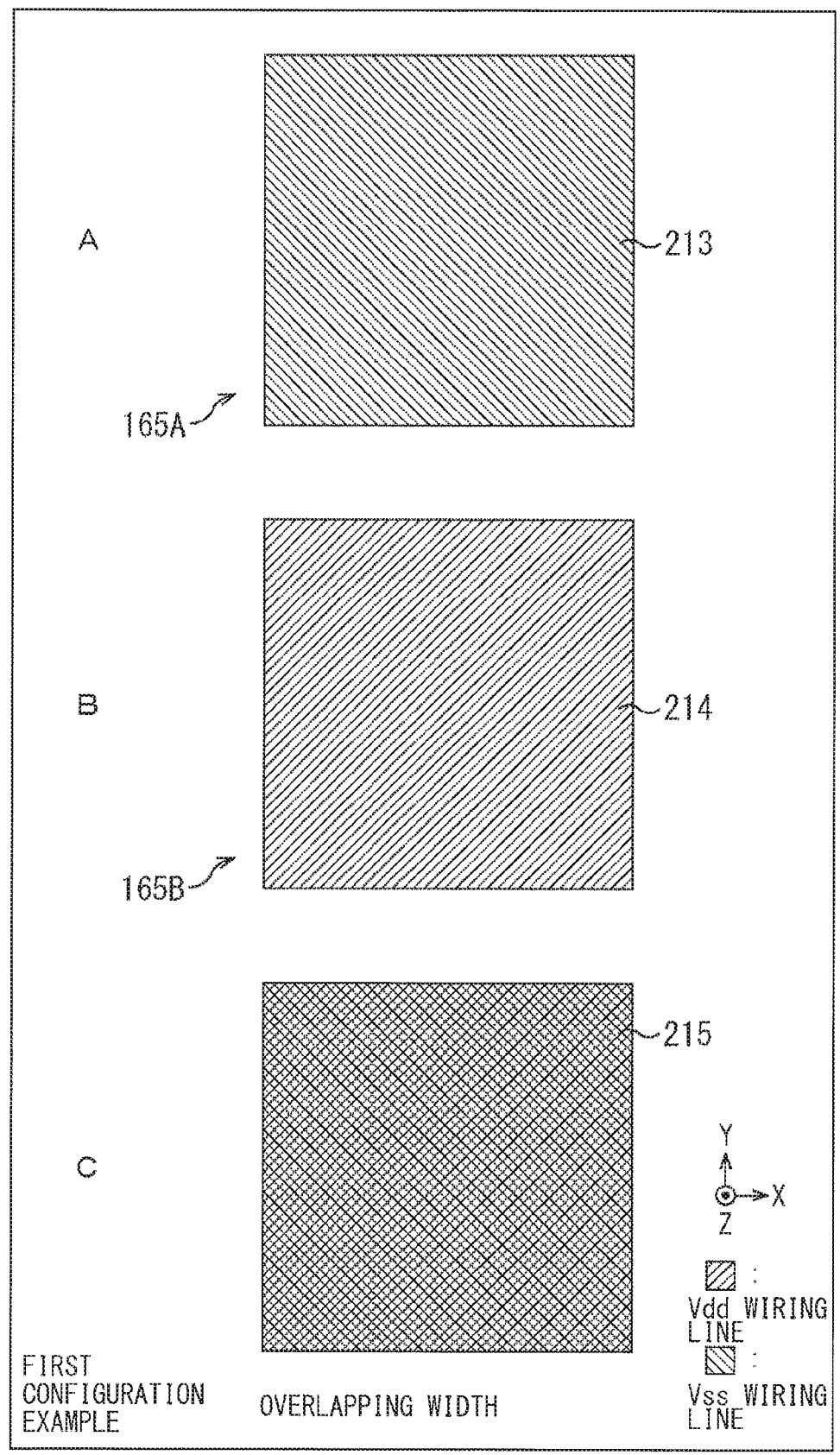

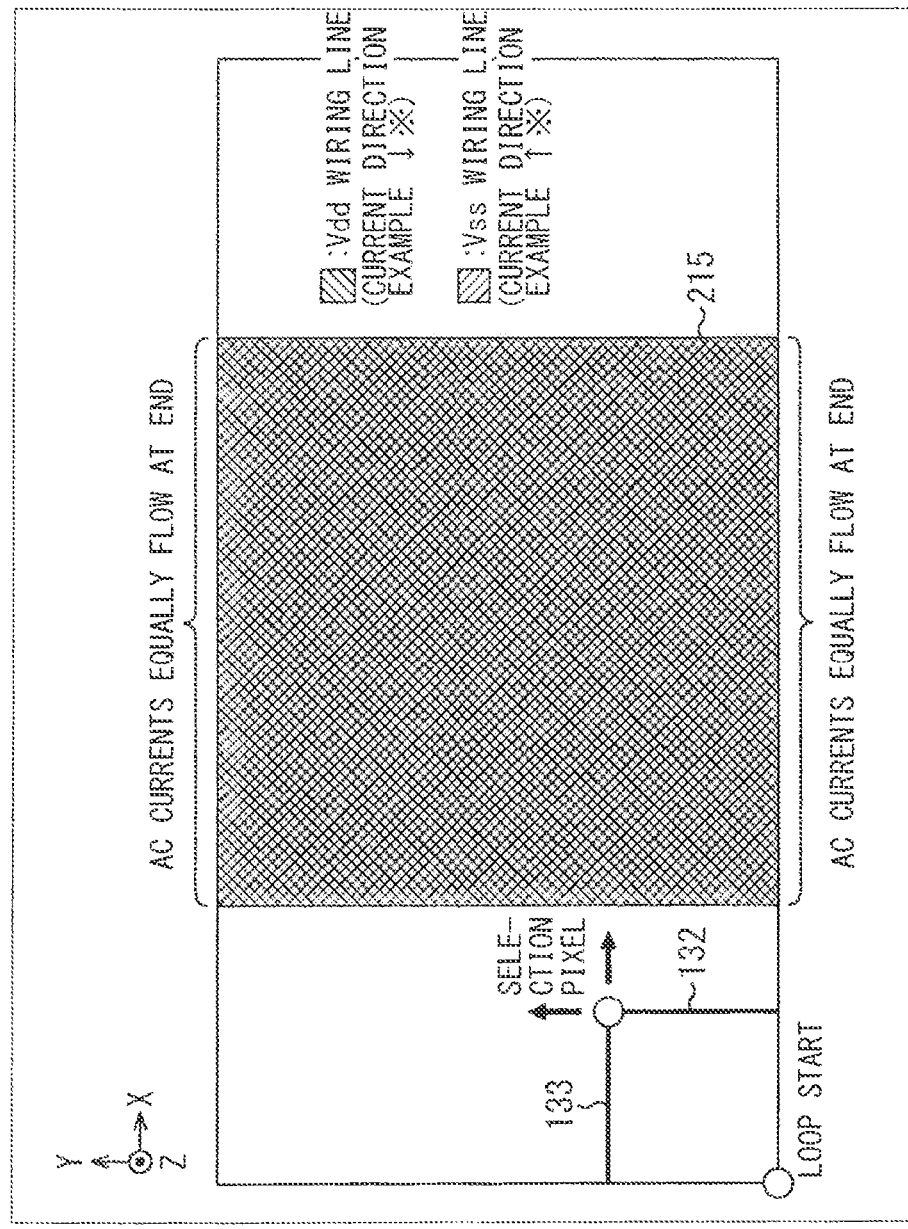

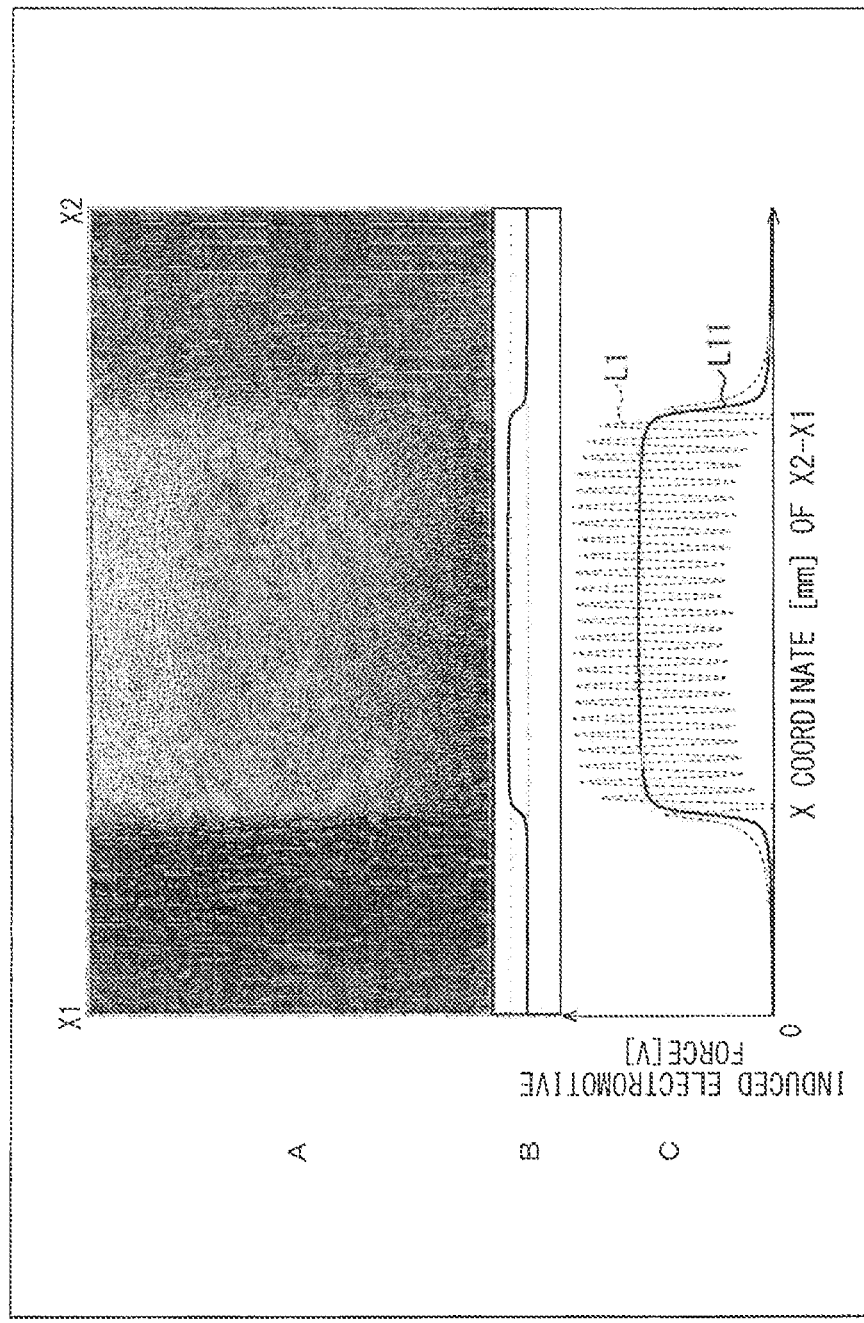

[FIG. 15]
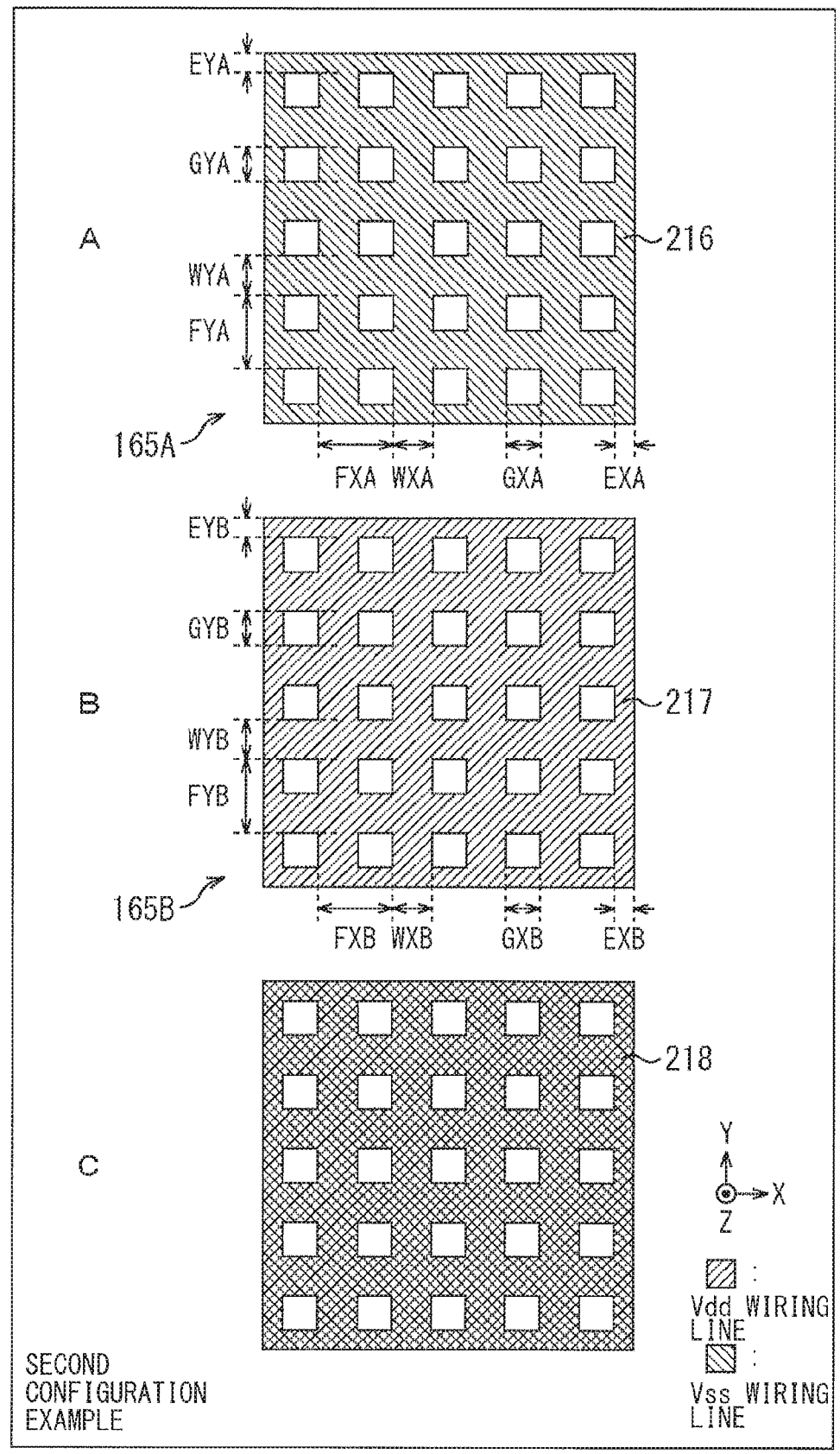

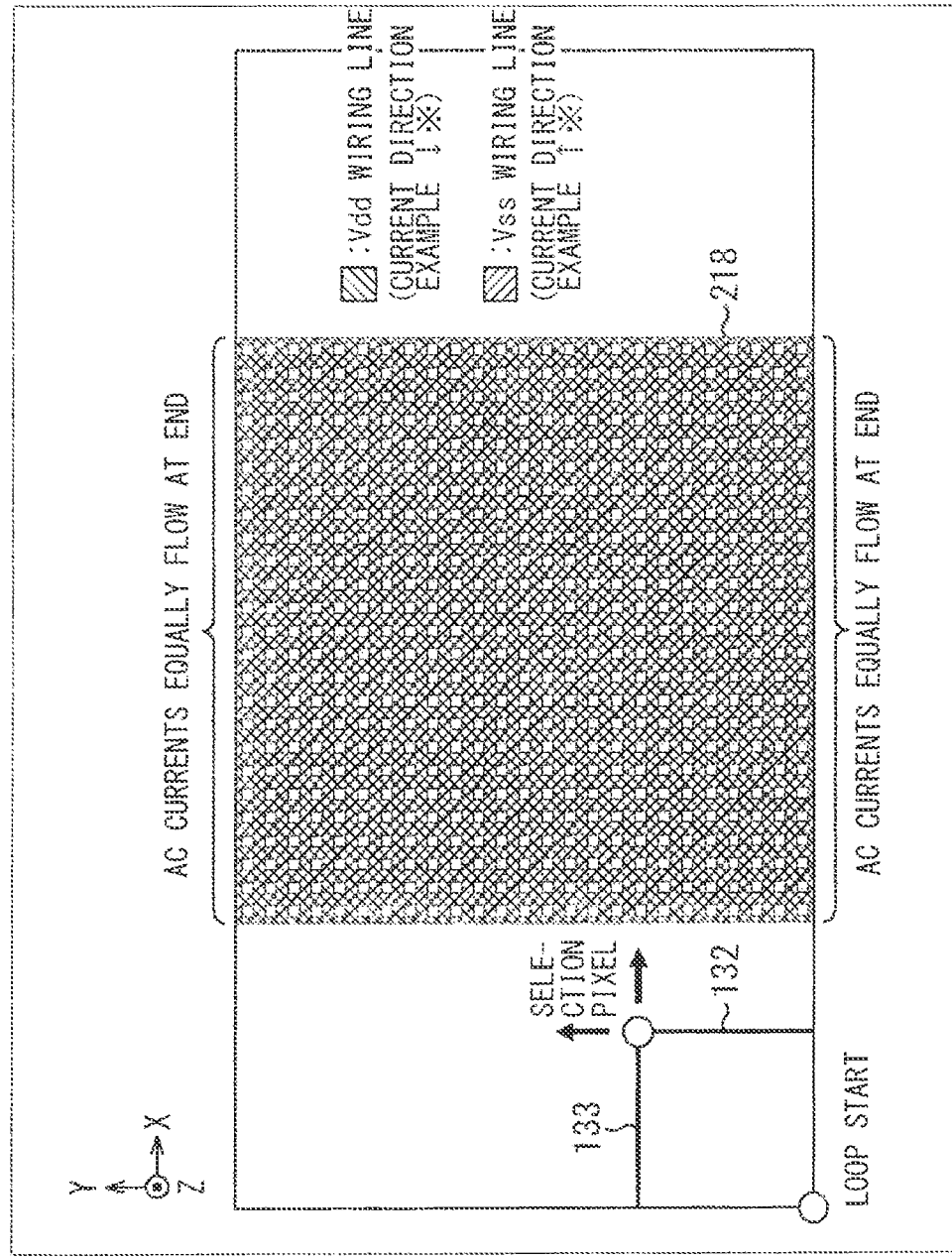

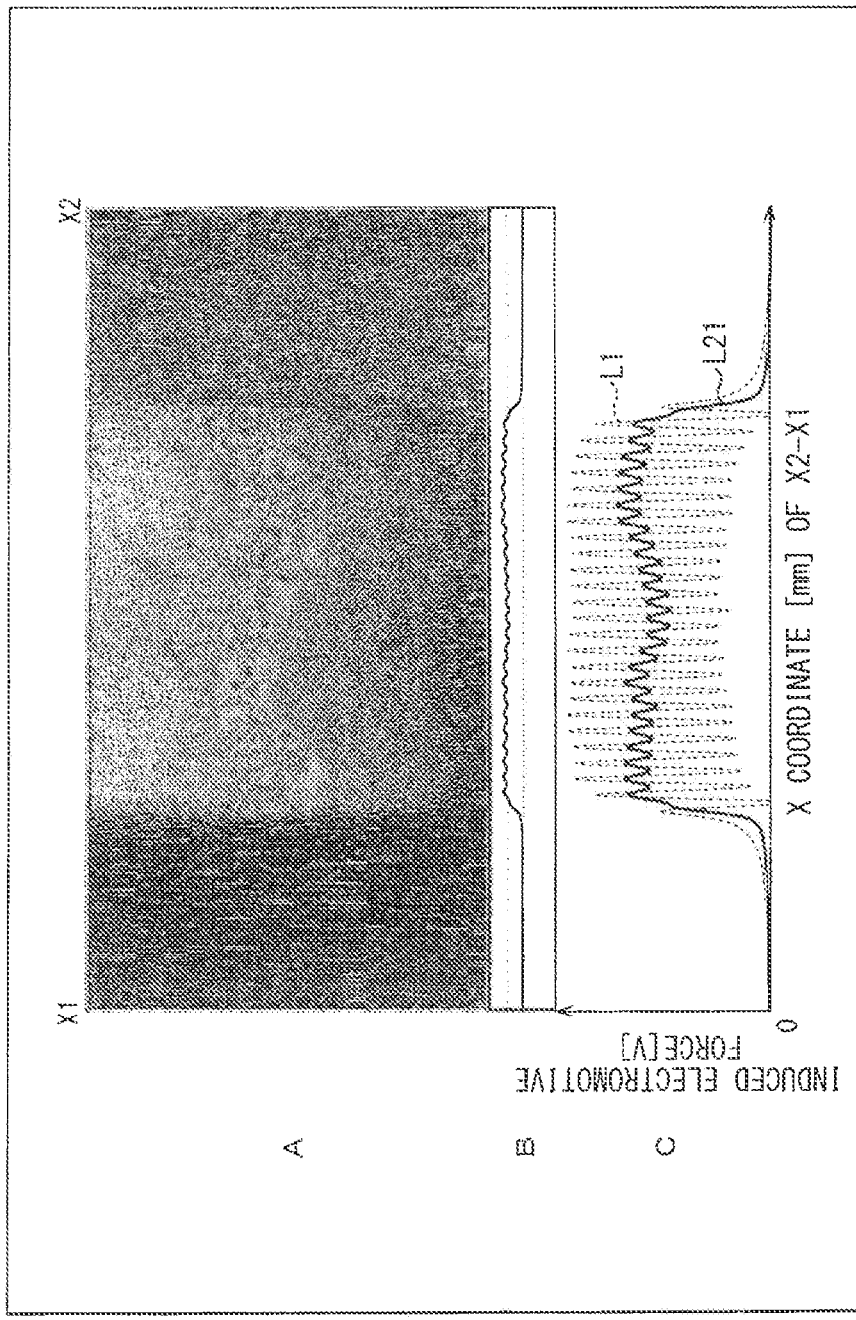

[ FIG. 18 ]
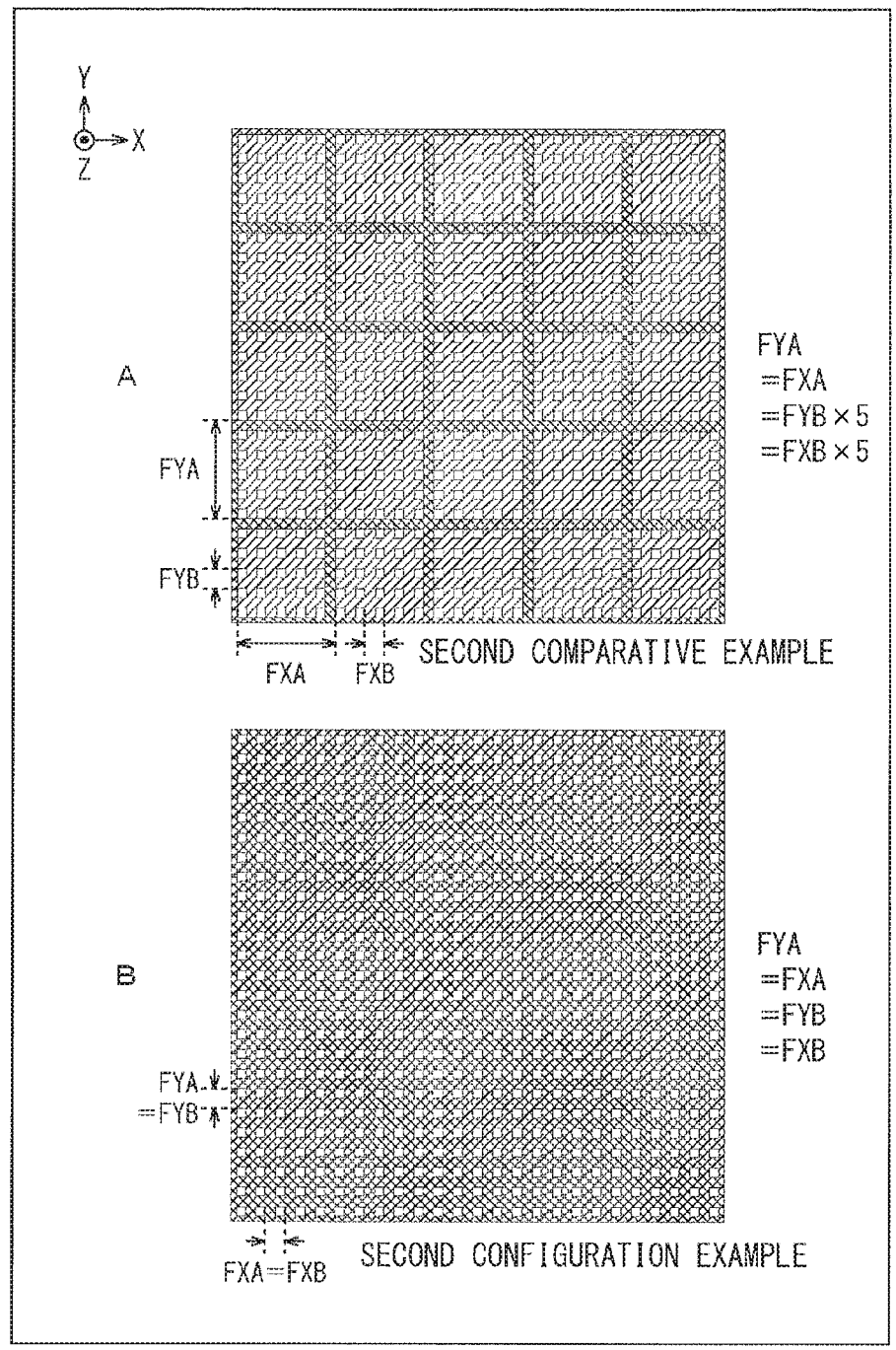

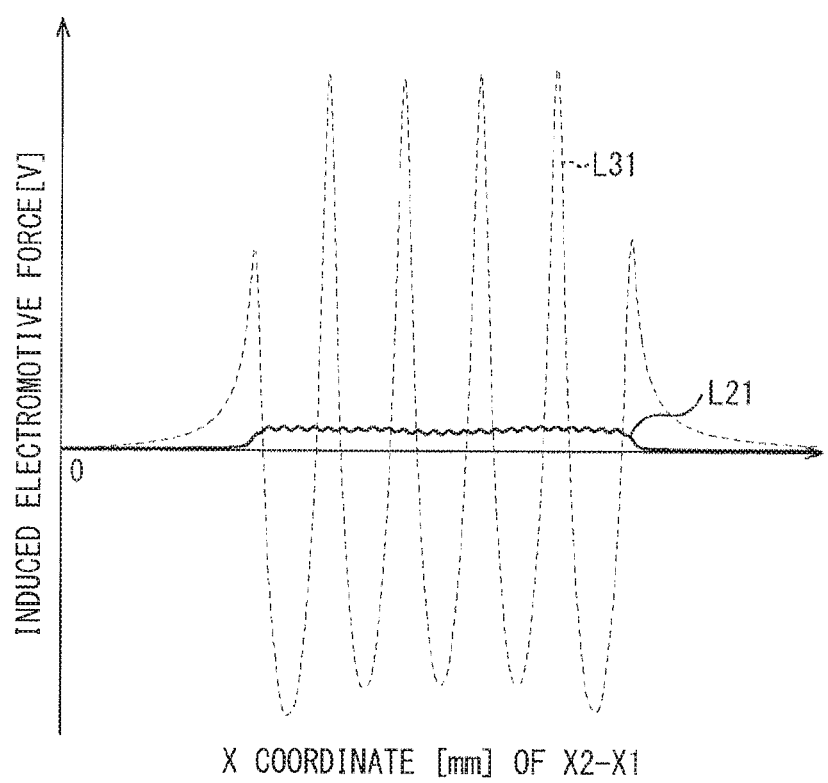
[ FIG. 19 ]

[FIG. 20]
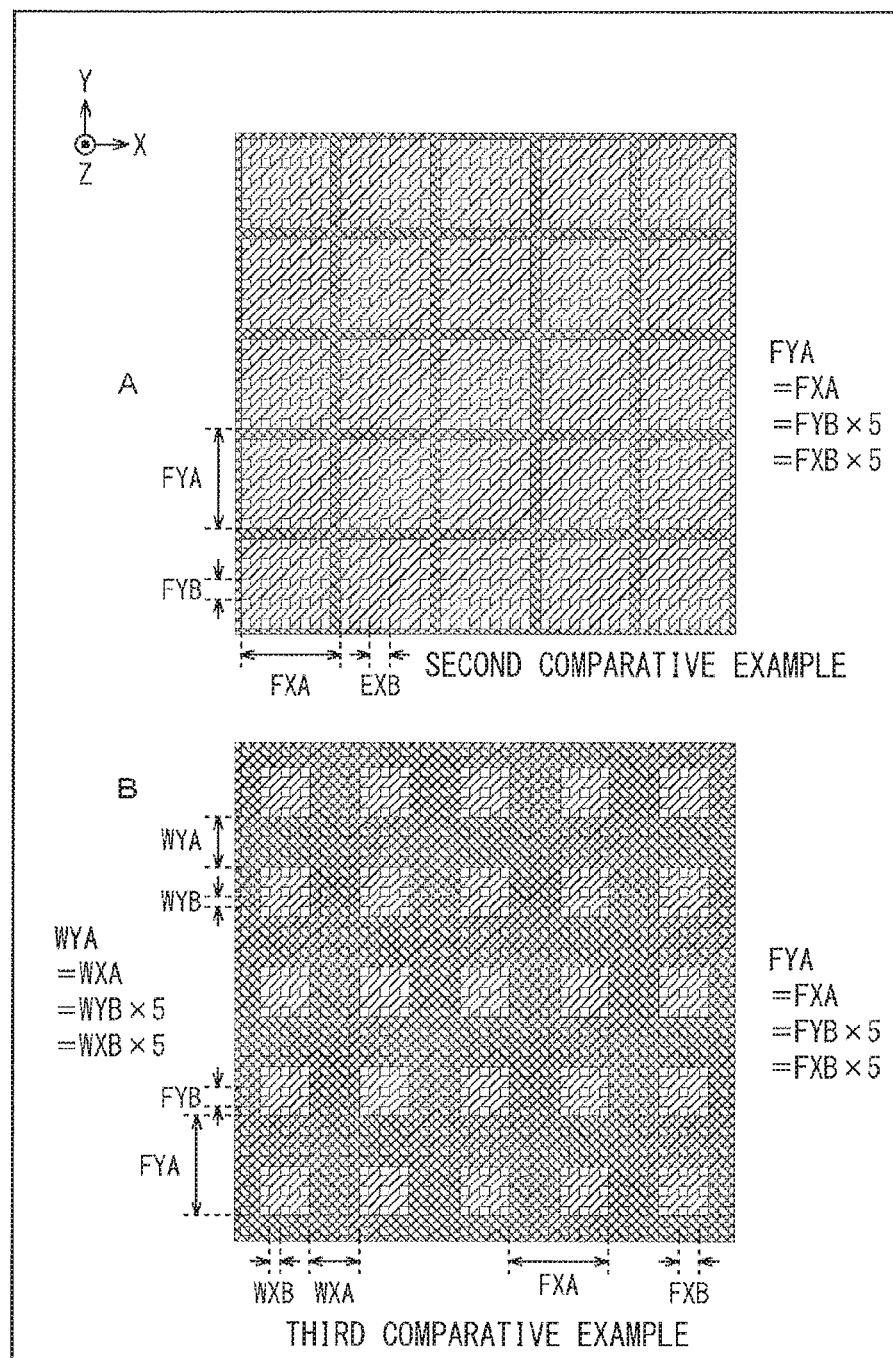

[ FIG. 21 ]
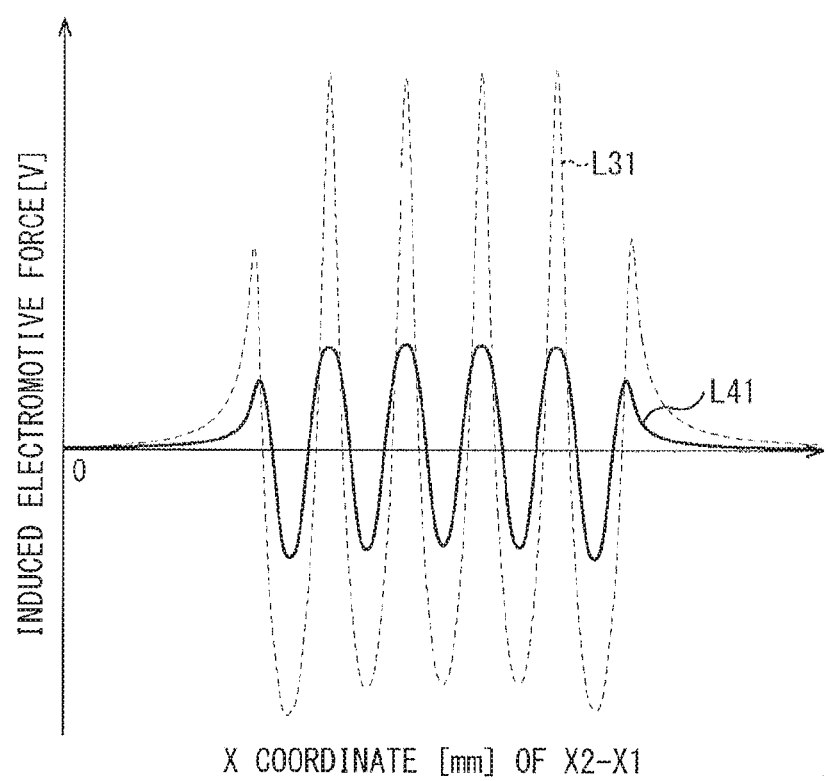

[FIG. 22]
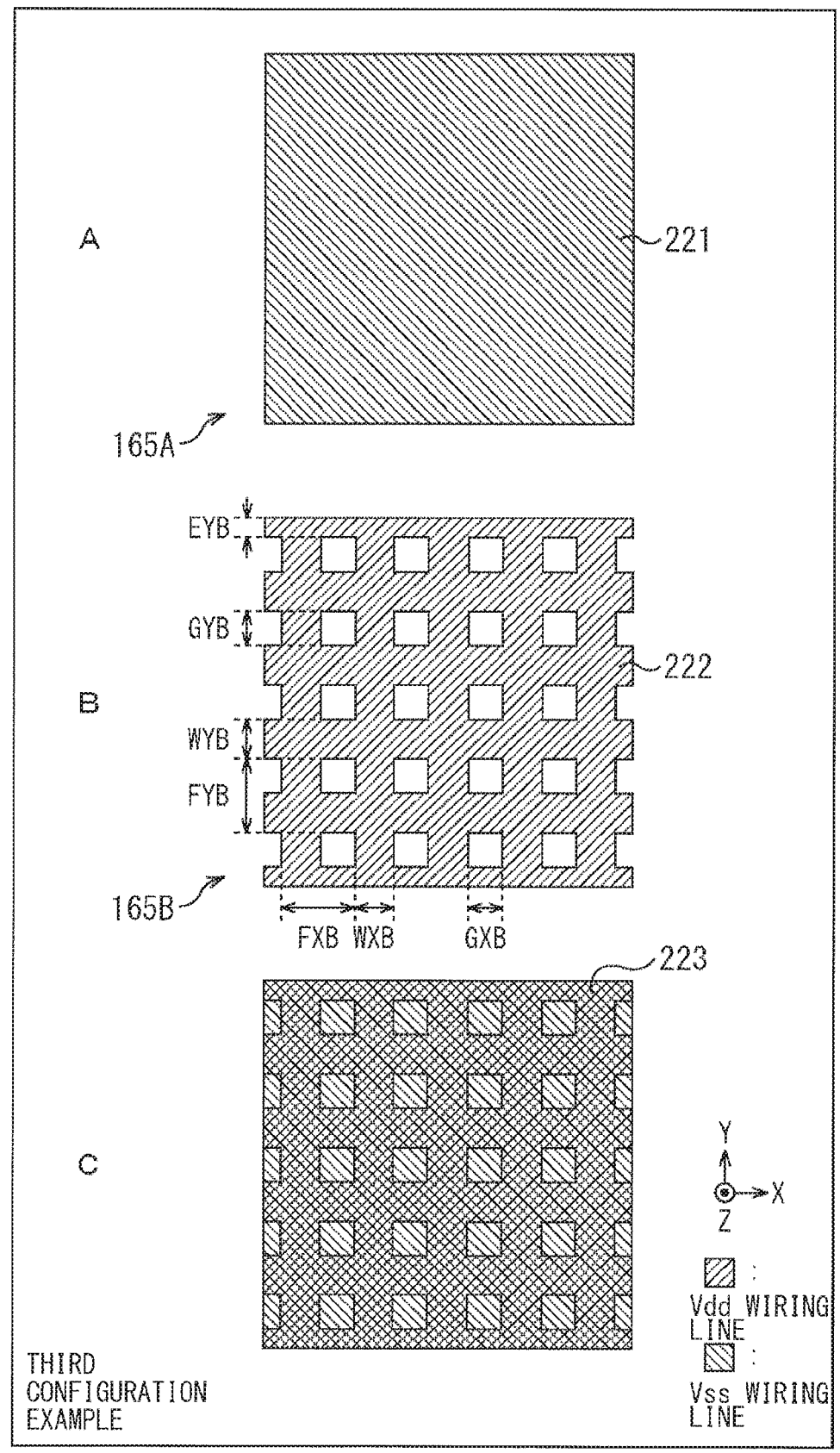

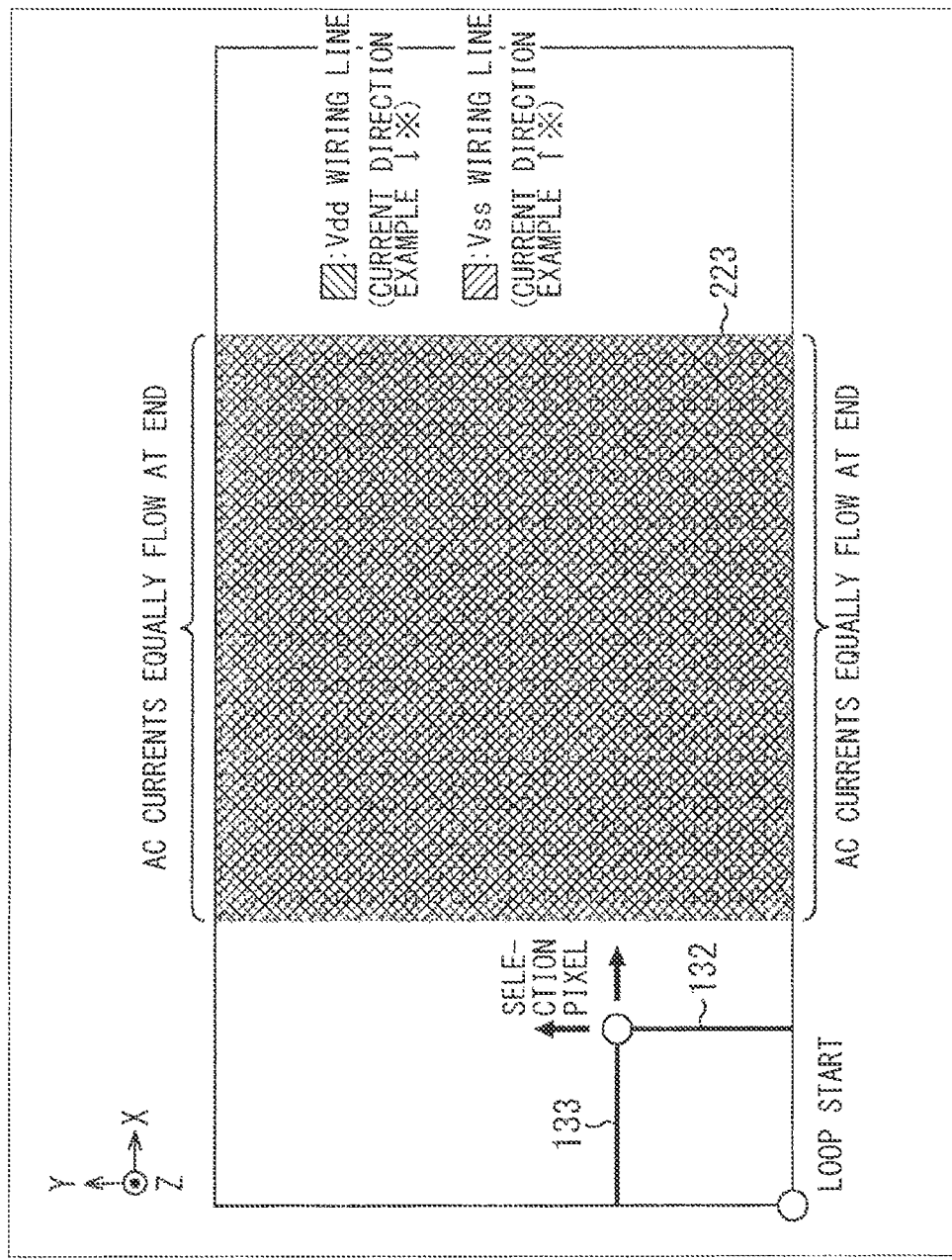

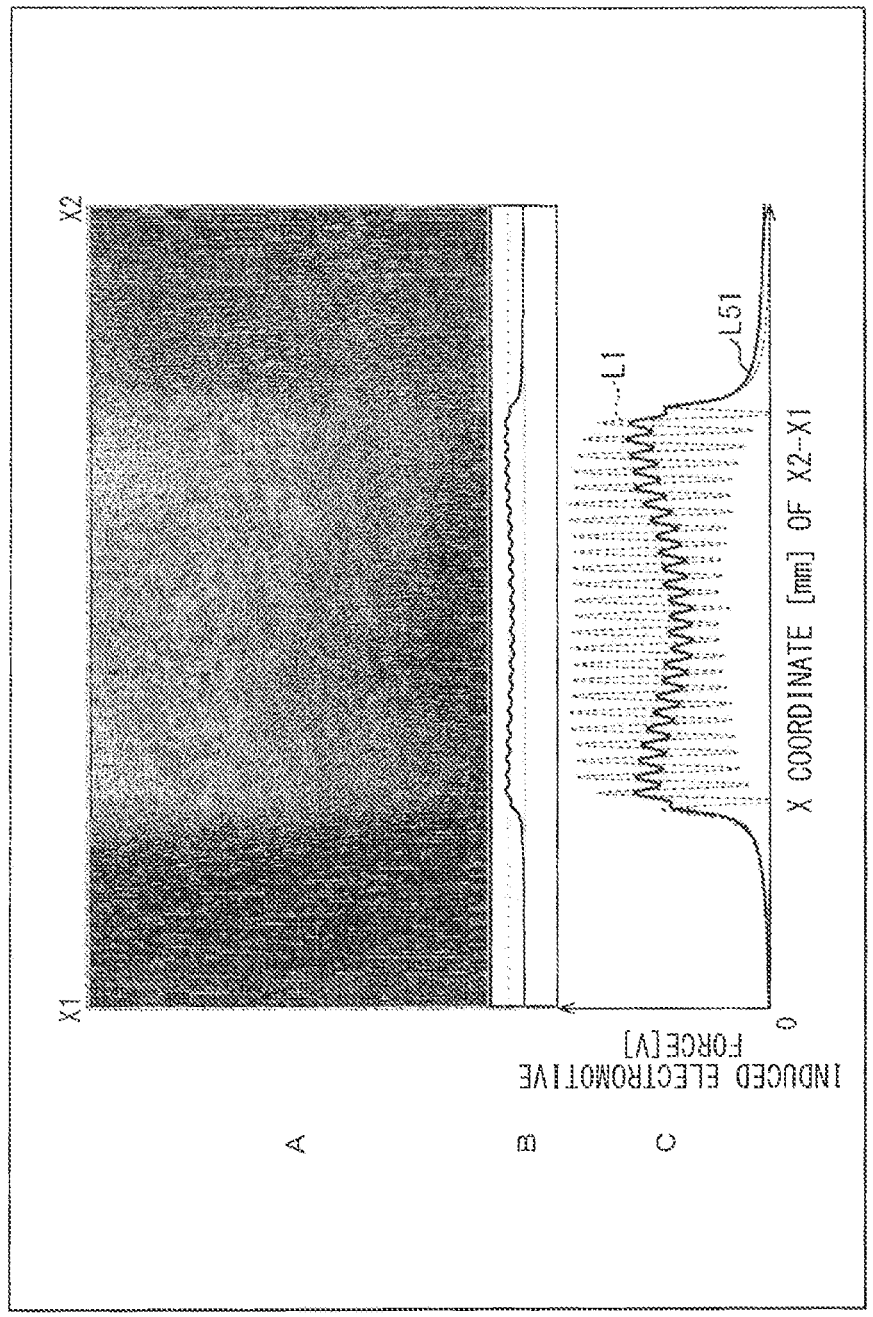
[FIG. 24]

[FIG. 25]
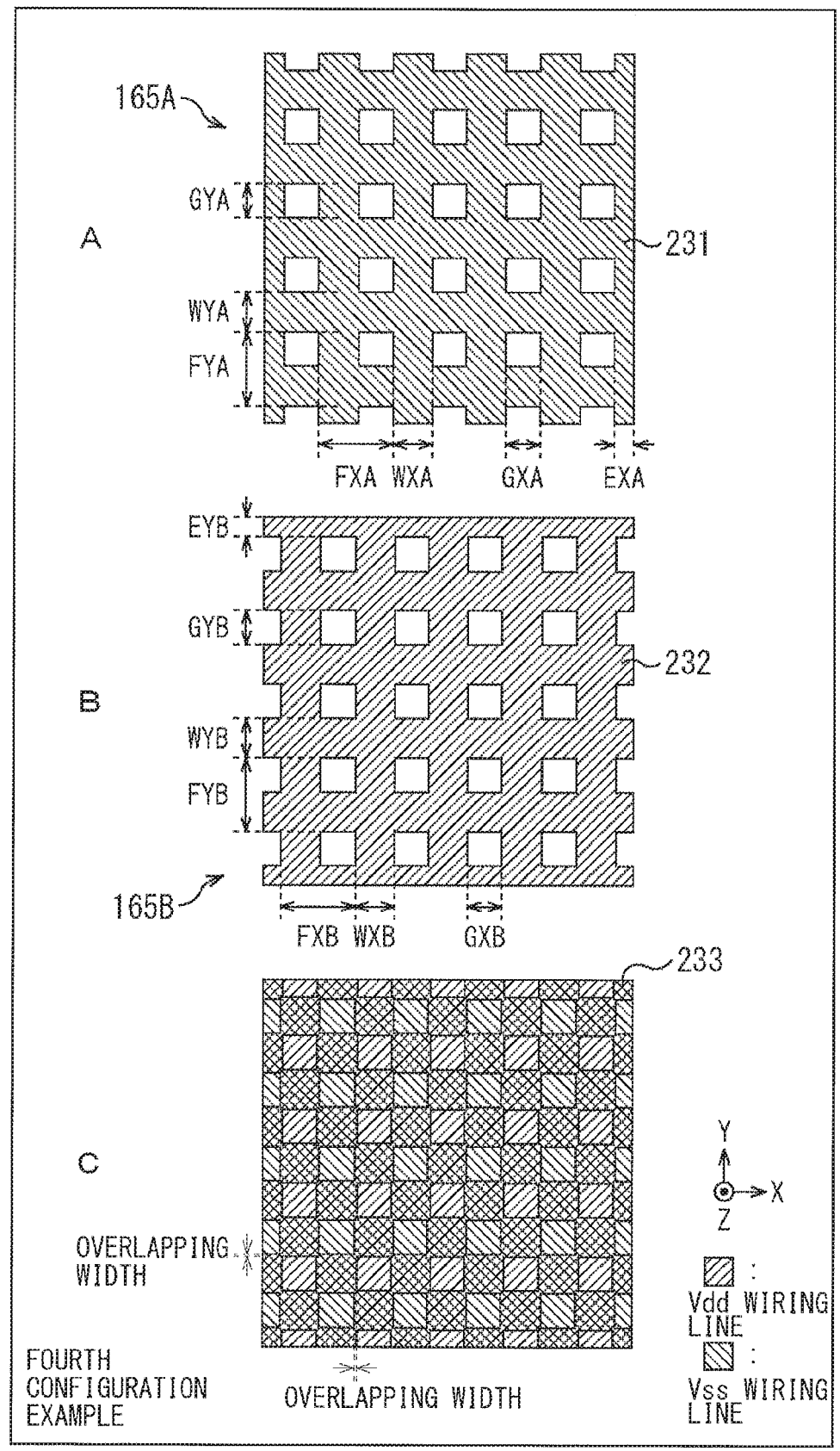

[FIG. 26]
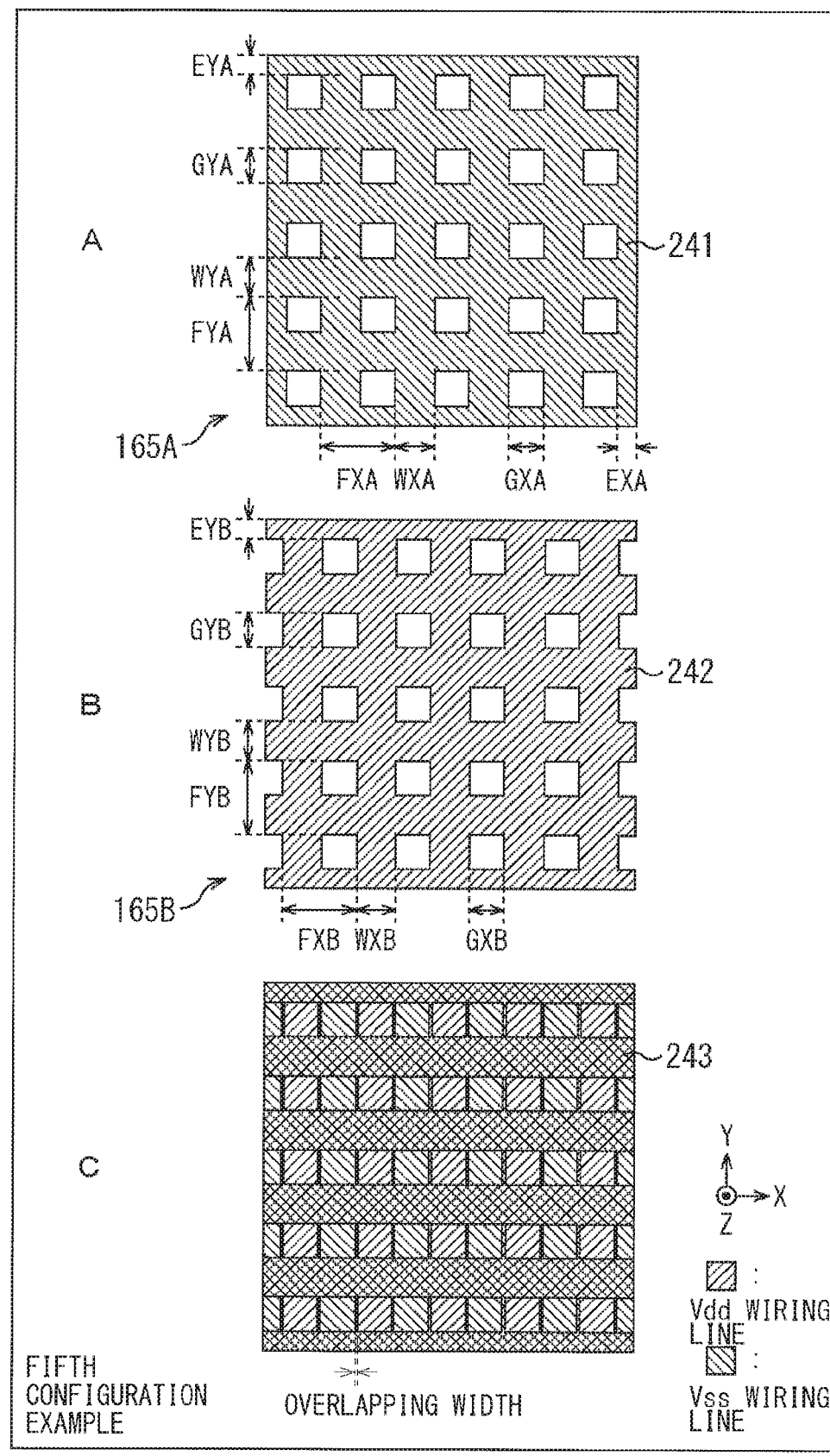

[FIG. 27]
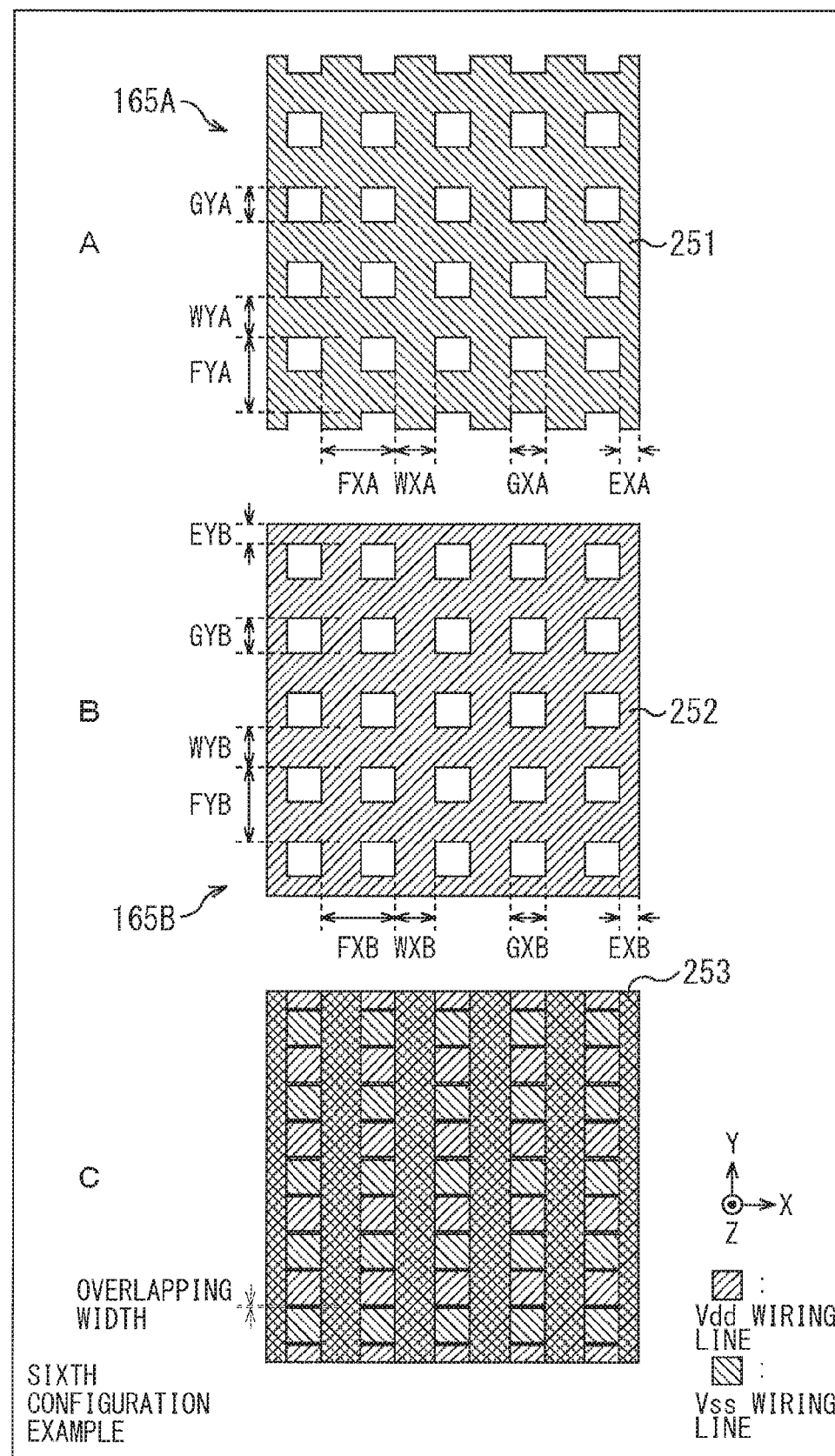

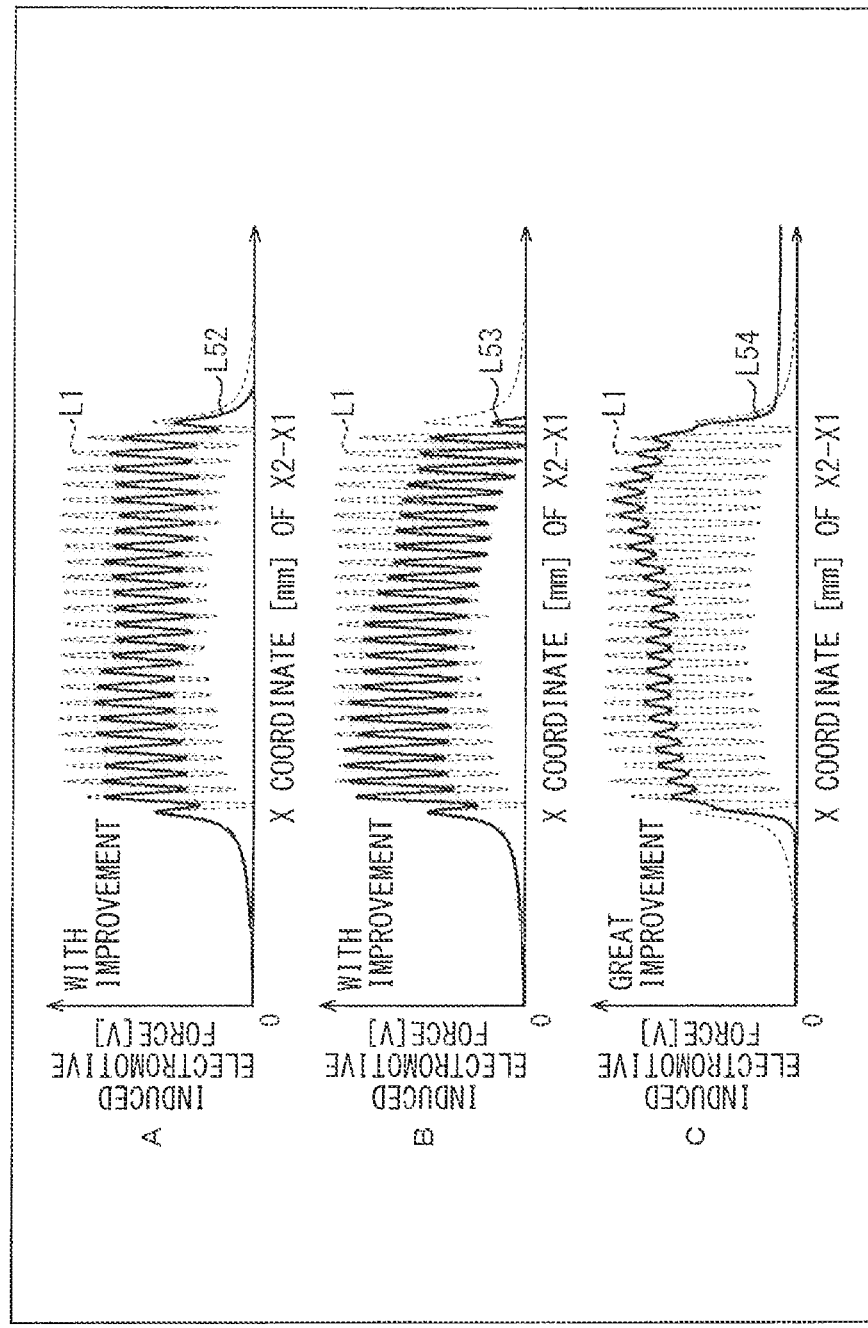
[FIG. 28]

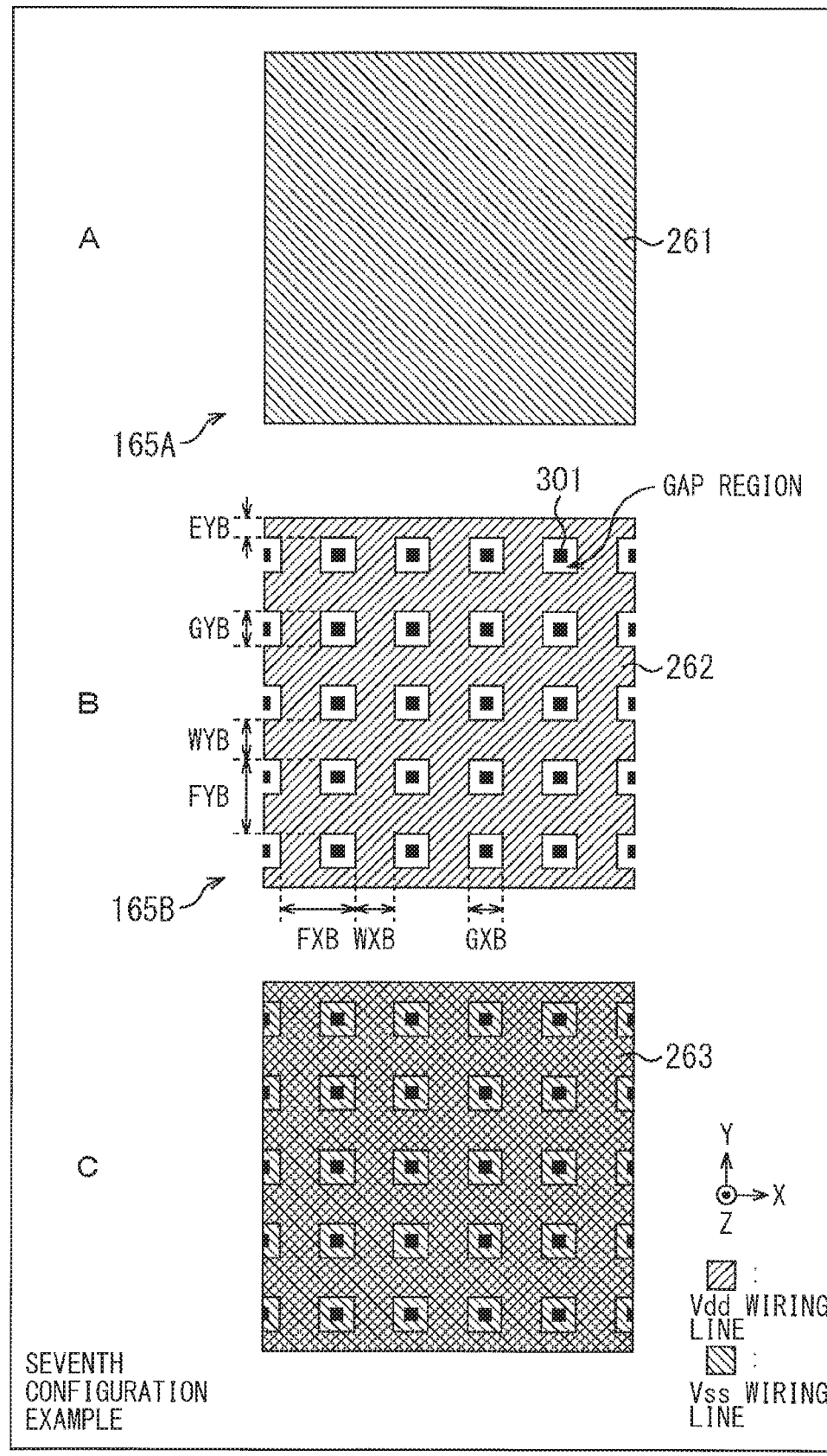
[FIG. 29]

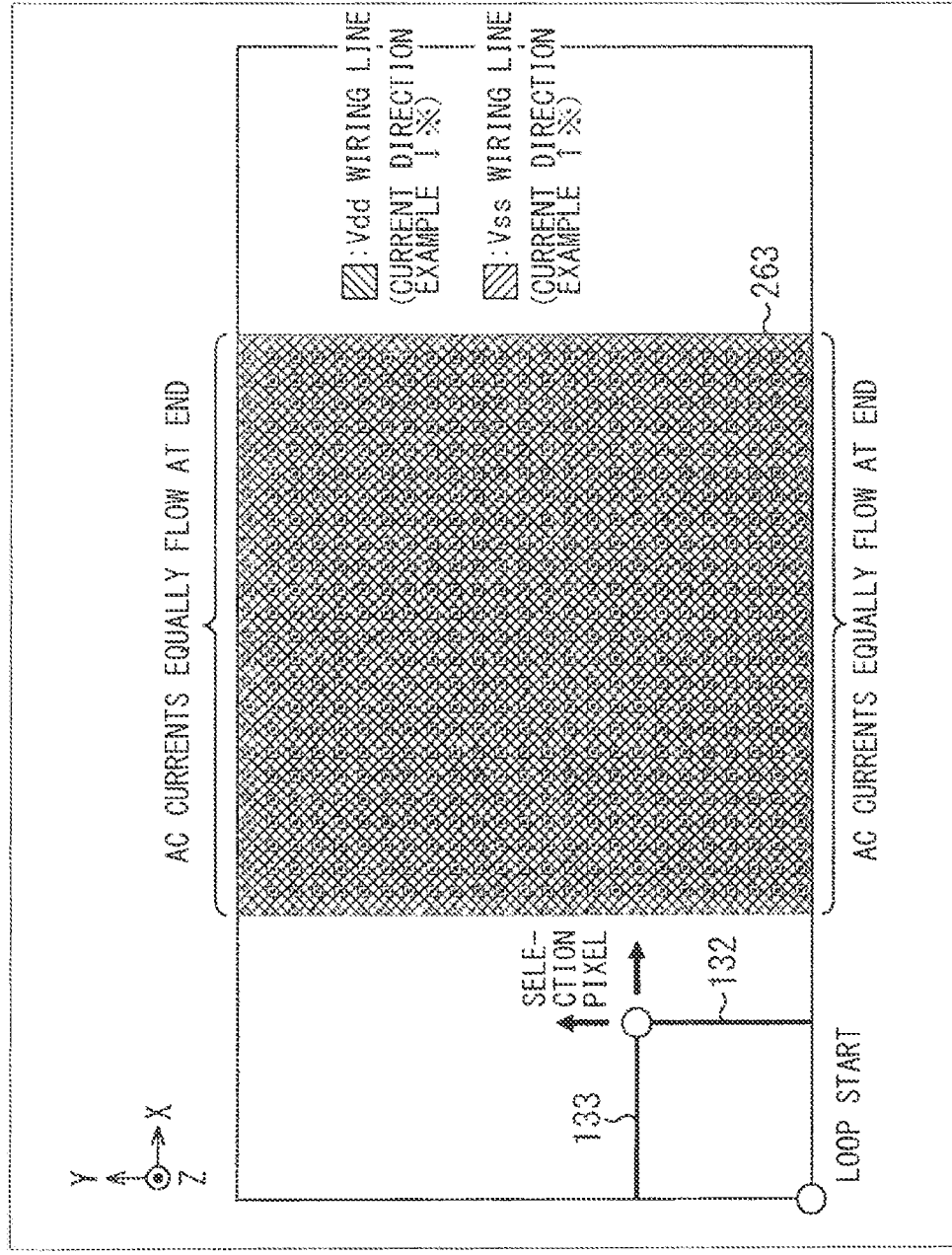
[FIG. 30]

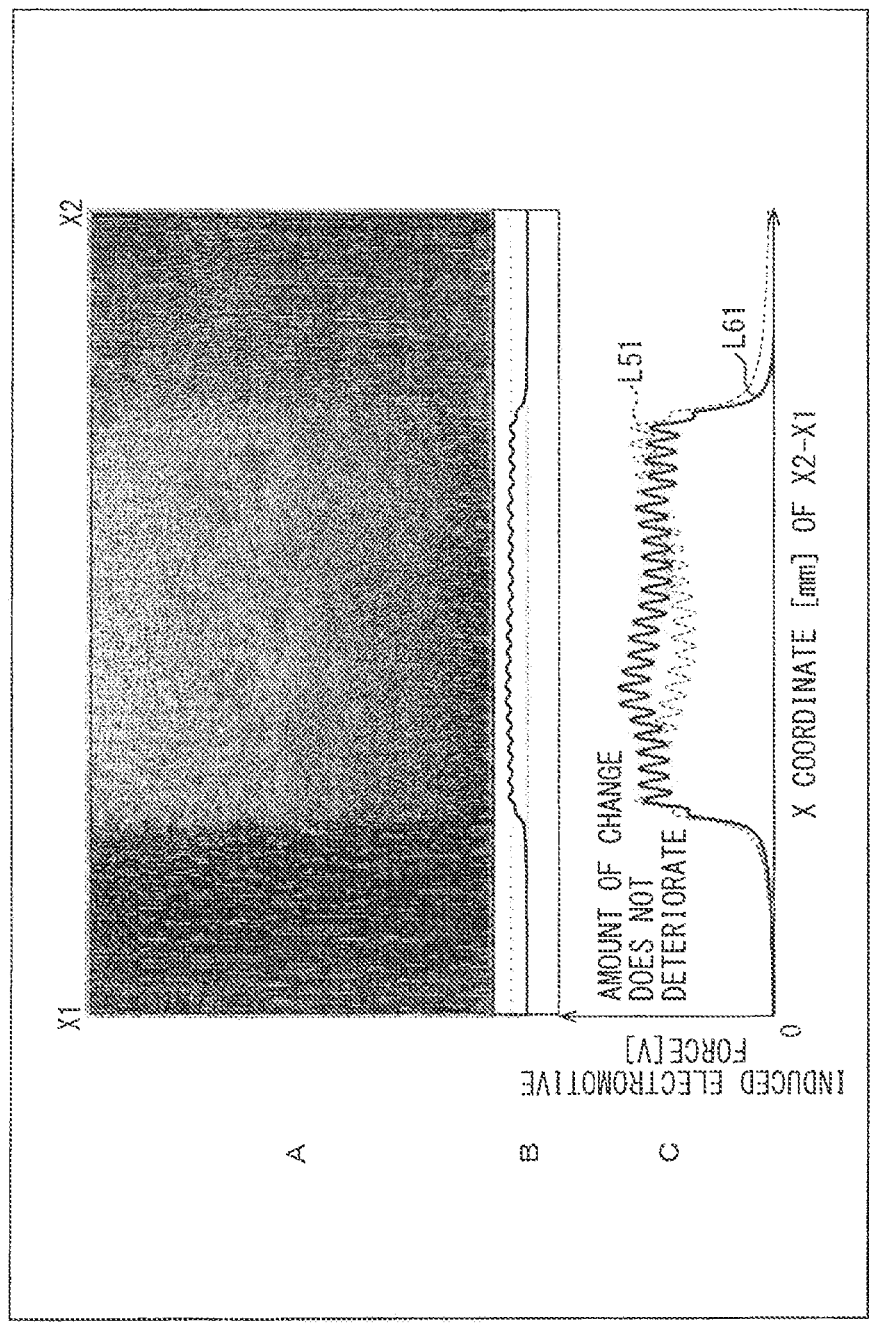

[FIG. 32]
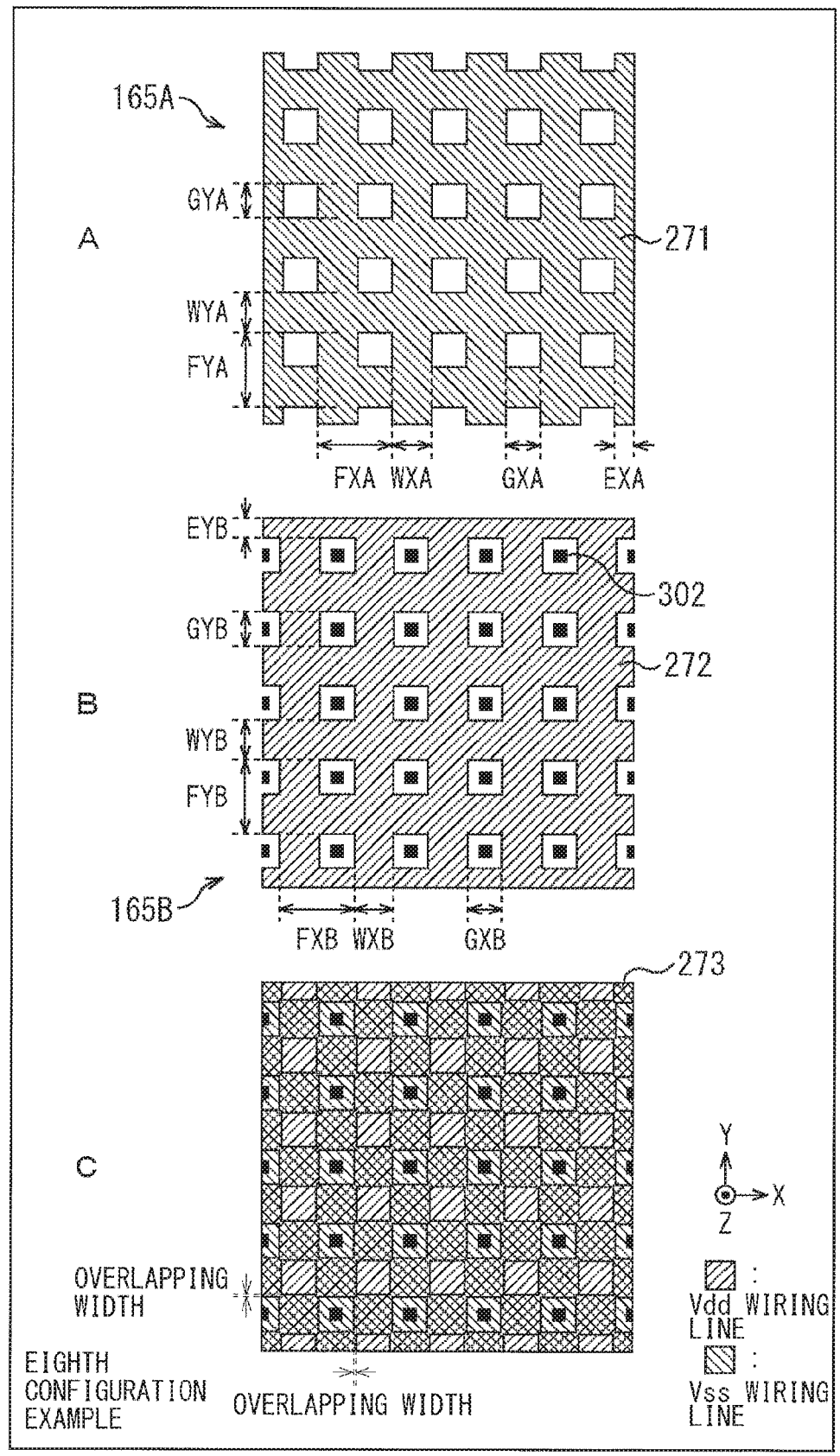

[FIG. 33]
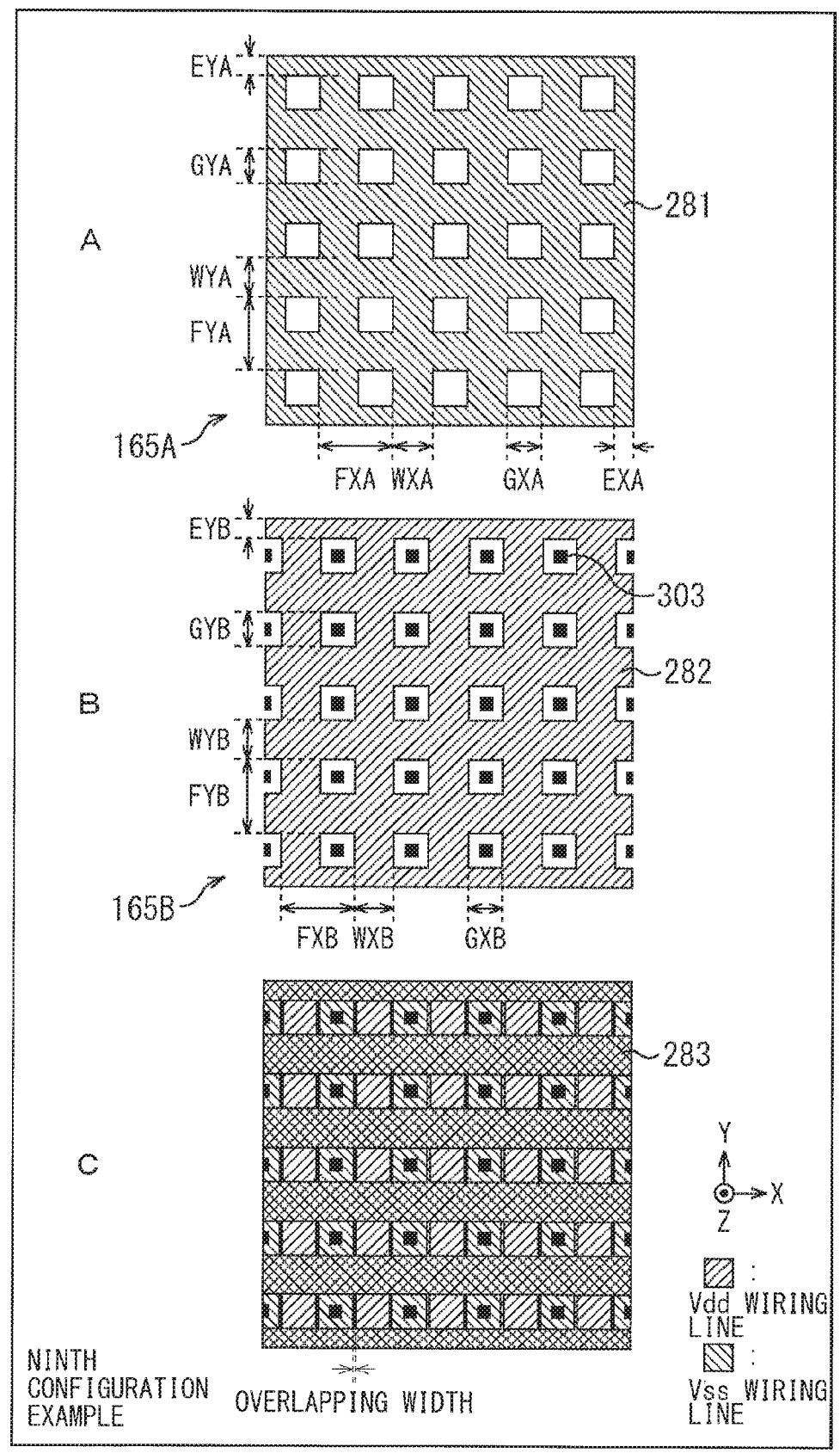

[FIG. 34]
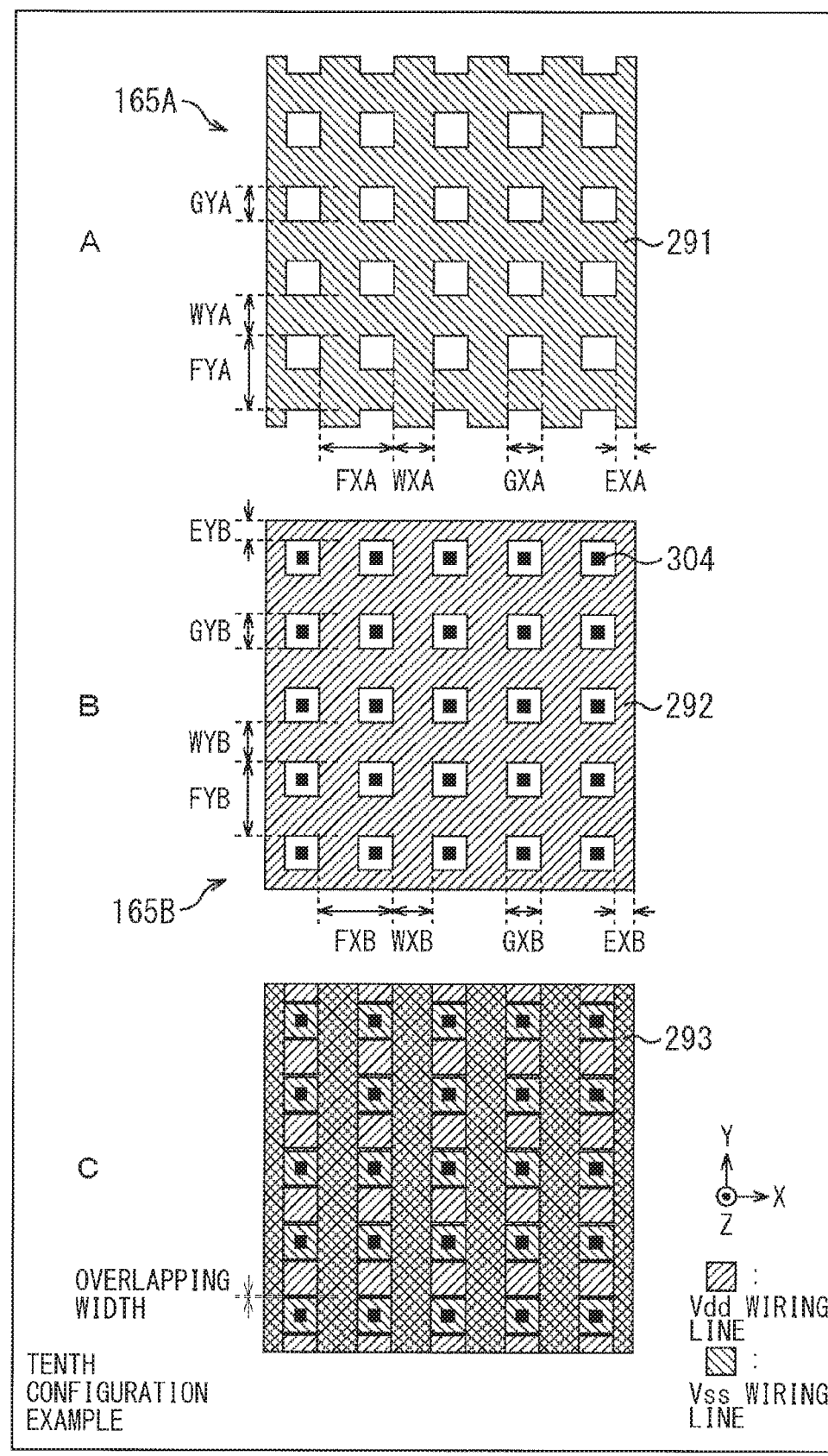

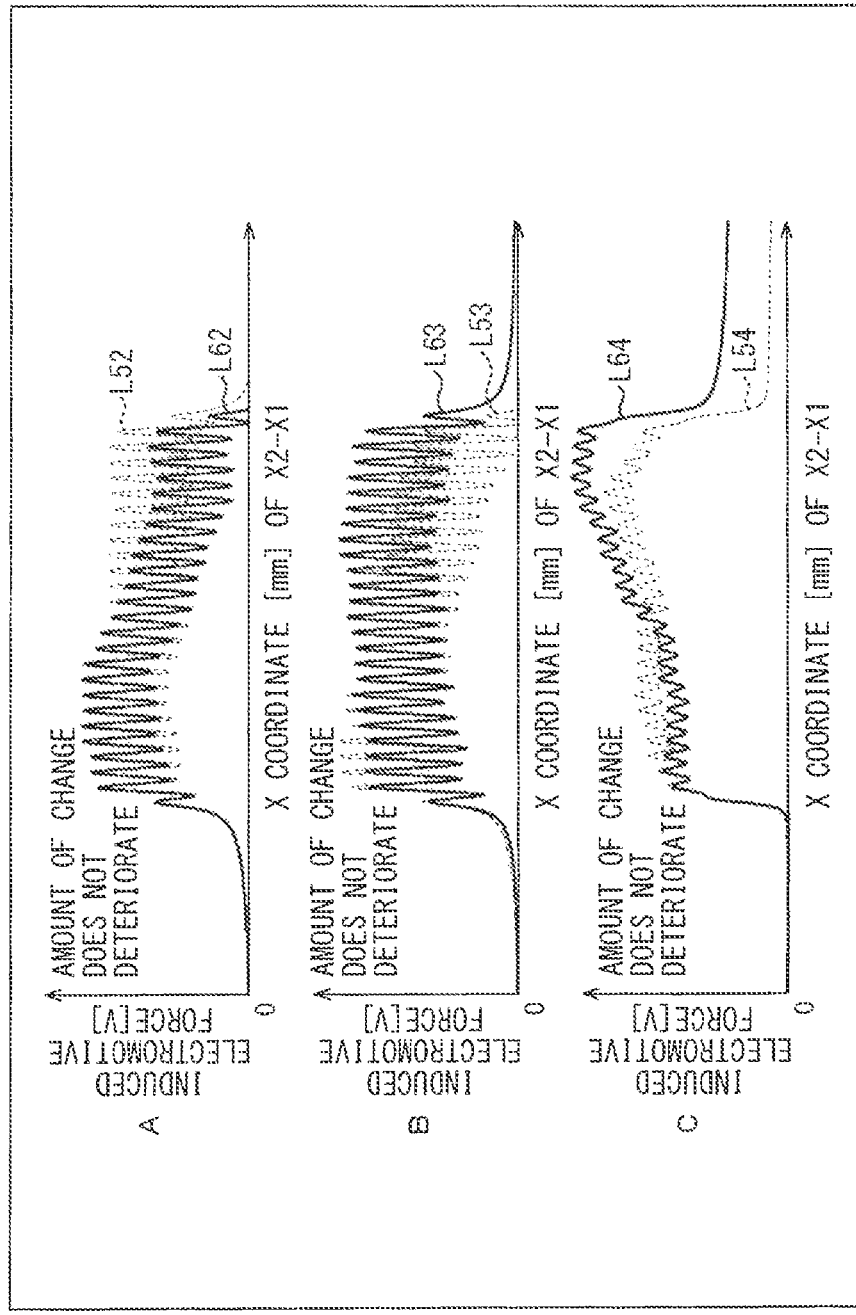

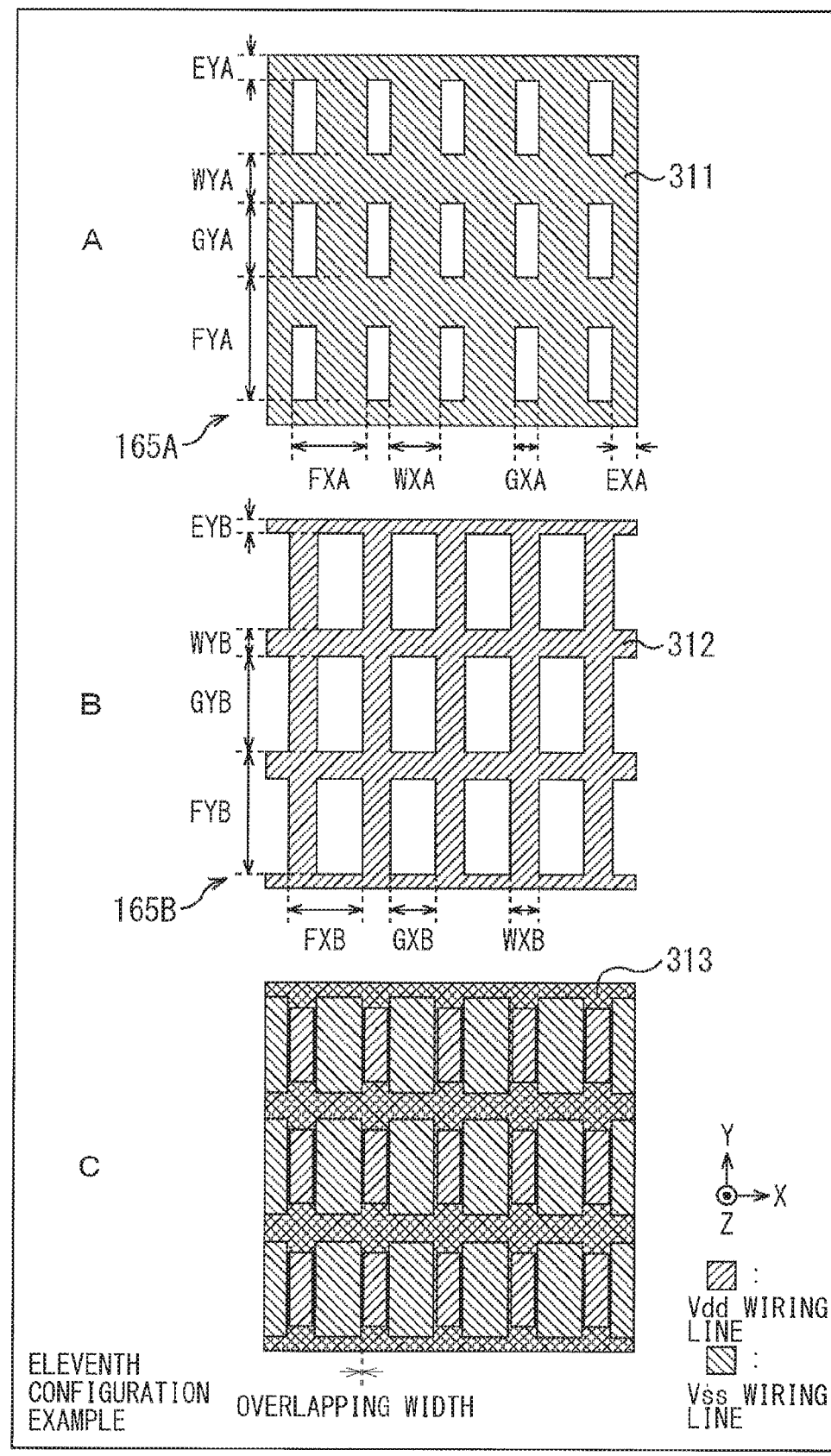
[FIG. 36]

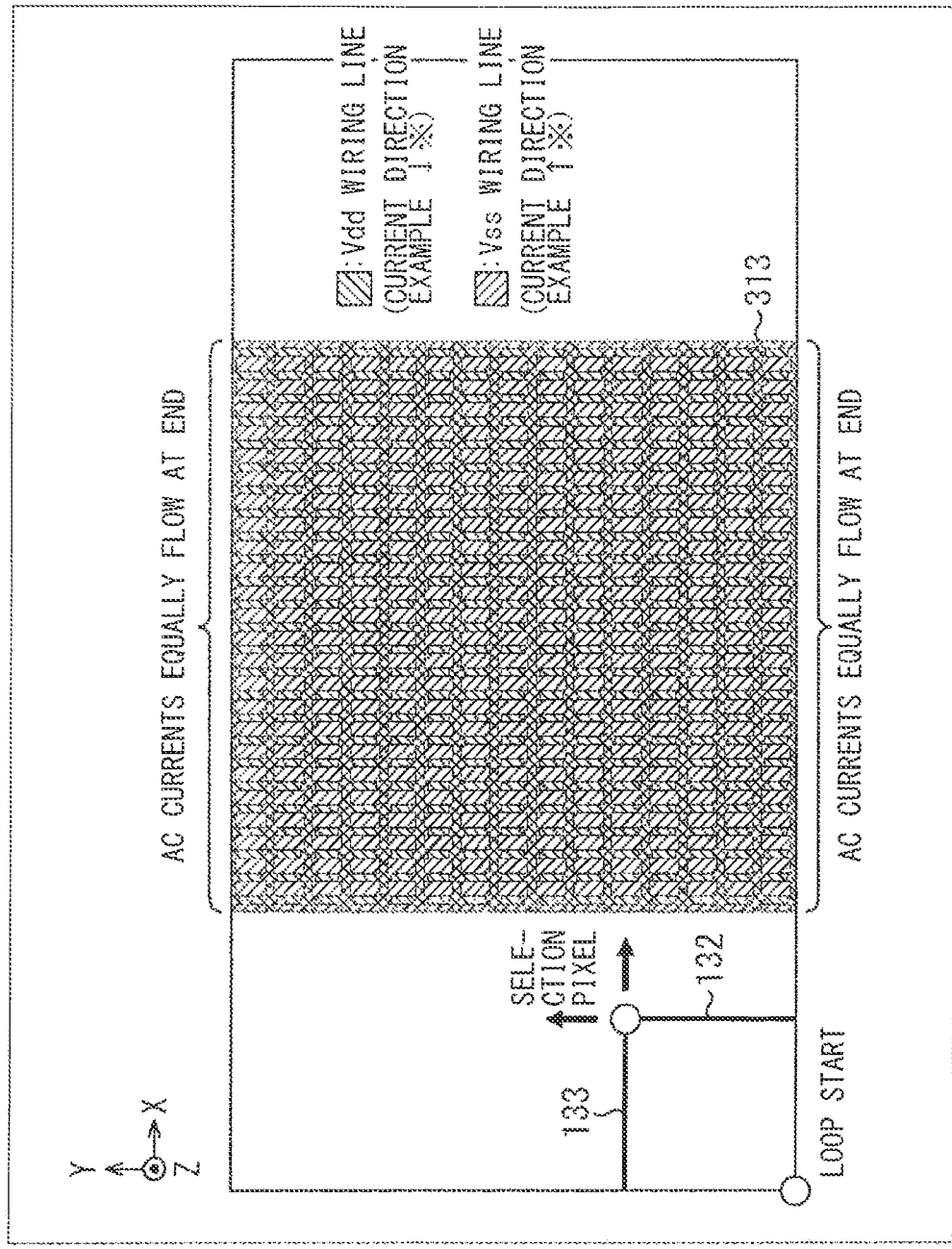

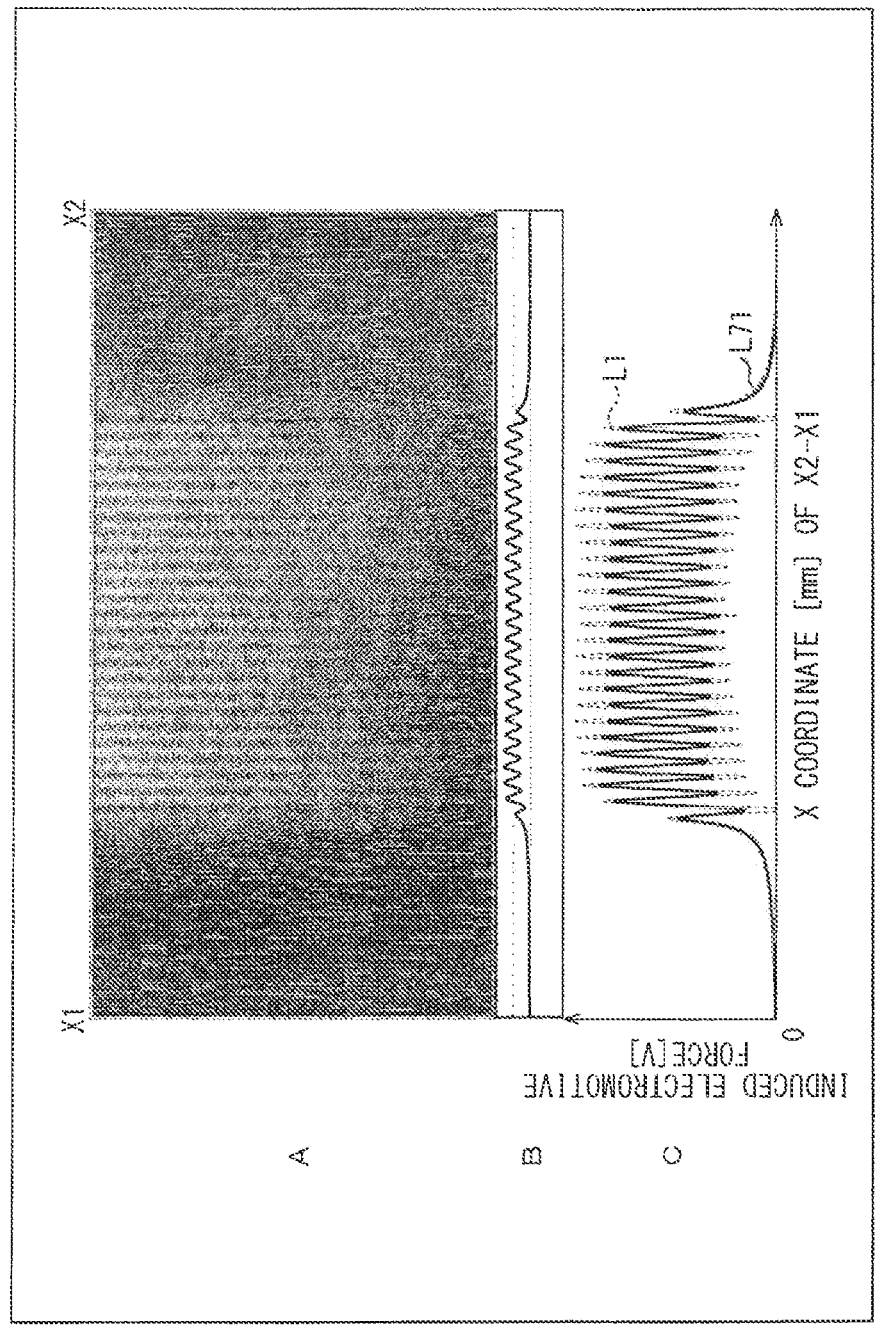
[FIG. 38]

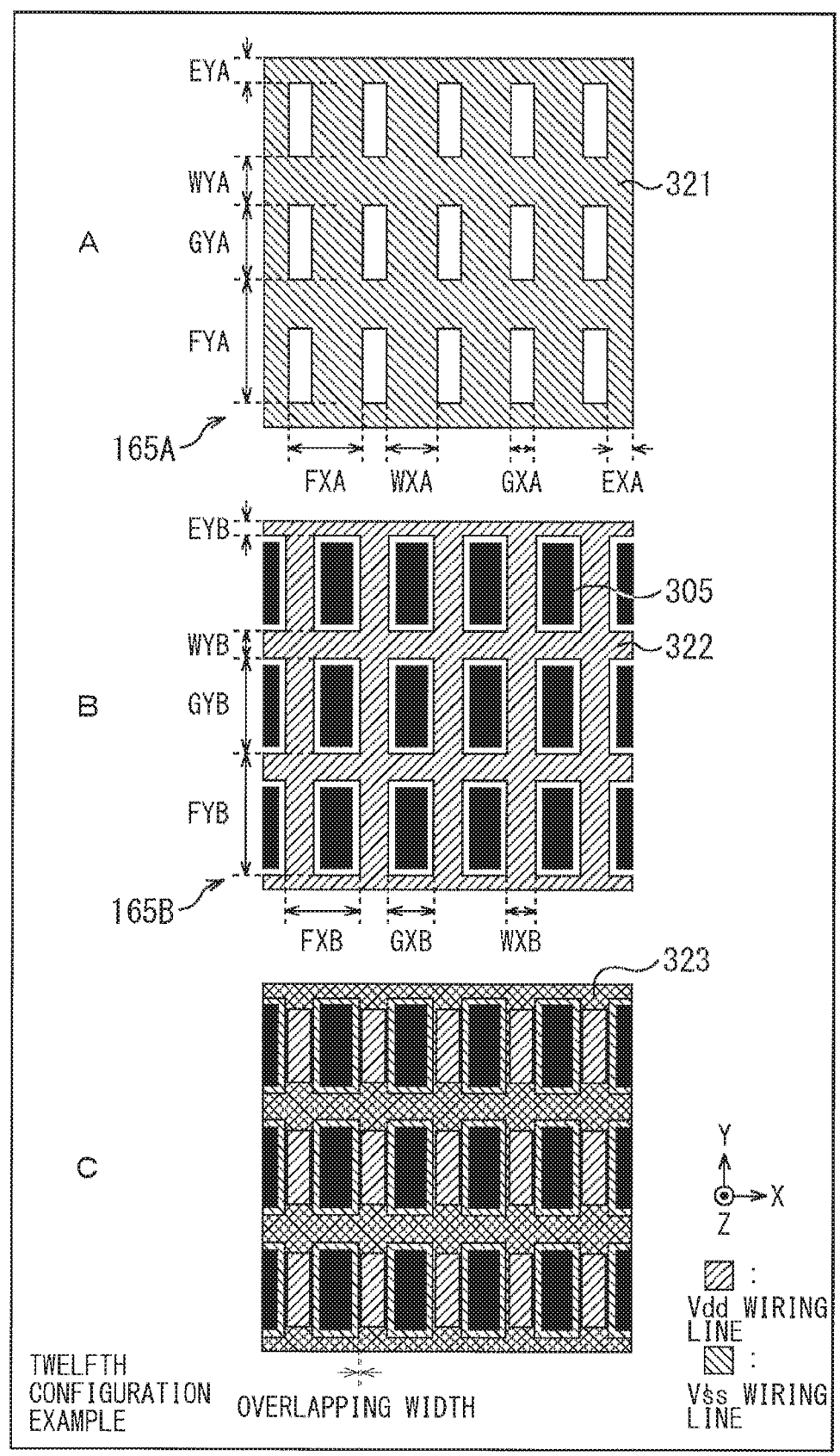

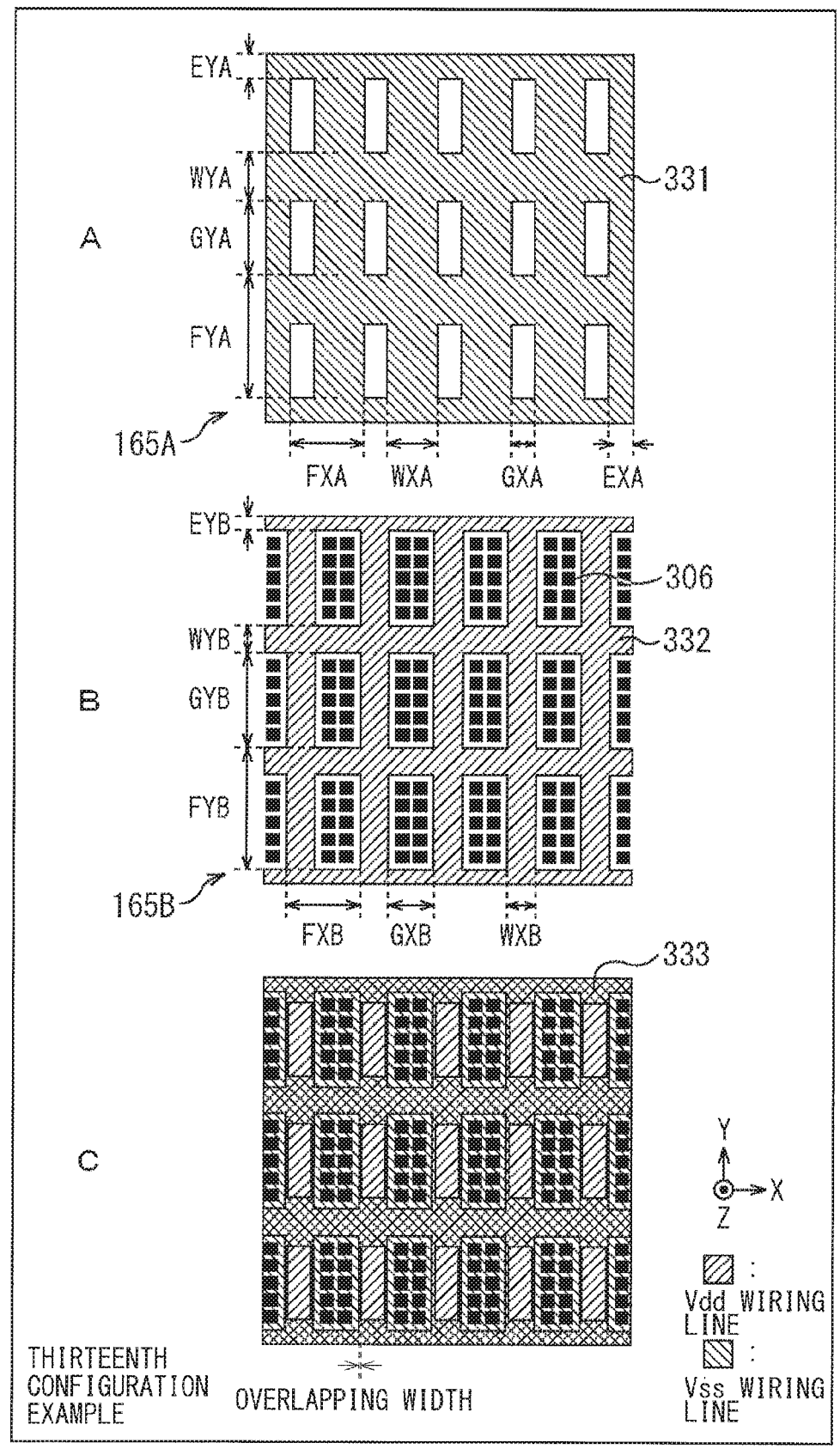
[FIG. 40]

[FIG. 41]
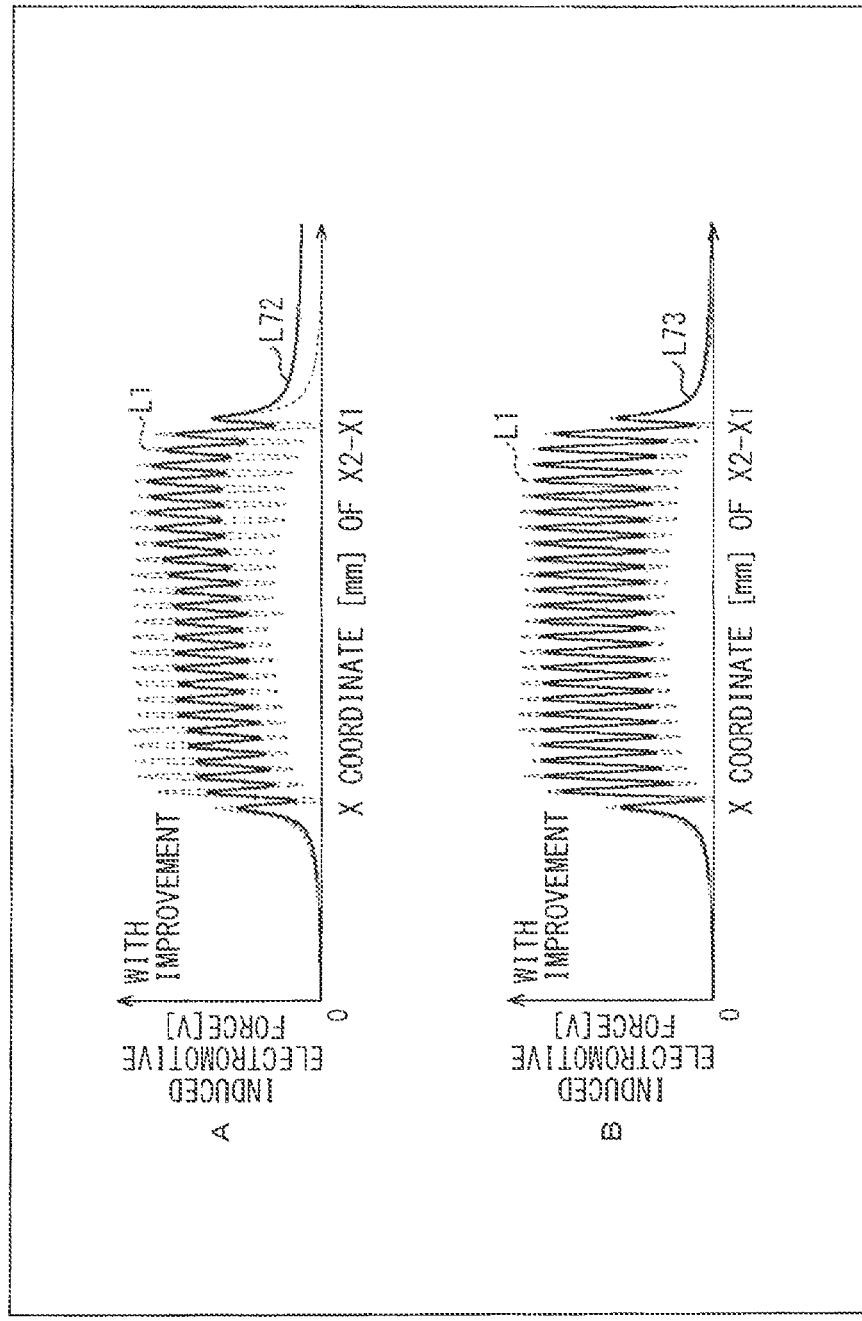

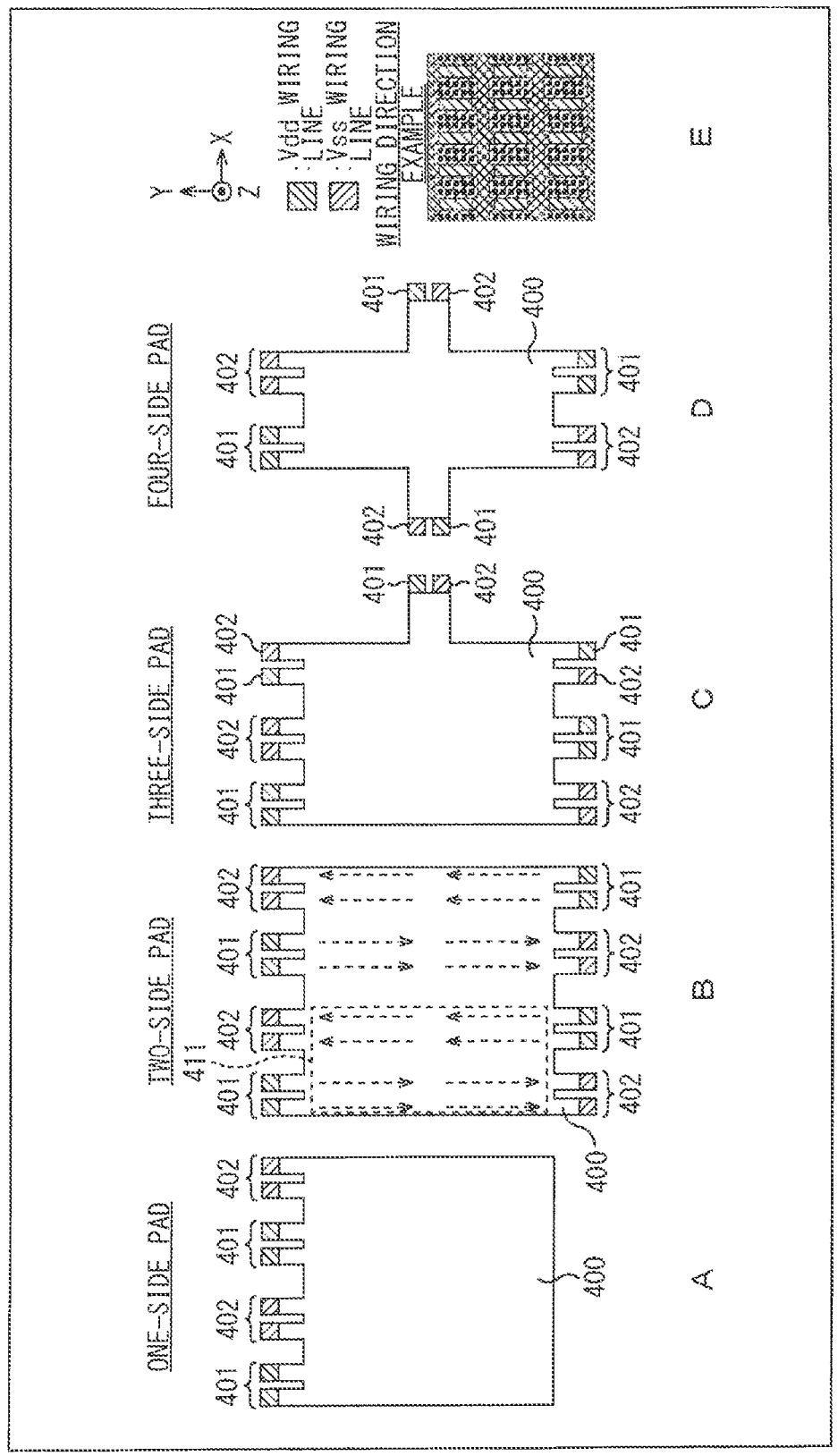
[FIG. 42]

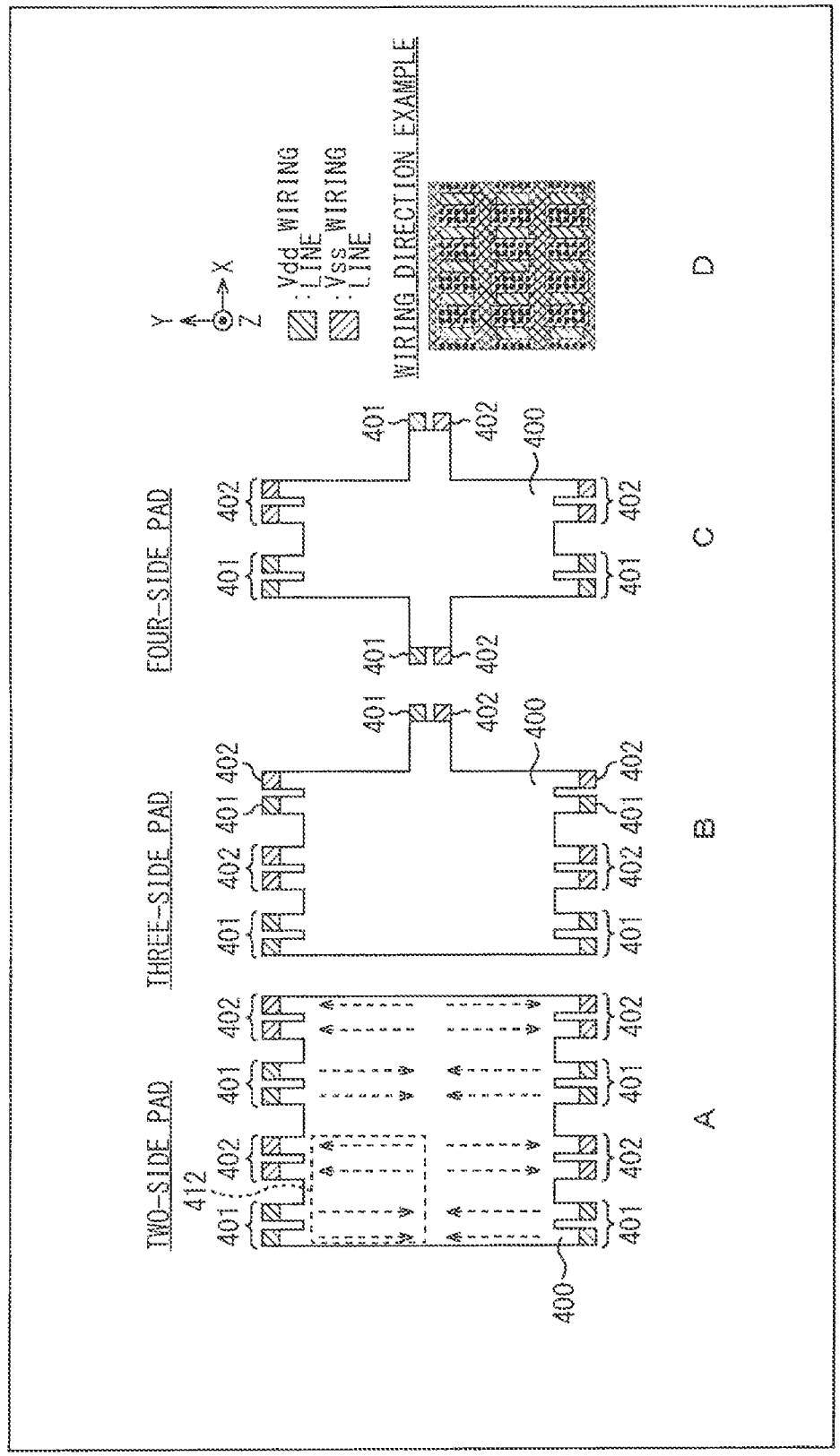
[FIG. 43]

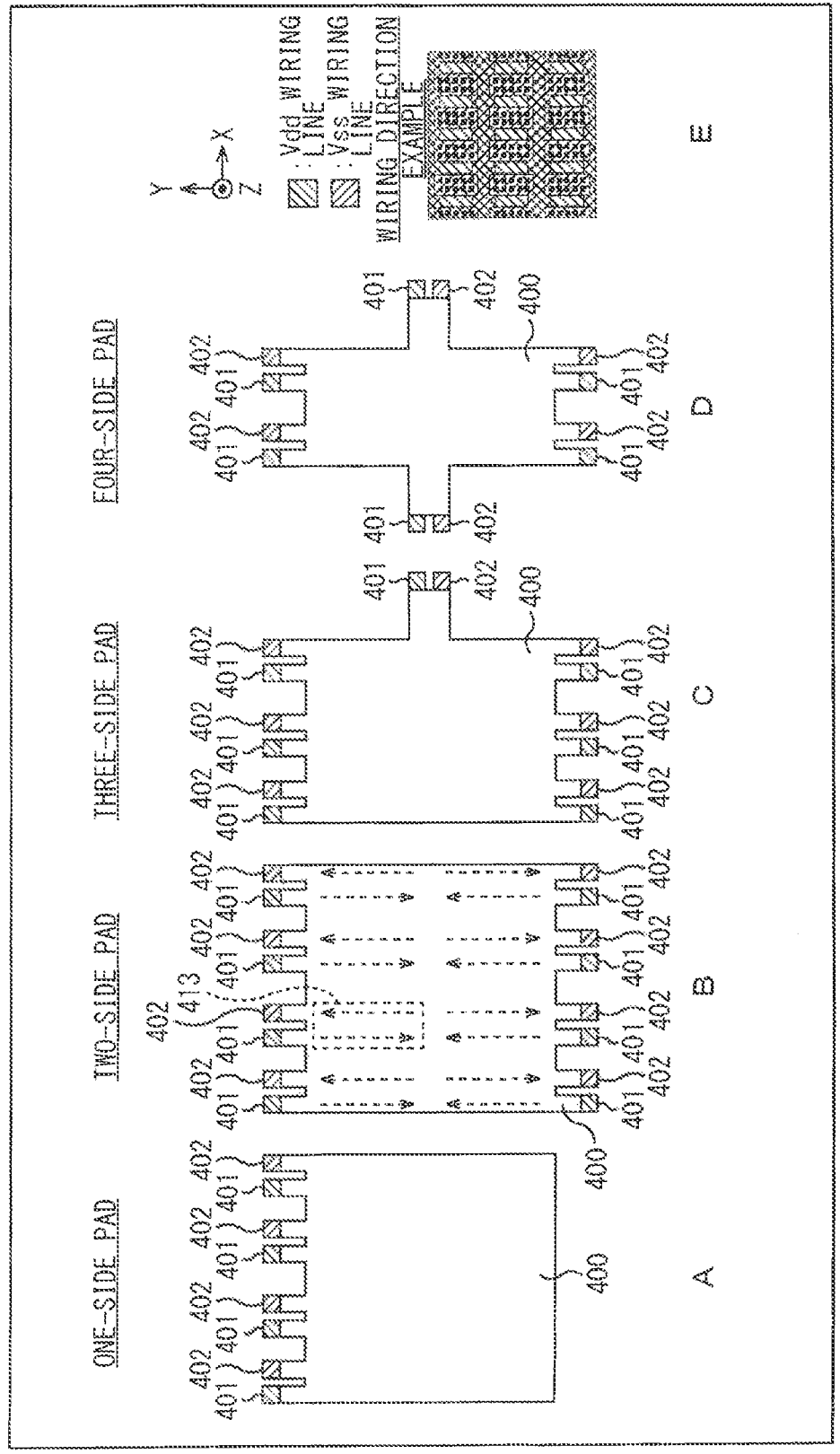
[FIG. 44]

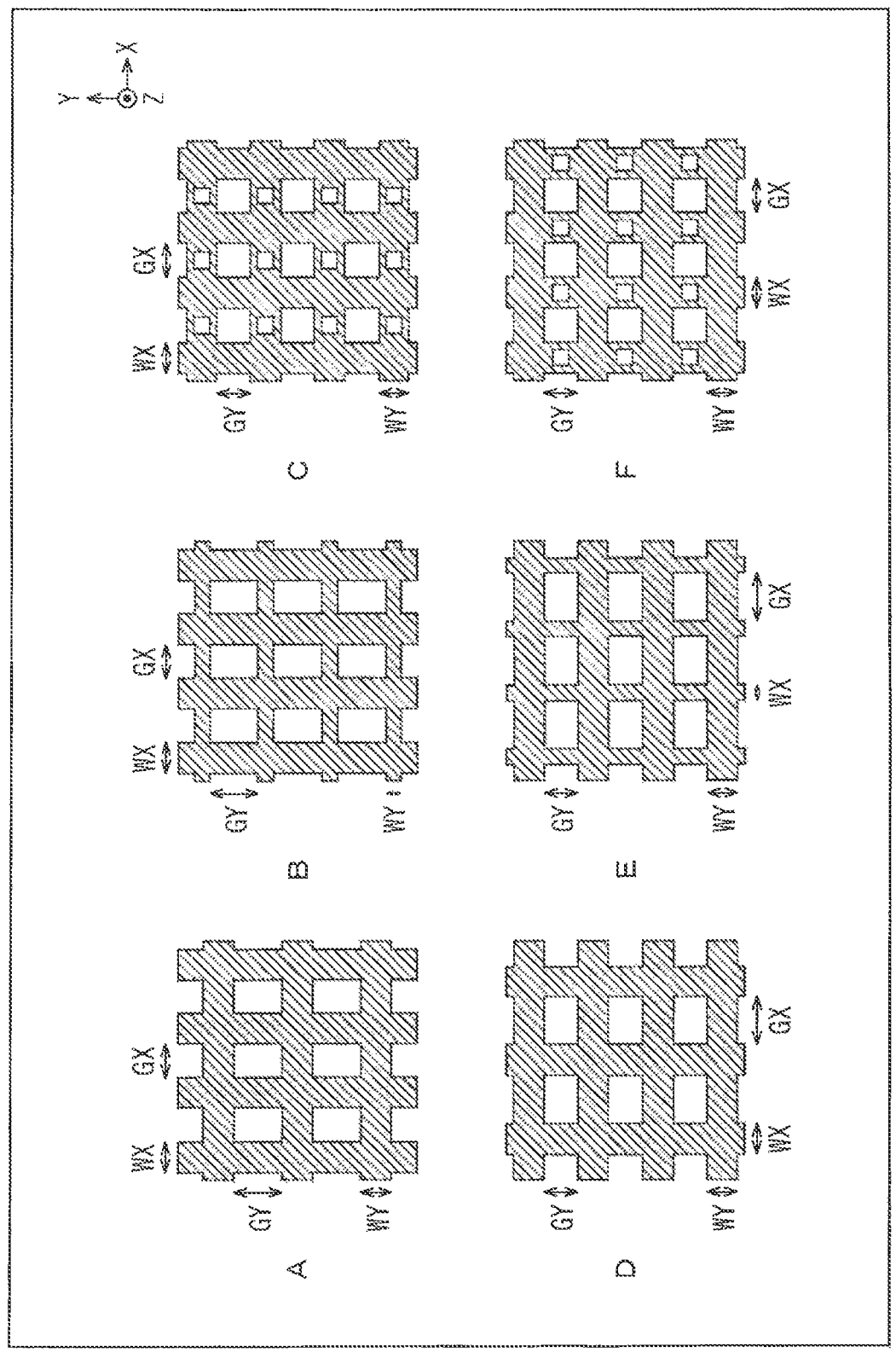

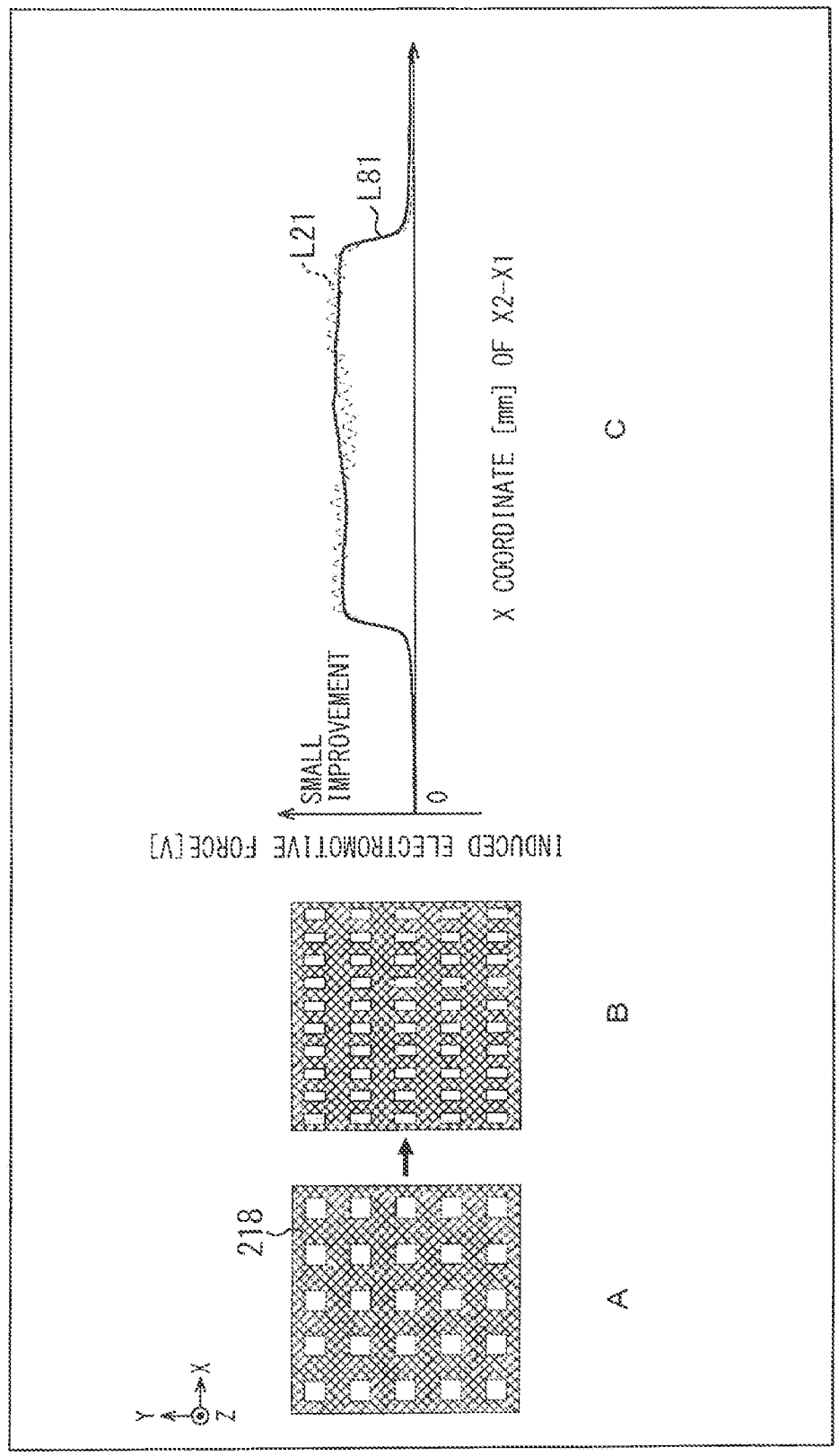

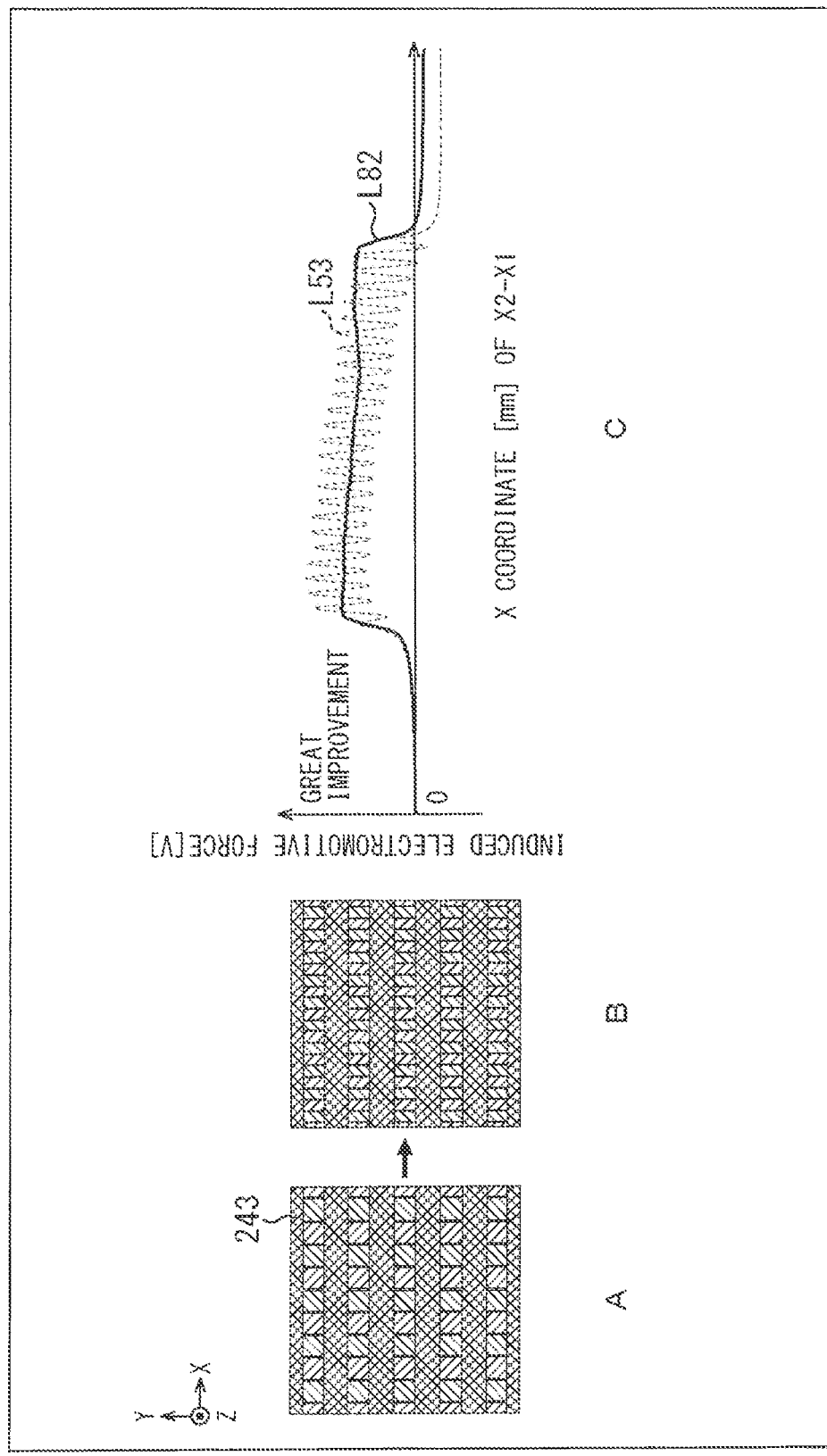

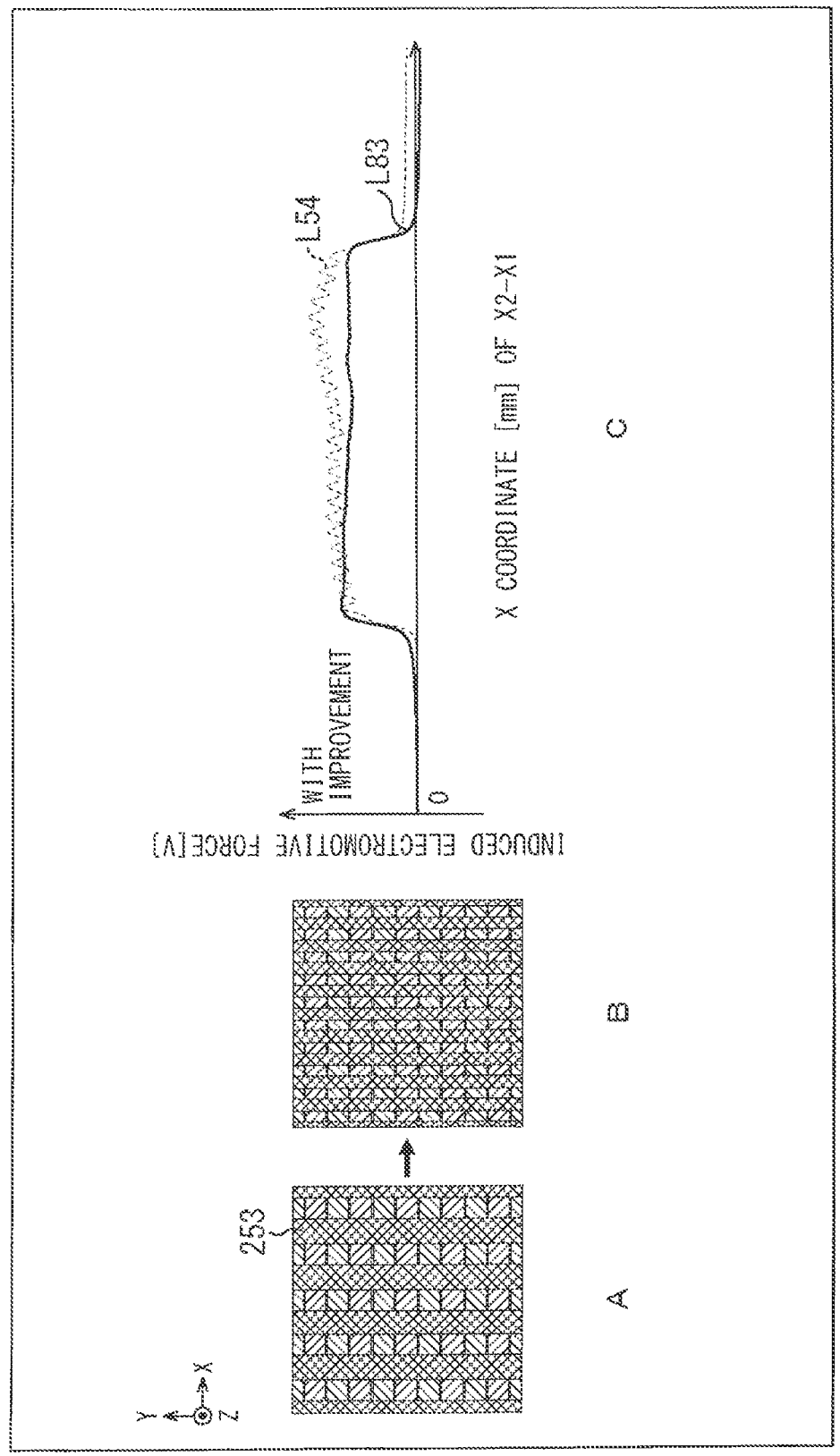
[FIG. 48]

[FIG. 49]
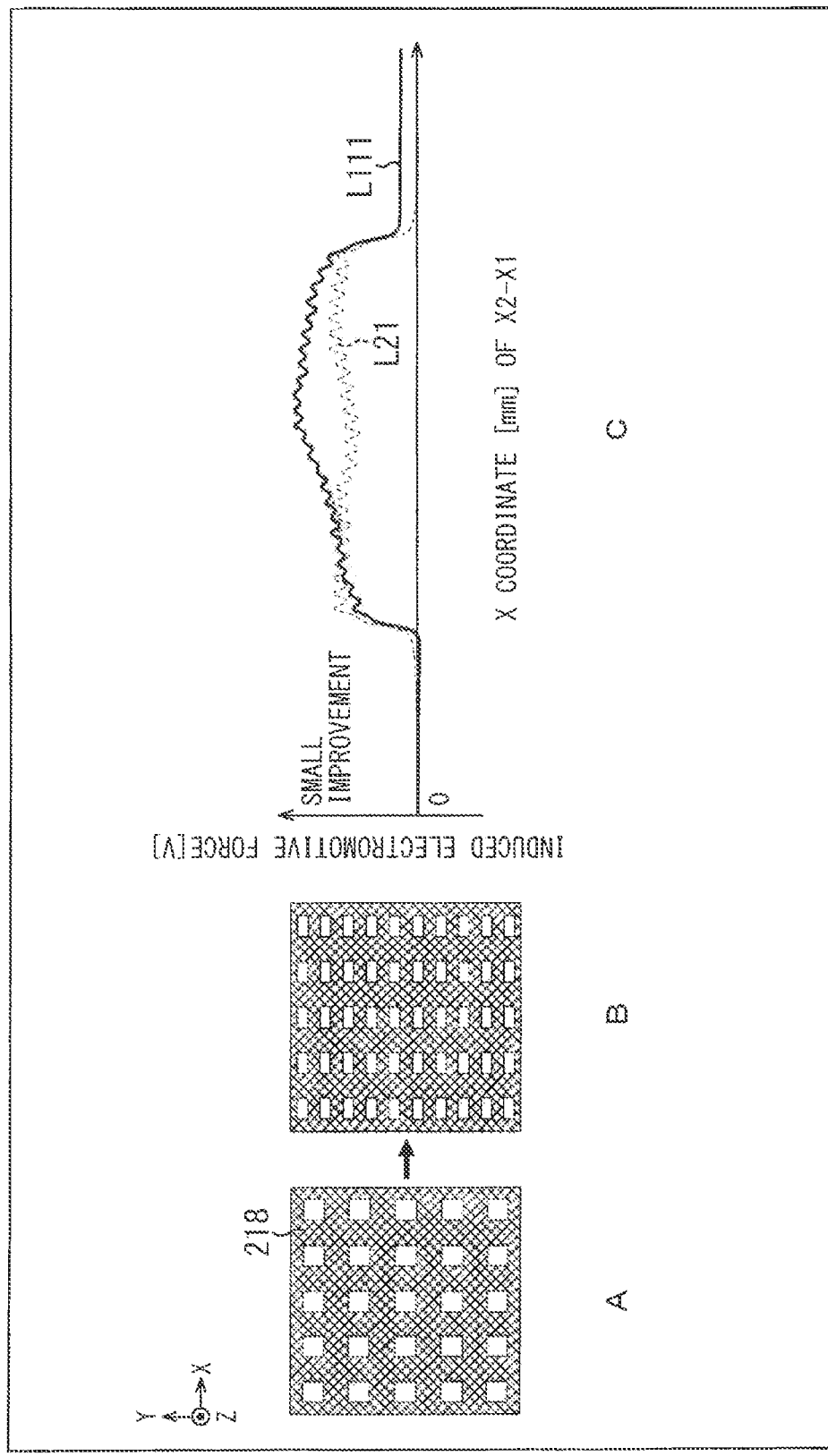

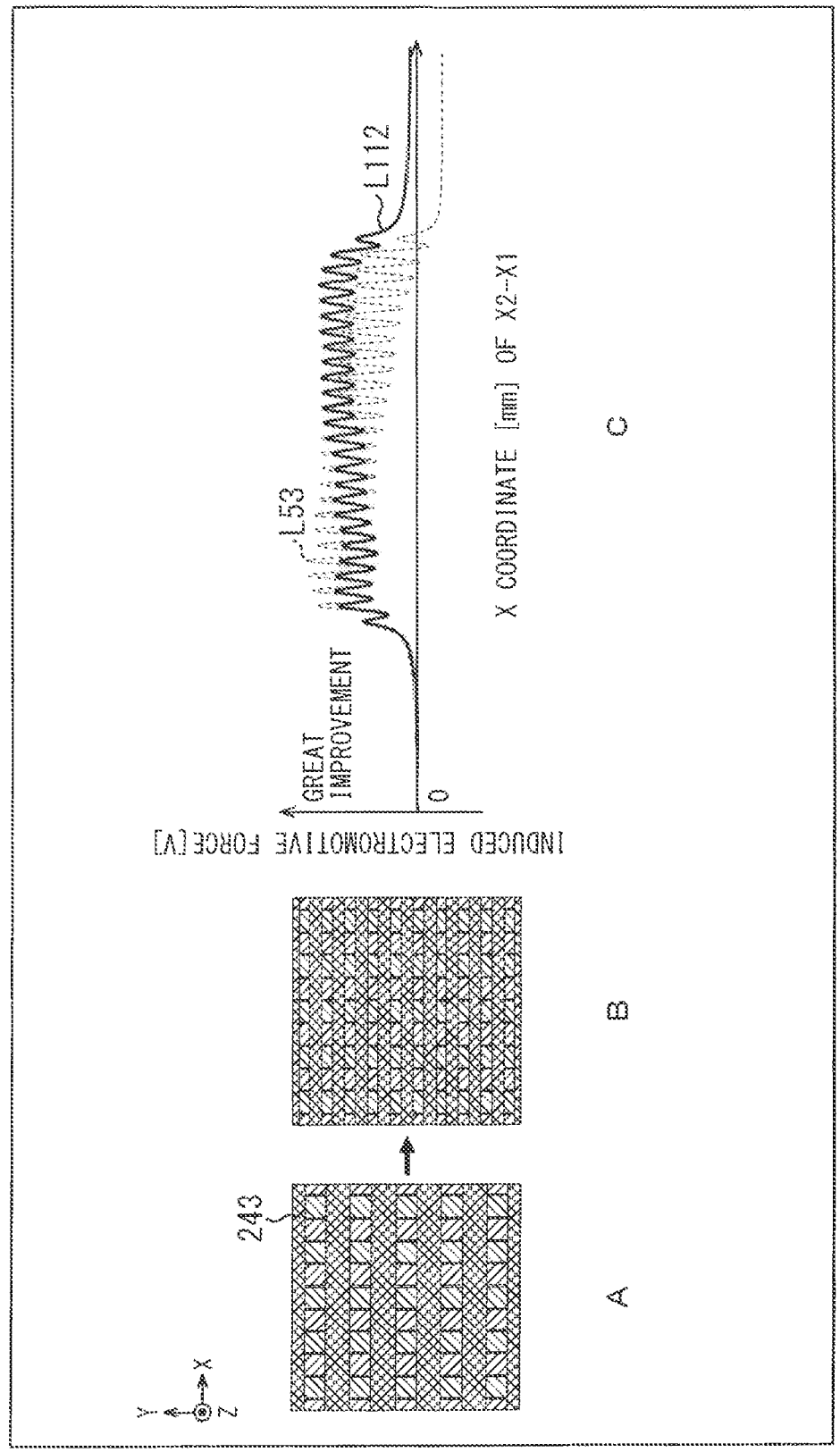
[FIG. 50]

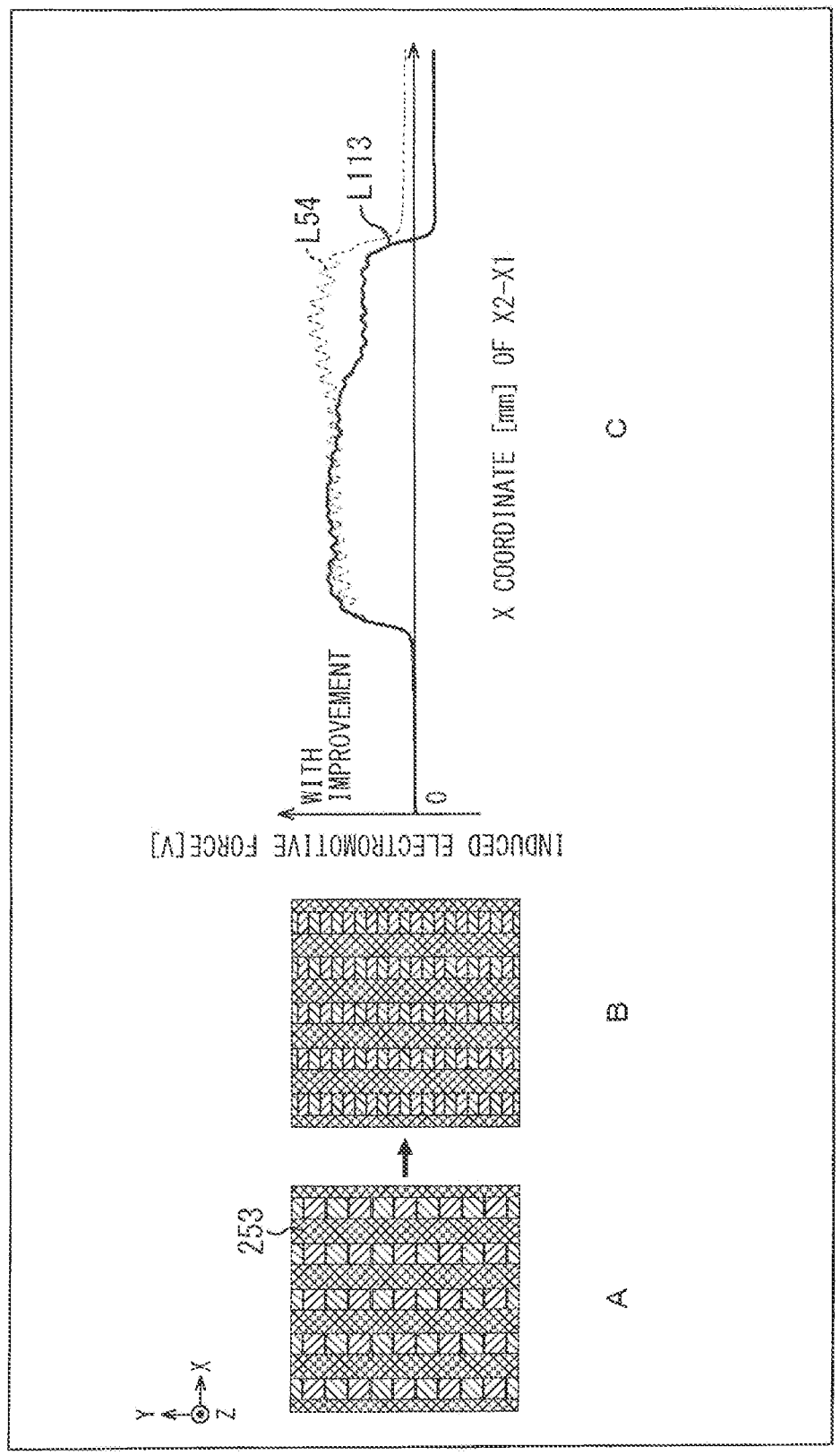

[FIG. 52]
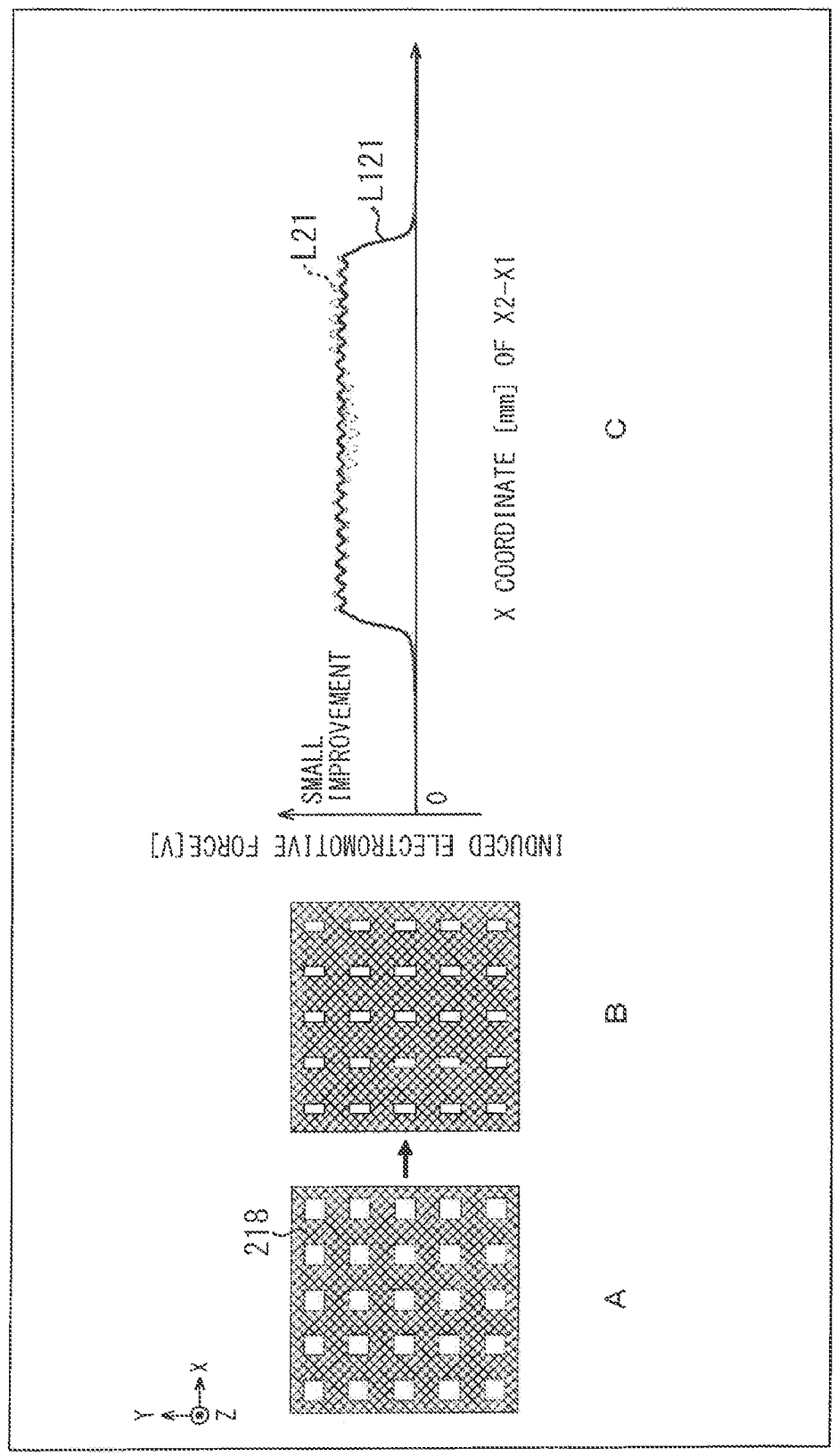

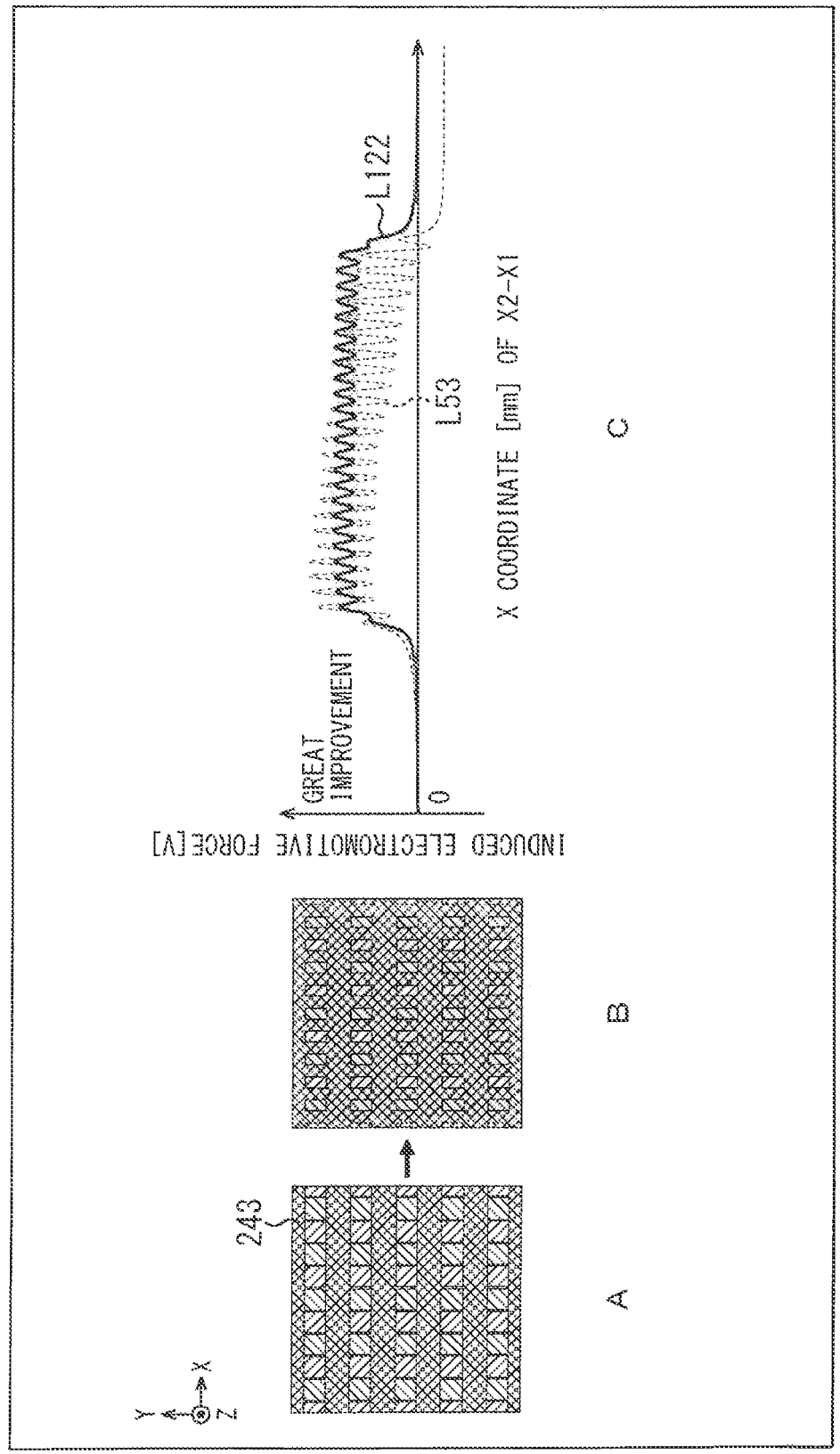
[FIG. 53]

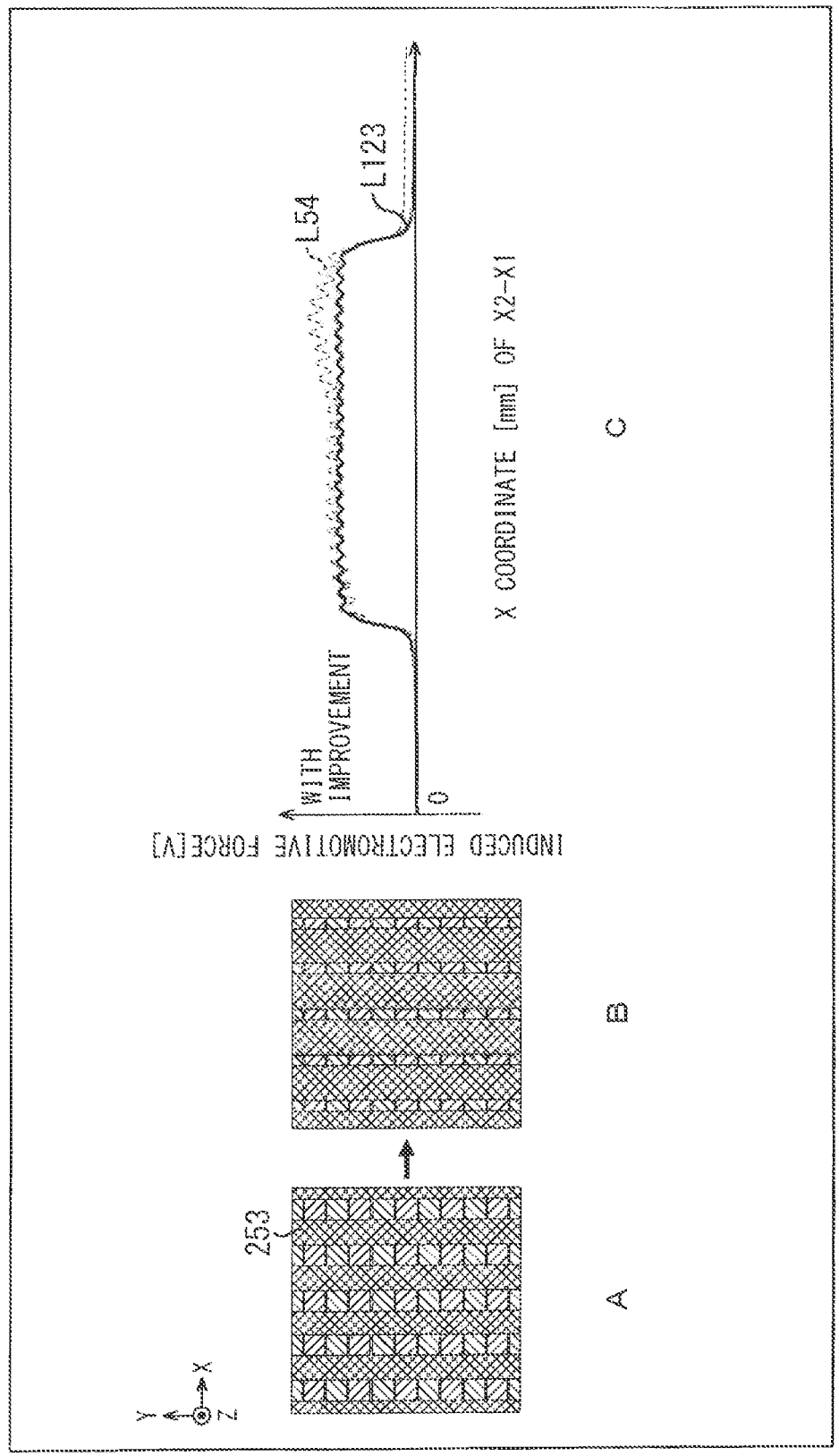
[FIG. 54]

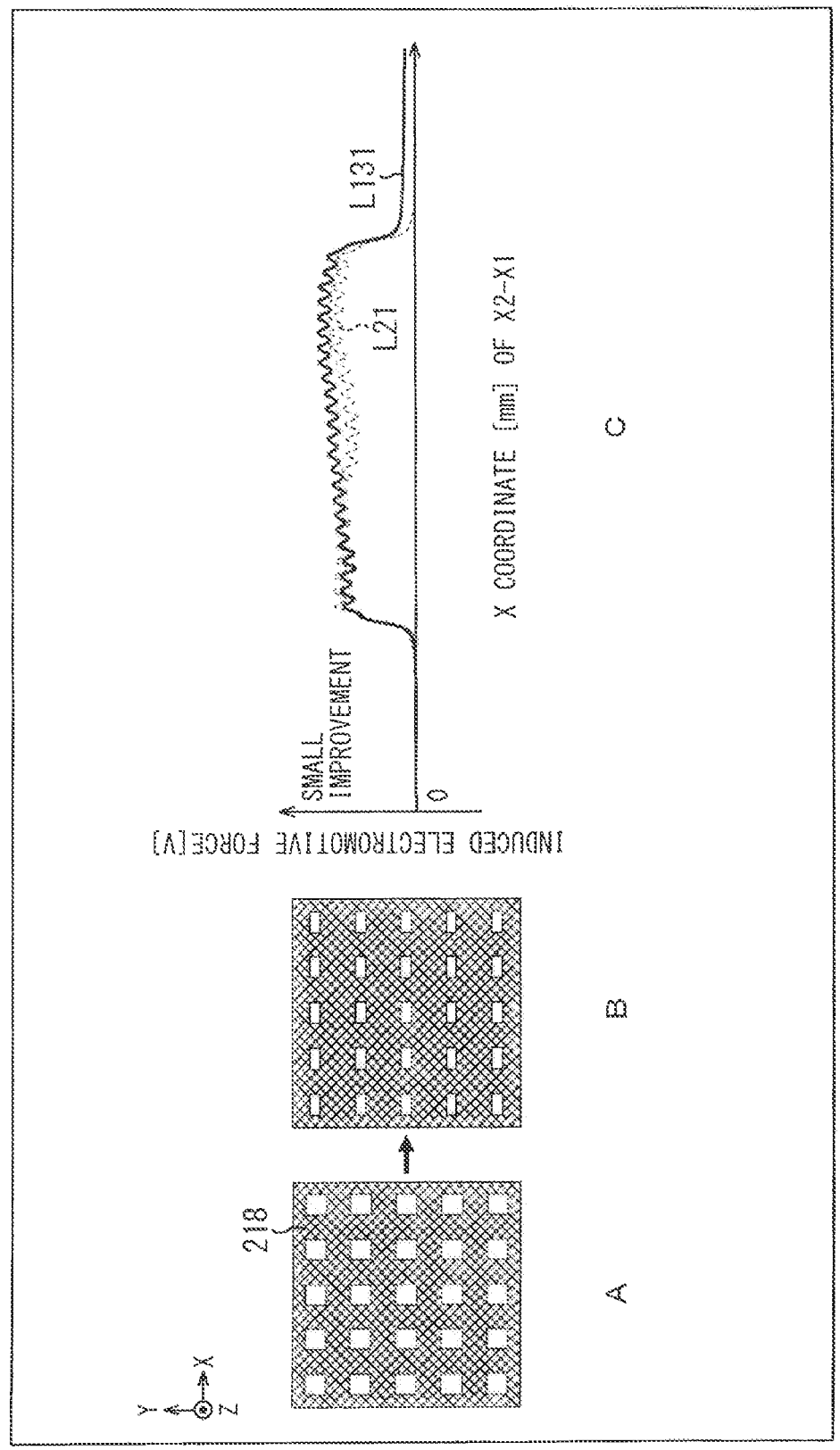

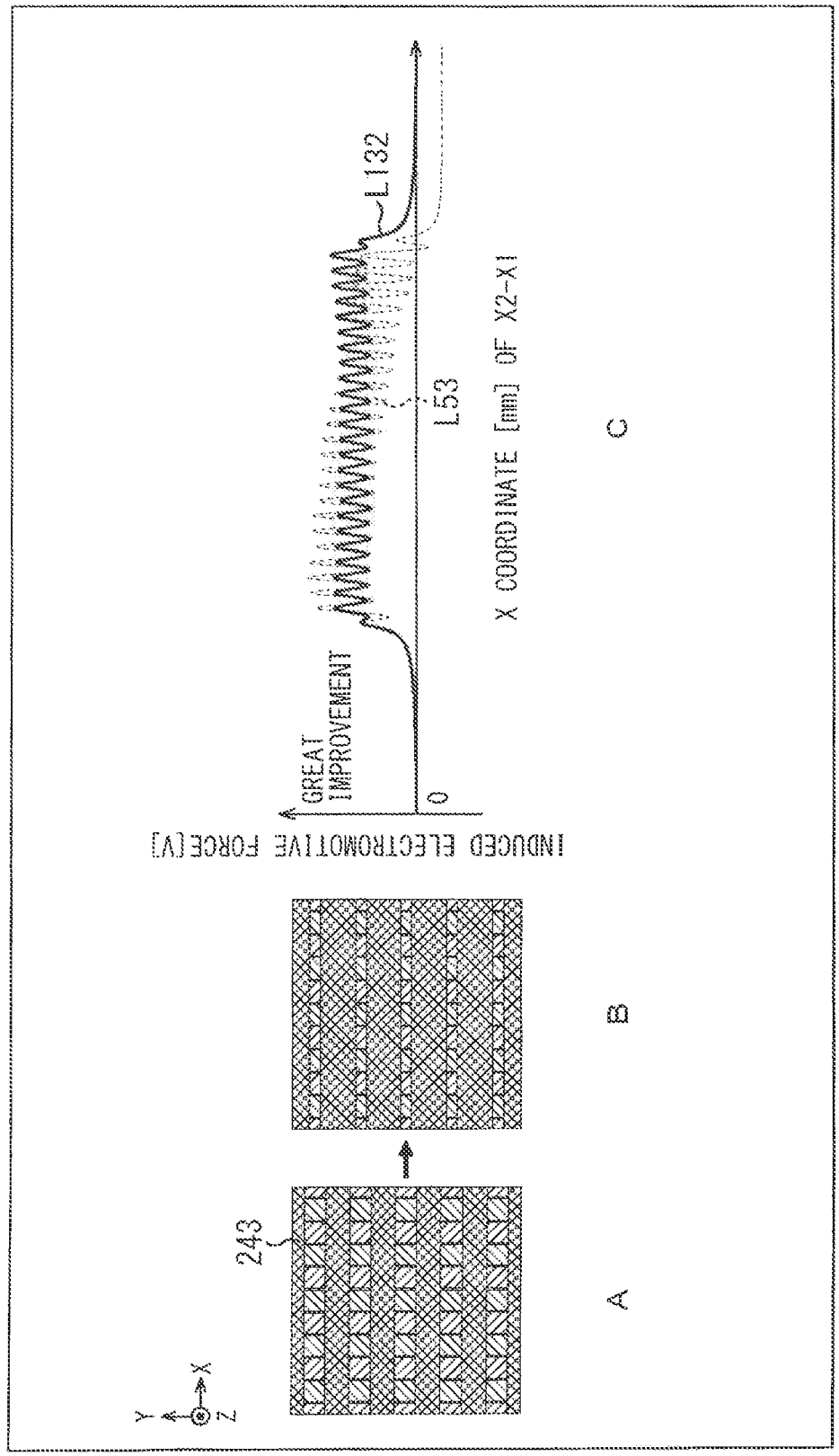
[FIG. 56]

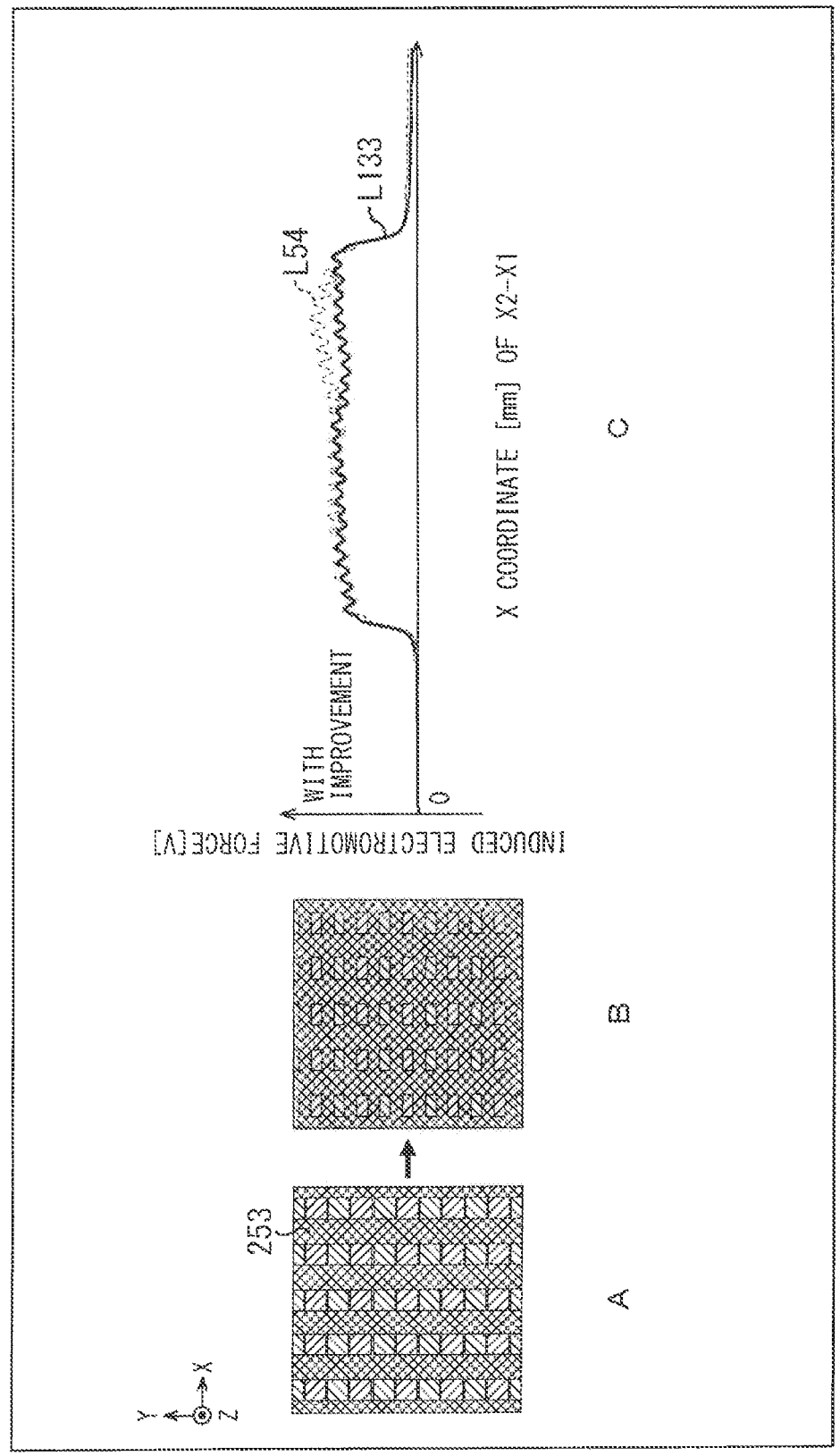

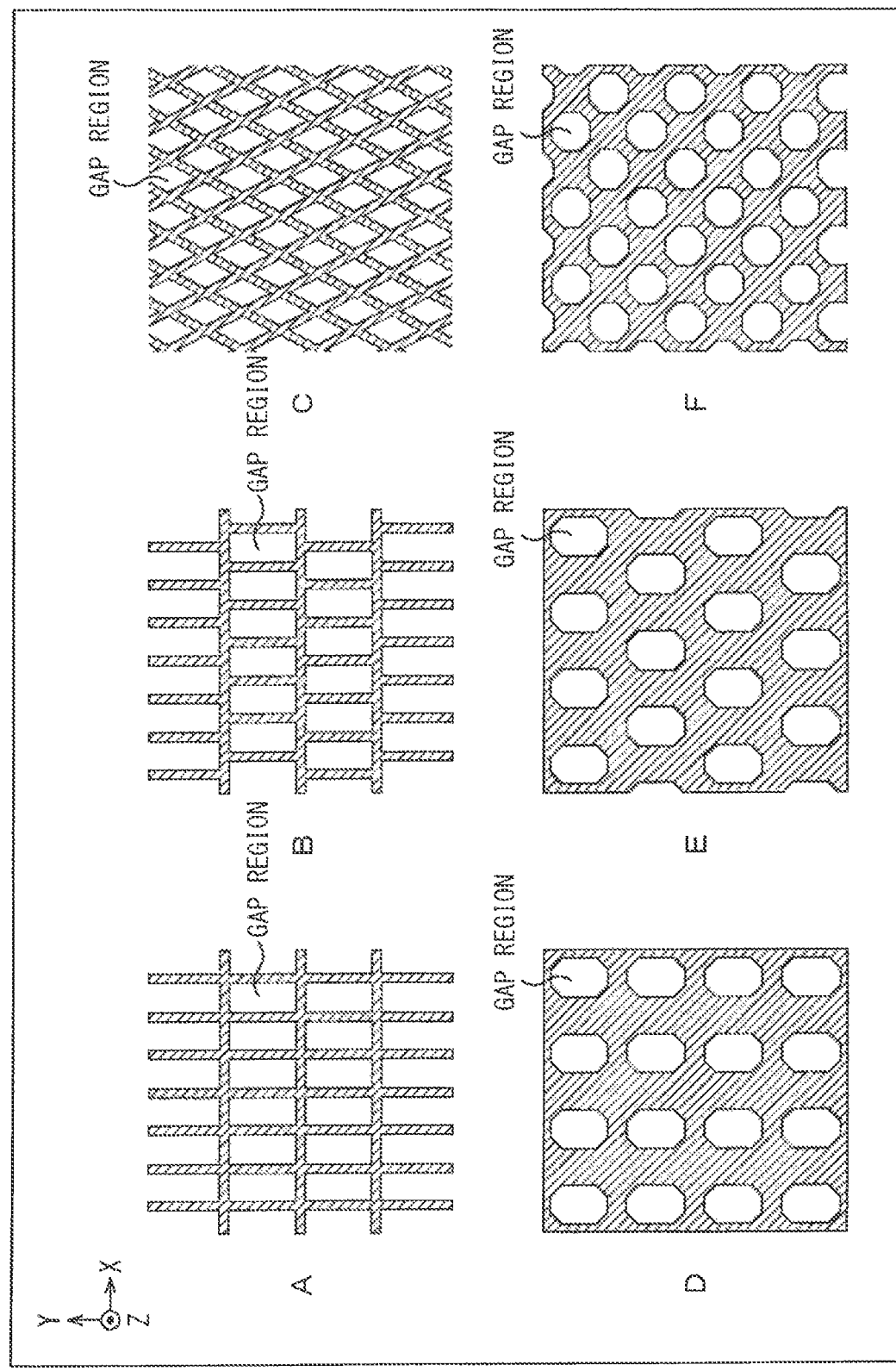

[FIG. 59]
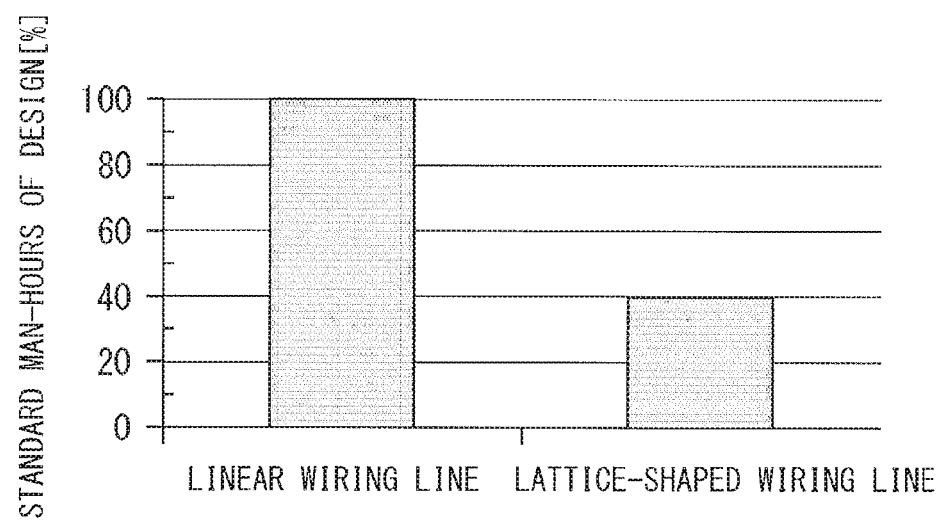

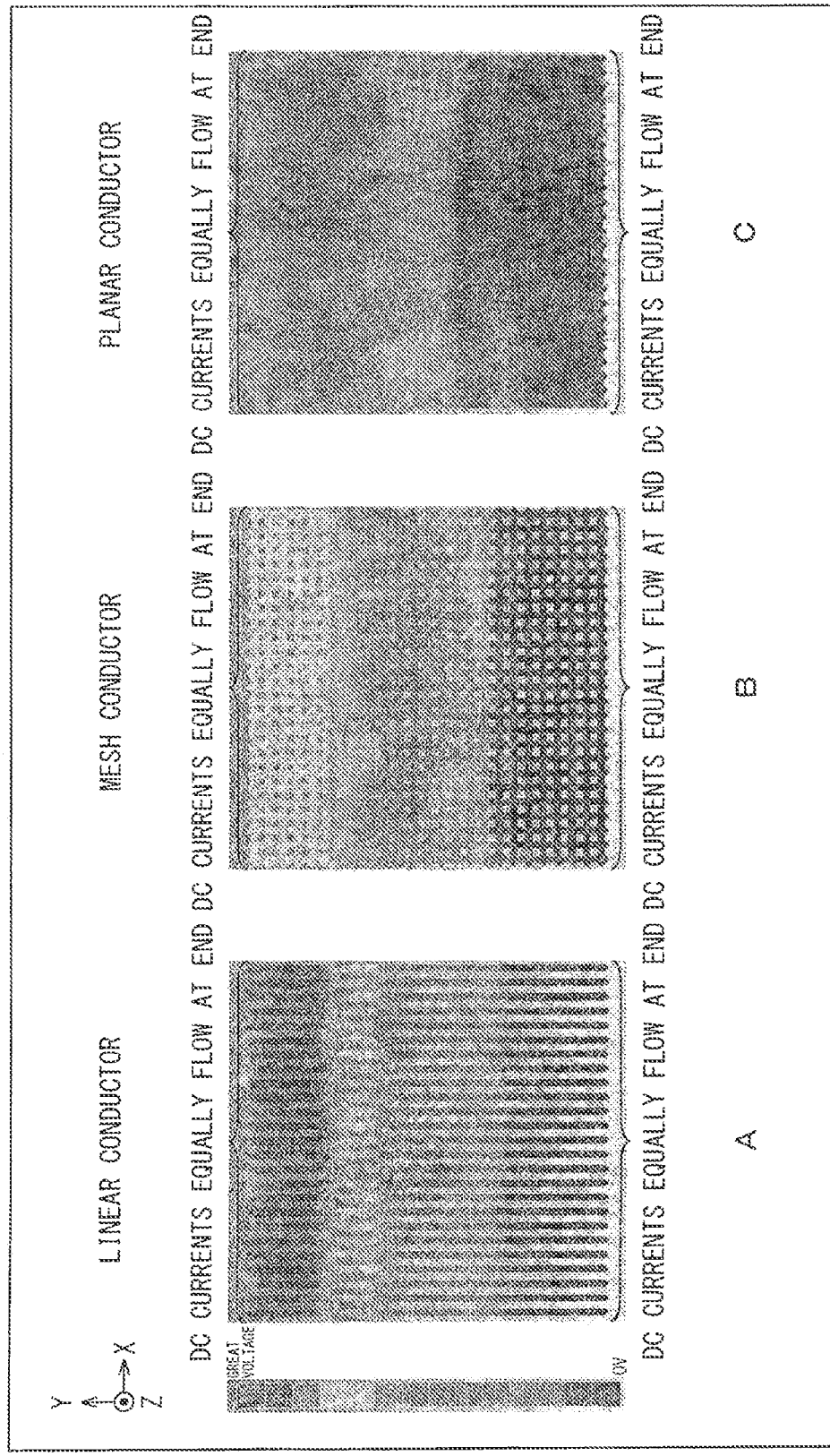

[ FIG. 61 ]
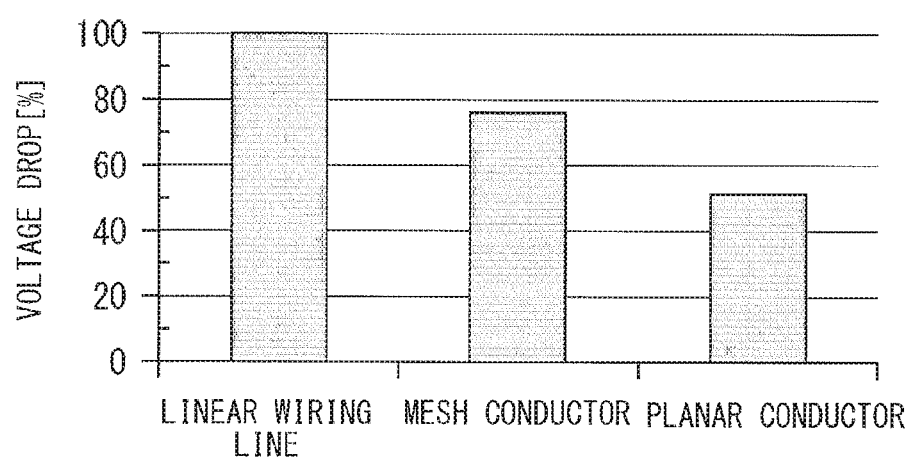

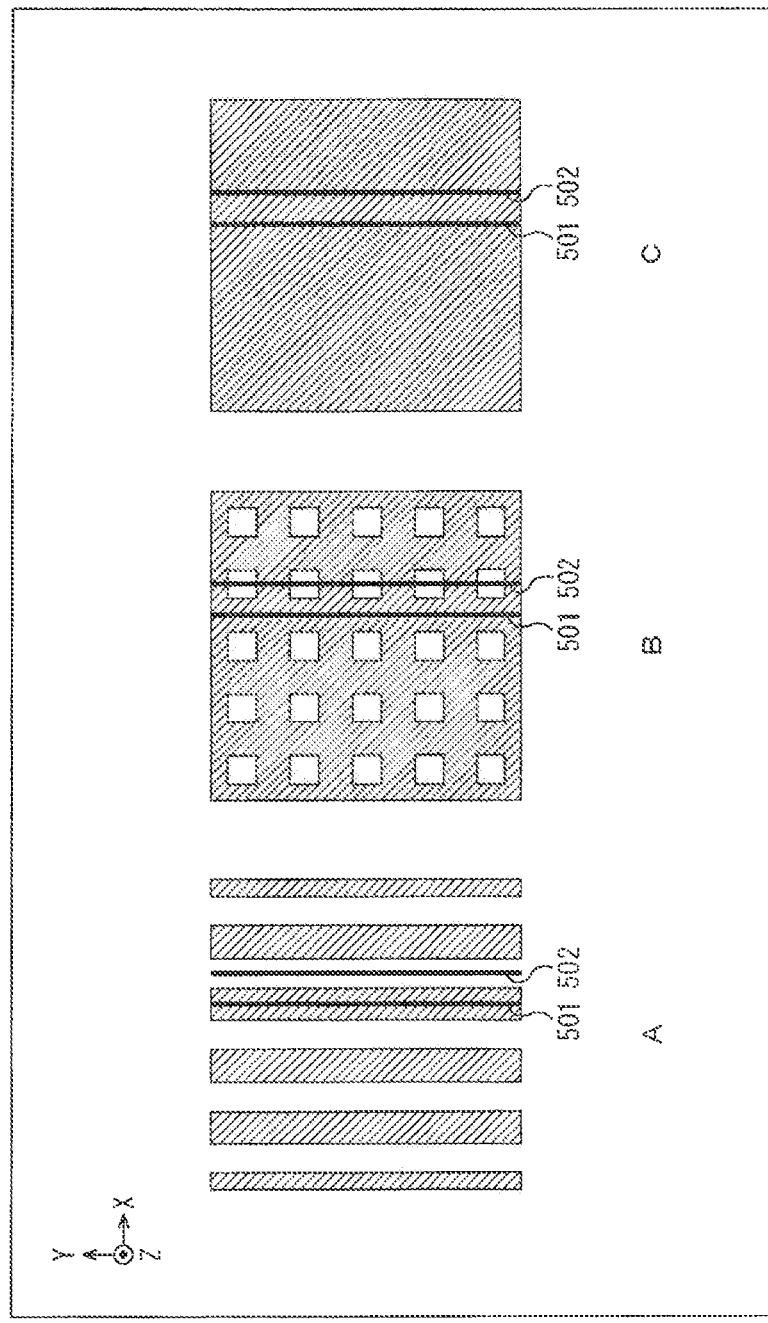

[FIG. 63]
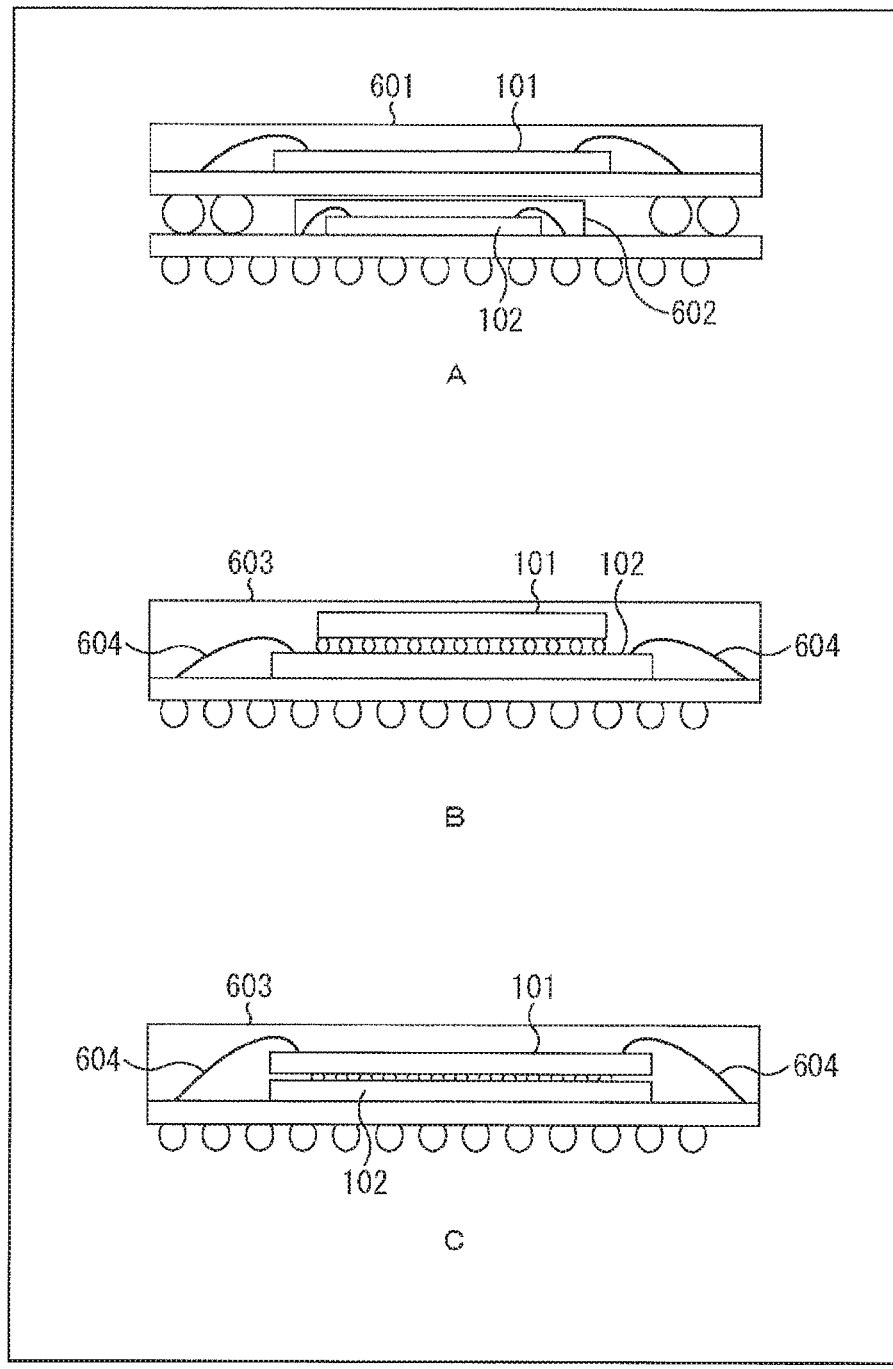

[ FIG. 64 ]
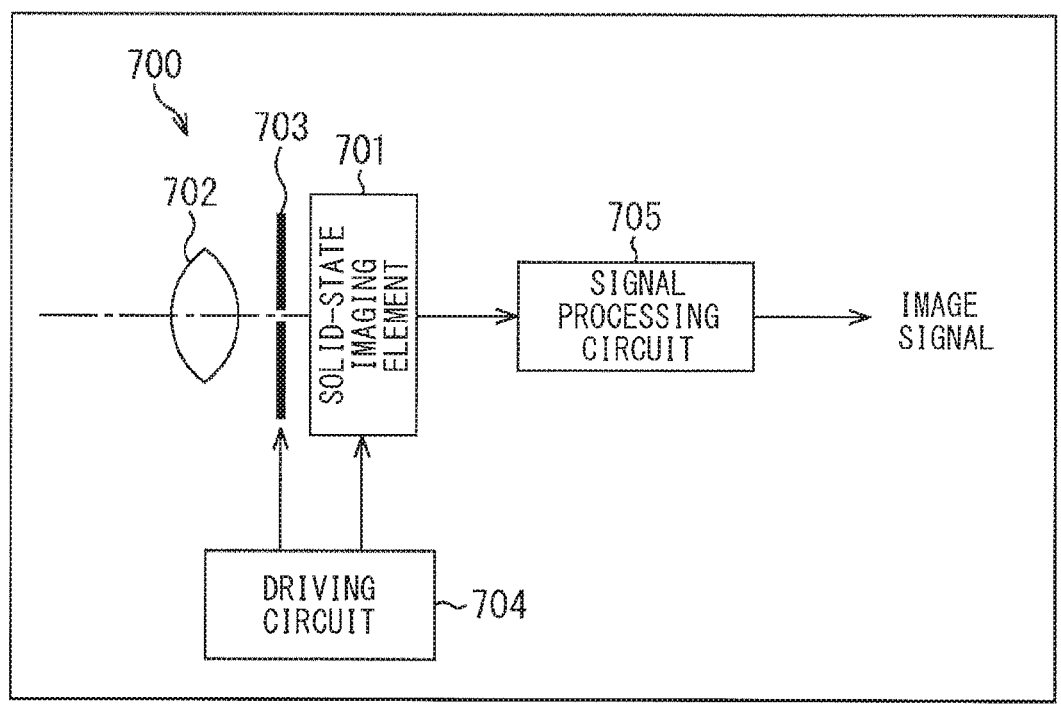

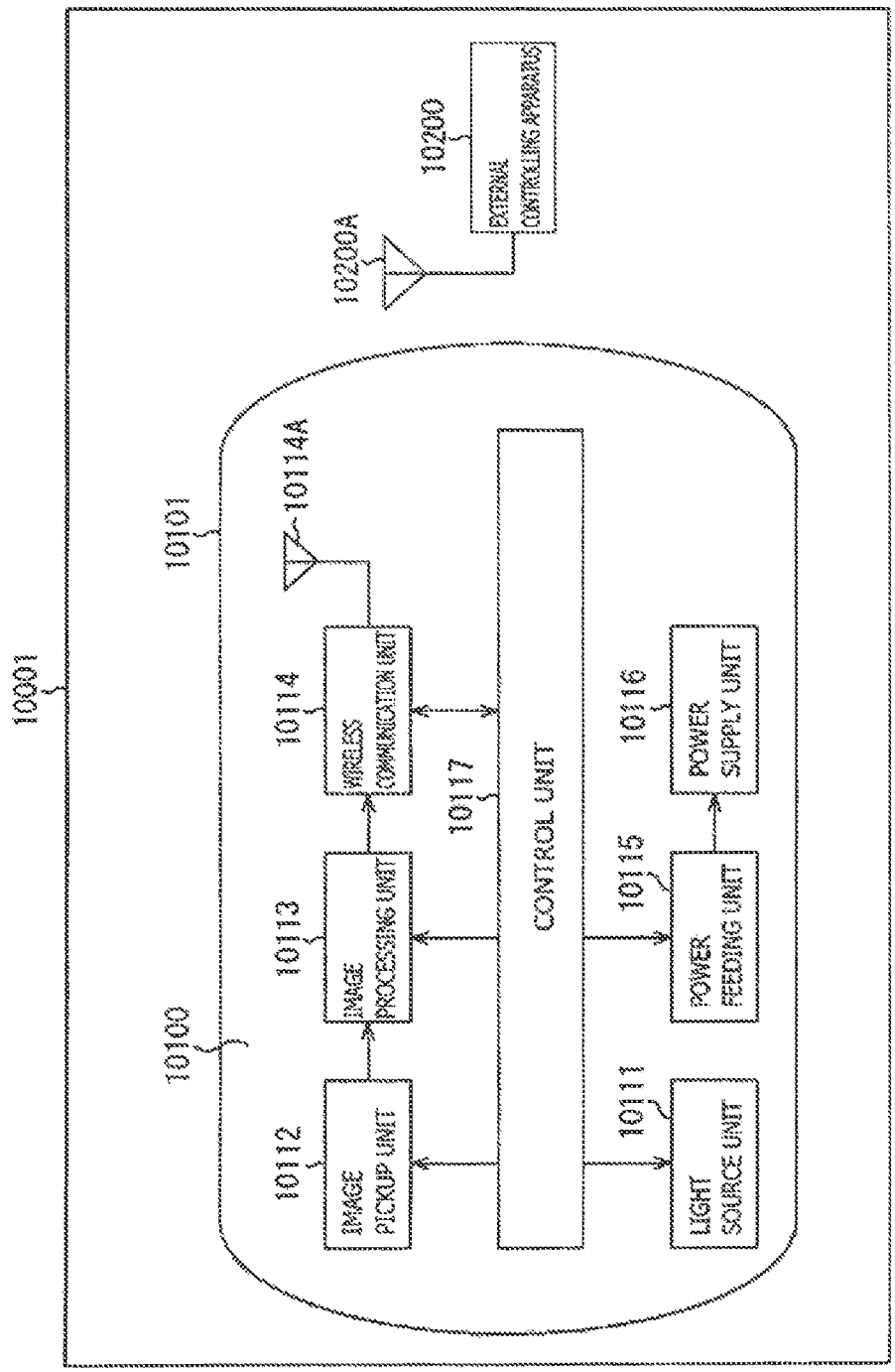
[FIG. 65]

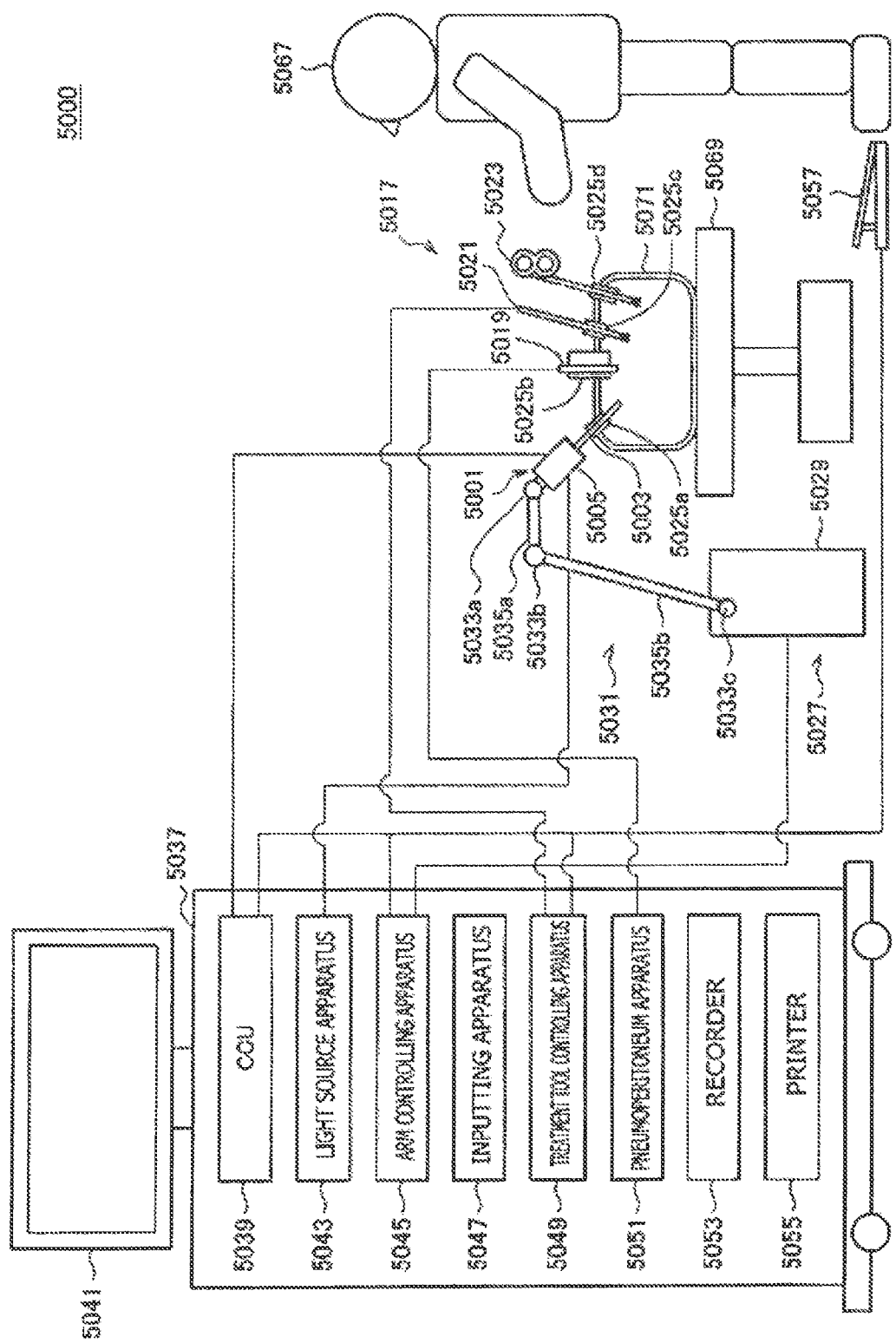

[FIG. 67]
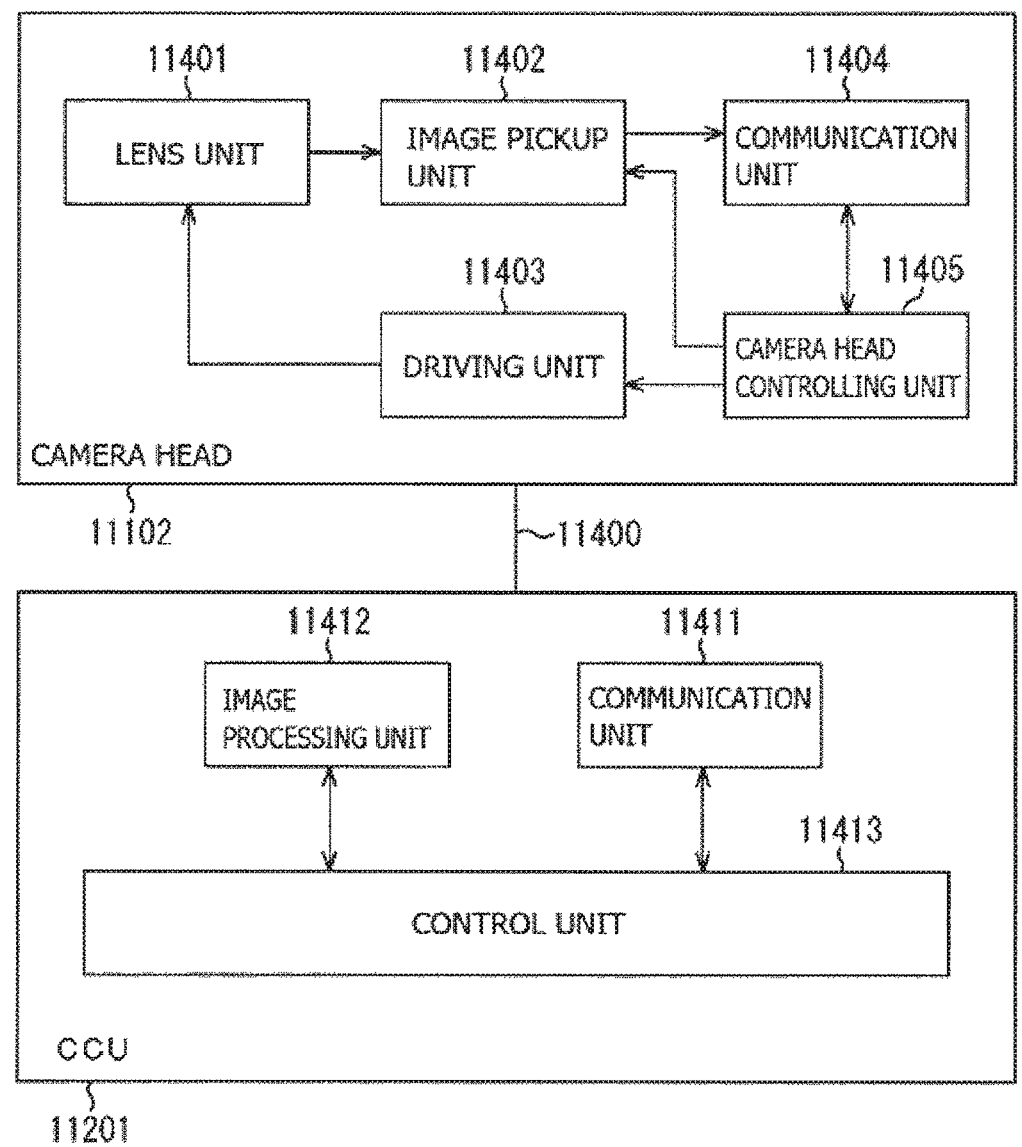

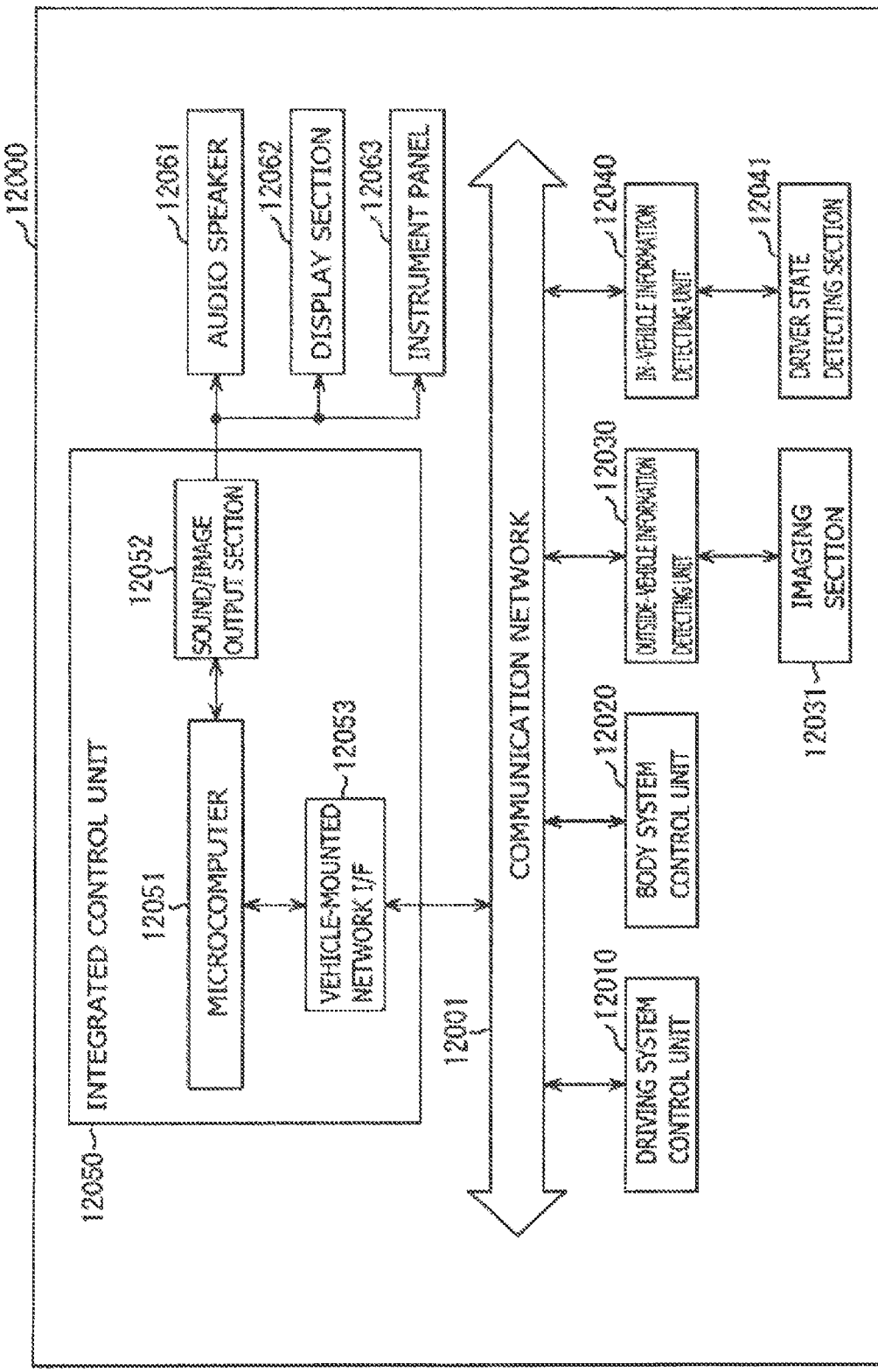
[FIG. 68]

[FIG. 69]
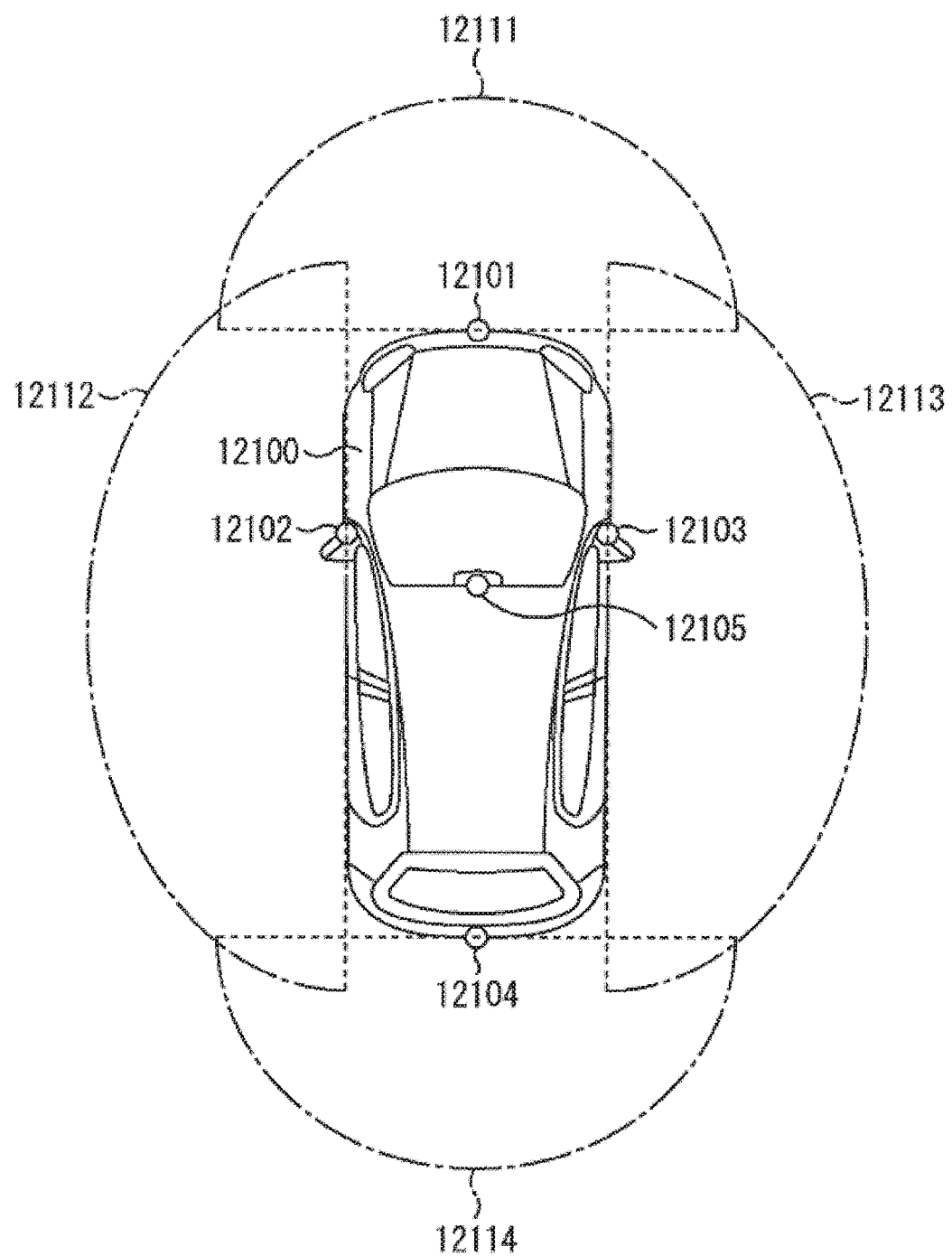

SEMICONDUCTOR DEVICE AND ELECTRONIC APPARATUS

TECHNICAL FIELD

The present technology relates to a semiconductor device and an electronic apparatus, and more particularly, to a semiconductor device and an electronic apparatus that make it possible to suppress noise that may be generated in signals.

BACKGROUND ART

In solid-state imaging devices typified by CMOS (complementary metal oxide semiconductor) image sensors, noise may be generated in pixel signals generated by respective pixels due to the internal configurations of the solid-state imaging devices.

For example, some active elements such as transistors and diodes present inside the solid-state imaging devices emit minute hot carrier light, and in a case where the hot carrier light leaks into the photoelectric conversion unit formed in a pixel, noise is generated in the pixel signals.

As a method of suppressing noise caused by hot carrier light emitted from an active element, a technique of providing a light-shielding structure to a wiring line formed between the active element and the photoelectric conversion unit has been known (e.g., see PTL 1).

In addition, for example, noise (inductive noise) may be generated in pixel signals because of an induced electromotive force due to a magnetic field caused by the internal configuration of a solid-state imaging device. Specifically, when pixel signals are read out from a certain pixel, a conductor loop is formed on a pixel array from a control line through which a control signal for selecting a pixel from which a pixel signal is read out is transmitted, and a signal line through which a pixel signal read out from the selected pixel is transmitted.

Then, the presence of a wiring line in the vicinity of the conductor loop including a control line and a signal line causes a change in currents flowing through the wiring line to generate a magnetic flux passing through the conductor loop. This generates an induced electromotive force in the conductor loop, and inductive noise may be generated in pixel signals. The following refers to a conductor loop in which a magnetic flux is generated by a change in currents flowing through a wiring line in the vicinity and generates an induced electromotive force as Victim conductor loop.

As a method of suppressing inductive noise in an electronic apparatus, there is a method of canceling the generated magnetic flux by crossing wiring lines causing the magnetic flux inside the electronic apparatus into two-layer mesh wiring lines (e.g., see PTL 2).

CITATION LIST

Patent Literature

PTL 1: International Publication No. WO 2013/115075
PTL 2: Japanese Unexamined Patent Application Publication No. 2014-57426

SUMMARY OF THE INVENTION

Problems to be Solved by the Invention

However, although it is possible in the invention described in PTL 2 above to suppress inductive noise, nothing is taken into consideration about blocking emitted hot carrier light.

The present technology has been made in view of such circumstances, and the present technology makes it possible to more effectively suppress the generation of noise in signals.

Means for Solving the Problems

A semiconductor device according to a first aspect of the present technology includes: a first semiconductor substrate on which at least a portion of a first conductor loop is formed; and a second semiconductor substrate on which a second conductor loop is formed. The second semiconductor substrate includes a first conductor layer and a second conductor layer. The first conductor layer and the second conductor layer each include a conductor. The first conductor layer and the second conductor layer are configured to cause a direction of a loop surface in which a magnetic flux is generated from the second conductor loop to be different from a direction of a loop surface in which an induced electromotive force is generated in the first conductor loop.

An electronic apparatus according to a second aspect of the present technology includes a semiconductor device including a first semiconductor substrate on which at least a portion of a first conductor loop is formed, and a second semiconductor substrate on which a second conductor loop is formed. The second semiconductor substrate includes a first conductor layer and a second conductor layer. The first conductor layer and the second conductor layer each include a conductor. The first conductor layer and the second conductor layer are configured to cause a direction of a loop surface in which a magnetic flux is generated from the second conductor loop to be different from a direction of a loop surface in which an induced electromotive force is generated in the first conductor loop.

According to the first and second aspects of the present technology, there are provided a first semiconductor substrate on which at least a portion of a first conductor loop is formed; and a second semiconductor substrate on which a second conductor loop is formed. The second semiconductor substrate includes a first conductor layer and a second conductor layer. The first conductor layer and the second conductor layer each include a conductor. The first conductor layer and the second conductor layer are configured to cause a direction of a loop surface in which a magnetic flux is generated from the second conductor loop to be different from a direction of a loop surface in which an induced electromotive force is generated in the first conductor loop.

Effects of the Invention

According to the first aspect of the present technology, it is possible to suppress the generation of noise in signals.
According to the second aspect of the present technology, it is possible to suppress the generation of noise in signals.
It should be noted that the effects described here are not necessarily limitative, but may be any of effects described in the present disclosure.

BRIEF DESCRIPTION OF DRAWING

FIG. 2 is a block diagram illustrating a configuration example of a solid-state imaging device to which the present technology is applied.
FIG. 3 is a block diagram illustrating an example of a main component of a pixel/analog processing unit.

FIG. 4 is a diagram illustrating a detailed configuration example of a pixel array.

FIG. 5 is a circuit diagram illustrating a configuration example of a pixel.

FIG. 6 is a block diagram illustrating a cross-sectional structure example of a solid-state imaging device.

FIG. 7 is a schematic configuration diagram illustrating a planar disposition example of circuit blocks each including a region in which an active element group is formed.

FIG. 8 is a diagram illustrating an example of a positional relationship between a light-shielding target region by a light-shielding structure, the region of the active element group, and a buffer region.

FIG. 9 is a diagram illustrating a first comparative example of conductor layers A and B.

FIG. 10 is a diagram illustrating a condition of a current that flows in the first comparative example.

FIG. 11 is a diagram illustrating a simulation result of inductive noise corresponding to the first comparative example.

FIG. 12 is a diagram illustrating a first configuration example of the conductor layers A and B.

FIG. 13 is a diagram illustrating a condition of a current that flows in the first configuration example.

FIG. 14 is a diagram illustrating a simulation result of inductive noise corresponding to the first configuration example.

FIG. 15 is a diagram illustrating a second configuration example of the conductor layers A and B.

FIG. 16 is a diagram illustrating a condition of a current that flows in the second configuration example.

FIG. 17 is a diagram illustrating a simulation result of inductive noise corresponding to the second configuration example.

FIG. 18 is a diagram illustrating a second comparative example of the conductor layers A and B.

FIG. 19 is a diagram illustrating a simulation result of inductive noise corresponding to the second comparative example.

FIG. 20 is a diagram illustrating a third comparative example of the conductor layers A and B.

FIG. 21 is a diagram illustrating a simulation result of inductive noise corresponding to the third comparative example.

FIG. 22 is a diagram illustrating a third configuration example of the conductor layers A and B.

FIG. 23 is a diagram illustrating a condition of a current that flows in the third configuration example.

FIG. 24 is a diagram illustrating a simulation result of inductive noise corresponding to the third configuration example.

FIG. 25 is a diagram illustrating a fourth configuration example of the conductor layers A and B.

FIG. 26 is a diagram illustrating a fifth configuration example of the conductor layers A and B.

FIG. 27 is a diagram illustrating a sixth configuration example of the conductor layers A and B.

FIG. 28 is a diagram illustrating a simulation result of inductive noise corresponding to the fourth to sixths configuration examples.

FIG. 29 is a diagram illustrating a seventh configuration example of the conductor layers A and B.

FIG. 30 is a diagram illustrating a condition of a current that flows in the seventh configuration example.

FIG. 31 is a diagram illustrating a simulation result of inductive noise corresponding to the seventh configuration example.

FIG. 32 is a diagram illustrating an eighth configuration example of the conductor layers A and B.

FIG. 33 is a diagram illustrating a ninth configuration example of the conductor layers A and B.

FIG. 34 is a diagram illustrating a tenth configuration example of the conductor layers A and B.

FIG. 35 is a diagram illustrating a simulation result of inductive noise corresponding to the eighth to tenth configuration examples.

FIG. 36 is a diagram illustrating an eleventh configuration example of the conductor layers A and B.

FIG. 37 is a diagram illustrating a condition of a current that flows in the eleventh configuration example.

FIG. 38 is a diagram illustrating a simulation result of inductive noise corresponding to the eleventh configuration example.

FIG. 39 is a diagram illustrating a twelfth configuration example of the conductor layers A and B.

FIG. 40 is a diagram illustrating a thirteenth configuration example of the conductor layers A and B.

FIG. 41 is a diagram illustrating a simulation result of inductive noise corresponding to the twelfth and thirteenth configuration examples.

FIG. 42 is a plan view illustrating a first disposition example of pads in a semiconductor substrate.

FIG. 43 is a plan view illustrating a second disposition example of the pads in the semiconductor substrate.

FIG. 44 is a plan view illustrating a third disposition example of the pads in the semiconductor substrate.

FIG. 45 is a diagram illustrating an example of a conductor having resistance values different between an X direction and a Y direction.

FIG. 46 is a diagram illustrating a modification example in which a conductor cycle in the X direction in the second configuration example of the conductor layers A and B is multiplied by ½, and an effect thereof.

FIG. 47 is a diagram illustrating a modification example in which a conductor cycle in the X direction in the fifth configuration example of the conductor layers A and B is multiplied by ½, and an effect thereof.

FIG. 48 is a diagram illustrating a modification example in which a conductor cycle in the X direction in the sixth configuration example of the conductor layers A and B is multiplied by ½, and an effect thereof.

FIG. 49 is a diagram illustrating a modification example in which a conductor cycle in the Y direction in the second configuration example of the conductor layers A and B is multiplied by ½, and an effect thereof.

FIG. 50 is a diagram illustrating a modification example in which a conductor cycle in the Y direction in the fifth configuration example of the conductor layers A and B is multiplied by ½, and an effect thereof.

FIG. 51 is a diagram illustrating a modification example in which a conductor cycle in the Y direction in the sixth configuration example of the conductor layers A and B is multiplied by ½, and an effect thereof.

FIG. 52 is a diagram illustrating a modification example in which conductor width in the X direction in the second configuration example of the conductor layers A and B is doubled, and an effect thereof.

FIG. 53 is a diagram illustrating a modification example in which conductor width in the X direction in the fifth configuration example of the conductor layers A and B is doubled, and an effect thereof.

FIG. 54 is a diagram illustrating a modification example in which conductor width in the X direction in the sixth configuration example of the conductor layers A and B is doubled, and an effect thereof.

FIG. 55 is a diagram illustrating a modification example in which conductor width in the Y direction in the second configuration example of the conductor layers A and B is doubled, and an effect thereof.

FIG. 56 is a diagram illustrating a modification example in which conductor width in the Y direction in the fifth configuration example of the conductor layers A and B is doubled, and an effect thereof.

FIG. 57 is a diagram illustrating a modification example in which conductor width in the Y direction in the sixth configuration example of the conductor layers A and B is doubled, and an effect thereof.

FIG. 58 is a diagram illustrating a modification example of a mesh conductor included in each configuration example of the conductor layers A and B.

FIG. 59 is a diagram for describing improvement in a degree of layout freedom.

FIG. 60 is a diagram for describing a reduction in a voltage drop (IR-Drop).

FIG. 61 is a diagram for describing a reduction in the voltage drop (IR-Drop).

FIG. 62 is a diagram for describing a reduction in capacitive noise.

FIG. 63 is a diagram illustrating a package stack example of a first semiconductor substrate and a second semiconductor substrate included in the solid-state imaging device.

FIG. 64 is a block diagram illustrating a configuration example of an imaging device.

FIG. 65 is a block diagram depicting an example of a schematic configuration of an in-vivo information acquisition system.

FIG. 66 is a view depicting an example of a schematic configuration of an endoscopic surgery system.

FIG. 67 is a block diagram depicting an example of a functional configuration of a camera head and a camera control unit (CCU).

FIG. 68 is a block diagram depicting an example of schematic configuration of a vehicle control system.

FIG. 69 is a diagram of assistance in explaining an example of installation positions of an outside-vehicle information detecting section and an imaging section.

MODES FOR CARRYING OUT THE INVENTION

Figure 1:
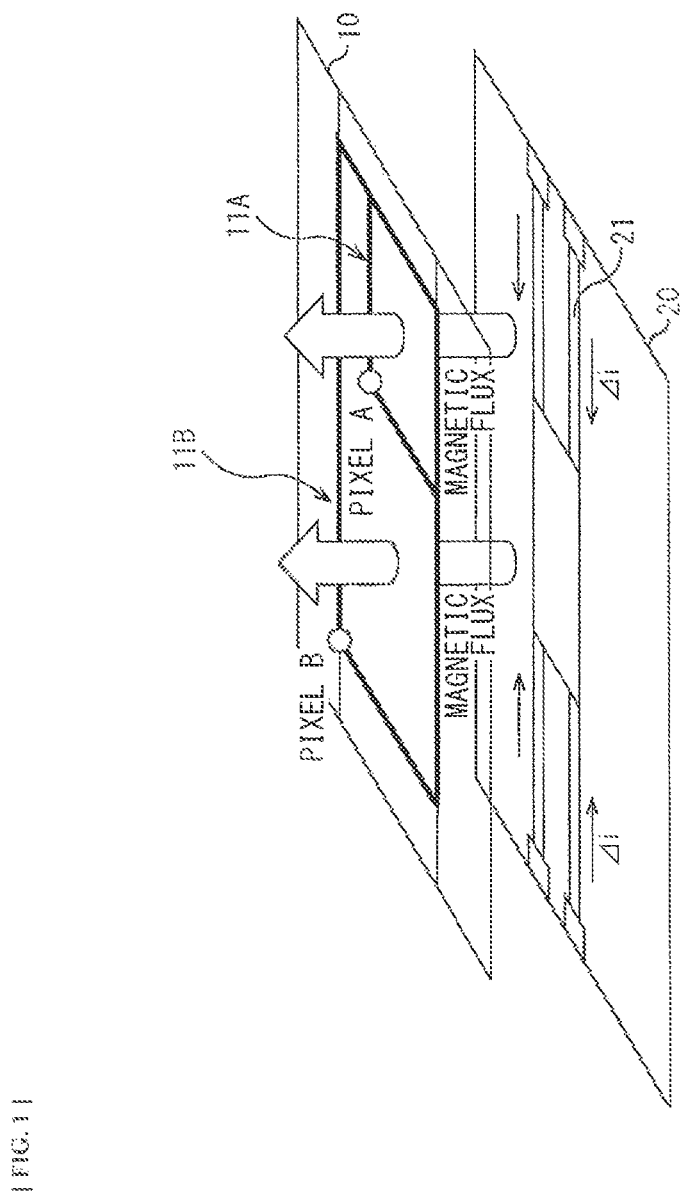
FIG. 1 is a diagram describing a change in an induced electromotive force caused by a change in a conductor loop.

The following describes the best mode (referred to as embodiment below) for carrying out the present technology in detail with reference to the drawings. It should be noted that description is given in the following order.
1. Victim Conductor Loop and Magnetic Flux
2. Configuration Example of Solid-state Imaging Device according to Embodiment of the Present Technology
3. Light-shielding Structure for Emitted Hot Carrier Light
4. Configuration Example of Conductor Layers A and B
5. Disposition Example of Electrodes in Semiconductor Substrate on Which Conductor Layers A and B Are Formed
6. Modification Example of Configuration Example of Conductor Layers A and B
7. Modification Example of Mesh Conductor
8. Various Effects
9. Example of Application
10. Configuration Example of Imaging Device
11. Example of Application to In-vivo Information Acquisition System
12. Example of Application to Endoscopic Surgery System
13. Example of Application to Mobile Body

1. VICTIM CONDUCTOR LOOP AND MAGNETIC FLUX

For example, in a case where a solid-state imaging device (semiconductor device) such as a CMOS image sensor includes, in the vicinity of a power supply wiring line, a circuit in which a Victim conductor loop is formed, a change in a magnetic flux passing through the loop surface of the Victim conductor loop sometimes causes a change in an induced electromotive force generated in the Victim conductor loop, and generates noise in pixel signals. It should be noted that it is sufficient if the Victim conductor loop at least partially includes a conductor. In addition, the entire Victim conductor loop may include a conductor.

Here, the Victim conductor loop (first conductor loop) refers to a conductor loop that is influenced by a change in the intensity of a magnetic field generated in the vicinity. In contrast, a conductor loop that is present in the vicinity of the Victim conductor loop and causes a change in flowing currents to make a change in the intensity of a magnetic field, and influence the Victim conductor loop is referred to as Aggressor conductor loop (second conductor loop).

FIG. 1 is a diagram describing a change in an induced electromotive force caused by a change in a Victim conductor loop. For example, a solid-state imaging device such as a CMOS image sensor illustrated in FIG. 1 includes a pixel substrate 10 and a logic substrate 20 stacked in this order from the top. In the solid-state imaging device of FIG. 1, at least a portion of Victim conductor loops 11 (11A and 11B) is formed in the pixel region of the pixel substrate 10. A power supply wiring line 21 for supplying (digital) power is formed in the region of the logic substrate 20 stacked on the pixel substrate 10 in the vicinity of the Victim conductor loop 11.

A magnetic flux generated by this wiring line 21 passes through the loop surface of the Victim conductor loop 11 on the pixel substrate 10, thereby causing an induced electromotive force to be generated in the Victim conductor loop 11.

It should be noted that it is possible to calculate the induced electromotive force Vemf generated in the Victim conductor loop 11 in accordance with the following expressions (1) and (2). It should be noted that $\Phi$ represents a magnetic flux, H represents the intensity of a magnetic field, $\mu$ represents a magnetic permeability, and S represents the area of the Victim conductor loop 11.

[Expression 1]
$$\Phi = \int_S \mu H \cdot dS \quad (1)$$

[Expression 2]
$$V_{emf} = -\frac{d\Phi}{dt} \quad (2)$$

The loop path of the Victim conductor loop 11 formed in the pixel region of the pixel substrate 10 changes in accordance with the position of a pixel selected as a pixel to be read out from which pixel signals are read out. In the case of the example of FIG. 1, the loop path of the Victim conductor loop 11A formed when a pixel A is selected is different from the loop path of the Victim conductor loop 11B formed when a pixel B at a position different from the position of the pixel A is selected. In other words, the effective shape of the conductor loop changes in accordance with the position of a pixel to be selected.

In this manner, as the loop path of the Victim conductor loop 11 changes, the magnetic flux passing through the loop surface of the Victim conductor loop changes. This sometimes considerably changes the induced electromotive force generated in the Victim conductor loop. In addition, the change in the induced electromotive force sometimes causes noise (inductive noise) to be generated in pixel signals read out from a pixel. This inductive noise then sometimes causes striped image noise to be generated in a captured image. That is, the image quality of the captured image is sometimes reduced.

Accordingly, the present disclosure proposes technology of suppressing the generation of inductive noise due to an induced electromotive force in a Victim conductor loop.

2. CONFIGURATION EXAMPLE OF SOLID-STATE IMAGING DEVICE (SEMICONDUCTOR DEVICE) ACCORDING TO EMBODIMENT OF THE PRESENT TECHNOLOGY

FIG. 2 is a block diagram illustrating an example of a main component of a solid-state imaging device according to an embodiment of the present technology.

A solid-state imaging device 100 illustrated in FIG. 2 is a device that photoelectrically converts light from a subject and outputs the converted light as image data. For example, the solid-state imaging device 100 is configured as a back-illuminated CMOS image sensor or the like using CMOS.

As illustrated in FIG. 2, the solid-state imaging device 100 includes a first semiconductor substrate 101 and a second semiconductor substrate 102 that are stacked.

A pixel/analog processing unit 111 including a pixel, an analog circuit, and the like is formed on the first semiconductor substrate 101. A digital processing unit 112 including a digital circuit and the like is formed on the second semiconductor substrate 102.

The first semiconductor substrate 101 and the second semiconductor substrate 102 are insulated from each other and superimposed on each other. That is, a component of the pixel/analog processing unit 111 and a component of the second semiconductor substrate 102 are basically insulated from each other. It should be noted that, although not illustrated, a component formed in the pixel/analog processing unit 111 and a component formed in the digital processing unit 112 are electrically coupled to each other as necessary (at a necessary portion), for example, through a conductor via (VIA), a through-silicon via (TSV), a junction of the same metal such as a Cu—Cu junction, an Au—Au junction, or an Al—Al junction, a junction of different metals such as a Cu—Au junction, a Cu—Al junction, or an Au—Al junction, a bonding wire, or the like.

It should be noted that FIG. 2 describes the solid-state imaging device 100 including substrates stacked in two layers as an example, but substrates are stacked in any number of layers in the solid-state imaging device 100. For example, a single layer or three or more layers may be stacked. The following describes a case where substrates in two layers are included as in the example of FIG. 2.

FIG. 3 is a block diagram illustrating an example of main components formed in the pixel/analog processing unit 111.

As illustrated in FIG. 3, a pixel array 121, an A/D conversion unit 122, a vertical scanning unit 123, and the like are formed in the pixel/analog processing unit 111.

In the pixel array 121, a plurality of pixels 131 (FIG. 4) each including a photoelectric conversion element such as a photodiode is disposed vertically and horizontally.

The A/D conversion unit 122 performs A/D conversion on an analog signal or the like read out from each pixel 131 of the pixel array 121, and outputs a resultant digital pixel signal.

The vertical scanning unit 123 controls the operation of a transistor (such as a transfer transistor 142 of FIG. 5) of each pixel 131 of the pixel array 121. That is, the charge accumulated in each pixel 131 of the pixel array 121 is read out under the control of the vertical scanning unit 123, and supplied as pixel signals to the A/D conversion unit 122 through the signal line 132 (FIG. 4) for each column of unit pixels for A/D conversion.

The A/D conversion unit 122 supplies a result (digital pixel signals) of the A/D conversion to a logic circuit (not illustrated) formed in the digital processing unit 112 for each column of the pixel 131.

FIG. 4 is a diagram illustrating a detailed configuration example of the pixel array 121. Pixels 131-11 to 131-MN are formed in the pixel array 121 (M and N each represent any natural number). That is, in the pixel array 121, the pixels 131 of M rows and N columns are disposed in a matrix (array). The following refers to the pixels 131-11 to 131-MN as pixels 131 in a case where it is unnecessary to distinguish the pixels 131-11 to 131-MN from each other.

In the pixel array 121, signal lines 132-1 to 132-N and control lines 133-1 to 133-M are formed. The following refers the signal lines 132-1 to 132-N as signal lines 132 in a case where it is unnecessary to distinguish the signal lines 132-1 to 132-N from each other, and refers to the control lines 133-1 to 133-M as control lines 133 in a case where it is unnecessary to distinguish the control lines 133-1 to 133-M from each other.

The signal line 132 corresponding to each column is coupled to the pixel 131 for each column. In addition, the control line 133 corresponding to each row is coupled to the pixel 131 for each row. A control signal from the vertical scanning unit 123 is transmitted to the pixel 131 through the control line 133.

An analog pixel signal is outputted from the pixel 131 to the A/D conversion unit 122 through the signal line 132.

Next, FIG. 5 is a circuit diagram illustrating a configuration example of the pixel 131. The pixel 131 includes a photodiode 141 serving as a photoelectric conversion element, the transfer transistor 142, a reset transistor 143, an amplifying transistor 144, and a select transistor 145.

The photodiode 141 photoelectrically converts the received light into photoelectric charge (here, photoelectrons) having a charge amount corresponding to the light amount, and accumulates the photoelectric charge. The anode electrode of the photodiode 141 is coupled to GND, and the cathode electrode is coupled to a floating diffusion (FD) through the transfer transistor 142. Needless to say, a scheme may be adopted in which the cathode electrode of the photodiode 141 is coupled to a power supply, the anode electrode is coupled to the floating diffusion through the transfer transistor 142, and photoelectric charge is read out as photoholes.

The transfer transistor 142 controls the reading of the photoelectric charge from the photodiode 141. The transfer transistor 142 has the drain electrode coupled to the floating diffusion and the source electrode coupled to the cathode electrode of the photodiode 141. In addition, a transfer control line for transmitting a transfer control signal TRG supplied from the vertical scanning unit 123 (FIG. 3) is coupled to the gate electrode of the transfer transistor 142. When the transfer control signal TRG (i.e., the gate potential of the transfer transistor 142) is off, no photoelectric charge is transferred from the photodiode 141 (photoelectric charge is accumulated in the photodiode 141). When the transfer control signal TRG (i.e., the gate potential of the transfer transistor 142) is on, the photoelectric charge accumulated in the photodiode 141 is transferred to the floating diffusion.

The reset transistor 143 resets the potential of the floating diffusion. The reset transistor 143 has the drain electrode coupled to power supply potential, and the source electrode coupled to the floating diffusion. In addition, a reset control line for transmitting a reset control signal RST supplied from the vertical scanning unit 123 is coupled to the gate electrode of the reset transistor 143. When the reset control signal RST (i.e., the gate potential of the reset transistor 143) is off, the floating diffusion is separated from the power supply potential. When the reset control signal RST (i.e., the gate potential of the reset transistor 143) is on, the charge of the floating diffusion is discharged to the power supply potential, and the floating diffusion is reset.

The amplifying transistor 144 outputs an electric signal (analog signal) corresponding to the voltage of the floating diffusion (causes a current to flow). The amplifying transistor 144 has the gate electrode coupled to the floating diffusion, the drain electrode coupled to the (source follower) power supply voltage, and the source electrode coupled to the drain electrode of the select transistor 145. For example, the amplifying transistor 144 outputs a reset signal (reset level) serving as an electric signal corresponding to the voltage of the floating diffusion reset by the reset transistor 143 to the select transistor 145 as a pixel signal. In addition, the amplifying transistor 144 outputs a light accumulation signal (signal level) serving as an electric signal corresponding to the voltage of the floating diffusion to which photoelectric charge is transferred by the transfer transistor 142 to the select transistor 145 as a pixel signal.

The select transistor 145 controls the output of electric signals supplied from the amplifying transistor 144 to the signal line (VSL) 132 (i.e., the A/D conversion unit 122). The select transistor 145 has the drain electrode coupled to the source electrode of the amplifying transistor 144, and the source electrode coupled to the signal line 132. In addition, a select control line for transmitting a select control signal SEL supplied from the vertical scanning unit 123 is coupled to the gate electrode of the select transistor 145. When the select control signal SEL (i.e., the gate potential of the select transistor 145) is off, the amplifying transistor 144 and the signal line 132 are electrically uncoupled from each other. Therefore, no reset signal or no light accumulation signal is not outputted as a pixel signal from the pixel 131 in this state. When the select control signal SEL (i.e., the gate potential of the select transistor 145) is on, the pixel 131 is selected. That is, the amplifying transistor 144 and the signal line 132 are electrically coupled to each other, and a reset signal or a light accumulation signal serving as a pixel signal outputted from the amplifying transistor 144 is supplied to the A/D conversion unit 122 through the vertical signal line 132. In short, a reset signal or a light accumulation signal serving as a pixel signal is read out from the pixel 131.

It should be noted that the pixel 131 is configured in any way, but the example of FIG. 5 is not limitative.

When the pixel 131 is selected as a target from which an analog signal serving as a pixel signal is read out, various Victim conductor loops (loop-shaped (ring-shaped) conductors) are formed in the pixel/analog processing unit 111 configured as described above by using the control line 133, the signal line 132, the power supply wiring line (analog power supply wiring line or digital power supply wiring line), and the like for controlling the various transistors described above. A magnetic flux generated from a wiring line or the like in the vicinity passes through the loop surface of each of these Victim conductor loops, thereby causing an induced electromotive force to be generated.

It is sufficient if the Victim conductor loop includes a portion of at least one of the control line 133 or the signal line 132. In addition, a Victim conductor loop including a portion of the control line 133 and a Victim conductor loop including a portion of the signal line 132 may each exist as an independent Victim conductor loop. Further, a portion or the entirety of the Victim conductor loop may be included in the second semiconductor substrate 102. Further, the Victim conductor loop may have a variable loop path or a fixed loop path.

It is desirable that the respective wiring directions of the control line 133 and the signal line 132 included in the Victim conductor loop be substantially orthogonal to each other, but may be substantially parallel to each other.

It should be noted that a conductor loop present in the vicinity of another conductor loop may serve as a Victim conductor loop. For example, even a conductor loop that is not influenced even if a change in the currents flowing through an Aggressor loop in the vicinity causes a change in the intensity of a magnetic field may serve as a Victim conductor loop.

When high-frequency signals flow through a wiring line (Aggressor conductor loop) present in the vicinity of a Victim conductor loop and the intensity of a magnetic field around the Aggressor conductor loop changes, the influence sometimes causes an induced electromotive force to be generated in the Victim conductor loop, and causes noise to be generated in the Victim conductor loop. Especially in a case where wiring lines through which currents flow in the same direction are concentrated in the vicinity of the Victim conductor loop, the intensity of a magnetic field has a greater change, and a greater induced electromotive force (i.e., noise) is generated in the Victim conductor loop.

Accordingly, in the present disclosure, the direction of the magnetic flux generated from the loop surface of the Aggressor conductor loop is adjusted to prevent the magnetic field from passing through the Aggressor conductor loop.

3. LIGHT-SHIELDING STRUCTURE FOR EMITTED HOT CARRIER LIGHT

FIG. 6 is a diagram illustrating a cross-sectional structure example of the solid-state imaging device 100.

As described above, the solid-state imaging device 100 includes the first semiconductor substrate 101 and the second semiconductor substrate 102 that are stacked.

In the first semiconductor substrate 101, for example, a pixel array in which a plurality of pixel units each including the photodiode 141 serving as a photoelectric conversion unit and the plurality of pixel transistors (the transfer transistor 142 to the select transistor 145 in FIG. 5) are two-dimensionally disposed is formed.

The photodiode 141 is formed to have, for example, an n-type semiconductor region and a p-type semiconductor region on the base front surface side (lower side in the diagram) in a well region formed in a semiconductor base 152. The plurality of pixel transistors (the transfer transistor 142 to the select transistor 145 in FIG. 5) is formed on the semiconductor base 152.

A multilayer wiring layer 153 is formed on the front surface side of the semiconductor base 152. In the multilayer wiring layer 153, wiring lines are disposed in a plurality of layers with an interlayer insulating film interposed therebetween. The wiring lines each include, for example, a copper wiring line. In the pixel transistor, the vertical scanning unit 123, and the like, wiring lines of different wiring layers are coupled to each other at a necessary position by a coupling conductor penetrating the wiring layers. For example, an antireflection film, a light-shielding film for blocking light in a predetermined region, and an optical member 155 such as a color filter or a microlens provided at the position corresponding to each photodiode 141 are formed on the back surface (upper surface in the diagram) of the semiconductor base 152.

Meanwhile, a logic circuit serving as the digital processing unit 112 (FIG. 2) is formed on the second semiconductor substrate 102. The logic circuit includes, for example, a plurality of MOS transistors 164 formed in a p-type semiconductor well region of a semiconductor base 162.

Further, a multilayer wiring layer 163 is formed on the semiconductor base 162. The multilayer wiring layer 163 includes a plurality of wiring layers in which wiring lines are disposed with an interlayer insulating film interposed therebetween. FIG. 6 illustrates two wiring layers (wiring layers 165A and 165B) of the plurality of wiring layers included in the multilayer wiring layer 163.

In the solid-state imaging device 100, the wiring layer 165A and the wiring layer 165B form a light-shielding structure 151.

Here, in the second semiconductor substrate 102, a region in which an active element such as the MOS transistor 164 is formed is defined as an active element group 167. In the second semiconductor substrate 102, for example, a circuit for achieving one function includes a combination of active elements such as a plurality of nMOS transistors and pMOS transistors. The regions in which these active element groups 167 are formed are then defined as circuit blocks (corresponding to circuit blocks 202 to 204 in FIG. 7). It should be noted that an active element formed on the second semiconductor substrate 102 may include a diode or the like in addition to the MOS transistor 164.

In the multilayer wiring layer 163 of the second semiconductor substrate 102, the light-shielding structure 151 including the wiring layer 165A and the wiring layer 165B then exists between the active element groups 167 and the photodiodes 141, thereby suppressing the hot carrier light emitted from the active element groups 167 from leaking into the photodiodes 141 (the details are described below).

Among the wiring layer 165A and the wiring layer 165B included in the light-shielding structure 151, the following refers to the wiring layer 165A closer to the first semiconductor substrate 101 as conductor layer A (first conductor layer). In the first semiconductor substrate 101, the photodiodes 141 and the like are formed. In addition, the wiring layer 165B closer to the active element groups 167 is referred to as conductor layer B (second conductor layer).

However, the wiring layer 165A closer to the first semiconductor substrate 101 in which the photodiodes 141 and the like are formed may be referred to as conductor layer B, and the wiring layer 165B closer to the active element groups 167 may be referred to as conductor layer A. Further, any of an insulating layer, a semiconductor layer, another conductor layer, and the like may be provided between the conductor layers A and B. In addition, any of an insulating layer, a semiconductor layer, another conductor layer, and the like may be provided at a position other than the position between the conductor layers A and B.

It is desirable that the conductor layer A and the conductor layer B be conductor layers in which it is the easiest for currents to flow in a circuit board, a semiconductor substrate, and an electronic apparatus. This is not, however, limitative.

It is desirable that one of the conductor layer A or the conductor layer B be the conductor layer in which it is the easiest for currents to flow in a circuit board, a semiconductor substrate, and an electronic apparatus, and the other be the conductor layer in which it is the second easiest for currents to flow in a circuit board, a semiconductor substrate, and an electronic apparatus. This is not, however, limitative.

It is desirable that one of the conductor layer A or the conductor layer B be not a conductor layer in which it is the most difficult for currents to flow in a circuit board, a semiconductor substrate, and an electronic apparatus. This is not, however, limitative. It is desirable that both of the conductor layer A and the conductor layer B be not conductor layers in which it is the most difficult for currents to flow in a circuit board, a semiconductor substrate, and an electronic apparatus. This is not, however, limitative.

For example, one of the conductor layer A or the conductor layer B may be a conductor layer in which it is the easiest for currents to flow in the first semiconductor substrate 101, and the other may be a conductor layer in which it is the second easiest for currents to flow in the first semiconductor substrate 101.

For example, one of the conductor layer A or the conductor layer B may be a conductor layer in which it is the easiest for currents to flow in the second semiconductor substrate 102, and the other may be a conductor layer in which it is the second easiest for currents to flow in the second semiconductor substrate 102.

For example, one of the conductor layer A or the conductor layer B may be a conductor layer in which it is the easiest for currents to flow in the first semiconductor substrate 101, and the other may be a conductor layer in which it is the easiest for currents to flow in the second semiconductor substrate 102.

For example, one of the conductor layer A or the conductor layer B may be a conductor layer in which it is the easiest for currents to flow in the first semiconductor substrate 101, and the other may be a conductor layer in which it is the second easiest for currents to flow in the second semiconductor substrate 102.

For example, one of the conductor layer A or the conductor layer B may be a conductor layer in which it is the second easiest for currents to flow in the first semiconductor substrate 101, and the other may be a conductor layer in which it is the easiest for currents to flow in the second semiconductor substrate 102.

For example, one of the conductor layer A or the conductor layer B may be a conductor layer in which it is the second easiest for currents to flow in the first semiconductor substrate 101, and the other may be a conductor layer in which it is the second easiest for currents to flow in the second semiconductor substrate 102.

For example, one of the conductor layer A or the conductor layer B does not have to be a conductor layer in which it is the most difficult for currents to flow in the first semiconductor substrate 101 or the second semiconductor substrate 102.

For example, both of the conductor layer A and the conductor layer B do not have to be conductor layers in which it is the most difficult for currents to flow in the first semiconductor substrate 101 or the second semiconductor substrate 102.

It should be noted that the easiest described above is replaceable with the third easiest, the fourth easiest, or the N-th (N represents a positive number) easiest, and the second easiest described above is also replaceable with the third easiest, the fourth easiest, or the N-th (N represents a positive number) easiest.

It should be noted that the above-described conductor layer in which it is easy for currents to flow in a circuit board, a semiconductor substrate, and an electronic apparatus may be considered to be any of a conductor layer in which it is easy for currents to flow in the circuit board, a conductor layer in which it is easy for currents to flow in the semiconductor substrate, and a conductor layer in which it is easy for currents to flow in the electronic apparatus. In addition, the above-described conductor layer in which it is difficult for currents to flow in a circuit board, a semiconductor substrate, and an electronic apparatus may be considered to be any of a conductor layer in which it is difficult for currents to flow in the circuit board, a conductor layer in which it is difficult for currents to flow in the semiconductor substrate, and a conductor layer in which it is difficult for currents to flow in the electronic apparatus. In addition, the above-described conductor layer in which it is easy for currents to flow is replaceable with a conductor layer having low sheet resistance. The conductor layer in which it is difficult for currents to flow is replaceable with a conductor layer having high sheet resistance.

It should be noted that, as conductor materials used for the conductor layers A and B, metal such as copper, aluminum, tungsten, chromium, nickel, tantalum, molybdenum, titanium, gold, silver, or iron, or a mixture or a compound including at least any of these is mainly used. In addition, a semiconductor such as silicon, germanium, a compound semiconductor, or an organic semiconductor may be included. Further, an insulator such as cotton, paper, polyethylene, polyvinyl chloride, natural rubber, polyester, epoxy resin, melamine resin, phenolic resin, polyurethane, synthetic resin, mica, asbestos, glass fiber, or porcelain may be included.

Flowing currents may cause the conductor layers A and B included in the light-shielding structure 151 to serve as Aggressor conductor loops.

Next, a region (light-shielding target region) in which light is blocked by the light-shielding structure 151 is described.

FIG. 7 is a schematic configuration diagram illustrating an example of the planar disposition of circuit blocks in the semiconductor base 162. The circuit blocks each include a region in which the active element group 167 is formed.

FIG. 7 illustrates, in A, an example of a case where the plurality of circuit blocks 202 to 204 is collectively treated as a light-shielding target region by the light-shielding structure 151. A region 205 including all of the circuit blocks 202, 203, and 204 serves as a light-shielding target region.

FIG. 7 illustrates, in B, an example of a case where the plurality of circuit blocks 202 to 204 is individually treated as light-shielding target regions by the light-shielding structure 151. Regions 206, 207, and 208 respectively including the circuit blocks 202, 203, and 204 individually serve as light-shielding target regions, and a region 209 other than the regions 206 to 208 is treated as a light-shielding non-target region.

In the case illustrated in B of FIG. 7, it is possible to avoid restriction on the degree of layout freedom for the conductor layers A and B included in the light-shielding structure 151. However, the conductor layers A and B have more complicated layouts, requesting much effort to be made to design the layouts of the conductor layers A and B.

To easily design the layouts of the conductor layers A and B included in the light-shielding structure 151, it is desirable to adopt the example illustrated in A of FIG. 7 and collectively treat a plurality of circuit blocks as a light-shielding target region.

Accordingly, the present disclosure proposes the structures of the conductor layers A and B that make it possible to easily design the layouts while avoiding restriction on the degree of layout freedom of the conductor layers A and B.

It should be noted that, in addition to a circuit block representing the region of the active element group 167, the light-shielding target region according to the present embodiment is provided with a buffer region in a region around the circuit block to cause the region around a circuit block to serve as a light-shielding target region. The active element group 167 serves as a light source for emitting hot carrier light. Providing a buffer region in a region around the circuit block makes it possible to prevent hot carrier light from leaking into the photodiode 141. The hot carrier light is emitted from the circuit block in an oblique direction.

FIG. 8 is a diagram illustrating an example of the positional relationship between a light-shielding target region by the light-shielding structure 151, the region of the active element group, and a buffer region.

In the example illustrated in FIG. 8, the region in which the active element group 167 is formed and buffer regions 191 around the active element group 167 serve as a light-shielding target region 194, and the light-shielding structure 151 is formed to be opposed to the light-shielding target region 194.

Here, the length from the active element group 167 to the light-shielding structure 151 is defined as interlayer distance 192. In addition, the length from an end of the active element group 167 to an end of the light-shielding structure 151 by a wiring line is defined as buffer region width 193.

The light-shielding structure 151 is formed to cause the buffer region width 193 to be greater than the interlayer distance 192. This makes it possible to block the oblique component of the hot carrier light emitted as a point light source.

It should be noted that an appropriate value for the buffer region width 193 changes depending on the interlayer distance 192 between the light-shielding structure 151 and the active element group 167. For example, in a case of the great interlayer distance 192, it is necessary to provide the large buffer region 191 to make it possible to sufficiently block the oblique component of hot carrier light emitted from the active element group 167. In contrast, in the case of the short interlayer distance 192, it is possible to sufficiently block hot carrier light emitted from the active element group 167 without providing the large buffer region 191. Therefore, if the light-shielding structure 151 is formed by using a wiring layer close to the active element group 167 among a plurality of wiring layers included in the multilayer wiring layer 163, it is possible to increase the degree of layout freedom for the conductor layers A and B. However, it is difficult in many cases to form the light-shielding structure 151 by using a wiring layer close to the active element group 167 because of layout restriction or the like of the wiring layer close to the active element group 167. In the present technology, even in a case where the light-shielding structure 151 is formed by using a wiring layer far from the active element group 167, a high degree of layout freedom is obtained.

4. CONFIGURATION EXAMPLE OF CONDUCTOR LAYERS A AND B

The following describes a configuration example of the conductor layer A (wiring layer 165A) and the conductor layer B (wiring layer 165B) included in the light-shielding structure 151 that may serve as an Aggressor conductor loop in the solid-state imaging device 100 to which the present technology is applied. However, before that, a comparative example to be compared with the configuration example is described.

First Comparative Example

FIG. 9 is a plan view illustrating a first comparative example of the conductor layers A and B included in the light-shielding structure 151 to be compared with a plurality of configuration examples. The plurality of configuration examples is described below. It should be noted that FIG. 9 illustrates the conductor layer A in A, and FIG. 9 illustrates the conductor layer B in B. In the coordinate system in FIG. 9, an X axis represents the horizontal direction, a Y axis represents the vertical direction, and a Z axis represents the direction vertical to an XY plane.

In the conductor layer A in the first comparative example, linear conductors 211 that are long in the Y direction are periodically disposed in the X direction with a conductor cycle FXA. It should be noted that conductor cycle FXA=conductor width WXA in X direction+gap width GXA in X direction. Each linear conductor 211 is, for example, a wiring line (Vss wiring line) to be coupled to GND or a negative power supply.

In the conductor layer B in the first comparative example, linear conductors 212 that are long in the Y direction are periodically disposed in the X direction with a conductor cycle FXB. It should be noted that conductor cycle FXB=conductor width WXB in X direction+gap width GXB in X direction. Each linear conductor 212 is, for example, a wiring line (Vdd wiring line) to be coupled to a positive power supply. Here, conductor cycle FXB=conductor cycle FXA.

It should be noted that the coupling destinations of the conductor layers A and B may be replaced with each other to have each linear conductor 211 as a Vdd wiring line and each linear conductor 212 as a Vss wiring line.

FIG. 9 illustrates, in C, the conductor layers A and B respectively illustrated in A and B of FIG. 9, as viewed from the photodiode 141 side (back side). In the case of the first comparative example, as illustrated in C of FIG. 9, in a case where the linear conductor 211 included in the conductor layer A and the linear conductor 212 included in the conductor layer B are disposed to overlap each other, the linear conductors 211 and 212 are formed to generate an overlapping portion in which the conductor portions are superimposed on each other. Accordingly, it is possible to sufficiently block hot carrier light emitted from the active element group 167. It should be noted that the width of the overlapping portion is also referred to as overlapping width.

FIG. 10 is a diagram illustrating a condition of currents flowing in the first comparative example (FIG. 9).

It is assumed that AC currents flow equally at the ends of the linear conductor 211 included in the conductor layer A and the linear conductor 212 included the conductor layer B. However, the current direction changes in accordance with time. For example, it is assumed that, when a current flows through the linear conductor 212 that is a Vdd wiring line from the upper side to the lower side of the diagram, a current flows through the linear conductor 211 that is a Vss wiring line from the lower side to the upper side of the diagram.

In a case where a current flows in the first comparative example as illustrated in FIG. 10, a conductor loop whose loop surface is substantially parallel to the XY plane facilitates a magnetic flux substantially in the Z direction to be generated between the linear conductor 211 that is a Vss wiring line and the linear conductor 212 that is a Vdd wiring line. The conductor loop includes the adjacent linear conductors 211 and 212 in the plan view of FIG. 10.

Meanwhile, in the pixel array 121 of the first semiconductor substrate 101 stacked on the second semiconductor substrate 102, as illustrated in FIG. 10, the Victim conductor loop including the signal line 132 and the control line 133 is formed on the XY plane. The light-shielding structure 151 including the conductor layers A and B is formed on the second semiconductor substrate 102. In the Victim conductor loop formed on the XY plane, an induced electromotive force is easily generated by the magnetic flux in the Z direction. A greater change in the induced electromotive force causes the solid-state imaging device 100 to output a more deteriorated image (having more inductive noise).

Further, an induced electromotive force is proportional to the dimension of the Victim conductor loop depending on the configuration of the Aggressor conductor loop. Accordingly, when the movement of a selection pixel in the pixel array 121 causes a change in the effective dimension of the Victim conductor loop including the signal line 132 and the control line 133, the change in the induced electromotive force stands out.

In the case of the first comparative example, the direction (substantially Z direction) of the magnetic flux generated from the loop surface of the Aggressor conductor loop of the light-shielding structure 151 including the conductor layers A and B substantially matches the direction (substantially Z direction) of the magnetic flux that easily causes the induced electromotive force to be generated in the Victim conductor loop. Accordingly, the deterioration (generation of inductive noise) of an image outputted from the solid-state imaging device 100 is expected.

FIG. 11 illustrates a simulation result of inductive noise generated in a case where the first comparative example is applied to the solid-state imaging device 100.

FIG. 11 illustrates, in A, an image in which inductive noise is generated. The image is outputted from the solid-state imaging device 100. FIG. 11 illustrates, in B, a change in pixel signals in a line segment X1-X2 of the image illustrated in A of FIG. 11. FIG. 11 illustrates, in C, a solid line L1 representing the induced electromotive force that causes inductive noise in the image. The horizontal axis in C of FIG. 11 represents the X axis coordinate of the image, and the vertical axis represents the magnitude of the induced electromotive force.

The following uses the solid line L1 illustrated in C of FIG. 11 for a comparison with the simulation result of the inductive noise generated in a case where the configuration example of the conductor layers A and B included in the light-shielding structure 151 is applied to the solid-state imaging device 100.

First Configuration Example

FIG. 12 illustrates a first configuration example of the conductor layers A and B. It should be noted that FIG. 12 illustrates the conductor layer A in A, and FIG. 12 illustrates the conductor layer B in B. In the coordinate system in FIG. 12, an X axis represents the horizontal direction, a Y axis represents the vertical direction, and a Z axis represents the direction vertical to an XY plane.

The conductor layer A in the first configuration example includes a planar conductor 213. The planar conductor 213 is, for example, a wiring line (Vss wiring line) to be coupled to GND or a negative power supply.

The conductor layer B in the first comparative example includes a planar conductor 214. The planar conductor 214 is, for example, a wiring line (Vdd wiring line) to be coupled to a positive power supply.

It should be noted that the coupling destinations of the conductor layers A and B may be replaced with each other to have the planar conductor 213 as a Vdd wiring line and each linear conductor 214 as a Vss wiring line. The same applies to each configuration example described below.

FIG. 12 illustrates, in C, the conductor layers A and B respectively illustrated in A and B of FIG. 12, as viewed from the photodiode 141 side (back side). However, a hatched region 215 in C of FIG. 12 indicates a region in which the planar conductor 213 of the conductor layer A and the planar conductor 214 of the conductor layer B overlap. In the hatched region 215, oblique lines intersect. Therefore, in the case of C of FIG. 12, it is indicated that the entire surface of the planar conductor 213 of the conductor layer A is overlaid on the entire surface of the planar conductor 214 of the conductor layer B. In the case of the first configuration example, the entire surface of the planar conductor 213 of the conductor layer A is overlaid on the entire surface of the planar conductor 214 of the conductor layer B. This makes it possible to reliably block hot carrier light emitted from the active element group 167.

FIG. 13 is a diagram illustrating a condition of currents flowing in the first configuration example (FIG. 12).

It is assumed that AC currents flow equally at the ends of the planar conductor 213 included in the conductor layer A and the planar conductor 214 included the conductor layer B. However, the current direction changes in accordance with time. For example, it is assumed that, when a current flows through the planar conductor 214 that is a Vdd wiring line from the upper side to the lower side of the diagram, a current flows through the planar conductor 213 that is a Vss wiring line from the lower side to the upper side of the diagram.

In a case where a current flows in the first configuration example as illustrated in FIG. 13, a magnetic flux substantially in the X direction and the substantially Y direction is easily generated between the planar conductor 213 that is a Vss wiring line and the planar conductor 214 that is a Vdd wiring line by a conductor loop whose loop surface is substantially vertical to the X axis and a conductor loop whose loop surface is substantially vertical to the Y axis. The conductor loops include (cross sections of) the planar conductors 213 and 214 in a cross section in which the planar conductors 213 and 214 are disposed.

Meanwhile, in the pixel array 121 of the first semiconductor substrate 101 stacked on the second semiconductor substrate 102, as illustrated in FIG. 13, the Victim conductor loop including the signal line 132 and the control line 133 is formed on the XY plane. The light-shielding structure 151 including the conductor layers A and B is formed on the second semiconductor substrate 102. In the Victim conductor loop formed on the XY plane, an induced electromotive force is easily generated by the magnetic flux in a Z-axis direction. A greater change in the induced electromotive force causes the solid-state imaging device 100 to output a more deteriorated image (having more inductive noise).

Further, when the movement of a selection pixel in the pixel array 121 causes a change in the effective dimension of the Victim conductor loop including the signal line 132 and the control line 133, the change in the induced electromotive force stands out.

In the case of the first configuration example, the direction (substantially X direction or substantially Y direction) of the magnetic flux generated from the loop surface of the Aggressor conductor loop of the light-shielding structure 151 including the conductor layers A and B is substantially orthogonal, with a difference of substantially 90 degrees, to the direction (Z direction) of the magnetic flux that causes an induced electromotive force to be generated in the Victim conductor loop. In other words, the direction of the loop surface in which the magnetic flux is generated from the Aggressor conductor loop differs substantially by 90 degrees from the direction of the loop surface in which an induced electromotive force is caused to be generated in the Victim conductor loop. Therefore, it is expected that the deterioration (generation of inductive noise) of an image to be outputted from the solid-state imaging device 100 is less than that in the case of the first comparative example.

FIG. 14 illustrates a simulation result of inductive noise generated in a case where the first configuration example (FIG. 12) is applied to the solid-state imaging device 100.

FIG. 14 illustrates, in A, an image in which inductive noise may be generated. The image is outputted from the solid-state imaging device 100. FIG. 14 illustrates, in B, a change in pixel signals in a line segment X1-X2 of the image illustrated in A of FIG. 14. FIG. 14 illustrates, in C, a solid line L11 representing the induced electromotive force that causes inductive noise in the image. The horizontal axis in C of FIG. 14 represents the X axis coordinate of the image, and the vertical axis represents the magnitude of the induced electromotive force. It should be noted that a dotted line L1 in C of FIG. 14 corresponds to the first comparative example (FIG. 9).

As can be seen from the comparison between the solid line L11 and the dotted line L1 illustrated in C of FIG. 14, the first configuration example makes it possible to suppress a change in the induced electromotive force generated in the Victim conductor loop as compared with the first comparative example. Therefore, it is possible to prevent inductive noise from being generated in an image to be outputted from the solid-state imaging device 100.

Second Configuration Example

FIG. 15 illustrates a second configuration example of the conductor layers A and B. It should be noted that FIG. 15 illustrates the conductor layer A in A, and FIG. 15 illustrates the conductor layer B in B. In the coordinate system in FIG. 15, an X axis represents the horizontal direction, a Y axis represents the vertical direction, and a Z axis represents the direction vertical to an XY plane.

The conductor layer A in the second configuration example includes a mesh conductor 216. The conductor width of the mesh conductor 216 in the X direction is defined as WXA, the gap width is defined as GXA, the conductor cycle is defined as FXA (=conductor width WXA+gap width GXA), and the end width is defined as EXA (=conductor width WXA/2). In addition, the conductor width of the mesh conductor 216 in the Y direction is defined as WYA, the gap width is defined as GYA, the conductor cycle is defined as FYA (=conductor width WYA+gap width GYA), and the end width is defined as EYA (=conductor width WYA/2). The mesh conductor 216 is, for example, a wiring line (Vss wiring line) to be coupled to GND or a negative power supply.

The conductor layer B in the second configuration example includes a mesh conductor 217. The conductor width of the mesh conductor 217 in the X direction is defined as WXB, the gap width is defined as GXB, the conductor cycle is defined as FXB (=conductor width WXB+gap width GXB), and the end width is defined as EXB (=conductor width WXB/2). In addition, the conductor width of the mesh conductor 217 in the Y direction is defined as WYB, the gap width is defined as GYB, the conductor cycle is defined as FYB (=conductor width WYB+gap width GYB), and the end width is defined as EYB (=conductor width WYB/2). The mesh conductor 217 is, for example, a wiring line (Vdd wiring line) to be coupled to a positive power supply.

It should be noted that it is desirable that the mesh conductor 216 and the mesh conductor 217 satisfy the following relationships.

conductor width $WXA$=conductor width $WYA$=conductor width $WXB$=conductor width $WYB$ gap width $GXA$=gap width $GYA$=gap width $GXB$=gap width $GYB$ end width $EXA$=end width $EYA$=end width $EXB$=end width $EYB$ conductor cycle $FXA$=conductor cycle $FYA$=conductor cycle $FXB$=conductor cycle $FYB$ FIG. 15 illustrates, in C, the conductor layers A and B respectively illustrated in A and B of FIG. 15, as viewed from the photodiode 141 side (back side). However, a hatched region 218 in C of FIG. 15 indicates a region in which the mesh conductor 216 of the conductor layer A and the mesh conductor 217 of the conductor layer B overlap. In the hatched region 218, oblique lines intersect. In the case of the second configuration example, a gap of the mesh conductor 216 included in the conductor layer A and a gap of the mesh conductor 217 included in the conductor layer B match each other. Accordingly, it is not possible to sufficiently block hot carrier light emitted from the active element group 167. However, as described below, it is possible to suppress the generation of inductive noise.

FIG. 16 is a diagram illustrating a condition of currents flowing in the second configuration example (FIG. 15).

It is assumed that AC currents flow equally at the ends of the mesh conductor 216 included in the conductor layer A and the mesh conductor 217 included the conductor layer B. However, the current direction changes in accordance with time. For example, it is assumed that, when a current flows through the mesh conductor 217 that is a Vdd wiring line from the upper side to the lower side of the diagram, a current flows through the mesh conductor 216 that is a Vss wiring line from the lower side to the upper side of the diagram.

In a case where a current flows in the second configuration example as illustrated in FIG. 16, a magnetic flux substantially in the X direction and the substantially Y direction is easily generated between the mesh conductor 216 that is a Vss wiring line and the mesh conductor 217 that is a Vdd wiring line by a conductor loop whose loop surface is substantially vertical to the X axis and a conductor loop whose loop surface is substantially vertical to the Y axis. The conductor loops include (cross sections of) the mesh conductors 216 and 217 in a cross section in which the mesh conductors 216 and 217 are disposed.

Meanwhile, in the pixel array 121 of the first semiconductor substrate 101 stacked on the second semiconductor substrate 102, as illustrated in FIG. 16, the Victim conductor loop including the signal line 132 and the control line 133 is formed on the XY plane. The light-shielding structure 151 including the conductor layers A and B is formed on the second semiconductor substrate 102. In the Victim conductor loop formed on the XY plane, an induced electromotive force is easily generated by the magnetic flux in the Z direction. A greater change in the induced electromotive force causes the solid-state imaging device 100 to output a more deteriorated image (having more inductive noise).

Further, when the movement of a selection pixel in the pixel array 121 causes a change in the effective dimension of the Victim conductor loop including the signal line 132 and the control line 133, the change in the induced electromotive force stands out.

In the case of the second configuration example, the direction (substantially X direction or substantially Y direction) of the magnetic flux generated from the loop surface of the Aggressor conductor loop of the light-shielding structure 151 including the conductor layers A and B is substantially orthogonal, with a difference of substantially 90 degrees, to the direction (Z direction) of the magnetic flux that causes an induced electromotive force to be generated in the Victim conductor loop. In other words, the direction of the loop surface in which the magnetic flux is generated from the Aggressor conductor loop differs substantially by 90 degrees from the direction of the loop surface in which an induced electromotive force is caused to be generated in the Victim conductor loop. Therefore, it is expected that the deterioration (generation of inductive noise) of an image to be outputted from the solid-state imaging device 100 is less than that in the first comparative example.

FIG. 17 illustrates a simulation result of inductive noise generated in a case where the second configuration example (FIG. 15) is applied to the solid-state imaging device 100.

FIG. 17 illustrates, in A, an image in which inductive noise may be generated. The image is outputted from the solid-state imaging device 100. FIG. 17 illustrates, in B, a change in pixel signals in a line segment X1-X2 of the image illustrated in A of FIG. 17. FIG. 17 illustrates, in C, a solid line L21 representing the induced electromotive force that causes inductive noise in the image. The horizontal axis in C of FIG. 17 represents the X axis coordinate of the image, and the vertical axis represents the magnitude of the induced electromotive force. It should be noted that a dotted line L1 in C of FIG. 17 corresponds to the first comparative example (FIG. 9).

As can be seen from comparison between the solid line L21 and the dotted line L1 illustrated in C of FIG. 17, the second configuration example makes it possible to suppress a change in the induced electromotive force generated in the Victim conductor loop as compared with the first comparative example. Therefore, it is possible to prevent inductive noise from being generated in an image to be outputted from the solid-state imaging device 100.

Second Comparative Example

In the second configuration example (FIG. 15), a relationship between the mesh conductor 216 included in the conductor layer A and the mesh conductor 217 included in the conductor layer B, conductor cycle FXA=conductor cycle FYA=conductor cycle FXB=conductor cycle FYB is satisfied.

In this manner, if the conductor cycle FXA of the conductor layer A in the X direction, the conductor cycle FYA of the conductor layer A in the Y direction, the conductor cycle FXB of the conductor layer B in the X direction, and the conductor cycle FYB of the conductor layer B in the X direction match each other, it is possible to suppress the generation of inductive noise.

Each of FIGS. 18 and 19 is a diagram for describing that it is possible to suppress the generation of inductive noise if all the conductor cycles of the conductor layer A and the conductor layer B match each other.

FIG. 18 illustrates, in A, a second comparative example in which the second configuration example is modified for a comparison with the second configuration example illustrated in FIG. 15. In this second comparative example, the gap width GXA of the mesh conductor 216 included in the conductor layer A in the X direction and the gap width GYA in the Y direction in the second configuration example are widened, and the conductor cycle FXA in the X direction and the conductor cycle FYA in the Y direction are made five times as great as those of the second configuration example. It should be noted that it is assumed that the mesh conductor 217 included in the conductor layer B in the second comparative example is the same as that of the second configuration example.

FIG. 18 illustrates, in B, the second configuration example illustrated in C of FIG. 15 at the same magnification as that of A of FIG. 18.

FIG. 19 illustrates a change in an induced electromotive force that causes inductive noise to be generated in an image as a simulation result obtained in a case where the second comparative example (A of FIG. 18) and the second configuration example (B of FIG. 18) are applied to the solid-state imaging device 100. It should be noted that it is assumed that a condition of currents flowing in the second comparative example is similar to that of FIG. 16. The horizontal axis in FIG. 19 represents the X axis coordinate of the image, and the vertical axis represents the magnitude of the induced electromotive force.

The solid line L21 in FIG. 19 corresponds to the second configuration example, and a dotted line L31 corresponds to the second comparative example.

As can be seen from the comparison between the solid line L21 and the dotted line L31, the second configuration example makes it possible to suppress a change in an induced electromotive force generated in the Victim conductor loop and suppress inductive noise as compared with the second comparative example.

Third Comparative Example

Incidentally, even in a case where the conductor width of a mesh conductor included in the conductor layer A in the second comparative example is increased, it is possible to suppress the generation of inductive noise.

Each of FIGS. 20 and 21 is a diagram for describing that increasing the conductor width of a mesh conductor included in the conductor layer A makes it possible to suppress the generation of inductive noise.

FIG. 20 illustrates, in A, the second comparative example illustrated in A of FIG. 18 again.

FIG. 20 illustrates, in B, a third comparative example in which the second configuration example is modified for a comparison with the second comparative example. In this third comparative example, the conductor width WXA and conductor width WYA of the mesh conductor 216 included in the conductor layer A in the X direction and the Y direction in the second configuration example are five times as great as those of the second configuration example. It should be noted that it is assumed that the mesh conductor 217 included in the conductor layer B in the third comparative example is the same as that of the second configuration example.

FIG. 21 illustrates a change in an induced electromotive force that causes inductive noise to be generated in an image as a simulation result obtained in a case where the third comparative example and the second comparative example are applied to the solid-state imaging device 100. It should be noted that it is assumed that a condition of currents flowing in the third comparative example is similar to that of FIG. 16. The horizontal axis in FIG. 21 represents the X axis coordinate of the image, and the vertical axis represents the magnitude of the induced electromotive force.

The solid line L41 in FIG. 21 corresponds to the third comparative example, and a dotted line L31 corresponds to the second comparative example.

As can be seen from the comparison between the solid line L41 and the dotted line L31, the third comparative example makes it possible to suppress a change in an induced electromotive force generated in the Victim conductor loop and suppress inductive noise as compared with the second comparative example.

Third Configuration Example

Next, FIG. 22 illustrates a third configuration example of the conductor layers A and B. It should be noted that FIG. 22 illustrates the conductor layer A in A, and FIG. 22 illustrates the conductor layer B in B. In the coordinate system in FIG. 22, an X axis represents the horizontal direction, a Y axis represents the vertical direction, and a Z axis represents the direction vertical to an XY plane.

The conductor layer A in the third configuration example includes a planar conductor 221. The planar conductor 221 is, for example, a wiring line (Vss wiring line) to be coupled to GND or a negative power supply.

The conductor layer B in the third configuration example includes a mesh conductor 222. The conductor width of the mesh conductor 222 in the X direction is defined as WXB, the gap width is defined as GXB, and the conductor cycle is defined as FXB (=conductor width WXB+gap width GXB). In addition, the conductor width of the mesh conductor 222 in the Y direction is defined as WYB, the gap width is defined as GYB, the conductor cycle is defined as FYB (=conductor width WYB+gap width GYB), and the end width is defined as EYB. The mesh conductor 222 is, for example, a wiring line (Vdd wiring line) to be coupled to a positive power supply.

It should be noted that it is desirable that the mesh conductor 222 satisfy the following relationships.

conductor width $WXB$=conductor width $WYB$ gap width $GXB$=gap width $GYB$ end width $EYB$=conductor width $WYB/2$ conductor cycle $FXB$=conductor cycle $FYB$ As in the relationships described above, equalizing the conductor widths, the conductor cycles, and the gap widths between the X direction and the Y direction makes the wiring resistances and wiring impedances of the mesh conductor 222 uniform between the X direction and the Y direction. This makes it possible to equalize the magnetic field resistances and the voltage drops between the X direction and the Y direction.

In addition, making the end width EYB half as great as the conductor width WYB makes it possible to suppress an induced electromotive force generated in the Victim conductor loop by the magnetic field generated around an end of the mesh conductor 222.

FIG. 22 illustrates, in C, the conductor layers A and B respectively illustrated in A and B of FIG. 22, as viewed from the photodiode 141 side (back side). However, a hatched region 223 in C of FIG. 22 indicates a region in which the planar conductor 221 of the conductor layer A and the mesh conductor 222 of the conductor layer B overlap. In the hatched region 223, oblique lines intersect. In the case of the third configuration example, the active element group 167 is covered by at least one of the conductor layer A or the conductor layer B. This makes it possible to block hot carrier light emitted from the active element group 167.

FIG. 23 is a diagram illustrating a condition of currents flowing in the third configuration example (FIG. 22).

It is assumed that AC currents flow equally at the ends of the planar conductor 221 included in the conductor layer A and the mesh conductor 222 included the conductor layer B. However, the current direction changes in accordance with time. For example, it is assumed that, when a current flows through the mesh conductor 222 that is a Vdd wiring line from the upper side to the lower side of the diagram, a current flows through the planar conductor 221 that is a Vss wiring line from the lower side to the upper side of the diagram.

In a case where a current flows in the third configuration example as illustrated in FIG. 23, a magnetic flux substantially in the X direction and the substantially Y direction is easily generated between the planar conductor 221 that is a Vss wiring line and the mesh conductor 222 that is a Vdd wiring line by a conductor loop whose loop surface is substantially vertical to the X axis and a conductor loop whose loop surface is substantially vertical to the Y axis. The conductor loops include (cross sections of) the planar conductor 221 and the mesh conductor 222 in a cross section in which the planar conductor 221 and the mesh conductor 222 are disposed.

Meanwhile, in the pixel array 121 of the first semiconductor substrate 101 stacked on the second semiconductor substrate 102, the Victim conductor loop including the signal line 132 and the control line 133 is formed on the XY plane. The light-shielding structure 151 including the conductor layers A and B is formed on the second semiconductor substrate 102. In the Victim conductor loop formed on the XY plane, an induced electromotive force is easily generated by the magnetic flux in the Z direction. A greater change in the induced electromotive force causes the solid-state imaging device 100 to output a more deteriorated image (having more inductive noise).

Further, when the movement of a selection pixel in the pixel array 121 causes a change in the effective dimension of the Victim conductor loop including the signal line 132 and the control line 133, the change in the induced electromotive force stands out.

In the case of the third configuration example, the direction (substantially X direction or substantially Y direction) of the magnetic flux generated from the loop surface of the Aggressor conductor loop of the light-shielding structure 151 including the conductor layers A and B is substantially orthogonal, with a difference of substantially 90 degrees, to the direction (Z direction) of the magnetic flux that causes an induced electromotive force to be generated in the Victim conductor loop. In other words, the direction of the loop surface in which the magnetic flux is generated from the Aggressor conductor loop differs substantially by 90 degrees from the direction of the loop surface in which an induced electromotive force is caused to be generated in the Victim conductor loop. Therefore, it is expected that the deterioration (generation of inductive noise) of an image to be outputted from the solid-state imaging device 100 is less than that in the first comparative example.

FIG. 24 illustrates a simulation result of inductive noise generated in a case where the third configuration example (FIG. 22) is applied to the solid-state imaging device 100.

FIG. 24 illustrates, in A, an image in which inductive noise may be generated. The image is outputted from the solid-state imaging device 100. FIG. 24 illustrates, in B, a change in pixel signals in a line segment X1-X2 of the image illustrated in A of FIG. 24. FIG. 24 illustrates, in C, a solid line L51 representing the induced electromotive force that causes inductive noise in the image. The horizontal axis in C of FIG. 24 represents the X axis coordinate of the image, and the vertical axis represents the magnitude of the induced electromotive force. It should be noted that a dotted line L1 in C of FIG. 24 corresponds to the first comparative example (FIG. 9).

As can be seen from the comparison between the solid line L51 and the dotted line L1 illustrated in C of FIG. 24, the third configuration example makes it possible to suppress a change in the induced electromotive force generated in the Victim conductor loop as compared with the first comparative example. Therefore, it is possible to prevent inductive noise from being generated in an image to be outputted from the solid-state imaging device 100.

Fourth Configuration Example

Next, FIG. 25 illustrates a fourth configuration example of the conductor layers A and B. It should be noted that FIG. 25 illustrates the conductor layer A in A, and FIG. 25 illustrates the conductor layer B in B. In the coordinate system in FIG. 25, an X axis represents the horizontal direction, a Y axis represents the vertical direction, and a Z axis represents the direction vertical to an XY plane.

The conductor layer A in the fourth configuration example includes a mesh conductor 231. The conductor width of the mesh conductor 231 in the X direction is defined as WXA, the gap width is defined as GXA, the conductor cycle is defined as FXA (=conductor width WXA+gap width GXA), and the end width is defined as EXA (=conductor width WXA/2). In addition, the conductor width of the mesh conductor 215 in the Y direction is defined as WYA, the gap width is defined as GYA, and the conductor cycle is defined as FYA (=conductor width WYA+gap width GYA). The mesh conductor 231 is, for example, a wiring line (Vss wiring line) to be coupled to GND or a negative power supply.

The conductor layer B in the fourth configuration example includes a mesh conductor 232. The conductor width of the mesh conductor 232 in the X direction is defined as WXB, the gap width is defined as GXB, and the conductor cycle is defined as FXB (=conductor width WXB+gap width GXB). In addition, the conductor width of the mesh conductor 232 in the Y direction is defined as WYB, the gap width is defined as GYB, the conductor cycle is defined as FYB (=conductor width WYB+gap width GYB), and the end width is defined as EYB (=conductor width WYB/2). The mesh conductor 232 is, for example, a wiring line (Vdd wiring line) to be coupled to a positive power supply.

It should be noted that it is desirable that the mesh conductor 231 and the mesh conductor 232 satisfy the following relationships.

conductor width $WXA$=conductor width $WYA$=conductor width $WXB$=conductor width $WYB$ gap width $GXA$=gap width $GYA$=gap width $GXB$=gap width $GYB$ end width $EXA$=end width $EYB$ conductor cycle $FXA$=conductor cycle $FYA$=conductor cycle $FXB$=conductor cycle $FYB$ conductor width $WYA$=2×overlapping width+gap width $GYA$ and conductor width $WXA$=2×overlapping width+gap width $GXA$ conductor width $WYB$=2×overlapping width+gap width $GYB$ and conductor width $WXB$=2×overlapping width+gap width $GXB$ Here, the overlapping width is the width of the overlapping portion where the conductor portions overlap in a case where the mesh conductor 231 of the conductor layer A and the mesh conductor 232 of the conductor layer B are disposed in an overlapping manner.

As in the relationships described above, equalizing all the conductor cycles of the mesh conductor 231 and the mesh conductor 232 in the X direction and the Y direction makes it possible to cause the current distribution of the mesh conductor 231 and the current distribution of the mesh conductor 232 to be substantially equal and have opposite characteristics. This makes it possible to effectively offset the magnetic field generated by the current distribution of the mesh conductor 231 and the magnetic field generated by the current distribution of the mesh conductor 232.

In addition, equalizing all the conductor cycles, conductor widths, and gap widths of the mesh conductor 231 and the mesh conductor 232 in the X direction and the Y direction makes the wiring resistances and the wiring impedances of the mesh conductor 231 and the mesh conductor 232 uniform between the X direction and the Y direction. This makes it possible to make the magnetic field resistances and the voltage drops equal between the X direction and the Y direction.

In addition, making the end width EXA of the mesh conductor 231 half as great as the conductor width WXA makes it possible to suppress an induced electromotive force generated in the Victim conductor loop by the magnetic field generated around an end of the mesh conductor 231. In addition, making the end width EYB of the mesh conductor 232 half as great as the conductor width WYB makes it possible to suppress an induced electromotive force generated in the Victim conductor loop by the magnetic field generated around an end of the mesh conductor 231.

It should be noted that, instead of providing an end in the X direction of the mesh conductor 231 of the conductor layer A, the end of the mesh conductor 232 of the conductor layer B in the X direction may be provided. In addition, instead of providing the end of the mesh conductor 232 of the conductor layer B in the Y direction, an end in the Y direction of the mesh conductor 231 of the conductor layer A may be provided.

FIG. 25 illustrates, in C, the conductor layers A and B respectively illustrated in A and B of FIG. 25, as viewed from the photodiode 141 side (back side). However, a hatched region 233 in C of FIG. 25 indicates a region in which the mesh conductor 231 of the conductor layer A and the mesh conductor 232 of the conductor layer B overlap. In the hatched region 233, oblique lines intersect. In the case of the fourth configuration example, the active element group 167 is covered by at least one of the conductor layer A or the conductor layer B. This makes it possible to block hot carrier light emitted from the active element group 167.

However, for the mesh conductor 231 of the conductor layer A and the mesh conductor 232 of the conductor layer B to completely block emitted hot carrier light, the following relationships have to be satisfied.

conductor width $WYA$≥gap width $GYA$ conductor width $WXA$≥gap width $GXA$ conductor width $WYB$≥gap width $GYB$ conductor width $WXB$≥gap width $GXB$ This case means that the following relationships are satisfied.

conductor width $WYA$=2×overlapping width+gap width $GYA$ conductor width $WXA$=2×overlapping width+gap width $GXA$ conductor width $WYB$=2×overlapping width+gap width $GYB$ conductor width $WXB$=2×overlapping width+gap width $GXB$ In a case where a current flows in the fourth configuration example similarly to the case illustrated in FIG. 23, a magnetic flux substantially in the X direction and the substantially Y direction is easily generated between the mesh conductor 231 that is a Vss wiring line and the mesh conductor 232 that is a Vdd wiring line by a conductor loop whose loop surface is substantially vertical to the X axis and a conductor loop whose loop surface is substantially vertical to the Y axis. The conductor loops include (cross sections of) the mesh conductors 231 and 232 in a cross section in which the mesh conductors 231 and 232 are disposed.

Fifth Configuration Example

Next, FIG. 26 illustrates a fifth configuration example of the conductor layers A and B. It should be noted that FIG. 26 illustrates the conductor layer A in A, and FIG. 26 illustrates the conductor layer B in B. In the coordinate system in FIG. 26, an X axis represents the horizontal direction, a Y axis represents the vertical direction, and a Z axis represents the direction vertical to an XY plane.

The conductor layer A in the fifth configuration example includes a mesh conductor 241. The mesh conductor 241 is obtained by moving the mesh conductor 231 included in the conductor layer A in the fourth configuration example (FIG. 25) by the conductor cycle FYA/2 in the Y direction. The mesh conductor 241 is, for example, a wiring line (Vss wiring line) to be coupled to GND or a negative power supply.

The conductor layer B in the fifth configuration example includes a mesh conductor 242. The mesh conductor 242 has a shape similar to that of the mesh conductor 232 included in the conductor layer B in the fourth configuration example (FIG. 25), and the description thereof is thus omitted. The mesh conductor 242 is, for example, a wiring line (Vdd wiring line) to be coupled to a positive power supply.

It should be noted that it is desirable that the mesh conductor 241 and the mesh conductor 242 satisfy the following relationships.

conductor width $WXA$=conductor width $WYA$=conductor width $WXB$=conductor width $WYB$ gap width $GXA$=gap width $GYA$=gap width $GXB$=gap width $GYB$ end width $EXA$=end width $EYB$ conductor cycle $FXA$=conductor cycle $FYA$=conductor cycle $FXB$=conductor cycle $FYB$ conductor width $WYA$=2×overlapping width+gap width $GYA$ and conductor width $WXA$=2×overlapping width+gap width $GXA$ conductor width $WYB$=2×overlapping width+gap width $GYB$ and conductor width $WXB$=2×overlapping width+gap width $GXB$ Here, the overlapping width is the width of the overlapping portion where the conductor portions overlap in a case where the mesh conductor 241 of the conductor layer A and the mesh conductor 242 of the conductor layer B are disposed in an overlapping manner.

FIG. 26 illustrates, in C, the conductor layers A and B respectively illustrated in A and B of FIG. 26, as viewed from the photodiode 141 side (back side). However, a hatched region 243 in C of FIG. 26 indicates a region in which the mesh conductor 241 of the conductor layer A and the mesh conductor 242 of the conductor layer B overlap. In the hatched region 243, oblique lines intersect. In the case of the fifth configuration example, the active element group 167 is covered by at least one of the conductor layer A or the conductor layer B. This makes it possible to block hot carrier light emitted from the active element group 167.

In addition, in the case of the fifth configuration example, the region 243 in which the mesh conductor 241 and the mesh conductor 242 overlap each other is continuous in the X direction. In the region 243 in which the mesh conductor 241 and the mesh conductor 242 overlap each other, respective currents different in polarity flow through the mesh conductor 241 and the mesh conductor 242. This allows the magnetic fields generated from the region 243 to cancel each other. Therefore, it is possible to suppress the generation of inductive noise near the region 243.

In a case where a current flows in the fifth configuration example similarly to the case illustrated in FIG. 23, a magnetic flux substantially in the X direction and the substantially Y direction is easily generated between the mesh conductor 241 that is a Vss wiring line and the mesh conductor 242 that is a Vdd wiring line by a conductor loop whose loop surface is substantially vertical to the X axis and a conductor loop whose loop surface is substantially vertical to the Y axis. The conductor loops include (cross sections of) the mesh conductors 241 and 242 in a cross section in which the mesh conductors 241 and 242 are disposed.

Sixth Configuration Example

Next, FIG. 27 illustrates a sixth configuration example of the conductor layers A and B. It should be noted that FIG. 27 illustrates the conductor layer A in A, and FIG. 27 illustrates the conductor layer B in B. In the coordinate system in FIG. 27, an X axis represents the horizontal direction, a Y axis represents the vertical direction, and a Z axis represents the direction vertical to an XY plane.

The conductor layer A in the sixth configuration example includes a mesh conductor 251. The mesh conductor 251 has a shape similar to that of the mesh conductor 231 included in the conductor layer A in the fourth configuration example (FIG. 25), and the description thereof is thus omitted. The mesh conductor 251 is, for example, a wiring line (Vss wiring line) to be coupled to GND or a negative power supply.

The conductor layer B in the sixth configuration example includes a mesh conductor 252. The mesh conductor 252 is obtained by moving the mesh conductor 232 included in the conductor layer B in the fourth configuration example (FIG. 25) by the conductor cycle FXB/2 in the X direction. The mesh conductor 252 is, for example, a wiring line (Vdd wiring line) to be coupled to a positive power supply.

It should be noted that it is desirable that the mesh conductor 251 and the mesh conductor 252 satisfy the following relationships.

conductor width $WXA$=conductor width $WYA$=conductor width $WXB$=conductor width $WYB$ gap width $GXA$=gap width $GYA$=gap width $GXB$=gap width $GYB$ end width $EXA$=end width $EYB$ conductor cycle $FXA$=conductor cycle $FYA$=conductor cycle $FXB$=conductor cycle $FYB$ conductor width $WYA$=2×overlapping width+gap width $GYA$ and conductor width $WXA$=2×overlapping width+gap width $GXA$ conductor width $WYB$=2×overlapping width+gap width $GYB$ and conductor width $WXB$=2×overlapping width+gap width $GXB$ Here, the overlapping width is the width of the overlapping portion where the conductor portions overlap in a case where the mesh conductor 251 of the conductor layer A and the mesh conductor 252 of the conductor layer B are disposed in an overlapping manner.

FIG. 27 illustrates, in C, the conductor layers A and B respectively illustrated in A and B of FIG. 27, as viewed from the photodiode 141 side (back side). However, a hatched region 253 in C of FIG. 27 indicates a region in which the mesh conductor 251 of the conductor layer A and the mesh conductor 252 of the conductor layer B overlap. In the hatched region 253, oblique lines intersect. In the case of the sixth configuration example, the active element group 167 is covered by at least one of the conductor layer A or the conductor layer B. This makes it possible to block hot carrier light emitted from the active element group 167.

In a case where a current flows in the sixth configuration example similarly to the case illustrated in FIG. 23, a magnetic flux substantially in the X direction and the substantially Y direction is easily generated between the mesh conductor 251 that is a Vss wiring line and the mesh conductor 252 that is a Vdd wiring line by a conductor loop whose loop surface is substantially vertical to the X axis and a conductor loop whose loop surface is substantially vertical to the Y axis. The conductor loops include (cross sections of)

the mesh conductors 251 and 252 in a cross section in which the mesh conductors 251 and 252 are disposed.

Further, in the case of the sixth configuration example, the region 253 in which the mesh conductor 251 and the mesh conductor 252 overlap each other is continuous in the Y direction. In this region 253 in which the mesh conductor 251 and the mesh conductor 252 overlap each other, respective currents different in polarity flow through the mesh conductor 251 and the mesh conductor 252. This allows the magnetic fields generated from the region 253 to cancel each other. Therefore, it is possible to suppress the generation of inductive noise near the region 253.

Simulation Results of Fourth to Sixth Configuration Examples

FIG. 28 illustrates a change in an induced electromotive force that causes inductive noise to be generated in an image as a simulation result obtained in a case where the fourth to sixth configuration examples (FIGS. 25 to 27) are applied to the solid-state imaging device 100. It should be noted that it is assumed that a condition of currents flowing in the fourth to sixth configuration examples is similar to that of FIG. 23. The horizontal axis in FIG. 28 represents the X axis coordinate of the image, and the vertical axis represents the magnitude of the induced electromotive force.

A solid line L52 in A of FIG. 28 corresponds to the fourth configuration example (FIG. 25), and a dotted line L1 corresponds to the first comparative example (FIG. 9). As can be seen from the comparison between the solid line L52 and the dotted line L31, the fourth configuration example makes it possible to suppress a change in an induced electromotive force generated in the Victim conductor loop and suppress inductive noise as compared with the first comparative example.

A solid line L53 in B of FIG. 28 corresponds to the fifth configuration example (FIG. 26), and a dotted line L1 corresponds to the first comparative example (FIG. 9). As can be seen from the comparison between the solid line L53 and the dotted line L31, the fifth configuration example makes it possible to suppress a change in an induced electromotive force generated in the Victim conductor loop and suppress inductive noise as compared with the first comparative example.

A solid line L54 in C of FIG. 28 corresponds to the sixth configuration example (FIG. 27), and a dotted line L1 corresponds to the first comparative example (FIG. 9). As can be seen from the comparison between the solid line L54 and the dotted line L31, the sixth configuration example makes it possible to suppress a change in an induced electromotive force generated in the Victim conductor loop and suppress inductive noise as compared with the first comparative example.

In addition, as can be seen from the comparison between the solid lines L52 to L54, the sixth configuration example makes it possible to further suppress a change in an induced electromotive force generated in the Victim conductor loop and further suppress inductive noise as compared with the fourth configuration example and the fifth configuration example.

Seventh Configuration Example

Next, FIG. 29 illustrates a seventh configuration example of the conductor layers A and B. It should be noted that FIG. 29 illustrates the conductor layer A in A, and FIG. 29 illustrates the conductor layer B in B. In the coordinate system in FIG. 29, an X axis represents the horizontal direction, a Y axis represents the vertical direction, and a Z axis represents the direction vertical to an XY plane.

The conductor layer A in the seventh configuration example includes a planar conductor 261. The planar conductor 261 is, for example, a wiring line (Vss wiring line) to be coupled to GND or a negative power supply.

The conductor layer B in the seventh configuration example includes a mesh conductor 262 and a relay conductor 301. The mesh conductor 262 has a shape similar to that of the mesh conductor 222 of the conductor layer B in the third configuration example (FIG. 22), and the description thereof is thus omitted. The mesh conductor 262 is, for example, a wiring line (Vdd wiring line) to be coupled to a positive power supply.

The relay conductor (other conductor) 301 is disposed in a gap region of the mesh conductor 262 that is not a conductor, and electrically insulated from the mesh conductor 262. The relay conductor (other conductor) 301 is coupled to Vss to which the planar conductor 261 of the conductor layer A is coupled.

The relay conductor 301 has any shape, and a symmetrical circular or polygonal shape such as rotational symmetry or mirror symmetry is desirable. It is possible to dispose the relay conductor 301 in the middle of the gap region of the mesh conductor 262 or at any other position. The relay conductor 301 may be coupled to a conductor layer serving as a Vss wiring line that is different from the conductor layer A. The relay conductor 301 may be coupled to a conductor layer serving as a Vss wiring line closer to the active element group 167 than the conductor layer B. It is possible to couple the relay conductor 301 to a conductor layer different from the conductor layer A, a conductor layer closer to the active element group 167 than the conductor layer B, or the like through a conductor via (VIA) extending in the Z direction.

FIG. 29 illustrates, in C, the conductor layers A and B respectively illustrated in A and B of FIG. 29, as viewed from the photodiode 141 side (back side). However, a hatched region 263 in C of FIG. 29 indicates a region in which the planar conductor 261 of the conductor layer A and the mesh conductor 262 of the conductor layer B overlap. In the hatched region 263, oblique lines intersect. In the case of the seventh configuration example, the active element group 167 is covered by at least one of the conductor layer A or the conductor layer B. This makes it possible to block hot carrier light emitted from the active element group 167.

In addition, in the case of the seventh configuration example, providing the relay conductor 301 makes it possible to couple the planar conductor 261 that is a Vss wiring line to the active element group 167 in substantially the shortest distance or a short distance. Coupling the planar conductor 261 and the active element group 167 to each other in substantially the shortest distance or a short distance makes it possible to reduce a voltage drop, energy loss, or inductive noise between the planar conductor 261 and the active element group 167.

FIG. 30 is a diagram illustrating a condition of currents flowing in the seventh configuration example (FIG. 29).

It is assumed that AC currents flow equally at the ends of the planar conductor 261 included in the conductor layer A and the mesh conductor 262 included the conductor layer B. However, the current direction changes in accordance with time. For example, it is assumed that, when a current flows through the mesh conductor 262 that is a Vdd wiring line from the upper side to the lower side of the diagram, a current flows through the planar conductor 261 that is a Vss wiring line from the lower side to the upper side of the diagram.

In a case where a current flows in the seventh configuration example as illustrated in FIG. 30, a magnetic flux substantially in the X direction and the substantially Y direction is easily generated between the planar conductor 261 that is a Vss wiring line and the mesh conductor 262 that is a Vdd wiring line by a conductor loop whose loop surface is substantially vertical to the X axis and a conductor loop whose loop surface is substantially vertical to the Y axis. The conductor loops include (cross sections of) the planar conductor 261 and the mesh conductor 262 in a cross section in which the planar conductor 261 and the mesh conductor 262 are disposed.

Meanwhile, in the pixel array 121 of the first semiconductor substrate 101 stacked on the second semiconductor substrate 102, the Victim conductor loop including the signal line 132 and the control line 133 is formed on the XY plane. The light-shielding structure 151 including the conductor layers A and B is formed on the second semiconductor substrate 102. In the Victim conductor loop formed on the XY plane, an induced electromotive force is easily generated by the magnetic flux in the Z direction. A greater change in the induced electromotive force causes the solid-state imaging device 100 to output a more deteriorated image (having more inductive noise).

Further, when the movement of a selection pixel in the pixel array 121 causes a change in the effective dimension of the Victim conductor loop including the signal line 132 and the control line 133, the change in the induced electromotive force stands out.

In the case of the seventh configuration example, the direction (substantially X direction or substantially Y direction) of the magnetic flux generated from the loop surface of the Aggressor conductor loop of the light-shielding structure 151 including the conductor layers A and B is substantially orthogonal, with a difference of substantially 90 degrees, to the direction (Z direction) of the magnetic flux that causes an induced electromotive force to be generated in the Victim conductor loop. In other words, the direction of the loop surface in which the magnetic flux is generated from the Aggressor conductor loop differs substantially by 90 degrees from the direction of the loop surface in which an induced electromotive force is caused to be generated in the Victim conductor loop. Therefore, it is expected that the deterioration (generation of inductive noise) of an image to be outputted from the solid-state imaging device 100 is less than that in the first comparative example.

FIG. 31 illustrates a simulation result of inductive noise generated in a case where the seventh configuration example (FIG. 29) is applied to the solid-state imaging device 100.

FIG. 31 illustrates, in A, an image in which inductive noise may be generated. The image is outputted from the solid-state imaging device 100. FIG. 31 illustrates, in B, a change in pixel signals in a line segment X1-X2 of the image illustrated in A of FIG. 31. FIG. 31 illustrates, in C, a solid line L61 representing the induced electromotive force that causes inductive noise in the image. The horizontal axis in C of FIG. 31 represents the X axis coordinate of the image, and the vertical axis represents the magnitude of the induced electromotive force. It should be noted that a dotted line L51 in C of FIG. 31 corresponds to the third configuration example (FIG. 22).

As can be seen from the comparison between the solid line L61 and the dotted line L51 illustrated in C of FIG. 31, the seventh configuration example does not deteriorate a change in the induced electromotive force generated in the Victim conductor loop as compared with the third configuration example. In other words, even in the seventh configuration example in which the relay conductor 301 is disposed in the gap of the mesh conductor 262 of the conductor layer B, it is possible to suppress the generation of inductive noise in an image to be outputted from the solid-state imaging device 100 to the same extent as in the third configuration example. However, this simulation result is a simulation result obtained in a case where the planar conductor 261 is not coupled to the active element group 167 and the mesh conductor 262 is not coupled to the active element group 167. For example, in a case where the planar conductor 261 and the active element group 167 are at least partially coupled to each other through a conductor via or the like in substantially the shortest distance or a short distance, or in a case where the mesh conductor 262 and the active element group 167 are at least partially coupled to each other through a conductor via or the like in substantially the shortest distance or a short distance, the amount of currents flowing through the planar conductor 261 or the mesh conductor 262 becomes gradually smaller in accordance with the position. In such a case, there is also a condition for great improvement to reduce the voltage drop, energy loss, and inductive noise to half or less by providing the relay conductor 301.

Eighth Configuration Example

Next, FIG. 32 illustrates an eighth configuration example of the conductor layers A and B. It should be noted that FIG. 32 illustrates the conductor layer A in A, and FIG. 32 illustrates the conductor layer B in B. In the coordinate system in FIG. 32, an X axis represents the horizontal direction, a Y axis represents the vertical direction, and a Z axis represents the direction vertical to an XY plane.

The conductor layer A in the eighth configuration example includes a mesh conductor 271. The mesh conductor 271 has a shape similar to that of the mesh conductor 231 of the conductor layer A in the fourth configuration example (FIG. 25), and the description thereof is thus omitted. The mesh conductor 271 is, for example, a wiring line (Vss wiring line) to be coupled to GND or a negative power supply.

The conductor layer B in the eighth configuration example includes a mesh conductor 272 and a relay conductor 302. The mesh conductor 272 has a shape similar to that of the mesh conductor 232 of the conductor layer B in the fourth configuration example (FIG. 25), and the description thereof is thus omitted. The mesh conductor 232 is, for example, a wiring line (Vdd wiring line) to be coupled to a positive power supply.

The relay conductor (other conductor) 302 is disposed in a gap region of the mesh conductor 272 that is not a conductor, and electrically insulated from the mesh conductor 272. The relay conductor (other conductor) 302 is coupled to Vss to which the mesh conductor 271 of the conductor layer A is coupled.

It should be noted that the relay conductor 302 has any shape, and a symmetrical circular or polygonal shape such as rotational symmetry or mirror symmetry is desirable. It is possible to dispose the relay conductor 302 in the middle of the gap region of the mesh conductor 272 or at any other position. The relay conductor 302 may be coupled to a conductor layer serving as a Vss wiring line that is different from the conductor layer A. The relay conductor 302 may be coupled to a conductor layer serving as a Vss wiring line closer to the active element group 167 than the conductor layer B. It is possible to couple the relay conductor 302 to a conductor layer different from the conductor layer A, a conductor layer closer to the active element group 167 than the conductor layer B, or the like through a conductor via (VIA) extending in the Z direction.

FIG. 32 illustrates, in C, the conductor layers A and B respectively illustrated in A and B of FIG. 32, as viewed from the photodiode 141 side (back side). However, a hatched region 273 in C of FIG. 32 indicates a region in which the mesh conductor 271 of the conductor layer A and the mesh conductor 272 of the conductor layer B overlap. In the hatched region 273, oblique lines intersect. In the case of the eighth configuration example, the active element group 167 is covered by at least one of the conductor layer A or the conductor layer B. This makes it possible to block hot carrier light emitted from the active element group 167.

In a case where a current flows in the eighth configuration example similarly to the case illustrated in FIG. 30, a magnetic flux substantially in the X direction and the substantially Y direction is easily generated between the mesh conductor 271 that is a Vss wiring line and the mesh conductor 272 that is a Vdd wiring line by a conductor loop whose loop surface is substantially vertical to the X axis and a conductor loop whose loop surface is substantially vertical to the Y axis. The conductor loops include (cross sections of) the mesh conductors 271 and 272 in a cross section in which the mesh conductors 271 and 272 are disposed.

In addition, in the case of the eighth configuration example, providing the relay conductor 302 makes it possible to couple the mesh conductor 271 that is a Vss wiring line to the active element group 167 in substantially the shortest distance or a short distance. Coupling the mesh conductor 271 and the active element group 167 to each other in substantially the shortest distance or a short distance makes it possible to reduce a voltage drop, energy loss, or inductive noise between the mesh conductor 271 and the active element group 167.

Ninth Configuration Example

Next, FIG. 33 illustrates a ninth configuration example of the conductor layers A and B. It should be noted that FIG. 33 illustrates the conductor layer A in A, and FIG. 33 illustrates the conductor layer B in B. In the coordinate system in FIG. 33, an X axis represents the horizontal direction, a Y axis represents the vertical direction, and a Z axis represents the direction vertical to an XY plane.

The conductor layer A in the ninth configuration example includes a mesh conductor 281. The mesh conductor 281 has a shape similar to that of the mesh conductor 241 of the conductor layer A in the fifth configuration example (FIG. 26), and the description thereof is thus omitted. The mesh conductor 281 is, for example, a wiring line (Vss wiring line) to be coupled to GND or a negative power supply.

The conductor layer B in the ninth configuration example includes a mesh conductor 282 and a relay conductor 303. The mesh conductor 282 has a shape similar to that of the mesh conductor 242 of the conductor layer B in the fifth configuration example (FIG. 26), and the description thereof is thus omitted. The mesh conductor 282 is, for example, a wiring line (Vdd wiring line) to be coupled to a positive power supply.

The relay conductor (other conductor) 303 is disposed in a gap region of the mesh conductor 282 that is not a conductor, and electrically insulated from the mesh conductor 282. The relay conductor (other conductor) 302 is coupled to Vss to which the mesh conductor 281 of the conductor layer A is coupled.

It should be noted that the relay conductor 303 has any shape, and a symmetrical circular or polygonal shape such as rotational symmetry or mirror symmetry is desirable. It is possible to dispose the relay conductor 303 in the middle of the gap region of the mesh conductor 282 or at any other position. The relay conductor 303 may be coupled to a conductor layer serving as a Vss wiring line that is different from the conductor layer A. The relay conductor 303 may be coupled to a conductor layer serving as a Vss wiring line closer to the active element group 167 than the conductor layer B. It is possible to couple the relay conductor 303 to a conductor layer different from the conductor layer A, a conductor layer closer to the active element group 167 than the conductor layer B, or the like through a conductor via (VIA) extending in the Z direction.

FIG. 33 illustrates, in C, the conductor layers A and B respectively illustrated in A and B of FIG. 33, as viewed from the photodiode 141 side (back side). However, a hatched region 283 in C of FIG. 33 indicates a region in which the mesh conductor 281 of the conductor layer A and the mesh conductor 282 of the conductor layer B overlap. In the hatched region 283, oblique lines intersect. In the case of the ninth configuration example, the active element group 167 is covered by at least one of the conductor layer A or the conductor layer B. This makes it possible to block hot carrier light emitted from the active element group 167.

In a case where a current flows in the ninth configuration example similarly to the case illustrated in FIG. 30, a magnetic flux substantially in the X direction and the substantially Y direction is easily generated between the mesh conductor 281 that is a Vss wiring line and the mesh conductor 282 that is a Vdd wiring line by a conductor loop whose loop surface is substantially vertical to the X axis and a conductor loop whose loop surface is substantially vertical to the Y axis. The conductor loops include (cross sections of) the mesh conductors 281 and 282 in a cross section in which the mesh conductors 281 and 282 are disposed.

In addition, in the case of the ninth configuration example, providing the relay conductor 303 makes it possible to couple the mesh conductor 281 that is a Vss wiring line to the active element group 167 in substantially the shortest distance or a short distance. Coupling the mesh conductor 281 and the active element group 167 to each other in substantially the shortest distance or a short distance makes it possible to reduce a voltage drop, energy loss, or inductive noise between the mesh conductor 281 and the active element group 167.

Tenth Configuration Example

Next, FIG. 34 illustrates a tenth configuration example of the conductor layers A and B. It should be noted that FIG. 34 illustrates the conductor layer A in A, and FIG. 34 illustrates the conductor layer B in B. In the coordinate system in FIG. 34, an X axis represents the horizontal direction, a Y axis represents the vertical direction, and a Z axis represents the direction vertical to an XY plane.

The conductor layer A in the tenth configuration example includes a mesh conductor 291. The mesh conductor 291 has a shape similar to that of the mesh conductor 251 of the conductor layer A in the sixth configuration example (FIG. 27), and the description thereof is thus omitted. The mesh conductor 291 is, for example, a wiring line (Vss wiring line) to be coupled to GND or a negative power supply.

The conductor layer B in the tenth configuration example includes a mesh conductor 292 and a relay conductor 304. The mesh conductor 292 has a shape similar to that of the mesh conductor 252 of the conductor layer B in the sixth configuration example (FIG. 27), and the description thereof is thus omitted. The mesh conductor 292 is, for example, a wiring line (Vdd wiring line) to be coupled to a positive power supply.

The relay conductor (other conductor) 304 is disposed in a gap region of the mesh conductor 292 that is not a conductor, and electrically insulated from the mesh conductor 292. The relay conductor (other conductor) 304 is coupled to Vss to which the mesh conductor 291 of the conductor layer A is coupled.

It should be noted that the relay conductor 304 has any shape, and a symmetrical circular or polygonal shape such as rotational symmetry or mirror symmetry is desirable. It is possible to dispose the relay conductor 304 in the middle of the gap region of the mesh conductor 292 or at any other position. The relay conductor 304 may be coupled to a conductor layer serving as a Vss wiring line that is different from the conductor layer A. The relay conductor 304 may be coupled to a conductor layer serving as a Vss wiring line closer to the active element group 167 than the conductor layer B. It is possible to couple the relay conductor 304 to a conductor layer different from the conductor layer A, a conductor layer closer to the active element group 167 than the conductor layer B, or the like through a conductor via (VIA) extending in the Z direction.

FIG. 34 illustrates, in C, the conductor layers A and B respectively illustrated in A and B of FIG. 34, as viewed from the photodiode 141 side (back side). However, a hatched region 293 in C of FIG. 34 indicates a region in which the mesh conductor 291 of the conductor layer A and the mesh conductor 292 of the conductor layer B overlap. In the hatched region 293, oblique lines intersect. In the case of the tenth configuration example, the active element group 167 is covered by at least one of the conductor layer A or the conductor layer B. This makes it possible to block hot carrier light emitted from the active element group 167.

In a case where a current flows in the tenth configuration example similarly to the case illustrated in FIG. 30, a magnetic flux substantially in the X direction and the substantially Y direction is easily generated between the mesh conductor 291 that is a Vss wiring line and the mesh conductor 292 that is a Vdd wiring line by a conductor loop whose loop surface is substantially vertical to the X axis and a conductor loop whose loop surface is substantially vertical to the Y axis. The conductor loops include (cross sections of) the mesh conductors 291 and 292 in a cross section in which the mesh conductors 291 and 292 are disposed.

In addition, in the case of the tenth configuration example, providing the relay conductor 304 makes it possible to couple the mesh conductor 291 that is a Vss wiring line to the active element group 167 in substantially the shortest distance or a short distance. Coupling the mesh conductor 291 and the active element group 167 to each other in substantially the shortest distance or a short distance makes it possible to reduce a voltage drop, energy loss, or inductive noise between the mesh conductor 291 and the active element group 167.

<Simulation Results of Eighth to Tenth Configuration Examples>

FIG. 35 illustrates a change in an induced electromotive force that causes inductive noise to be generated in an image as a simulation result obtained in a case where the eighth to tenth configuration examples (FIGS. 32 to 34) are applied to the solid-state imaging device 100. It should be noted that it is assumed that a condition of currents flowing in the eighth to tenth configuration examples is similar to that of FIG. 30. The horizontal axis in FIG. 35 represents the X axis coordinate of the image, and the vertical axis represents the magnitude of the induced electromotive force.

A solid line L62 in A of FIG. 35 corresponds to the eighth configuration example (FIG. 32), and a dotted line L52 corresponds to the fourth configuration example (FIG. 25). As can be seen from the comparison between the solid line L62 and the dotted line L52, the eighth configuration example does not deteriorate a change in the induced electromotive force generated in the Victim conductor loop as compared with the fourth configuration example. In other words, even in the eighth configuration example in which the relay conductor 302 is disposed in the gap of the mesh conductor 272 of the conductor layer B, it is possible to suppress the generation of inductive noise in an image to be outputted from the solid-state imaging device 100 to the same extent as in the fourth configuration example. However, this simulation result is a simulation result obtained in a case where the mesh conductor 271 is not coupled to the active element group 167 and the mesh conductor 272 is not coupled to the active element group 167. For example, in a case where the mesh conductor 271 and the active element group 167 are at least partially coupled to each other through a conductor via or the like in substantially the shortest distance or a short distance, or in a case where the mesh conductor 272 and the active element group 167 are at least partially coupled to each other through a conductor via or the like in substantially the shortest distance or a short distance, the amount of currents flowing through the mesh conductor 271 or the mesh conductor 272 becomes gradually smaller in accordance with the position. In such a case, there is also a condition for great improvement to reduce the voltage drop, energy loss, and inductive noise to half or less by providing the relay conductor 302.

A solid line L63 in B of FIG. 35 corresponds to the ninth configuration example (FIG. 33), and a dotted line L53 corresponds to the fifth configuration example (FIG. 26). As can be seen from the comparison between the solid line L63 and the dotted line L53, the ninth configuration example does not deteriorate a change in the induced electromotive force generated in the Victim conductor loop as compared with the fifth configuration example. In other words, even in the ninth configuration example in which the relay conductor 303 is disposed in the gap of the mesh conductor 282 of the conductor layer B, it is possible to suppress the generation of inductive noise in an image to be outputted from the solid-state imaging device 100 to the same extent as in the fifth configuration example. However, this simulation result is a simulation result obtained in a case where the mesh conductor 281 is not coupled to the active element group 167 and the mesh conductor 282 is not coupled to the active element group 167. For example, in a case where the mesh conductor 281 and the active element group 167 are at least partially coupled to each other through a conductor via or the like in substantially the shortest distance or a short distance, or in a case where the mesh conductor 282 and the active element group 167 are at least partially coupled to each other through a conductor via or the like in substantially the shortest distance or a short distance, the amount of currents flowing through the mesh conductor 281 or the mesh conductor 282 becomes gradually smaller in accordance with the position. In such a case, there is also a condition for great improvement to reduce the voltage drop, energy loss, and inductive noise to half or less by providing the relay conductor 303.

A solid line L64 in C of FIG. 35 corresponds to the tenth configuration example (FIG. 34), and a dotted line L54 corresponds to the sixth configuration example (FIG. 27). As can be seen from the comparison between the solid line L64 and the dotted line L54, the tenth configuration example does not deteriorate a change in the induced electromotive force generated in the Victim conductor loop as compared with the sixth configuration example. In other words, even in the tenth configuration example in which the relay conductor 304 is disposed in the gap of the mesh conductor 292 of the conductor layer B, it is possible to suppress the generation of inductive noise in an image to be outputted from the solid-state imaging device 100 to the same extent as in the sixth configuration example. However, this simulation result is a simulation result obtained in a case where the mesh conductor 291 is not coupled to the active element group 167 and the mesh conductor 292 is not coupled to the active element group 167. For example, in a case where the mesh conductor 291 and the active element group 167 are at least partially coupled to each other through a conductor via or the like in substantially the shortest distance or a short distance, or in a case where the mesh conductor 292 and the active element group 167 are at least partially coupled to each other through a conductor via or the like in substantially the shortest distance or a short distance, the amount of currents flowing through the mesh conductor 291 or the mesh conductor 292 becomes gradually smaller in accordance with the position. In such a case, there is also a condition for great improvement to reduce the voltage drop, energy loss, and inductive noise to half or less by providing the relay conductor 304.

In addition, as can be seen from the comparison between the solid lines L62 to L64, the tenth configuration example makes it possible to further suppress a change in an induced electromotive force generated in the Victim conductor loop and further suppress inductive noise as compared with the eighth configuration example and the ninth configuration example.

Eleventh Configuration Example

Next, FIG. 36 illustrates an eleventh configuration example of the conductor layers A and B. It should be noted that FIG. 36 illustrates the conductor layer A in A, and FIG. 36 illustrates the conductor layer B in B. In the coordinate system in FIG. 36, an X axis represents the horizontal direction, a Y axis represents the vertical direction, and a Z axis represents the direction vertical to an XY plane.

The conductor layer A in the eleventh configuration example includes a mesh conductor 311 having resistance values different between the X direction (first direction) and the Y direction (second direction). The mesh conductor 311 is, for example, a wiring line (Vss wiring line) to be coupled to GND or a negative power supply.

The conductor width of the mesh conductor 311 in the X direction is defined as WXA, the gap width is defined as GXA, the conductor cycle is defined as FXA (=conductor width WXA+gap width GXA), and the end width is defined as EXA (=conductor width WXA/2). In addition, the conductor width of the mesh conductor 311 in the Y direction is defined as WYA, the gap width is defined as GYA, the conductor cycle is defined as FYA (=conductor width WYA+ gap width GYA), and the end width is defined as EYA (=conductor width WYA/2). In the mesh conductor 311, gap width GYA>gap width GXA is satisfied. Therefore, the gap region of the mesh conductor 311 is shaped to be longer in the Y direction than in the X direction. The resistance values are different between the X direction and the Y direction. The resistance value in the Y direction is smaller than the resistance value in the X direction.

The conductor layer B in the eleventh configuration example includes a mesh conductor 312 having resistance values different between the X direction and the Y direction. The mesh conductor 312 is, for example, a wiring line (Vdd wiring line) to be coupled to a positive power supply.

The conductor width of the mesh conductor 312 in the X direction is defined as WXB, the gap width is defined as GXB, and the conductor cycle is defined as FXB (=conductor width WXB+gap width GXB). In addition, the conductor width of the mesh conductor 312 in the Y direction is defined as WYB, the gap width is defined as GYB, the conductor cycle is defined as FYB (=conductor width WYB+gap width GYB), and the end width is defined as EYB (=conductor width WYB/2). In the mesh conductor 312, gap width GYB>gap width GXB is satisfied. Therefore, the gap region of the mesh conductor 312 is shaped to be longer in the Y direction than in the X direction. The resistance values are different between the X direction and the Y direction. The resistance value in the Y direction is smaller than the resistance value in the X direction.

It should be noted that, in a case where the sheet resistance value of the mesh conductor 311 is greater than the sheet resistance value of the mesh conductor 312, it is desirable that the mesh conductor 311 and the mesh conductor 312 satisfy the following relationships.

conductor width $WYA \geq$ conductor width $WYB$ conductor width $WXA \geq$ conductor width $WXB$ gap width $GXA \leq$ gap width $GXB$ gap width $GYA \leq$ gap width $GYB$ In contrast, in a case where the sheet resistance value of the mesh conductor 311 is smaller than the sheet resistance value of the mesh conductor 312, it is desirable that the mesh conductor 311 and the mesh conductor 312 satisfy the following relationships.

conductor width $WYA \leq$ conductor width $WYB$ conductor width $WXA \leq$ conductor width $WXB$ gap width $GXA \geq$ gap width $GXB$ gap width $GYA \geq$ gap width $GYB$ Further, it is desirable that the sheet resistance values and the conductor widths of the respective mesh conductors 311 and 312 satisfy the following relationships.

(sheet resistance value of mesh conductor 311)/
  (sheet resistance value of mesh conductor 312)
  $\approx$ conductor width $WYA$/conductor width $WYB$ (sheet resistance value of mesh conductor 311)/
  (sheet resistance value of mesh conductor 312)
  $\approx$ conductor width $WXA$/conductor width $WXB$ The limitation disclosed in the present specification regarding dimensions is not essential. The configuration is desirable in which the current distribution of the mesh conductor 311 and the current distribution of the mesh conductor 312 are substantially equal, substantially the same, or substantially similar, and have opposite characteristics.

For example, the configuration is desirable in which the ratio between the wiring resistance of the mesh conductor 311 in the X direction and the wiring resistance of the mesh conductor 311 in the Y direction, and the ratio between the wiring resistance of the mesh conductor 312 in the X direction and the wiring resistance of the mesh conductor 312 in the Y direction are substantially the same.

In addition, the configuration is desirable in which the ratio between the wiring inductance of the mesh conductor 311 in the X direction and the wiring inductance of the mesh conductor 311 in the Y direction, and the ratio between the wiring inductance of the mesh conductor 312 in the X direction and the wiring inductance of the mesh conductor 312 in the Y direction are substantially the same.

In addition, the configuration is desirable in which the ratio between the wiring capacitance of the mesh conductor 311 in the X direction and the wiring capacitance of the mesh conductor 311 in the Y direction, and the ratio between the wiring capacitance of the mesh conductor 312 in the X direction and the wiring capacitance of the mesh conductor 312 in the Y direction are substantially the same.

In addition, the configuration is desirable in which the ratio between the wiring impedance of the mesh conductor 311 in the X direction and the wiring impedance of the mesh conductor 311 in the Y direction, and the ratio between the wiring impedance of the mesh conductor 312 in the X direction and the wiring impedance of the mesh conductor 312 in the Y direction are substantially the same.

In other words, it is desirable to satisfy any of the relationships: (wiring resistance of mesh conductor 311 in X direction×wiring resistance of mesh conductor 312 in Y direction)≈(wiring resistance of mesh conductor 312 in X direction×wiring resistance of mesh conductor 311 in Y direction); (wiring inductance of mesh conductor 311 in X direction×wiring inductance of mesh conductor 312 in Y direction)≈(wiring inductance of mesh conductor 312 in X direction×wiring inductance of mesh conductor 311 in Y direction); (wiring capacitance of mesh conductor 311 in X direction×wiring capacitance of mesh conductor 312 in Y direction)≈(wiring capacitance of mesh conductor 312 in X direction×wiring capacitance of mesh conductor 311 in Y direction); or (wiring impedance of mesh conductor 311 in X direction×wiring impedance of mesh conductor 312 in Y direction)≈(wiring impedance of mesh conductor 312 in X direction×wiring impedance of mesh conductor 311 in Y direction), but it is not essential to satisfy this relationship.

It should be noted that the wiring resistance, wiring inductance, wiring capacitance, and wiring impedance described above are respectively replaceable with conductor resistance, conductor inductance, conductor capacitance, and conductor impedance.

It should be noted that the impedance Z, resistance R, inductance L, and capacitance C described above have a relationship of $Z=R+j\omega L+1/j\omega C$, where $\omega$ represents an angular frequency and j represents an imaginary unit.

It should be noted that the relationship between these ratios may be satisfied as a whole of the mesh conductor 311 and the mesh conductor 312, may be satisfied within a portion of the mesh conductor 311 and the mesh conductor 312. It is sufficient if the relationship is satisfied within any range.

Further, there may be provided a circuit that makes adjustments to cause the current distributions to be substantially equal, substantially the same, or substantially similar, and have opposite characteristics.

Satisfying the relationship described above makes it possible to cause the current distribution of the mesh conductor 311 and the current distribution of the mesh conductor 312 to be substantially equal and have opposite characteristics. This makes it possible effectively offset the magnetic field generated by the current distribution of the mesh conductor 311 and the magnetic field generated by the current distribution of the mesh conductor 312.

FIG. 36 illustrates, in C, the conductor layers A and B respectively illustrated in A and B of FIG. 36, as viewed from the photodiode 141 side (back side). However, a hatched region 313 in C of FIG. 36 indicates a region in which the mesh conductor 311 of the conductor layer A and the mesh conductor 312 of the conductor layer B overlap. In the hatched region 313, oblique lines intersect. In the case of the eleventh configuration example, the active element group 167 is covered by at least one of the conductor layer A or the conductor layer B. This makes it possible to block hot carrier light emitted from the active element group 167.

In addition, in the case of the eleventh configuration example, the region 313 in which the mesh conductor 311 and the mesh conductor 312 overlap each other is continuous in the X direction. In the region 313 in which the mesh conductor 311 and the mesh conductor 312 overlap each other, respective currents different in polarity flow through the mesh conductor 311 and the mesh conductor 312. This allows the magnetic fields generated from the region 313 to cancel each other. Therefore, it is possible to suppress the generation of inductive noise near the region 313.

In addition, in the case of the eleventh configuration example, the mesh conductor 311 is formed to cause the gap width GYA in the Y direction and the gap width GXA in the X direction to be different from each other, and the mesh conductor 312 is formed to cause the gap width GYB in the Y direction and the gap width GXB in the X direction to be different from each other.

In this manner, shaping the mesh conductors 311 and 312 to make the gap widths different between the X direction and the Y direction makes it possible to conform to restriction on the dimensions of the wiring regions, the dimensions of the gap regions, the occupation ratio of the wiring regions in the respective conductor layers, and the like when actually designing and manufacturing the conductor layers. It is possible to increase the degree of design freedom for the wiring layouts. In addition, as compared with a case where there is provided no difference in gap width, it is possible to design wiring lines in layouts that are advantageous in terms of the voltage drop (IR-Drop), inductive noise, and the like.

FIG. 37 is a diagram illustrating a condition of currents flowing in the eleventh configuration example (FIG. 36).

It is assumed that AC currents flow equally at the ends of the mesh conductor 311 included in the conductor layer A and the mesh conductor 312 included the conductor layer B. However, the current direction changes in accordance with time. For example, it is assumed that, when a current flows through the mesh conductor 312 that is a Vdd wiring line from the upper side to the lower side of the diagram, a current flows through the mesh conductor 311 that is a Vss wiring line from the lower side to the upper side of the diagram.

In a case where a current flows in the eleventh configuration example as illustrated in FIG. 37, a magnetic flux substantially in the X direction and the substantially Y direction is easily generated between the mesh conductor 311 that is a Vss wiring line and the mesh conductor 312 that is a Vdd wiring line by a conductor loop whose loop surface is substantially vertical to the X axis and a conductor loop whose loop surface is substantially vertical to the Y axis. The conductor loops include (cross sections of) the mesh conductors 311 and 312 in a cross section in which the mesh conductors 311 and 312 are disposed.

Meanwhile, in the pixel array 121 of the first semiconductor substrate 101 stacked on the second semiconductor substrate 102, the Victim conductor loop including the signal line 132 and the control line 133 is formed on the XY plane. The light-shielding structure 151 including the conductor layers A and B is formed on the second semiconductor substrate 102. In the Victim conductor loop formed on the XY plane, an induced electromotive force is easily generated by the magnetic flux in the Z direction. A greater change in the induced electromotive force causes the solid-state imaging device 100 to output a more deteriorated image (having more inductive noise).

Further, when the movement of a selection pixel in the pixel array 121 causes a change in the effective dimension of the Victim conductor loop including the signal line 132 and the control line 133, the change in the induced electromotive force stands out.

In the case of the eleventh configuration example, the direction (substantially X direction or substantially Y direction) of the magnetic flux generated from the loop surface of the Aggressor conductor loop of the light-shielding structure 151 including the conductor layers A and B is substantially orthogonal, with a difference of substantially 90 degrees, to the direction (Z direction) of the magnetic flux that causes an induced electromotive force to be generated in the Victim conductor loop. In other words, the direction of the loop surface in which the magnetic flux is generated from the Aggressor conductor loop differs substantially by 90 degrees from the direction of the loop surface in which an induced electromotive force is caused to be generated in the Victim conductor loop. Therefore, it is expected that the deterioration (generation of inductive noise) of an image to be outputted from the solid-state imaging device 100 is less than that in the first comparative example.

FIG. 38 illustrates a simulation result of inductive noise generated in a case where the eleventh configuration example (FIG. 36) is applied to the solid-state imaging device 100.

FIG. 38 illustrates, in A, an image in which inductive noise may be generated. The image is outputted from the solid-state imaging device 100. FIG. 38 illustrates, in B, a change in pixel signals in a line segment X1-X2 of the image illustrated in A of FIG. 38. FIG. 38 illustrates, in C, a solid line L71 representing the induced electromotive force that causes inductive noise in the image. The horizontal axis in C of FIG. 38 represents the X axis coordinate of the image, and the vertical axis represents the magnitude of the induced electromotive force. It should be noted that a dotted line L1 in C of FIG. 38 corresponds to the first comparative example (FIG. 9).

As can be seen from the comparison between the solid line L71 illustrated in C of FIG. 38 and the dotted line L31, the eleventh configuration example makes it possible to suppress a change in an induced electromotive force generated in the Victim conductor loop and suppress inductive noise as compared with the first comparative example.

It should be noted that the eleventh configuration example may be used by being rotated by 90 degrees in the XY plane. In addition, it is not limited to 90 degrees, but it may be used by being rotated at any angle. For example, it may be configured to be inclined with respect to the X axis or the Y axis.

Twelfth Configuration Example

Next, FIG. 39 illustrates a twelfth configuration example of the conductor layers A and B. It should be noted that FIG. 39 illustrates the conductor layer A in A, and FIG. 39 illustrates the conductor layer B in B. In the coordinate system in FIG. 39, an X axis represents the horizontal direction, a Y axis represents the vertical direction, and a Z axis represents the direction vertical to an XY plane.

The conductor layer A in the twelfth configuration example includes a mesh conductor 321. The mesh conductor 321 has a shape similar to that of the mesh conductor 311 of the conductor layer A in the eleventh configuration example (FIG. 36), and the description thereof is thus omitted. The mesh conductor 321 is, for example, a wiring line (Vss wiring line) to be coupled to GND or a negative power supply.

The conductor layer B in the twelfth configuration example includes a mesh conductor 322 and a relay conductor 305. The mesh conductor 322 has a shape similar to that of the mesh conductor 312 of the conductor layer B in the eleventh configuration example (FIG. 36), and the description thereof is thus omitted. The mesh conductor 322 is, for example, a wiring line (Vdd wiring line) to be coupled to a positive power supply.

The relay conductor (other conductor) 305 is disposed in a gap region of the mesh conductor 322 that is not a conductor, but has a rectangular shape long in the Y direction, and electrically insulated from the mesh conductor 322. The relay conductor (other conductor) 305 is coupled to Vss to which the mesh conductor 321 of the conductor layer A is coupled.

It should be noted that the relay conductor 305 has any shape, and a symmetrical circular or polygonal shape such as rotational symmetry or mirror symmetry is desirable. It is possible to dispose the relay conductor 305 in the middle of the gap region of the mesh conductor 322 or at any other position. The relay conductor 305 may be coupled to a conductor layer serving as a Vss wiring line that is different from the conductor layer A. The relay conductor 305 may be coupled to a conductor layer serving as a Vss wiring line closer to the active element group 167 than the conductor layer B. It is possible to couple the relay conductor 305 to a conductor layer different from the conductor layer A, a conductor layer closer to the active element group 167 than the conductor layer B, or the like through a conductor via (VIA) extending in the Z direction.

FIG. 39 illustrates, in C, the conductor layers A and B respectively illustrated in A and B of FIG. 39, as viewed from the photodiode 141 side (back side). However, a hatched region 323 in C of FIG. 39 indicates a region in which the mesh conductor 321 of the conductor layer A and the mesh conductor 322 of the conductor layer B overlap. In the hatched region 323, oblique lines intersect. In the case of the twelfth configuration example, the active element group 167 is covered by at least one of the conductor layer A or the conductor layer B. This makes it possible to block hot carrier light emitted from the active element group 167.

In a case where a current flows in the twelfth configuration example similarly to the case illustrated in FIG. 37, a magnetic flux substantially in the X direction and the substantially Y direction is easily generated between the mesh conductor 321 that is a Vss wiring line and the mesh conductor 322 that is a Vdd wiring line by a conductor loop whose loop surface is substantially vertical to the X axis and a conductor loop whose loop surface is substantially vertical to the Y axis. The conductor loops include (cross sections of) the mesh conductors 321 and 322 in a cross section in which the mesh conductors 321 and 322 are disposed.

Further, in the case of the twelfth configuration example, the region 323 in which the mesh conductor 321 and the mesh conductor 322 overlap each other is continuous in the X direction. In the region 323 in which the mesh conductor 321 and the mesh conductor 322 overlap each other, respective currents different in polarity flow through the mesh conductor 321 and the mesh conductor 322. This allows the magnetic fields generated from the region 323 to cancel each other. Therefore, it is possible to suppress the generation of inductive noise near the region 323.

In addition, in the case of the twelfth configuration example, providing the relay conductor 305 makes it possible to couple the mesh conductor 321 that is a Vss wiring line to the active element group 167 in substantially the shortest distance or a short distance. Coupling the mesh conductor 321 and the active element group 167 to each other in substantially the shortest distance or a short distance makes it possible to reduce a voltage drop, energy loss, or inductive noise between the mesh conductor 321 and the active element group 167.

It should be noted that the twelfth configuration example may be used by being rotated by 90 degrees in the XY plane. In addition, it is not limited to 90 degrees, but it may be used by being rotated at any angle. For example, it may be configured to be inclined with respect to the X axis or the Y axis.

Thirteenth Configuration Example

Next, FIG. 40 illustrates a thirteenth configuration example of the conductor layers A and B. It should be noted that FIG. 40 illustrates the conductor layer A in A, and FIG. 40 illustrates the conductor layer B in B. In the coordinate system in FIG. 40, an X axis represents the horizontal direction, a Y axis represents the vertical direction, and a Z axis represents the direction vertical to an XY plane.

The conductor layer A in the thirteenth configuration example includes a mesh conductor 331. The mesh conductor 331 has a shape similar to that of the mesh conductor 311 of the conductor layer A in the eleventh configuration example (FIG. 36), and the description thereof is thus omitted. The mesh conductor 331 is, for example, a wiring line (Vss wiring line) to be coupled to GND or a negative power supply.

The conductor layer B in the thirteenth configuration example includes a mesh conductor 332 and a relay conductor 306. The mesh conductor 332 has a shape similar to that of the mesh conductor 312 of the conductor layer B in the eleventh configuration example (FIG. 36), and the description thereof is thus omitted. The mesh conductor 332 is, for example, a wiring line (Vdd wiring line) to be coupled to a positive power supply.

The relay conductor (other conductor) 306 is obtained by dividing the relay conductor 305 in the twelfth configuration example (FIG. 39) into a plurality of portions (ten portions in FIG. 40) with spaces therebetween. The relay conductor 306 is disposed in a gap region of the mesh conductor 332 that has a rectangular shape long in the Y direction, and electrically insulated from the mesh conductor 332. The relay conductor 306 is coupled to Vss to which the mesh conductor 331 of the conductor layer A is coupled. It may depend on regions into how many portions a relay conductor is divided and whether or not a relay conductor is coupled to Vss. In this case, the current distribution is finely adjustable at the time of design. This makes it possible to lead to the suppression of inductive noise and reduction in voltage drops (IR-Drop).

It should be noted that the relay conductor 306 has any shape, and a symmetrical circular or polygonal shape such as rotational symmetry or mirror symmetry is desirable. It is optionally changeable into how many portions the relay conductor 306 is divided. It is possible to dispose the relay conductor 306 in the middle of the gap region of the mesh conductor 332 or at any other position. The relay conductor 306 may be coupled to a conductor layer serving as a Vss wiring line that is different from the conductor layer A. The relay conductor 306 may be coupled to a conductor layer serving as a Vss wiring line closer to the active element group 167 than the conductor layer B. It is possible to couple the relay conductor 306 to a conductor layer different from the conductor layer A, a conductor layer closer to the active element group 167 than the conductor layer B, or the like through a conductor via (VIA) extending in the Z direction.

FIG. 40 illustrates, in C, the conductor layers A and B respectively illustrated in A and B of FIG. 40, as viewed from the photodiode 141 side (back side). However, a hatched region 333 in C of FIG. 40 indicates a region in which the mesh conductor 331 of the conductor layer A and the mesh conductor 332 of the conductor layer B overlap. In the hatched region 333, oblique lines intersect. In the case of the thirteenth configuration example, the active element group 167 is covered by at least one of the conductor layer A or the conductor layer B. This makes it possible to block hot carrier light emitted from the active element group 167.

In a case where a current flows in the thirteenth configuration example similarly to the case illustrated in FIG. 37, a magnetic flux substantially in the X direction and the substantially Y direction is easily generated between the mesh conductor 331 that is a Vss wiring line and the mesh conductor 332 that is a Vdd wiring line by a conductor loop whose loop surface is substantially vertical to the X axis and a conductor loop whose loop surface is substantially vertical to the Y axis. The conductor loops include (cross sections of) the mesh conductors 331 and 332 in a cross section in which the mesh conductors 331 and 332 are disposed.

Further, in the case of the thirteenth configuration example, the region 333 in which the mesh conductor 331 and the mesh conductor 332 overlap each other is continuous in the X direction. In the region 333, respective currents different in polarity flow through the mesh conductor 331 and the mesh conductor 332. This allows the magnetic fields generated from the region 333 to cancel each other. Therefore, it is possible to suppress the generation of inductive noise near the region 333.

In addition, in the case of the thirteenth configuration example, providing the relay conductor 306 makes it possible to couple the mesh conductor 331 that is a Vss wiring line to the active element group 167 in substantially the shortest distance or a short distance. Coupling the mesh conductor 331 and the active element group 167 to each other in substantially the shortest distance or a short distance makes it possible to reduce a voltage drop, energy loss, or inductive noise between the mesh conductor 331 and the active element group 167.

Further, in the thirteenth configuration example, the relay conductor 306 is divided into a plurality of portions. This makes it possible to cause the current distribution in the conductor layer A and the current distribution in the conductor layer B to be substantially uniform and opposite in polarity. Accordingly, it is possible to cause the magnetic field generated from the conductor layer A and the magnetic field generated from the conductor layer B to cancel each other. Therefore, in the thirteenth configuration example, it is possible to make it difficult for an external factor to cause a difference in current distribution between the Vdd wiring line and the Vss wiring line. The sixteenth configuration example is thus preferable in a case where the current distribution in the XY plane is complicated or in a case where the impedances of the conductors coupled to the mesh conductors 331 and 332 are different between the Vdd wiring line and the Vss wiring line.

It should be noted that the thirteenth configuration example may be used by being rotated by 90 degrees in the XY plane. In addition, it is not limited to 90 degrees, but it may be used by being rotated at any angle. For example, it may be configured to be inclined with respect to the X axis or the Y axis.

Simulation Results of Twelfth and Thirteenth Configuration Examples

FIG. 41 illustrates a change in an induced electromotive force that causes inductive noise to be generated in an image as a simulation result obtained in a case where the twelfth configuration example (FIG. 39) and the thirteenth configuration example (FIG. 40) are applied to the solid-state imaging device 100. It should be noted that it is assumed that a condition of currents flowing in the twelfth and thirteenth configuration examples is similar to that of FIG. 37. The horizontal axis in FIG. 41 represents the X axis coordinate of the image, and the vertical axis represents the magnitude of the induced electromotive force.

A solid line L72 in A of FIG. 41 corresponds to the twelfth configuration example (FIG. 39), and a dotted line L1 corresponds to the first comparative example (FIG. 9). As can be seen from the comparison between the solid line L72 and the dotted line L1, the twelfth configuration example does not change the induced electromotive force generated in the Victim conductor loop as compared with the first comparative example. Therefore, the twelfth configuration example makes it possible to suppress inductive noise in an image to be outputted from the solid-state imaging device 100 as compared with the first comparative example. However, this simulation result is a simulation result obtained in a case where the mesh conductor 321 is not coupled to the active element group 167 and the mesh conductor 322 is not coupled to the active element group 167. For example, in a case where the mesh conductor 321 and the active element group 167 are at least partially coupled to each other through a conductor via or the like in substantially the shortest distance or a short distance, or in a case where the mesh conductor 322 and the active element group 167 are at least partially coupled to each other through a conductor via or the like in substantially the shortest distance or a short distance, the amount of currents flowing through the mesh conductor 321 or the mesh conductor 322 becomes gradually smaller in accordance with the position. In such a case, there is also a condition for great improvement to reduce the voltage drop, energy loss, and inductive noise to half or less by providing the relay conductor 305.

A solid line L73 in B of FIG. 41 corresponds to the thirteenth configuration example (FIG. 40), and a dotted line L1 corresponds to the first comparative example (FIG. 9). As can be seen from the comparison between the solid line L73 and the dotted line L1, the thirteenth configuration example does not change the induced electromotive force generated in the Victim conductor loop as compared with the first comparative example. Therefore, the thirteenth configuration example makes it possible to suppress inductive noise in an image to be outputted from the solid-state imaging device 100 as compared with the first comparative example. However, this simulation result is a simulation result obtained in a case where the mesh conductor 331 is not coupled to the active element group 167 and the mesh conductor 332 is not coupled to the active element group 167. For example, in a case where the mesh conductor 331 and the active element group 167 are at least partially coupled to each other through a conductor via or the like in substantially the shortest distance or a short distance, or in a case where the mesh conductor 332 and the active element group 167 are at least partially coupled to each other through a conductor via or the like in substantially the shortest distance or a short distance, the amount of currents flowing through the mesh conductor 331 or the mesh conductor 332 becomes gradually smaller in accordance with the position. In such a case, there is also a condition for great improvement to reduce the voltage drop, energy loss, and inductive noise to half or less by providing the relay conductor 306.

5. DISPOSITION EXAMPLE OF ELECTRODES IN SEMICONDUCTOR SUBSTRATE ON WHICH CONDUCTOR LAYERS A AND B ARE FORMED

Next, the disposition of electrodes on a semiconductor substrate on which a conductor having resistance values different between the X direction and the Y direction as in the above-described eleventh to thirteenth configuration examples of the conductor layers A and B is formed is described.

It should be noted that the following describes, as an example, a case where the thirteenth configuration example (FIG. 40) is formed on a semiconductor substrate. The thirteenth configuration example includes the conductor layers A and B including conductors (mesh conductors 331 and 332) whose resistance values in the Y direction are smaller than the resistance values in the X direction. However, the same applies to the cases where the eleventh and twelfth configuration examples of the conductor layers A and B are formed on a semiconductor substrate. The conductor layers A and B include conductors whose resistance values in the Y direction are smaller than the resistance values in the X direction.

In the thirteenth configuration example of the conductor layers A and B formed on a semiconductor substrate, the resistance values of the conductors (mesh conductors 331 and 332) in the Y direction are smaller than the resistance values in the X direction, and currents thus easily flow in the Y direction. Therefore, to make, as small as possible, the voltage drops (IR-Drop) of the conductors in the thirteenth configuration example of the conductor layers A and B, it is desirable to dispose a plurality of pads (electrodes) to be disposed on a semiconductor substrate more densely in the X direction than in the Y direction, but a plurality of pads (electrodes) may also be disposed more densely in the Y direction than in the X direction. In the Y direction, the resistance values are smaller. In the X direction, the resistance values are larger.

First Disposition Example of Pads on Semiconductor Substrate

FIG. 42 is a plan view illustrating a first disposition example in which pads are disposed on a semiconductor substrate more denseley in the X direction than in the Y direction. It should be noted that, in the coordinate system in FIG. 42, an X axis represents the horizontal direction, a Y axis represents the vertical direction, and a Z axis represents the direction vertical to an XY plane.

FIG. 42 illustrates, in A, a case where pads are disposed on one side of a wiring region 400 in which the plurality of thirteenth configuration examples (FIG. 40) each including the conductor layers A and B is formed. FIG. 42 illustrates, in B, a case where pads are disposed on the two sides of the wiring region 400 opposed to each other in the Y direction. In the wiring region 400, the plurality of thirteenth configuration examples (FIG. 40) each including the conductor layers A and B is formed. It should be noted that a dotted arrow in the diagram represents an example of the direction of a current flowing there, and a current loop 411 is generated by a current represented by the dotted arrow in a rectangular broken line 411. The direction of the current represented by the dotted arrow changes every moment.

FIG. 42 illustrates, in C, a case where pads are disposed on three sides of the wiring region 400 in which the plurality of thirteenth configuration examples (FIG. 40) each including the conductor layers A and B is formed. FIG. 42 illustrates, in D, a case where pads are disposed on the four sides of a wiring region 400 in which the plurality of thirteenth configuration examples (FIG. 40) each including the conductor layers A and B is formed. FIG. 42 illustrates, in E, the directions of the plurality of thirteenth configuration examples of the conductor layers A and B formed in the wiring region 400.

A pad 401 disposed in the wiring region 400 is coupled to a Vdd wiring line, and a pad 402 is a wiring line (Vss wiring line) that is, for example, coupled to GND or a negative power supply.

In the case of the first disposition example illustrated in FIG. 42, the pads 401 and 402 each include one pad or a plurality of pads (two pads in the case of FIG. 42) disposed adjacent to each other. The pads 401 and 402 are disposed adjacent to each other. The pad 401 including one pad and the pad 402 including one pad are disposed adjacent to each other, and the pad 401 including two pads and the pad 402 including two pads are disposed adjacent to each other. The polarity (the coupling destination is the Vdd wiring line or the Vss wiring line) of the pad 401 is opposed to the polarity of the pad 402. It is assumed that the number of pads 401 and the number of pads 402 disposed in the wiring region 400 are substantially the same.

This makes it possible to cause the distribution of currents flowing through the respective conductor layers A and B formed in the wiring region 400 to be substantially uniform and have opposite polarities. Accordingly, it is possible to effectively offset the magnetic fields generated from the respective conductor layers A and B and the induced electromotive forces based thereon.

In addition, in a case where pads are formed on two or more sides of the wiring region 400 as illustrated in B, C, and D of FIG. 42, the pads opposed to each other on the opposite sides have opposite polarities. As illustrated by the dotted arrow in B of FIG. 42, this facilitates currents in the same direction to be distributed at positions in the wiring region 400 with the same X coordinate and the different Y coordinates.

Second Disposition Example of Pads on Semiconductor Substrate

Next, FIG. 43 is a plan view illustrating a second disposition example in which pads are disposed on a semiconductor substrate more densely in the X direction than in the Y direction. It should be noted that, in the coordinate system in FIG. 43, an X axis represents the horizontal direction, a Y axis represents the vertical direction, and a Z axis represents the direction vertical to an XY plane.

FIG. 43 illustrates, in A, a case where pads are disposed on the two sides of the wiring region 400 opposed to each other in the Y direction. In the wiring region 400, the plurality of thirteenth configuration examples (FIG. 40) each including the conductor layers A and B is formed. It should be noted that a dotted arrow in the diagram represents the direction of a current flowing there, and a current loop 412 is generated by a current represented by the dotted arrow in a rectangular broken line 412. The direction of the current represented by the dotted arrow changes every moment.

FIG. 43 illustrates, in B, a case where pads are disposed on three sides of the wiring region 400 in which the plurality of thirteenth configuration examples (FIG. 40) each including the conductor layers A and B is formed. FIG. 43 illustrates, in C, a case where pads are disposed on the four sides of the wiring region 400 in which the plurality of thirteenth configuration examples (FIG. 40) each including the conductor layers A and B is formed. FIG. 43 illustrates, in D, the directions of the plurality of thirteenth configuration examples of the conductor layers A and B formed in the wiring region 400.

A pad 401 disposed in the wiring region 400 is coupled to a Vdd wiring line, and a pad 402 is a wiring line (Vss wiring line) that is, for example, coupled to GND or a negative power supply.

In the case of the second disposition example illustrated in FIG. 43, the pads 401 and 402 each include a plurality of pads (two pads in the case of FIG. 43) disposed adjacent to each other. The pads 401 and 402 are disposed adjacent to each other. The pad 401 including one pad and the pad 402 including one pad are disposed adjacent to each other, and the pad 401 including two pads and the pad 402 including two pads are disposed adjacent to each other. The polarity (the coupling destination is the Vdd wiring line or the Vss wiring line) of the pad 401 is opposed to the polarity of the pad 402. It is assumed that the number of pads 401 and the number of pads 402 disposed in the wiring region 400 are substantially the same.

This makes it possible to cause the distribution of currents flowing through the respective conductor layers A and B formed in the wiring region 400 to be substantially uniform and have opposite polarities. Accordingly, it is possible to effectively offset the magnetic fields generated from the respective conductor layers A and B and the induced electromotive forces based thereon.

Further, in the second disposition example, the pads opposed to each other on the opposite sides have the same polarity. However, portions of the pads opposed to each other on the opposite sides may have opposite polarities. This causes the current loop 412 smaller than the current loop 411 illustrated in B of FIG. 42 to be generated in the wiring region 400. The magnitude of current loops influences the distribution range of magnetic fields. The distribution range of magnetic fields becomes narrower with a decrease in the magnitude of electric field loops. Therefore, in the second disposition example, the distribution range of magnetic fields is narrower than in the first disposition example. Thus, it is possible in the second disposition example to reduce an induced electromotive force to be generated and the inductive noise based thereon as compared with the first disposition example.

Third Disposition Example of Pads on Semiconductor Substrate

Next, FIG. 44 is a plan view illustrating a third disposition example in which pads are disposed on a semiconductor substrate more densely in the X direction than in the Y direction. It should be noted that, in the coordinate system in FIG. 44, an X axis represents the horizontal direction, a Y axis represents the vertical direction, and a Z axis represents the direction vertical to an XY plane.

FIG. 44 illustrates, in A, a case where pads are disposed on one side of a wiring region 400 in which the plurality of thirteenth configuration examples (FIG. 40) each including the conductor layers A and B is formed. FIG. 44 illustrates, in B, a case where pads are disposed on the two sides of the wiring region 400 opposed to each other in the Y direction. In the wiring region 400, the plurality of thirteenth configuration examples (FIG. 40) each including the conductor layers A and B is formed. It should be noted that a dotted arrow in the diagram represents the direction of a current flowing there, and a current loop 413 is generated by a current represented by the dotted arrow in a rectangular broken line 413.

FIG. 44 illustrates, in C, a case where pads are disposed on three sides of the wiring region 400 in which the plurality of thirteenth configuration examples (FIG. 40) each including the conductor layers A and B is formed. FIG. 44 illustrates, in D, a case where pads are disposed on the four sides of a wiring region 400 in which the plurality of thirteenth configuration examples (FIG. 40) each including the conductor layers A and B is formed. FIG. 44 illustrates, in E, the directions of the plurality of thirteenth configuration examples of the conductor layers A and B formed in the wiring region 400.

A pad 401 disposed in the wiring region 400 is coupled to a Vdd wiring line, and a pad 402 is a wiring line (Vss wiring line) that is, for example, coupled to GND or a negative power supply.

In the case of the third disposition example illustrated in FIG. 44, the respective pads included in the pad group including a plurality of pads (2 in the case of FIG. 44) disposed adjacent to each other have opposite polarities (the coupling destination is the Vdd wiring line or the Vss wiring line). It is assumed that the number of pads 401 disposed on one side or all the sides of the wiring region 400 is substantially the same as the number of pads 402.

Further, in the third disposition example, the pads opposed to each other on the opposite sides have the same polarity. However, portions of the pads opposed to each other on the opposite sides may have opposite polarities.

This causes the current loop 413 smaller than the current loop 412 illustrated in A of FIG. 43 to be generated in the wiring region 400. Therefore, in the third disposition example, the distribution range of magnetic fields is narrower than in the second disposition example. Thus, it is possible in the third disposition example to reduce an induced electromotive force to be generated and the inductive noise based thereon as compared with the second disposition example.

Example of Conductor Whose Resistance Value in Y Direction and Resistance Value in X Direction are Different from Each Other FIG. 45 is a plan view illustrating another example of conductors included in the conductor layers A and B. That is, FIG. 45 is a plan view illustrating an example of conductors whose resistance value in the Y direction and resistance value in the X direction are different from each other. It should be noted that A to C of FIG. 45 each illustrate an example in which the resistance value in the Y direction is smaller than the resistance value in the X direction, and D to F of FIG. 45 each illustrate an example in which the resistance value in the X direction is smaller than the resistance value in the Y direction.

FIG. 45 illustrates, in A, a mesh conductor whose conductor width WX in the X direction and conductor width WY in the Y direction are equal to each other, and whose gap width GX in the X direction is narrower than the gap width GY in the Y direction. FIG. 45 illustrates, in B, a mesh conductor whose conductor width WX in the X direction is greater than the conductor width WY in the Y direction, and whose gap width GX in the X direction is narrower than the gap width GY in the Y direction. FIG. 45 illustrates, in C, a mesh conductor whose conductor width WX in the X direction and conductor width WY in the Y direction are equal to each other, and whose gap width GX in the X direction is equal to the gap width GY in the Y direction. The mesh conductor has a hole in the region of a portion that is long in the X direction and has the conductor width WY, but do not intersect with a portion that is long in the Y direction and has the conductor width WX.

FIG. 45 illustrates, in D, a mesh conductor whose conductor width WX in the X direction and conductor width WY in the Y direction are equal to each other, and whose gap width GX in the X direction is greater than the gap width GY in the Y direction. FIG. 45 illustrates, in E, a mesh conductor whose conductor width WX in the X direction is narrower than the conductor width WY in the Y direction, and whose gap width GX in the X direction is greater than the gap width GY in the Y direction. FIG. 45 illustrates, in F, a mesh conductor whose conductor width WX in the X direction and conductor width WY in the Y direction are equal to each other, and whose gap width GX in the X direction is equal to the gap width GY in the Y direction. The mesh conductor has a hole in the region of a portion that is long in the Y direction and has the conductor width WX, but do not intersect with a portion that is long in the X direction and has the conductor width WY.

The first to third disposition examples of pads in the wiring region 400 illustrated in FIGS. 42 to 44 have effects of suppressing a voltage drop (IR-Drop) in a conductor as illustrated in A to C of FIG. 45 in a case where the conductor is formed in the wiring region 400. The resistance value of the conductor in the Y direction is smaller than the resistance value in the X direction, and currents easily flow in the Y direction.

In addition, effects of suppressing the generation of inductive noise are expectable of the first to third disposition examples of pads in the wiring region 400 illustrated in FIGS. 42 to 44 because currents are more easy to diffuse in the X direction, and the magnetic field in the vicinity of the pads disposed on a side of the wiring region 400 is more difficult to concentrate in a case where a conductor as illustrated in D to F of FIG. 45 is formed in the wiring region 400. The resistance value of the conductor in the X direction is smaller than the resistance value in the Y direction, and currents easily flow in the X direction.

6. MODIFICATION EXAMPLE OF CONFIGURATION EXAMPLE OF CONDUCTOR LAYERS A AND B

Next, modification examples of some of the above-described first to thirteenth configuration examples of the conductor layers A and B are described.

FIG. 46 is a diagram illustrating a modification example in which a conductor cycle in the X direction in the second configuration example (FIG. 15) of the conductor layers A and B is multiplied by ½, and an effect thereof. It should be noted that A of FIG. 46 illustrates the second configuration example of the conductor layers A and B, and B of FIG. 46 illustrates a modification example of the second configuration example of the conductor layers A and B.

FIG. 46 illustrates, in C, a change in an induced electromotive force that causes inductive noise to be generated in an image as a simulation result obtained in a case where the modification example illustrated in B of FIG. 46 is applied to the solid-state imaging device 100. It should be noted that it is assumed that a condition of currents flowing in this modification example is similar to that of FIG. 13. The horizontal axis in FIG. 46 represents the X axis coordinate of the image, and the vertical axis represents the magnitude of the induced electromotive force.

A solid line L81 in C of FIG. 46 corresponds to the modification example illustrated in B of FIG. 46, and the dotted line L21 corresponds to the second configuration example (FIG. 15). As can be seen from the comparison between the solid line L81 and the dotted line L21, in this modification example, a change in an induced electromotive force generated in a Victim conductor loop is slightly less than in the second configuration example. Therefore, it is understood that this modification example makes it possible to suppress slightly more inductive noise than the second configuration example.

FIG. 47 is a diagram illustrating a modification example in which a conductor cycle in the X direction in the fifth configuration example (FIG. 26) of the conductor layers A and B is multiplied by ½, and an effect thereof. It should be noted that A of FIG. 47 illustrates the fifth configuration example of the conductor layers A and B, and B of FIG. 47 illustrates a modification example of the fifth configuration example of the conductor layers A and B.

FIG. 47 illustrates, in C, a change in an induced electromotive force that causes inductive noise to be generated in an image as a simulation result obtained in a case where the modification example illustrated in B of FIG. 47 is applied to the solid-state imaging device 100. It should be noted that it is assumed that a condition of currents flowing in this modification example is similar to that of FIG. 23. The horizontal axis in FIG. 47 represents the X axis coordinate of the image, and the vertical axis represents the magnitude of the induced electromotive force.

A solid line L82 in C of FIG. 47 corresponds to the modification example illustrated in B of FIG. 47, and the dotted line L53 corresponds to the fifth configuration example (FIG. 26). As can be seen from the comparison between the solid line L82 and the dotted line L53, in this modification example, a change in an induced electromotive force generated in a Victim conductor loop is far less than in the fifth configuration example. Therefore, it is understood that this modification example makes it possible to still further suppress inductive noise than the fifth configuration example.

FIG. 48 is a diagram illustrating a modification example in which a conductor cycle in the X direction in the sixth configuration example (FIG. 27) of the conductor layers A and B is multiplied by ½, and an effect thereof. It should be noted that A of FIG. 48 illustrates the sixth configuration example of the conductor layers A and B, and B of FIG. 48 illustrates a modification example of the sixth configuration example of the conductor layers A and B.

FIG. 48 illustrates, in C, a change in an induced electromotive force that causes inductive noise to be generated in an image as a simulation result obtained in a case where the modification example illustrated in B of FIG. 48 is applied to the solid-state imaging device 100. It should be noted that it is assumed that a condition of currents flowing in this modification example is similar to that of FIG. 23. The horizontal axis in FIG. 48 represents the X axis coordinate of the image, and the vertical axis represents the magnitude of the induced electromotive force.

A solid line L83 in C of FIG. 48 corresponds to the modification example illustrated in B of FIG. 48, and the dotted line L54 corresponds to the sixth configuration example (FIG. 27). As can be seen from the comparison between the solid line L83 and the dotted line L54, in this modification example, a change in an induced electromotive force generated in a Victim conductor loop is less than in the sixth configuration example. Therefore, it is understood that this modification example makes it possible to further suppress inductive noise than the sixth configuration example.

FIG. 49 is a diagram illustrating a modification example in which a conductor cycle in the Y direction in the second configuration example (FIG. 15) of the conductor layers A and B is multiplied by ½, and an effect thereof. It should be noted that A of FIG. 49 illustrates the second configuration example of the conductor layers A and B, and B of FIG. 49 illustrates a modification example of the second configuration example of the conductor layers A and B.

FIG. 49 illustrates, in C, a change in an induced electromotive force that causes inductive noise to be generated in an image as a simulation result obtained in a case where the modification example illustrated in B of FIG. 49 is applied to the solid-state imaging device 100. It should be noted that it is assumed that a condition of currents flowing in this modification example is similar to that of FIG. 13. The horizontal axis in FIG. 49 represents the X axis coordinate of the image, and the vertical axis represents the magnitude of the induced electromotive force.

A solid line L111 in C of FIG. 49 corresponds to the modification example illustrated in B of FIG. 49, and the dotted line L21 corresponds to the second configuration example. As can be seen from the comparison between the solid line L111 and the dotted line L21, in this modification example, a change in an induced electromotive force generated in a Victim conductor loop is slightly less than in the second configuration example. Therefore, it is understood that this modification example makes it possible to suppress slightly more inductive noise than the second configuration example.

FIG. 50 is a diagram illustrating a modification example in which a conductor cycle in the Y direction in the fifth configuration example (FIG. 26) of the conductor layers A and B is multiplied by ½, and an effect thereof. It should be noted that A of FIG. 50 illustrates the fifth configuration example of the conductor layers A and B, and B of FIG. 50 illustrates a modification example of the fifth configuration example of the conductor layers A and B.

FIG. 50 illustrates, in C, a change in an induced electromotive force that causes inductive noise to be generated in an image as a simulation result obtained in a case where the modification example illustrated in B of FIG. 50 is applied to the solid-state imaging device 100. It should be noted that it is assumed that a condition of currents flowing in this modification example is similar to that of FIG. 23. The horizontal axis in FIG. 50 represents the X axis coordinate of the image, and the vertical axis represents the magnitude of the induced electromotive force.

A solid line L112 in C of FIG. 50 corresponds to the modification example illustrated in B of FIG. 50, and the dotted line L53 corresponds to the fifth configuration example. As can be seen from the comparison between the solid line L112 and the dotted line L53, in this modification example, a change in an induced electromotive force generated in a Victim conductor loop is far less than in the fifth configuration example. Therefore, it is understood that this modification example makes it possible to still further suppress inductive noise than the fifth configuration example.

FIG. 51 is a diagram illustrating a modification example in which a conductor cycle in the Y direction in the sixth configuration example (FIG. 27) of the conductor layers A and B is multiplied by ½, and an effect thereof. It should be noted that A of FIG. 51 illustrates the sixth configuration example of the conductor layers A and B, and B of FIG. 51 illustrates a modification example of the sixth configuration example of the conductor layers A and B.

FIG. 51 illustrates, in C, a change in an induced electromotive force that causes inductive noise to be generated in an image as a simulation result obtained in a case where the modification example illustrated in B of FIG. 51 is applied to the solid-state imaging device 100. It should be noted that it is assumed that a condition of currents flowing in this modification example is similar to that of FIG. 23. The horizontal axis in FIG. 51 represents the X axis coordinate of the image, and the vertical axis represents the magnitude of the induced electromotive force.

A solid line L113 in C of FIG. 51 corresponds to the modification example illustrated in B of FIG. 51, and the dotted line L54 corresponds to the sixth configuration example. As can be seen from the comparison between the solid line L113 and the dotted line L54, in this modification example, a change in an induced electromotive force generated in a Victim conductor loop is less than in the sixth configuration example. Therefore, it is understood that this modification example makes it possible to further suppress inductive noise than the sixth configuration example.

FIG. 52 is a diagram illustrating a modification example in which the conductor width in the X direction in the second configuration example (FIG. 15) of the conductor layers A and B is doubled, and an effect thereof. It should be noted that A of FIG. 52 illustrates the second configuration example of the conductor layers A and B, and B of FIG. 52 illustrates a modification example of the second configuration example of the conductor layers A and B.

FIG. 52 illustrates, in C, a change in an induced electromotive force that causes inductive noise to be generated in an image as a simulation result obtained in a case where the modification example illustrated in B of FIG. 52 is applied to the solid-state imaging device 100. It should be noted that it is assumed that a condition of currents flowing in this modification example is similar to that of FIG. 13. The horizontal axis in FIG. 52 represents the X axis coordinate of the image, and the vertical axis represents the magnitude of the induced electromotive force.

A solid line L121 in C of FIG. 52 corresponds to the modification example illustrated in B of FIG. 52, and the dotted line L21 corresponds to the second configuration example. As can be seen from the comparison between the solid line L121 and the dotted line L21, in this modification example, a change in an induced electromotive force generated in a Victim conductor loop is slightly less than in the second configuration example. Therefore, it is understood that this modification example makes it possible to suppress slightly more inductive noise than the second configuration example.

FIG. 53 is a diagram illustrating a modification example in which the conductor width in the X direction in the fifth configuration example (FIG. 26) of the conductor layers A and B is doubled, and an effect thereof. It should be noted that A of FIG. 53 illustrates the fifth configuration example of the conductor layers A and B, and B of FIG. 53 illustrates a modification example of the fifth configuration example of the conductor layers A and B.

FIG. 53 illustrates, in C, a change in an induced electromotive force that causes inductive noise to be generated in an image as a simulation result obtained in a case where the modification example illustrated in B of FIG. 53 is applied to the solid-state imaging device 100. It should be noted that it is assumed that a condition of currents flowing in this modification example is similar to that of FIG. 23. The horizontal axis in FIG. 53 represents the X axis coordinate of the image, and the vertical axis represents the magnitude of the induced electromotive force.

A solid line L122 in C of FIG. 53 corresponds to the modification example illustrated in B of FIG. 53, and the dotted line L53 corresponds to the fifth configuration example. As can be seen from the comparison between the solid line L122 and the dotted line L53, in this modification example, a change in an induced electromotive force generated in a Victim conductor loop is far less than in the fifth configuration example. Therefore, it is understood that this modification example makes it possible to still further suppress inductive noise than the fifth configuration example.

FIG. 54 is a diagram illustrating a modification example in which the conductor width in the X direction in the sixth configuration example (FIG. 27) of the conductor layers A and B is doubled, and an effect thereof. It should be noted that A of FIG. 54 illustrates the sixth configuration example of the conductor layers A and B, and B of FIG. 54 illustrates a modification example of the sixth configuration example of the conductor layers A and B.

FIG. 54 illustrates, in C, a change in an induced electromotive force that causes inductive noise to be generated in an image as a simulation result obtained in a case where the modification example illustrated in B of FIG. 54 is applied to the solid-state imaging device 100. It should be noted that it is assumed that a condition of currents flowing in this modification example is similar to that of FIG. 23. The horizontal axis in FIG. 54 represents the X axis coordinate of the image, and the vertical axis represents the magnitude of the induced electromotive force.

A solid line L123 in C of FIG. 54 corresponds to the modification example illustrated in B of FIG. 54, and the dotted line L54 corresponds to the sixth configuration example. As can be seen from the comparison between the solid line L123 and the dotted line L54, in this modification example, a change in an induced electromotive force generated in a Victim conductor loop is less than in the sixth configuration example. Therefore, it is understood that this modification example makes it possible to further suppress inductive noise than the sixth configuration example.

FIG. 55 is a diagram illustrating a modification example in which the conductor width in the Y direction in the second configuration example (FIG. 15) of the conductor layers A and B is doubled, and an effect thereof. It should be noted that A of FIG. 55 illustrates the second configuration example of the conductor layers A and B, and B of FIG. 55 illustrates a modification example of the second configuration example of the conductor layers A and B.

FIG. 55 illustrates, in C, a change in an induced electromotive force that causes inductive noise to be generated in an image as a simulation result obtained in a case where the modification example illustrated in B of FIG. 55 is applied to the solid-state imaging device 100. It should be noted that it is assumed that a condition of currents flowing in this modification example is similar to that of FIG. 13. The horizontal axis in FIG. 55 represents the X axis coordinate of the image, and the vertical axis represents the magnitude of the induced electromotive force.

A solid line L131 in C of FIG. 55 corresponds to the modification example illustrated in B of FIG. 55, and the dotted line L21 corresponds to the second configuration example. As can be seen from the comparison between the solid line L131 and the dotted line L21, in this modification example, a change in an induced electromotive force generated in a Victim conductor loop is slightly less than in the second configuration example. Therefore, it is understood that this modification example makes it possible to suppress slightly more inductive noise than the second configuration example.

FIG. 56 is a diagram illustrating a modification example in which the conductor width in the Y direction in the fifth configuration example (FIG. 26) of the conductor layers A and B is doubled, and an effect thereof. It should be noted that A of FIG. 56 illustrates the fifth configuration example of the conductor layers A and B, and B of FIG. 56 illustrates a modification example of the fifth configuration example of the conductor layers A and B.

FIG. 56 illustrates, in C, a change in an induced electromotive force that causes inductive noise to be generated in an image as a simulation result obtained in a case where the modification example illustrated in B of FIG. 56 is applied to the solid-state imaging device 100. It should be noted that it is assumed that a condition of currents flowing in this modification example is similar to that of FIG. 23. The horizontal axis in FIG. 56 represents the X axis coordinate of the image, and the vertical axis represents the magnitude of the induced electromotive force.

A solid line L132 in C of FIG. 56 corresponds to the modification example illustrated in B of FIG. 56, and the dotted line L53 corresponds to the fifth configuration example. As can be seen from the comparison between the solid line L132 and the dotted line L53, in this modification example, a change in an induced electromotive force generated in a Victim conductor loop is far less than in the fifth configuration example. Therefore, it is understood that this modification example makes it possible to still further suppress inductive noise than the fifth configuration example.

FIG. 57 is a diagram illustrating a modification example in which the conductor width in the Y direction in the sixth configuration example (FIG. 27) of the conductor layers A and B is doubled, and an effect thereof. It should be noted that A of FIG. 57 illustrates the sixth configuration example of the conductor layers A and B, and B of FIG. 57 illustrates a modification example of the sixth configuration example of the conductor layers A and B.

FIG. 57 illustrates, in C, a change in an induced electromotive force that causes inductive noise to be generated in an image as a simulation result obtained in a case where the modification example illustrated in B of FIG. 57 is applied to the solid-state imaging device 100. It should be noted that it is assumed that a condition of currents flowing in this modification example is similar to that of FIG. 23. The horizontal axis in FIG. 57 represents the X axis coordinate of the image, and the vertical axis represents the magnitude of the induced electromotive force.

A solid line L133 in C of FIG. 57 corresponds to the modification example illustrated in B of FIG. 57, and the dotted line L54 corresponds to the sixth configuration example. As can be seen from the comparison between the solid line L133 and the dotted line L54, in this modification example, a change in an induced electromotive force generated in a Victim conductor loop is less than in the sixth configuration example. Therefore, it is understood that this modification example makes it possible to further suppress inductive noise than the sixth configuration example.

7. MODIFICATION EXAMPLE OF MESH CONDUCTOR

Next, FIG. 58 is a plan view illustrating a modification example of a mesh conductor applicable to each of the above-described configuration examples of the conductor layers A and B.

FIG. 58 illustrates, in A, the simplified shape of a mesh conductor adopted in each of the above-described configuration examples of the conductor layers A and B. A mesh conductor adopted in each of the above-described configuration examples of the conductor layers A and B has a rectangular gap region, and the respective rectangular gap regions are disposed linearly in the X direction and the Y direction.

FIG. 58 illustrates, in B, a simplified first modification example of a mesh conductor. The first modification example of a mesh conductor has a rectangular gap region, and the respective gap regions are disposed linearly in the X direction and disposed out of alignment between the respective stages in the Y direction.

FIG. 58 illustrates, in C, a simplified second modification example of a mesh conductor. The second modification example of a mesh conductor has a gap region shaped like a rhombus, and the respective gap regions are disposed linearly in the oblique direction.

FIG. 58 illustrates, in D, a simplified third modification example of a mesh conductor. In the third modification example of a mesh conductor, a gap region has a circular or polygonal shape (octagonal shape in a case of D of FIG. 58) other than a rectangular shape, and the respective gap regions are disposed linearly in the X direction and the Y direction.

FIG. 58 illustrates, in E, a simplified fourth modification example of a mesh conductor. In the fourth modification example of a mesh conductor, a gap region has a circular or polygonal shape (octagonal shape in a case of E of FIG. 58) other than a rectangular shape, and the respective gap regions are disposed linearly in the X direction, and disposed out of alignment between the respective stages in the Y direction.

FIG. 58 illustrates, in F, a simplified fifth modification example of a mesh conductor. In the fifth modification example of a mesh conductor, a gap region has a circular or polygonal shape (octagonal shape in a case of F of FIG. 58) other than a rectangular shape, and the respective gap regions are disposed linearly in the oblique direction.

It should be noted that the shape of a mesh conductor applicable to the respective configuration examples of the conductor layers A and B is not limited to the modification example illustrated in FIG. 58, but it is sufficient if the shape of a mesh conductor is a mesh shape.

8. VARIOUS EFFECTS

<Improvement in Degree of Freedom of Layout Design>

As described above, each configuration example of the conductor layers A and B adopts a planar conductor or a mesh conductor. Generally, a mesh conductor (lattice-shaped conductor) has a cyclic wiring structure with respect to the X direction and the Y direction. Therefore, if a mesh conductor having a basic cyclic structure serving as a unit of the cyclic structure (for one cycle) is designed, repeatedly disposing the basic cyclic structures in the X direction and the Y direction makes it possible to more easily design a layout of wiring lines than in a case where a linear conductor is used. In other words, in a case where a mesh conductor is used, the degree of layout freedom is increased more than in a case where a linear conductor is used. This makes it possible to reduce the man-hours, time, and cost necessary to design a layout.

FIG. 59 is a diagram illustrating a result obtained by simulating the man-hours of design in a case where a layout of circuit wiring lines that satisfies a predetermined condition is designed by using a linear conductor, and the man-hours of design in a case where a layout of circuit wiring lines is designed by using a mesh conductor (lattice-shaped conductor).

In the case of FIG. 59, if the man-hours of design in a case where a linear conductor is used for design is 100%, the man-hours of design when a mesh conductor (lattice-shaped conductor) is used for design is about 40%, and it is understood that it is possible to considerably reduce the man-hours of design.

<Reduction in Voltage Drop (IR-Drop)>

FIG. 60 is a diagram illustrating a change in voltage in a case where DC currents flow in the Y direction under the same condition through conductors that are disposed in the XY plane and have the same material, but different shapes.

In FIG. 60, A corresponds to a linear conductor. In FIG. 60, B corresponds to a mesh conductor. In FIG. 60, C corresponds to a planar conductor. The shades of colors represent voltage. When A, B, and C of FIG. 60 are compared, it is understood that a linear conductor has the greatest change in voltage, followed by a mesh conductor and a planar conductor.

FIG. 61 is a diagram relatively illustrating the voltage drops of a mesh conductor and a planar conductor as graphs, where a voltage drop of a linear conductor illustrated in A of FIG. 60 is 100%.

As can be seen from FIG. 61, a planar conductor and a mesh conductor make it possible reduce a voltage drop (IR-Drop) that may be a fatal obstacle to drive a semiconductor device as compared with a linear conductor.

However, it is known that it is not possible in many cases to manufacture planar conductors in the current process of processing a semiconductor substrate. Therefore, it is practical to adopt a configuration example in which mesh conductors are used for both of the conductor layers A and B. However, this is not true in a case where the process of processing semiconductor substrates evolves and makes it possible to manufacture planar conductors. It is possible in some cases to manufacture planar conductors for the uppermost metal layer and the lowermost metal layer of metal layers.

<Reduction in Capacitive Noise>

It is possible that conductors (planar conductors or mesh conductors) included in the conductor layers A and B cause not only inductive noise, but also capacitive noise to be generated in a Victim conductor loop including the signal line 132 and the control line 133.

Here, the capacitive noise means that, in a case where voltage is applied to conductors included in the conductor layers A and B, voltage is generated in the signal line 132 or the control line 133 due to capacitive coupling between the conductors and the signal line 132 or the control line 133, and voltage noise is further generated in the signal line 132 or the control line 133 due to a change in the applied voltage. This voltage noise becomes noise of pixel signals.

It is considered that the magnitude of capacitive noise is substantially proportional to the electrostatic capacity and voltage between conductors included in the conductor layers A and B and wiring lines such as the signal line 132 and the control line 133. With regard to the electrostatic capacity, in a case where the overlapping area of two conductors (one of which may be a conductor and the other of which may be a wiring line) is S, the two conductors are disposed in parallel with a space of d therebetween, and a dielectric having a dielectric constant E is uniformly filled between the conductors, electrostatic capacity C between the two conductors is $\varepsilon*S/d$. Therefore, it is understood that the capacitive noise increases with an increase in the overlapping area S of the two conductors.

FIG. 62 is a diagram for describing a difference in electrostatic capacity between conductors that are disposed in the XY plane and have the same material, but have different shapes, and another conductor (wiring line).

FIG. 62 illustrates, in A, a linear conductor that is long in the Y direction, and wiring lines 501 and 502 (corresponding to the signal line 132 and the control line 133) formed linearly in the Y direction with spaces from the linear conductor in the Z direction. However, the entire wiring line 501 is overlaid on the conductor region of the linear conductor, but the entire wiring line 502 is overlaid on the gap region of the linear conductor and has no area overlapping with the conductor region.

FIG. 62 illustrates, in B, a mesh conductor, and wiring lines 501 and 502 formed linearly in the Y direction with spaces from the mesh conductor in the Z direction. However, the entire wiring line 501 is overlaid on the conductor region of the mesh conductor, but substantially half of the wiring line 502 is overlaid on the conductor region of the mesh conductor.

FIG. 62 illustrates, in C, a planar conductor, and wiring lines 501 and 502 formed linearly in the Y direction with spaces from the planar conductor in the Z direction. However, the entire wiring lines 501 and 502 are overlaid on the conductor region of the planar conductor.

In a case where the differences between the electrostatic capacity of the conductor (linear conductor, mesh conductor, or planar conductor) and the electrostatic capacity of the wiring line 501, and the electrostatic capacity of the conductor (linear conductor, mesh conductor, or planar conductor) and the electrostatic capacity of the wiring line 502 illustrated in A, B, and C of FIG. 62 are compared, the linear conductor has the greatest electrostatic capacity, followed by the mesh conductor, and the planar conductor.

That is, the linear conductor has a great difference in electrostatic capacity between the linear conductor and the wiring line due to the difference in the XY coordinates of the wiring line, and also has a great difference in the generation of capacitive noise. Therefore, there is a possibility that an image has noise of pixel signals that is high in visual recognizability.

In contrast, the mesh conductor or the planar conductor has a small difference in electrostatic capacity between the conductor and the wiring line due to the difference in the XY coordinates of the wiring line as compared with the linear conductor. This makes it possible to further reduce the generation of capacitive noise. Therefore, it is possible to suppress noise of pixel signals caused by capacitive noise.

<Reduction in Radioactive Noise>

As described above, among the respective configuration examples of the conductor layers A and B, the configuration examples other than the first configuration example use mesh conductors. Effects of reducing radioactive noise are expectable of mesh conductors. Here, it is assumed that the radioactive noise includes radioactive noise (unnecessary radiation) from the inside to the outside of the solid-state imaging device 100, and radioactive noise (noise to be transmitted) from the outside to the inside of the solid-state imaging device 100.

The radioactive noise from the outside to the inside of the solid-state imaging device 100 may generate voltage noise in the signal line 132 and the like and noise of pixel signals. In a case where a configuration example is adopted in which a mesh conductor is used for at least one of the conductor layers A and B, effects of suppressing voltage noise and noise of pixel signals are thus expectable.

The conductor cycle of a mesh conductor influences the frequency band of radioactive noise that a mesh conductor is able to reduce. Accordingly, in a case where mesh conductors having different conductor cycles are used for the respective conductor layers A and B, it is possible to reduce the radioactive noise in a wider frequency band than in a case where mesh conductors having the same conductor frequency are used for the conductor layers A and B.

It should be noted that the effects described above are merely examples, but are not limited. Other effects may be included.

9. EXAMPLE OF APPLICATION

The technology according to the present disclosure is not limited to the description of each embodiment described above and the modification example or example of application thereof, but it is possible to carry out the technology according to the present disclosure with various modifications. A portion of the respective components in each embodiment described above and the modification example or example of application thereof may be omitted, a portion or all thereof may be changed, a portion or all thereof may be modified, a portion thereof may be replaced with another component, or another component may be added to a portion or all thereof. In addition, a portion or all of the respective components in each embodiment described above and the modification example or example of application thereof may be divided into a plurality of components, or a portion or all thereof may be separated into a plurality of components, and at least a portion of the plurality of divided or separated components may have different functions or features. Further, at least a portion of the respective components in each embodiment described above and the modification example or example of application thereof may be combined as different embodiment. Further, at least a portion of the respective components in each embodiment described above and the modification example or example of application thereof may be moved as different embodiment. Further, a coupling factor or a relay factor may be added to a combination of at least a portion of the respective components in each embodiment described above and the modification example or example of application thereof as different embodiment. Further, a switching factor or a switching function may be added to a combination of at least a portion of the respective components in each embodiment described above and the modification example or example of application thereof as different embodiment.

In the solid-state imaging device 100 according to the present embodiment, conductors included in the respective conductor layers A and B that may serve as an Aggressor conductor loop are a Vdd wiring line or a Vss wiring line. That is, in the conductor layers A and B, currents flow in opposite directions in at least a portion of regions. At certain time, when currents flow through the conductor layer A from the top to the bottom in the diagram, currents flow through the conductor layer B from the bottom to the top in the diagram. It should be noted that it is desirable that the currents have the same magnitude. It should be noted that an example in which conductors included in the conductor layers A and B are formed in the second semiconductor substrate is used for description, but this is not limitative. For example, the conductors may be included in the first semiconductor substrate, or a portion or all of the conductors may be included in what is other than the second semiconductor substrate.

As signals flowing through the conductor layers A and B, any signals other than Vdd or Vss may flow as long as the signals are differential signals whose direction of the currents changes in the time direction. In other words, it is sufficient if signals whose current I changes in accordance with time t (a minute current change for minute time dt is dI) flow through the conductor layers A and B. It should be noted that, even if DC currents basically flow through the conductor layers A and B, the current I changes in accordance with the time t in a case where there is a rise of the current, a time transition of the current, a fall of the current, or the like.

For example, the magnitude of currents flowing through the conductor layer A and the magnitude of currents flowing through the conductor layer B do not have to be the same. Conversely, the magnitude of currents flowing through the conductor layer A and the magnitude of currents flowing through the conductor layer B may be the same (currents that change in accordance with time flow through the conductor layers A and B at substantially the same timing). Generally, it is possible to suppress more the magnitude of an induced electromotive force generated in a Victim conductor loop in a case where currents that change in accordance with time flow through the conductor layers A and B at substantially the same timing than in a case where the magnitude of currents flowing through the conductor layer A and the magnitude of currents flowing through the conductor layer B are not the same. Meanwhile, signals flowing through the conductor layers A and B do not have to be differential signals. For example, both may be Vdd wiring lines, both may be Vss wiring lines, or both may be GND wiring lines, signal lines of the same type, signal lines of different types, and the like. In addition, conductors included in the conductor layers A and B may be conductors that are not coupled to a power supply or a source of signals. In these cases, the effects of suppressing inductive noise are lowered, but it is possible to obtain the other inventive effects.

In addition, for example, frequency signals of a predetermined frequency such as clock signals may flow through the conductor layers A and B. In addition, for example, alternating-current power supply currents may flow through the conductor layers A and B. In addition, for example, signals of the same frequency may flow through the conductor layers A and B. In addition, signals including a plurality of frequency components may flow through the conductor layers A and B. Meanwhile, DC signals whose current I does not change at all in accordance with the time t may flow. In this case, the effects of suppressing inductive noise are not obtained, but it is possible to obtain the other inventive effects. Meanwhile, signals may refrain from flowing. In this case, the effects of suppressing inductive noise, suppressing capacitive noise, and reducing a voltage drop (IR-Drop) are not obtained, but it is possible to obtain the other inventive effects.

<Package Stack Example of First Semiconductor Substrate 101 and Second Semiconductor Substrate 102 Included in Solid-State Imaging Device 100>

FIG. 63 is a diagram illustrating a stack example of the first semiconductor substrate 101 and the second semiconductor substrate 102 included in the solid-state imaging device 100.

The first semiconductor substrate 101 and the second semiconductor substrate 102 may be stacked on each other in any manner as a package.

For example, as illustrated in A of FIG. 63, the first semiconductor substrate 101 and the second semiconductor substrate 102 may be individually sealed by using sealing materials, and a resulting package 601 and a resulting package 602 may be stacked.

In addition, as illustrated in B or C of FIG. 63, a package 603 may be generated by sealing the stacked first semiconductor substrate 101 and second semiconductor substrate 102 by using a sealing material. In this case, a bonding wire 604 may be coupled to the second semiconductor substrate 102 as illustrated in B of FIG. 63, or may be coupled to the first semiconductor substrate 101 as illustrated in C of FIG. 63.

In addition, the package may be of any form. For example, CSP (Chip Size Package) or WL-CSP (Wafer Level Chip Size Package) may be used, or an interposer substrate or a re-wiring layer may be used in a package. In addition, any form may be adopted that has no package. For example, a semiconductor substrate may be implemented as COB (Chip On Board). For example, any of BGA (Ball Grid Array), COB (Chip On Board), COT (Chip On Tape), CSP (Chip Size Package/Chip Scale Package), DIMM (Dual In-line Memory Module), DIP (Dual In-line Package), FBGA (Fine-pitch Ball Grid Array), FLGA (Fine-pitch Land Grid Array), FQFP (Fine-pitch Quad Flat Package), HSIP (Single In-line Package with Heatsink), LCC (Leadless Chip Carrier), LFLGA (Low profile Fine pitch Land Grid Array), LGA (Land Grid Array), LQFP (Low-profile Quad Flat Package), MC-FBGA (Multi-Chip Fine-pitch Ball Grid Array), MCM (Multi-Chip Module), MCP (Multi-Chip Package), M-CSP (Molded Chip Size Package), MFP (Mini Flat Package), MQFP (Metric Quad Flat Package), MQUAD (Metal Quad), MSOP (Micro Small Outline Package), PGA (Pin Grid Array), PLCC (Plastic Leaded Chip Carrie), PLCC (Plastic Leadless Chip Carrie), QFI (Quad Flat I-leaded Package), QFJ (Quad Flat J-leaded Package), QFN (Quad Flat non-leaded Package), QFP (Quad Flat Package), QTCP (Quad Tape Carrier Package), QUIP (Quad In-line Package), SDIP (Shrink Dual In-line Package), SIMM (Single In-line Memory Module), SIP (Single In-line Package), S-MCP (Stacked Multi Chip Package), SNB (Small Outline Non-leaded Board), SOI (Small Outline I-leaded Package), SOJ (Small Outline J-leaded Package), SON (Small Outline Non-leaded Package), SOP (Small Outline Package), SSIP (Shrink Single In-line Package), SSOP (Shrink Small Outline Package), SZIP (Shrink Zigzag In-line Package), TAB (Tape-Automated Bonding), TCP (Tape Carrier Package), TQFP (Thin Quad Flat Package), TSOP (Thin Small Outline Package), TSSOP (Thin Shrink Small Outline Package), UCSP (Ultra Chip Scale Package), UTSOP (Ultra Thin Small Outline Package), VSO (Very Short Pitch Small Outline Package), VSOP (Very Small Outline Package), WL-CSP (Wafer Level Chip Size Package), ZIP (Zigzag In-line Package), and μMCP (Micro Multi-Chip Package) may be used.

The present technology is also applicable, for example, to any sensor such as a CCD (Charge-Coupled Device) image sensor, a CCD sensor, a CMOS sensor, a MOS sensor, an IR (Infrared) sensor, a UV (Ultraviolet) sensor, a ToF (Time of Flight) sensor, or a distance measurement sensor, a circuit board, an apparatus, an electronic apparatus, or the like.

In addition, the present technology is preferable for a sensor, a circuit board, an apparatus, or an electronic apparatus in which any devices such as transistors, diodes, or antennas are disposed in an array, and is particularly preferable for a sensor, a circuit board, an apparatus, or an electronic apparatus in which any devices are disposed in an array on substantially the same plane, but is not limited thereto.

The present technology is also applicable, for example, to various memory sensors, circuit boards for memories, memory apparatuses, or electronic apparatuses including memories, to which memory devices relate to, various CCD sensors, circuit boards for CCDs, CCD apparatuses, or electronic apparatuses including CCDs, to which CCDs relate, various CMOS sensors, circuit boards for CMOSs, CMOS apparatuses, or electronic apparatuses including CMOSs, to which CMOSs relate, various MOS sensors, circuit boards for MOSs, MOS apparatuses, electronic apparatuses including MOSs, to which MOSs relate, various display sensors, circuit boards for displays, display apparatuses, or electronic apparatuses including displays, to which light-emitting devices relate, various laser sensors, circuit boards for lasers, laser apparatuses, or electronic apparatuses including lasers, to which light-emitting devices relate, various antenna sensors, circuit boards for antennas, antenna apparatuses, or electronic apparatuses including antennas, to which antenna devices relate, and the like. Among these, a sensor including a Victim conductor loop whose loop path is variable, a circuit board, an apparatus, or an electronic apparatus, a sensor including a control line or a signal line, a circuit board, an apparatus, or an electronic apparatus, a sensor including an a horizon control line or a vertical signal line, a circuit board, an apparatus, or an electronic apparatus, or the like is preferable, but it is not limitative.

It should be noted that the first semiconductor substrate 101 and the second semiconductor substrate 102 included in the solid-state imaging device 100 are not stacked, but may be disposed adjacent to each other or may be disposed on the same plane.

<Example of Structural Application of Victim Conductor Loop and Aggressor Conductor Loop>

An Aggressor conductor loop that generates the magnetic flux passing through the loop surface of a Victim conductor loop may be superimposed on the Victim conductor loop, or also does not have to be superimposed thereon. Further, the Aggressor conductor loop may be formed on a plurality of semiconductor substrates stacked on a semiconductor substrate on which the Victim conductor loop is formed, or may be formed on the same semiconductor substrate as the semiconductor substrate on which the Victim conductor loop is formed.

Further, the Aggressor conductor loop does not have to be a semiconductor substrate, but may include, for example, various substrates such as a printed board, a flexible printed board, an interposer substrate, a package substrate, an inorganic substrate, or an organic substrate. The Aggressor conductor loop may be any substrate including a conductor or a substrate on which it is possible to form a conductor. The Aggressor conductor loop may be present on a circuit other than the semiconductor substrate such as a package in which the semiconductor substrate is sealed. Generally, the distance of the Aggressor conductor loop to the Victim conductor loop is shortened in the order of a case where the Aggressor conductor loop is formed on the semiconductor substrate, a case where the Aggressor conductor loop is formed on a package, and a case where the Aggressor conductor loop is formed on a printed board. Inductive noise and capacitive noise that may be generated in the Victim conductor loop tend to increase as the distance of the Aggressor conductor loop to the Victim conductor loop decreases. Accordingly, the present technology is more effective as the distance of the Aggressor conductor loop to the Victim conductor loop decreases. Further, the present technology is not limited to substrates, but also applicable to conductors themselves typified by leading lines and guide plates such as bonding wires, lead lines, antenna lines, power lines, GND lines, coaxial lines, dummy lines, sheet metal, or the like.

10. CONFIGURATION EXAMPLE OF IMAGING DEVICE

The solid-state imaging device 100 described above is applicable, for example, to a camera system such as a digital camera or a video camera, a mobile phone having an imaging function, another apparatus having an imaging function, or an electronic apparatus including a semiconductor device having a high-sensitivity analog element such as a flash memory.

FIG. 64 is a block diagram illustrating a configuration example of an imaging apparatus 700 as an example of an electronic apparatus.

The imaging apparatus 700 includes a solid-state imaging element 701, an optical system 702 that guides incident light to the solid-state imaging element 701, a shutter mechanism 703 provided between the solid-state imaging element 701 and the optical system 702, and a driving circuit 704 that drives the solid-state imaging element 701. The imaging apparatus 700 further includes a signal processing circuit 705 that processes an output signal of the solid-state imaging element 701.

The solid-state imaging element 701 corresponds to the solid-state imaging device 100 described above. The optical system 702 includes an optical lens group or the like, and causes image light (incident light) from a subject to enter the solid-state imaging element 701. This causes signal charge to be accumulated in the solid-state imaging element 701 for a predetermined period. The shutter mechanism 703 controls a light irradiation period and a light shielding period of incident light to the solid-state imaging element 701.

The driving circuit 704 supplies driving signals to the solid-state imaging element 701 and the shutter mechanism 703. The driving circuit 704 then controls the signal output operation of the solid-state imaging element 701 to the signal processing circuit 705 and the shutter operation of the shutter mechanism 703 by the supplied driving signal. That is, in this example, the operation of transferring signals from the solid-state imaging element 701 to the signal processing circuit 705 is performed on the basis of driving signals (timing signals) supplied from the driving circuit 704.

The signal processing circuit 705 performs various kinds of signal processing on the signals transferred from the solid-state imaging element 701. The signals (image signals) subjected to the various kinds of signal processing are stored in a storage medium (not illustrated) such as a memory, or outputted to a monitor (not illustrated).

According to the electronic apparatus such as the imaging apparatus 700 described above, in the solid-state imaging element 701, it is possible to suppress the generation of noise due to leakage from an active element such as a MOS transistor or a diode to a light-receiving element for light such as emitted hot carrier light at the time of operation in the peripheral circuit portion. Therefore, it is possible to provide a high-quality electronic apparatus with improved image quality.

11. EXAMPLE OF APPLICATION TO IN-VIVO INFORMATION ACQUISITION SYSTEM

The technology (present technology) according to the present disclosure is applicable to various products. For example, the technology according to the present disclosure may be applied to an in-vivo information acquisition system of a patient using a capsule type endoscope.

FIG. 65 is a block diagram depicting an example of a schematic configuration of an in-vivo information acquisition system of a patient using a capsule type endoscope, to which the technology according to an embodiment of the present disclosure can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit

10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 65, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

An example of the in-vivo information acquisition system to which the technology according to the present disclosure may be applied has been described above. The technology according to an embodiment of the present disclosure is applicable to the image pickup unit 10112 among the components described above. Specifically, the solid-state imaging device 100 described above is applicable as the image pickup unit 10112. Applying the technology according to the present disclosure to the image pickup unit 10112 and applying the technology according to the present disclosure to the image pickup unit 10112 make it possible to suppress the generation of noise and obtain a clearer surgical site image. This increases the accuracy of specification.

12. EXAMPLE OF APPLICATION TO ENDOSCOPIC SURGERY SYSTEM

The technology (present technology) according to the present disclosure is applicable to various products. For example, the technology according to the present disclosure may be applied to an endoscopic surgery system.

FIG. 66 is a view depicting an example of a schematic configuration of an endoscopic surgery system to which the technology according to an embodiment of the present disclosure (present technology) can be applied.

In FIG. 66, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 67 is a block diagram depicting an example of a functional configuration of the camera head 11102 and the CCU 11201 depicted in FIG. 66.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The image pickup unit 11402 includes an image pickup element. The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure may be applied has been described above. The technology according to an embodiment of the present disclosure is applicable, for example, to the image pickup unit 11402 of the camera head 11102 among the components described above. Specifically, the solid-state imaging device 100 described above is applicable as the image pickup unit 11402. Applying the technology according to the present disclosure to the image pickup unit 11402 makes it possible to suppress the generation of noise and obtain a clearer image of a surgical region. This allows a surgeon to check the surgical region with certainty.

It should be noted that the endoscopic surgery system has been described here as an example, but the technology according to the present disclosure may be additionally applied to, for example, a microscopic surgery system or the like.

13. Example of Application to Mobile Body

Further, for example, the technology according to the present disclosure may be achieved as a device mounted on any type of mobile body such as an automobile, an electric vehicle, a hybrid electric vehicle, a motorcycle, a bicycle, a personal mobility, an airplane, a drone, a vessel, or a robot.

FIG. 68 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 68, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 68, an audio speaker 12061, a display section 12062, and an instrument panel 12063 are illustrated as the output device. The display section 12062 may, for example, include at least one of an on-board display and a head-up display.

FIG. 69 is a diagram depicting an example of the installation position of the imaging section 12031.

In FIG. 69, as the imaging section 12031, the vehicle 12100 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The images of the area ahead acquired by the imaging sections 12101 and 12105 are used chiefly to detect a preceding vehicle, a pedestrian, an obstacle, a traffic light, a traffic sign, a lane, or the like.

Incidentally, FIG. 69 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure may be applied has been described above. The technology according to an embodiment of the present disclosure is applicable, for example, to the imaging section 12031 among the components described above. Specifically, the solid-state imaging device 100 described above is applicable as the imaging section 12031. Applying the technology according to the present disclosure to the imaging section 12031 makes it possible to suppress the generation of noise and obtain a photography image that is easier to see. This makes it possible to appropriately assist a driver in driving.

An embodiment of the present technology is not limited to the embodiments described above, but various changes and modifications may be made without departing from the scope of the technology.

The present technology may also be configured as below.

(1)

A semiconductor device including:

a first semiconductor substrate on which at least a portion of a first conductor loop is formed; and a second semiconductor substrate on which a second conductor loop is formed, the second semiconductor substrate including a first conductor layer and a second conductor layer, the first conductor layer and the second conductor layer each including a conductor, the first conductor layer and the second conductor layer being configured to cause a direction of a loop surface in which a magnetic flux is generated from the second conductor loop to be different from a direction of a loop surface in which an induced electromotive force is generated in the first conductor loop.

(2)

The semiconductor device according to (1), in which the first conductor layer and the second conductor layer are configured to cause the direction of the loop surface in which the magnetic flux is generated from the second conductor loop to be different by substantially 90 degrees from the direction of the loop surface in which the induced electromotive force is generated in the first conductor loop.

(3)
The semiconductor device according to (1) or (2), in which the first conductor layer and the second conductor layer form a light-shielding structure in at least a portion of regions.

(4)
The semiconductor device according to any of (1) to (3), in which at least one of the conductor included in the first conductor layer or the conductor included in the second conductor layer includes a wiring line that is coupled to a positive power supply, and another conductor includes a wiring line that is coupled to a negative power supply or GND.

(5)
The semiconductor device according to any of (1) to (4), in which at least one of the conductor included in the first conductor layer or the conductor included in the second conductor layer includes a planar conductor.

(6)
The semiconductor device according to any of (1) to (4), in which at least one of the conductor included in the first conductor layer or the conductor included in the second conductor layer includes a mesh conductor.

(7)
The semiconductor device according to (6), in which
the conductor included in the first conductor layer includes a planar conductor,
the conductor included in the second conductor layer includes a mesh conductor, and
as a positional relationship, the first conductor layer is closer to the first semiconductor substrate than the second conductor layer.

(8)
The semiconductor device according to (6), in which, in at least a portion of regions in the mesh conductor, conductor width of a conductor region and gap width of a gap region have a relationship of conductor width≥gap width.

(9)
The semiconductor device according to (6) or (8), in which
the conductor included in the first conductor layer includes a first mesh conductor,
the conductor included in the second conductor layer includes a second mesh conductor, and
a conductor cycle of the first mesh conductor and a conductor cycle of the second mesh conductor are substantially identical.

(10)
The semiconductor device according to (9), in which conductor width of the first mesh conductor and conductor width of the second mesh conductor are different from each other.

(11)
The semiconductor device according to any of (6) to (10), in which another conductor is disposed in at least a portion of a gap region of the mesh conductor that is not a conductor.

(12)
The semiconductor device according to (11), in which
the second conductor layer includes the mesh conductor in at least a portion of the gap region, the other conductor being disposed in the mesh conductor, and
the other conductor is coupled to at least a portion of the conductor included in the first conductor layer.

(13)
The semiconductor device according to any of (6) to (12), in which a resistance value of the mesh conductor in a first direction and a resistance value of the mesh conductor in a second direction are different from each other, the second direction being orthogonal to the first direction.

(14)
The semiconductor device according to any of (1) to (13), in which an effective shape of the first conductor loop is changeable.

(15)
The semiconductor device according to any of (1) to (14), in which
the first semiconductor substrate includes a pixel that receives light, and
the first conductor loop includes a conductor loop including the pixel, a signal line through which a pixel signal that is outputted from the pixel flows, and a control line through which a control signal for the pixel flows.

(16)
The semiconductor device according to any of (13) to (15), further including a plurality of pads, each of the plurality of pads including an electrode that is coupled to the mesh conductor whose resistance value in the second direction is lower than the resistance value in the first direction, in which
the plurality of pads is densely disposed in the first direction.

(17)
The semiconductor device according to any of (13) to (15), further including a plurality of pads, each of the plurality of pads including an electrode that is coupled to the mesh conductor whose resistance value in the second direction is lower than the resistance value in the first direction, in which
the plurality of pads is densely disposed in the second direction.

(18)
The semiconductor device according to (16) or (17), in which at least portions of the pads disposed adjacent to each other are different in polarity.

(19)
The semiconductor device according to (16) or (17), in which at least portions of the pads disposed to be opposed to each other are equal in polarity.

(20)
An electronic apparatus including
a semiconductor device including
a first semiconductor substrate on which at least a portion of a first conductor loop is formed, and
a second semiconductor substrate on which a second conductor loop is formed, the second semiconductor substrate including a first conductor layer and a second conductor layer, the first conductor layer and the second conductor layer each including a conductor,
the first conductor layer and the second conductor layer being configured to cause a direction of a loop surface in which a magnetic flux is generated from the second conductor loop to be different from a direction of a loop surface in which an induced electromotive force is generated in the first conductor loop.

REFERENCE SIGNS LIST

10 Pixel substrate, 11 Victim conductor loop, 20 Logic substrate, 21 Power supply wiring line, 100 Solid-state imaging device, 101 First semiconductor substrate, 102 Second semiconductor substrate, 111 Pixel/analog processing unit, 112 Digital processing unit, 121 Pixel array, 122 A/D conversion unit, 123 Vertical scanning unit, 131 Pixel, 132 Signal line, 133 Control line, 141 Photodiode, 142 Transfer transistor, 143 Reset transistor, 144 Amplifying transistor, 145 Select transistor, 151 Light-shielding structure, 152 Semiconductor base, 153 Multilayer wiring layer, 155 Optical member, 162 Semiconductor base, 163 Multilayer wiring layer, 164 MOS transistor, 165 Wiring layer, 167 Active element group, 191 Buffer region, 192 Interlayer distance, 193 Buffer region width, 194 Light-shielding target region, 202 to 204 Circuit block, 205 to 208 Light-shielding target region, 209 Light-shielding non-target region, 211, 212 Linear conductor, 213, 214 Planar conductor, 216, 217 Mesh conductor, 221 Planar conductor, 222 Mesh conductor, 231, 232 Mesh conductor, 241, 242 Mesh conductor, 251, 252 Mesh conductor, 261 Planar conductor, 262 Mesh conductor, 271, 272 Mesh conductor, 281, 282 Mesh conductor, 291, 292 Mesh conductor, 301 to 306 Relay conductor, 311, 312 Mesh conductor, 321, 322 Mesh conductor, 331, 332 Mesh conductor, 400 Wiring region, 401, 402 Pad, 501, 502 Wiring line, 601 to 603 Package, 604 Bonding wire, 700 Imaging device, 701 Solid-state imaging element, 702 Optical system, 703 Shutter mechanism, 704 Driving circuit, 705 Signal processing circuit

The invention claimed is:

1. A semiconductor device comprising:
a first semiconductor substrate on which at least a portion of a first conductor loop is formed; and
a second semiconductor substrate on which a second conductor loop is formed, the second semiconductor substrate including a first conductor layer and a second conductor layer, the first conductor layer and the second conductor layer each including a conductor,
the first conductor layer and the second conductor layer being configured to cause a direction of a loop surface in which a magnetic flux is generated from the second conductor loop to be different from a direction of a loop surface in which an induced electromotive force is generated in the first conductor loop.

2. The semiconductor device according to claim 1, wherein
the first conductor layer and the second conductor layer are configured to cause the direction of the loop surface in which the magnetic flux is generated from the second conductor loop to be different from the direction of the loop surface in which the induced electromotive force is generated in the first conductor loop.

3. The semiconductor device according to claim 2, wherein
the first conductor layer and the second conductor layer form a light-shielding structure in at least a portion of regions.

4. The semiconductor device according to claim 2, wherein
at least one of the conductor included in the first conductor layer or the conductor included in the second conductor layer includes a wiring line that is coupled to a positive power supply, and another conductor includes a wiring line that is coupled to a negative power supply or ground (GND).

5. The semiconductor device according to claim 2, wherein
at least one of the conductor included in the first conductor layer or the conductor included in the second conductor layer includes a planar conductor.

6. The semiconductor device according to claim 2, wherein
at least one of the conductor included in the first conductor layer or the conductor included in the second conductor layer includes a mesh conductor.

7. The semiconductor device according to claim 6, wherein
the conductor included in the first conductor layer includes a planar conductor,
the conductor included in the second conductor layer includes a mesh conductor, and
as a positional relationship, the first conductor layer is closer to the first semiconductor substrate than the second conductor layer.

8. The semiconductor device according to claim 6, wherein,
in at least a portion of regions in the mesh conductor, conductor width of a conductor region and gap width of a gap region have a relationship of conductor width≥gap width.

9. The semiconductor device according to claim 6, wherein
the conductor included in the first conductor layer includes a first mesh conductor, and
the conductor included in the second conductor layer includes a second mesh conductor.

10. The semiconductor device according to claim 9, wherein
conductor width of the first mesh conductor and conductor width of the second mesh conductor are different from each other.

11. The semiconductor device according to claim 6, wherein
another conductor is disposed in at least a portion of a gap region of the mesh conductor that is not a conductor.

12. The semiconductor device according to claim 11, wherein
the second conductor layer includes the mesh conductor in at least a portion of the gap region, the other conductor being disposed in the mesh conductor, and
the other conductor is coupled to at least a portion of the conductor included in the first conductor layer.

13. The semiconductor device according to claim 6, wherein
a resistance value of the mesh conductor in a first direction and a resistance value of the mesh conductor in a second direction are different from each other, the second direction being orthogonal to the first direction.

14. The semiconductor device according to claim 1, wherein an effective shape of the first conductor loop is changeable.

15. The semiconductor device according to claim 14, wherein
the first semiconductor substrate includes a pixel that receives light, and
the first conductor loop includes a conductor loop including the pixel, a signal line through which a pixel signal that is outputted from the pixel flows, and a control line through which a control signal for the pixel flows.

16. The semiconductor device according to claim 13, further comprising
a plurality of pads, each of the plurality of pads including an electrode that is coupled to the mesh conductor whose resistance value in the second direction is lower than the resistance value in the first direction, wherein the plurality of pads is densely disposed in the first direction.

17. The semiconductor device according to claim 13, further comprising
a plurality of pads, each of the plurality of pads including an electrode that is coupled to the mesh conductor whose resistance value in the second direction is lower than the resistance value in the first direction, wherein the plurality of pads is densely disposed in the second direction.

18. The semiconductor device according to claim 16, wherein
at least portions of the pads disposed adjacent to each other are different in polarity.

19. The semiconductor device according to claim 16, wherein
at least portions of the pads disposed to be opposed to each other are equal in polarity.

20. The semiconductor device according to claim 1, wherein
the first conductor layer and the second conductor layer are configured to cause the direction of the loop surface in which the magnetic flux is generated from the second conductor loop to be different by 90 degrees from the direction of the loop surface in which the induced electromotive force is generated in the first conductor loop.

21. The semiconductor device according to claim 6, wherein
the conductor included in the first conductor layer includes a first mesh conductor,
the conductor included in the second conductor layer includes a second mesh conductor, and
a conductor cycle of the first mesh conductor and a conductor cycle of the second mesh conductor are identical.

22. An electronic apparatus comprising
a semiconductor device including
a first semiconductor substrate on which at least a portion of a first conductor loop is formed, and
a second semiconductor substrate on which a second conductor loop is formed, the second semiconductor substrate including a first conductor layer and a second conductor layer, the first conductor layer and the second conductor layer each including a conductor,
the first conductor layer and the second conductor layer being configured to cause a direction of a loop surface in which a magnetic flux is generated from the second conductor loop to be different from a direction of a loop surface in which an induced electromotive force is generated in the first conductor loop.

* * * * *